(12) United States Patent
Curran

(10) Patent No.: US 11,651,957 B2
(45) Date of Patent: May 16, 2023

(54) PROCESS AND MANUFACTURE OF LOW-DIMENSIONAL MATERIALS SUPPORTING BOTH SELF-THERMALIZATION AND SELF-LOCALIZATION

(71) Applicant: SemiNuclear, Inc., Plano, TX (US)

(72) Inventor: Patrick Curran, Dallas, TX (US)

(73) Assignee: SemiNuclear, Inc., Plano, TX (US)

( * ) Notice: Subject to any disclaimer, the term of this patent is extended or adjusted under 35 U.S.C. 154(b) by 621 days.

(21) Appl. No.: 16/425,582

(22) Filed: May 29, 2019

(65) Prior Publication Data

US 2021/0104403 A1 Apr. 8, 2021

Related U.S. Application Data

(60) Continuation-in-part of application No. 15/959,463, filed on Apr. 23, 2018, now Pat. No. 11,521,853, and
(Continued)

(51) Int. Cl.
*C07F 7/21* (2006.01)
*C23C 16/30* (2006.01)
(Continued)

(52) U.S. Cl.
CPC .......... *H01L 21/02521* (2013.01); *C07F 7/21* (2013.01); *C23C 16/30* (2013.01);
(Continued)

(58) Field of Classification Search
CPC . C07F 7/21; C23C 16/30; C23C 16/40; C23C 16/401; H01L 21/02521;
(Continued)

(56) References Cited

U.S. PATENT DOCUMENTS

| 3,455,745 A | 7/1969 | Kern et al. |
| 3,607,367 A | 9/1971 | MCandless et al. |

(Continued)

FOREIGN PATENT DOCUMENTS

| CN | 101074478 | 5/2016 |
| RU | 2532137 C2 | 10/2014 |
| WO | WO2015186625 | 12/2015 |

OTHER PUBLICATIONS (Hallam, B., et. al.) Modelling kinetics of the boron-oxygen defect system, Energy Procedia 92 (2016) pp. 42-51 (doi: 10.1016/j.egypro.2016.07.008).
(Continued)

*Primary Examiner* — Humera N. Sheikh
*Assistant Examiner* — Kevin C T Li
(74) *Attorney, Agent, or Firm* — Locke Lord, LLP; Mark Backofen

(57) ABSTRACT

Various articles and devices can be manufactured to take advantage of a what is believed to be a novel thermodynamic cycle in which spontaneity is due to an intrinsic entropy equilibration. The novel thermodynamic cycle exploits the quantum phase transition between quantum thermalization and quantum localization. Preferred devices include a phonovoltaic cell, a rectifier and a conductor for use in an integrated circuit.

55 Claims, 104 Drawing Sheets

Related U.S. Application Data a continuation of application No. PCT/US2017/064020, filed on Nov. 30, 2017, said application No. 15/959,463 is a division of application No. 15/363,230, filed on Nov. 29, 2016, now Pat. No. 9,972,489, which is a continuation-in-part of application No. 15/167,672, filed on May 27, 2016, now abandoned, said application No. PCT/US2017/064020 is a continuation-in-part of application No. PCT/US2016/063933, filed on Nov. 29, 2016.

(60) Provisional application No. 62/591,848, filed on Nov. 29, 2017, provisional application No. 62/471,815, filed on Mar. 15, 2017, provisional application No. 62/167,418, filed on May 28, 2015.

(51) Int. Cl.

| | |
|---|---|
| *C23C 16/38* | (2006.01) |
| *C30B 29/40* | (2006.01) |
| *C30B 7/10* | (2006.01) |
| *H01B 1/06* | (2006.01) |
| *H01L 21/02* | (2006.01) |
| *C23C 16/40* | (2006.01) |

(52) U.S. Cl.
CPC ............. *C23C 16/38* (2013.01); *C23C 16/40* (2013.01); *C23C 16/401* (2013.01); *C30B 7/105* (2013.01); *C30B 29/406* (2013.01); *H01B 1/06* (2013.01); *H01L 21/0245* (2013.01); *H01L 21/0259* (2013.01); *H01L 21/0262* (2013.01); *H01L 21/02208* (2013.01); *H01L 21/02381* (2013.01); *H01L 21/02488* (2013.01); *H01L 21/02491* (2013.01); *H01L 21/02505* (2013.01); *H01L 21/02565* (2013.01); *H01L 21/02579* (2013.01); *H01L 21/02581* (2013.01); *H01L 21/02595* (2013.01)

(58) Field of Classification Search
CPC ......... H01L 21/02208; H01L 21/02381; H01L 21/0245; H01L 21/02488; H01L 21/02491; H01L 21/02505; H01L 21/02565; H01L 21/03579; H01L 21/02581; H01L 21/0259; H01L 21/02595; H01L 21/0262; H01L 21/02129; H01L 21/02271; H01L 35/00; H01L 39/005; H01L 39/12; C30B 25/00; C30B 29/10; C30B 29/406; C30B 7/105
See application file for complete search history.

(56) References Cited

U.S. PATENT DOCUMENTS

| | | | |
|---|---|---|---|
| 4,818,625 | A | 4/1989 | Lavendel et al. |
| 5,126,284 | A | 6/1992 | Curran |
| 5,272,237 | A | 12/1993 | Keller et al. |
| 5,598,025 | A | 1/1997 | Murakoshi et al. |
| 6,025,611 | A | 2/2000 | Dowben |
| 6,479,919 | B1 | 11/2002 | Aselage et al. |
| 6,517,808 | B1 | 2/2003 | Hawthorne et al. |
| 8,673,251 | B2 | 3/2014 | Cook et al. |
| 2001/0035206 | A1* | 11/2001 | Inamasu ............... H01L 31/075 438/57 |
| 2004/0005768 | A1 | 1/2004 | Hersee et al. |
| 2007/0037360 | A1 | 2/2007 | Jeong |
| 2009/0025556 | A1 | 1/2009 | Mirkin et al. |
| 2010/0047952 | A1 | 2/2010 | Ohnuma et al. |
| 2010/0163873 | A1 | 7/2010 | Cho et al. |
| 2010/0233633 | A1 | 9/2010 | Nguyen et al. |
| 2010/0313952 | A1 | 12/2010 | Coakley |
| 2011/0260047 | A1 | 10/2011 | Lee |
| 2012/0043483 | A1 | 2/2012 | Bowen, III et al. |
| 2015/0099078 | A1 | 4/2015 | Fish |
| 2015/0206940 | A1 | 7/2015 | Choi et al. |
| 2016/0318810 | A1 | 11/2016 | Goswami et al. |
| 2016/0351286 | A1 | 12/2016 | Curran |

OTHER PUBLICATIONS (Kumar, V.R., et. al.), Graphene Based On-Chip Interconnects and TSVs, Prospects and Challenges, IEEE Nanotechnology Magazine, Dec. 2014, pp. 14-21, (doi:10.1109/MNANO.2014.2355275).

(Lim, B., et. al.) Generation and annihilation of boron-oxygen-related recombination centers in compensated p- and n-type silicon, Journal of Applied Physics 108, 103722(2010) (doi: 10.1063/1.3511741).

(Liu, J., et. al.), The local structure of transition metal doped semiconducting boron carbides, Journal of Physics, 43 (2010), 085403, 8 pp., (doi:10.1088/0022-3727/43/8/085403).

(Liu, N., et. al.), Large-Area, Transparent, and Flexible Infrared Photodector Febricated Using P-N Junctions Formed by N-Doping Chemical Vapor Deposition Grown Graphene, Nano Letters, American Chemical Society, 2014, pp. 3702-3708, (dx.doi.org/10.1021/nl500443j).

(Olivia, J., et. al.) On the electronic structure and stability of icosahedral r-X2 Z10 H12 and Z12 H12 2-clusters; r ={ortho, meta, para}, X = {C, Si}, Z = {B, Al}, Physical Chemistry Chemical Physics, 12 (2010) pp. 5101-5108 (doi: 10.1039/b924322d).

(Palmer, D., et. al.) Kinetics of the electronically stimulated formation of a boron-oxygen complex in crystalline silicon, Physical Review B 76, 035210 (2007) (doi: 10.1103/PhysRevB.76.035210).

(Shioya, H., et. al.), Gate tunable non-linear currents in bi-layer graphene diodes, Applied Physics Letters, 100, 033113 (2012).

Zhang, Y, Epitaxial growth of icosahedral boron arsenide on silicon carbide substrates: Improved process conditions and electrical properties, a dissertation, Kansas State University, (Retrieved from the Internet on Sep. 4, 2018). >URL: http://krex.k-state.edu/dspace/bitstream/handle/2097/13122/YiZhang2011.pdf?sequence=3>2011; abstract; pp. 1, 77-79.

Balakrishnarajan, MM et al., Structure and bonding in boron carbide: The invincibility of imperfections, New Journal of Chemistry, vol. 31, pp. 473-485. Feb. 27, 2007: p. 474.

Sun, X, Two-Dimensional Boron Crystals: Structural Stability, Tunable Properties, Fabrications and Applications, Advanced Functional Materials, Nov. 11, 2016, vol. 27 No. 19; abstract; pp. 9-10.

Parkhomenko et al., Deposition of Au Thin Films and Nanoparticles by MOCVD, Chem. Vap. Deposition, 2012; 18 (10-12); 336-342 (doi: 10.1002/cvde.201207004) p. 336, col. 1, para 1-2; p. 337, col. 1, para 1; p. 337, col. 1, para 3-col. 2, para 1; p. 337, Fig. 1 p. 338, col. 1, para 338, Table 2.

Barron, Chemical Vapor Deposition of Silica Thin Films, OpenStax-CXX module; m24897, Jan. 22, 2010 (Jan. 22, 2010) (http://cte-cnx-dev.cnx.org/contents/jhbhyKow@4/Chemical-Vapor-Deposition-of-S) p. 9, para 1.

Aselage, The Coexistence of Silicon Borides with Boron-Saturated Silicon: Metastability of SiB3, Journal of Materials Research, 1998; 13(7): 1786-1794 (doi: 10.1557/JMR.1998.0252) p. 1786, col. 2, para 4—p. 1787, col. 1, para 1.

Kuchumov et al., Monitoring the Microstructure of Nanosized Palladium Layers Obtained via Thermal and VUV Stimulated MOCVD, Surface and Coatings Technology, 2013; 230:266-272 (doi: 10.1016/j.surfcoat.2013.06.049) p. 267, col. 1, para 4.

Kiran Shrestha "Electrical Conduction Mechanisms in the disordered material system p-type hydrogenated amorphous silicon", Dec. 2014, 90 pages.

Machine English translation of the description of CN101074478 to Ping et al., retrieved from the ESpacenet website. Internet retrieval date of Jan. 24, 2018.

Wesemann et al., "Silaborates with an Unprecedented Cluster Geometry", Organometallics 1999, vol. 18, pp. 4654-4659.

(56) References Cited

OTHER PUBLICATIONS

Ohishi et al. "Synthesis and formation mechanism of hydrogenated boron clusters B12Hn with controlled hydrogen content", The Journal of Chemical Physics, vol. 133, 2010, pp. 074305-1 to 074305-7.

Grunkkoette-Stock; Berhhard; Bezugly, Viktor; Kunstmann, Jens; Cuniberti, Gianaurelio; Frauenheim, Thomas; Niehaus, Thomas A.; "SCC-DFTB parametrization for Boron and Boranes", JCTC, Feb. 1, 2012, pp. 1153-1163, American Chemistry Society.

Wang, Liaoyuan, "Electronic Structure of Elemental Boron", Thesis, 2010, pp. 1-62, U of MO, Kansas City, MO.

Longuet-Higgins, H.C. Roberts, M. De V.; "The Electric Structure of an Icosahedron of Boron Atoms", Article, Feb. 16, 1995, pp. 110-119, The Royal Society, www.jstor.org.

Emin, David; "Unusual Properties of Icosahedral Boron-Rich Solids", Journal of Solid State Chemistry 179, Feb. 8, 2006, pp. 2791-2798, Elsevier.

Werheit, Helmut; Filipov, Volodymyr; Kuhlmann, Udo; Schwarz, Ulrich; Armbruester, Marc; Leithe-Jasper, Andreas; Tanaka, Takaho; Higashi, Iwami; Lunstroem, Torsten; Gurin, Vladimir N.; and Korsukova, Maria M.; "Raman Effect in icosahedral Boron-Rich Solids", Sci. Technol. Adv. Mater., 2010, pp. 1-28 (http://iopscience.iop.org/1468-6996/11/2/023001).

Sadrzadeh, Arta; Yakobson, Boris I.; "The Boron Fullerenes"; Handbook of Nanophysics: Clusters and Fullerenes; 2009 pp. 47-1-47-9, Rice University, US.

Jones Otten, Carolyn; Lourie, Oleg R.; Yu, Min-Fend; Cowley, John M.; Dyer, Mark J.; Ruoff, Rodney S.; Buhro, William E.; "Crystalline Boron Nanowires", J. Am. Chem. Soc.; 2002, pp. 4564-4565 and 1-10, JACS Communications, WWW.

Kirihara, Kazuhiro; Sasaki, Takeshi; Koshizaki, Naoto; Kimura, Kaoru; "Seebeck Coefficient and Power Factor of Single-Crystalline Boron Nanobelts", Applied Physics Express, 2011, pp. xxxxxx-1-xxxxxx-3, The Japan Society of Applied Physics.

Weber, W.; Thorpe, M.F.; "Vibrations in Icosahedra Boron Molecules and in Elemental Boron Solids", J. Phys. Chem. Solids, 1975, pp. 967-974, Great Britain.

Werheit, Helmut, "Present Knowledge of Electronic Properties and Charge Transport of Icosahedral Boron-Rich Solids" 16th International Symposium on Boron, Borides and Related Materials, Journal of Physics: Conference Series 176, 2009, pp. 1-11, IOP Publishing Ltd.

Howard, Iris A.; Beckel, Charles L.; "Analysis of Boron Carbides' Electronic Structure", NASA subcontract, Aug. 18, 1986, pp. 1-29, New Mexico, US.

Beckel, Charles L. Vaughan, James P.; "Vibrations of Regular Boron Icosahedra", AIP Conference Proceedings 140, 1986, pp. 305-311, AIP Publishing, New Mexico, US.

(Branz, H.M., et al.) Incorporation of Boron During Thermal Chemical Vapor Deposition of Doped Hydrogenated Amorphous Silicon, Applied Physics Letters, AIP Publishing, vol. 51, No. 12, Sep. 1987, pp. 922-924 (DOI: 10.1063/1.98802).

(Herner, S.B., et al.) Silicon deposition from BC13/SiH4 mixtures: Effect of very high boron concentralion on microstructure, Journal of Vacuum Science & Technology B: Microelectronicsprocessing and Phenomena, American Vacuum Society, New York vol. 22, No. 1, Jan. 2004, pp. 1-5 (DOI: 10.1116/1631292).

(Sarubbi, F., et al.) Chemical Vapor Deposition of $\alpha$-Boron Layers on Silicon for Controlled Nanometer-Deep p+n Junction Formation, Journal of Electronic Materials, vol. 39, No. 2, 2010 (DOI: 10.1007/S11664-009-1018-6).

(Caruso, A.N., et. al.), The all boron carbide diode neutron detector: Comparison with theory, Elsevier Materials Science and Engineering B 135 (2006), pp. 129-133.

(Rybakov, S.Yu., et. al.), Oxygen Effect on the Stability of PECVD Boron-Carbon Films, Journal De Physique IV, Colloque C5, supplement au Journal de Physique II, vol. 5, Jun. 1995.

(Aselage, T.L.), The coexistence of silicon borides with boron-saturated silicon: Metastability of SiB3, Journal of Materials Research, vol. 13, No. 7, Jul. 1998.

(Tsai, C.C.), Characterization of amorphous semiconducting silicon-boron alloys prepared by plasma decomposition, Physical Review B, vol. 9, No. 4, Feb. 1979.

(Melnick, C. and Kaviany, M.), Phonovoltaic. I. Harvesting hot optical phonons in a nanoscale p-n junction, Physical Review B93, 094302 (2016).

* cited by examiner

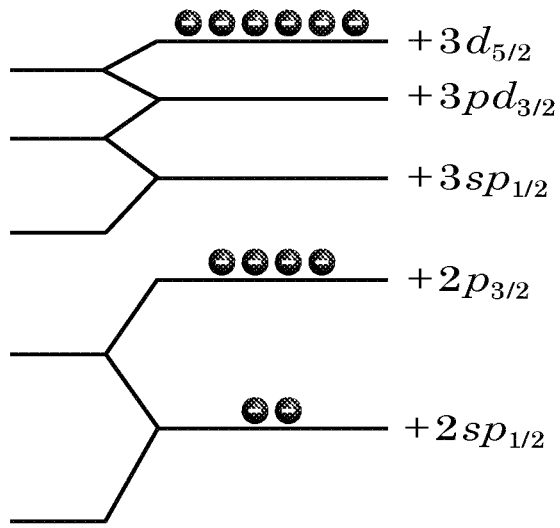
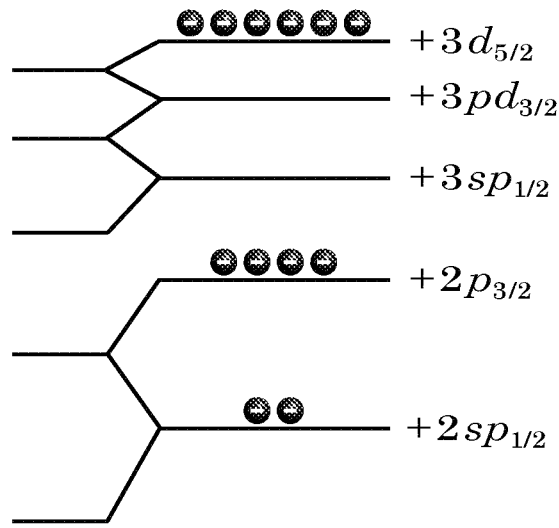
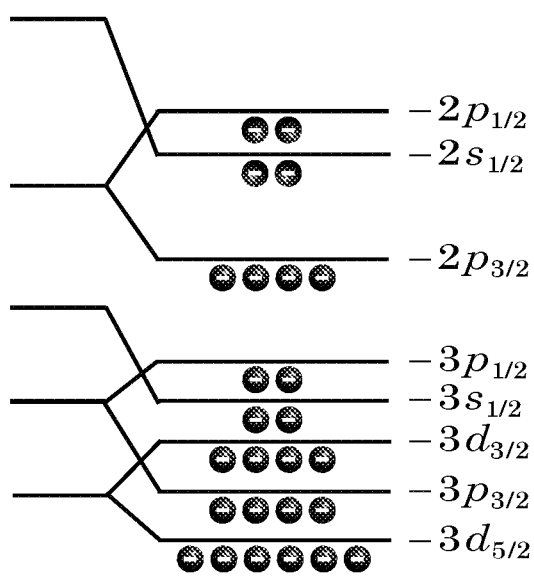
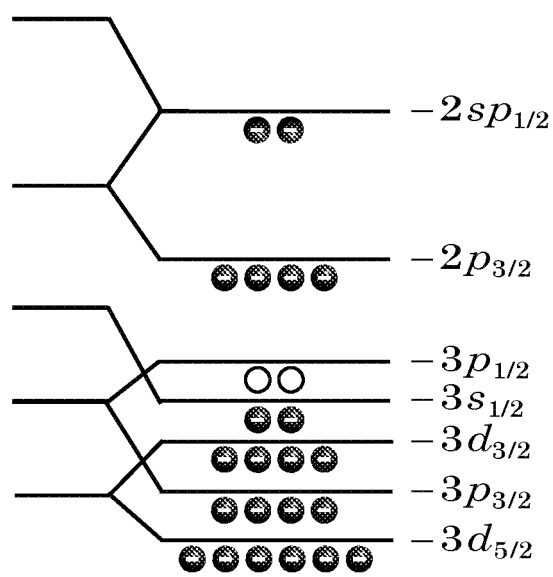
FIG. 18A
FIG. 18B

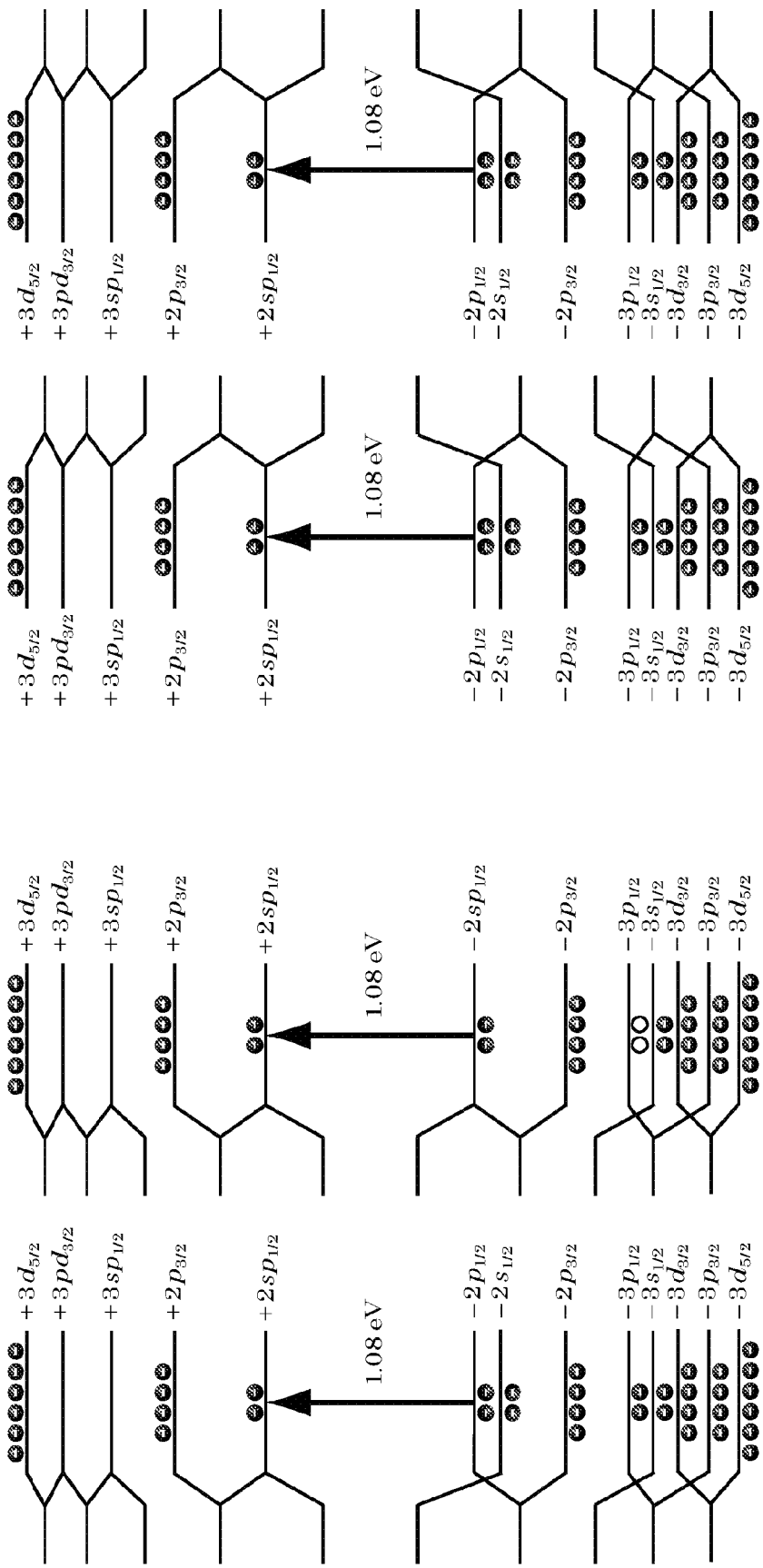

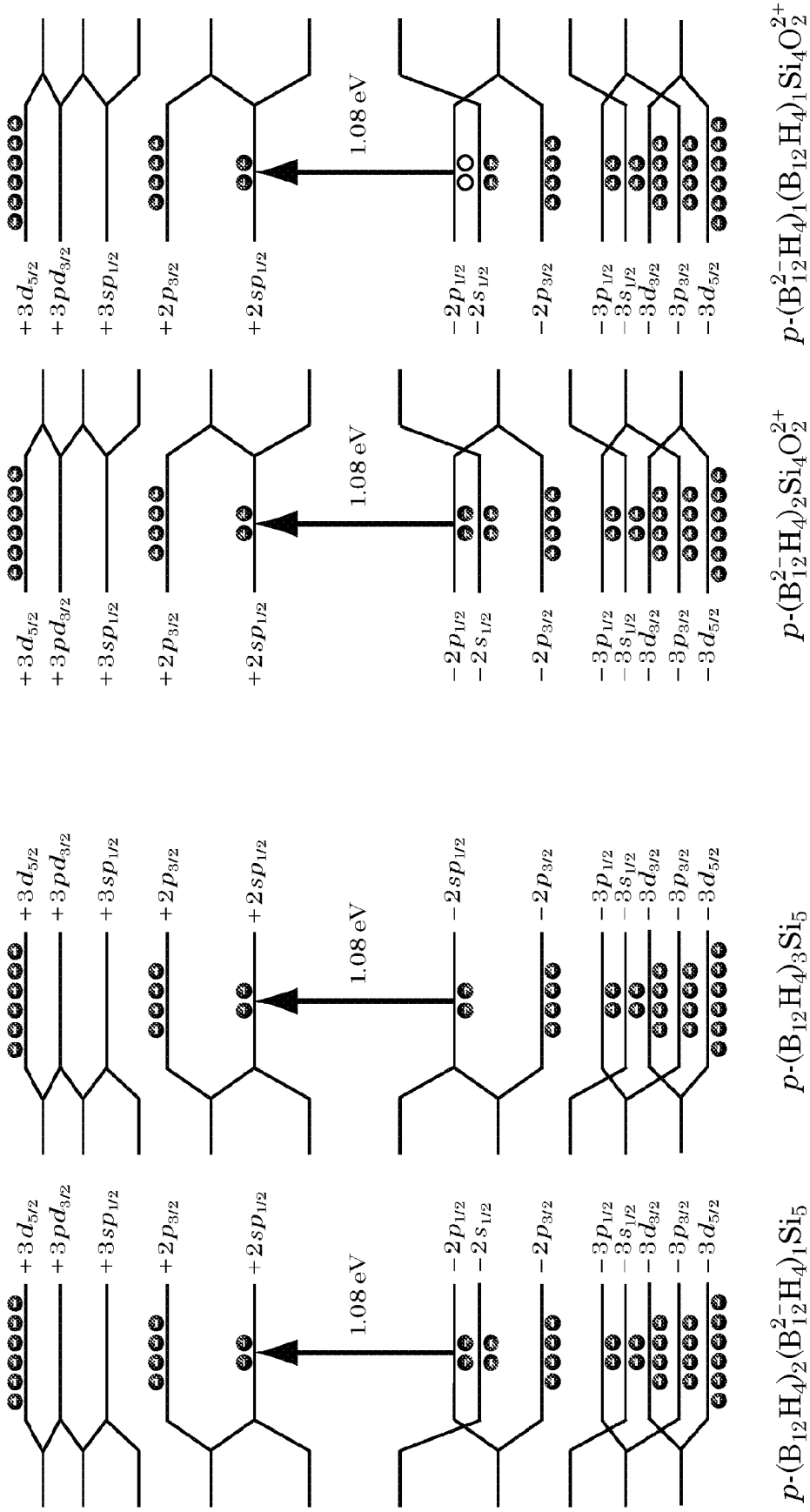

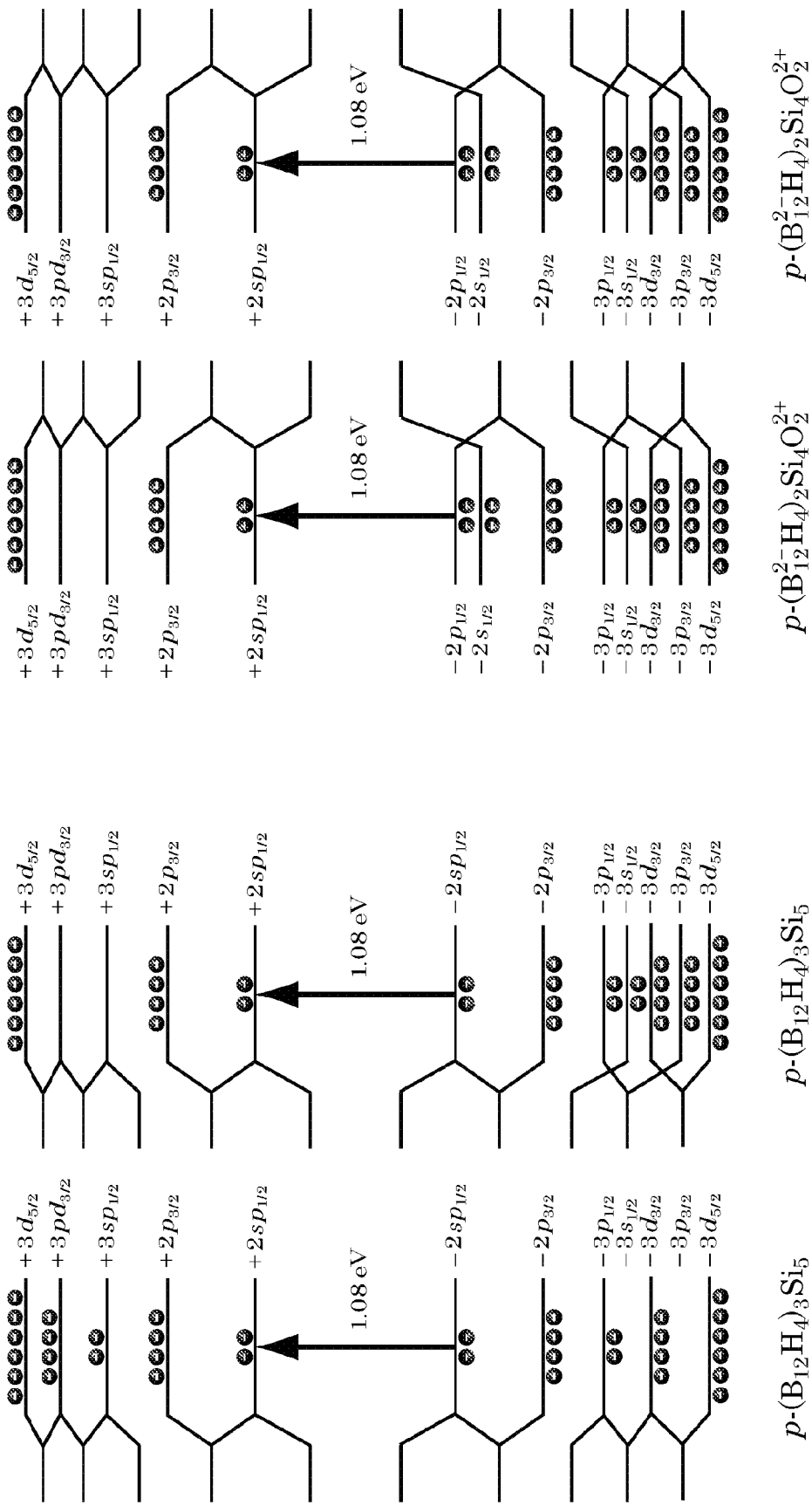

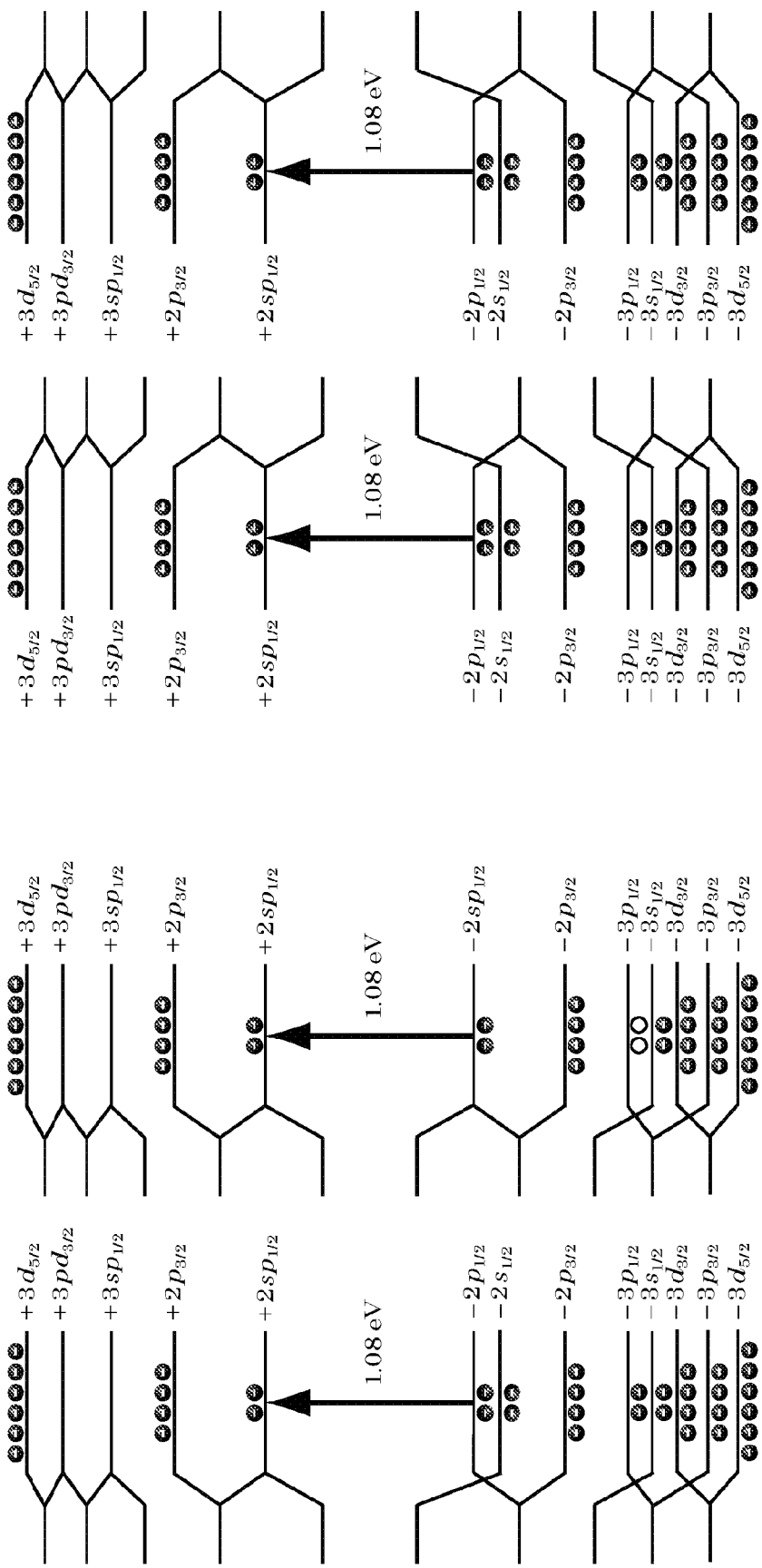

Phonovoltaic Cell

Photovoltaic Cell

Phonovoltaic Cell

Photovoltaic Cell

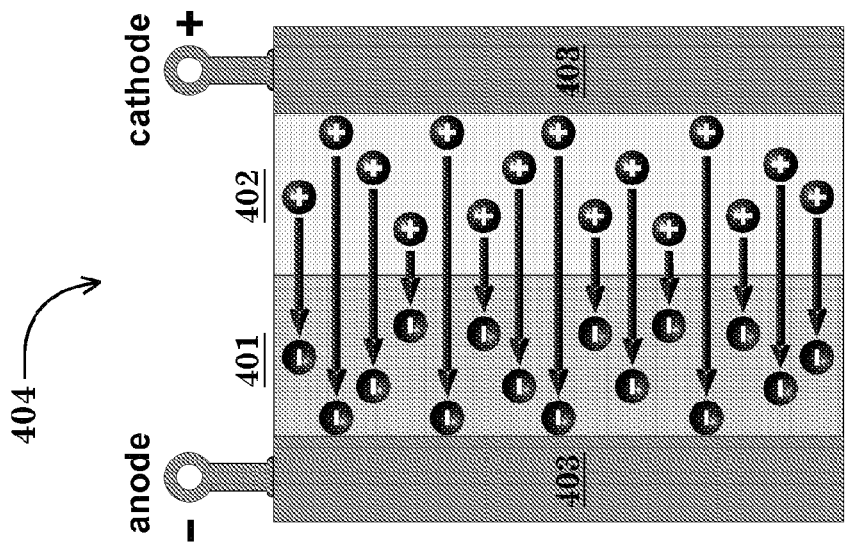
FIG. 96B Phonovoltaic Cell
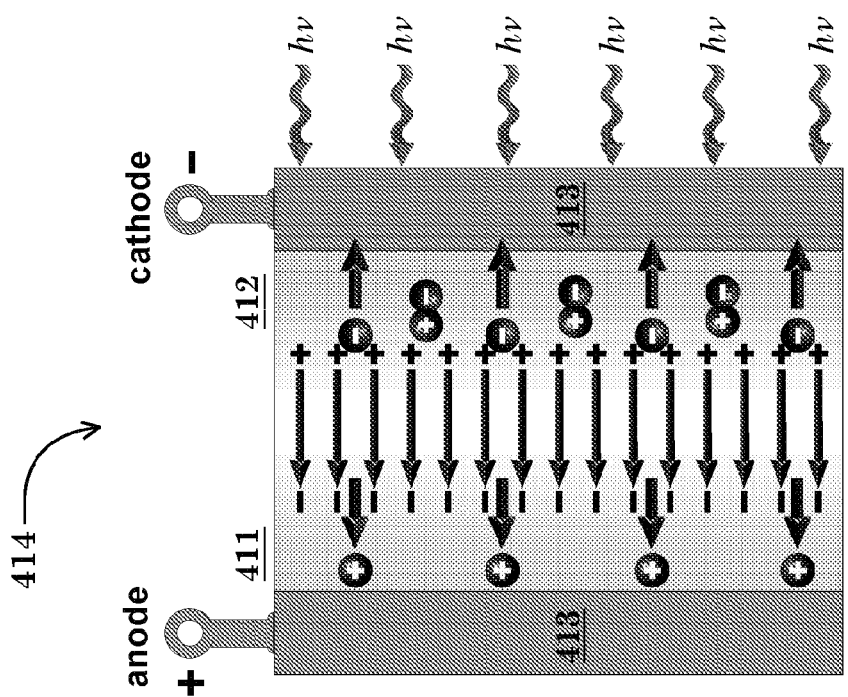
FIG. 96A Photovoltaic Cell

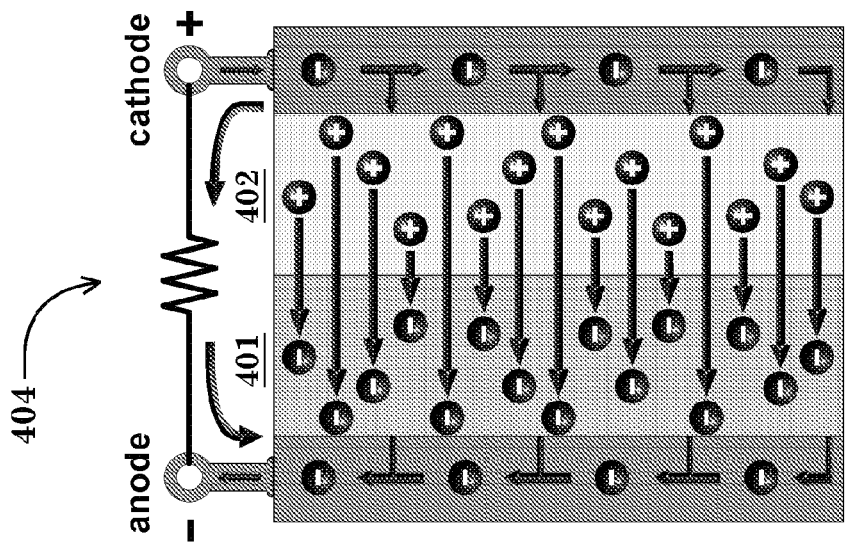
FIG. 97B Phonovoltaic Cell
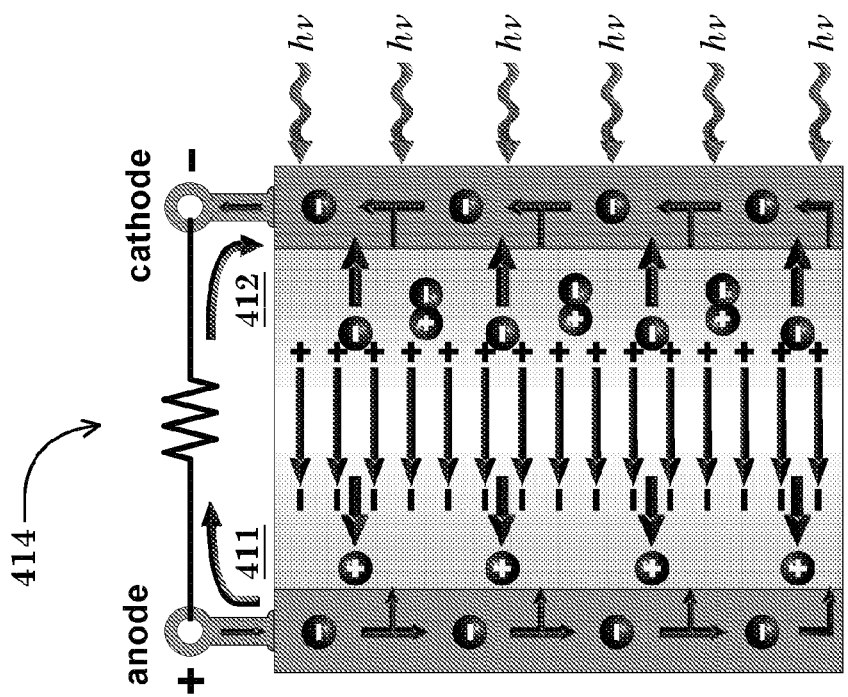
FIG. 97A Photovoltaic Cell

Projected Manufacturing Cost Analysis of Phonovoltaic Cell

| | p-Isotype rectifier 404 | Phonovoltaic Cell 400 36 rectifiers/die |
|---|---|---|
| wafer diameter | 300 mm | 300 mm |
| die size | 1 cm$^2$ | 1 cm$^2$ |
| die per wafer | 636 | 636 |
| effective processing cost | $350 | $350 |
| process/test yield | 90% | 90% |
| die cost | $0.55 | $0.55 |
| | | |
| open-circuit voltage | 26 mV | 0.94 V |
| specific resistance | 100 µΩ-cm$^2$ | 100 µΩ-cm$^2$ |
| short-circuit current density | 260 A/cm$^2$ | 260 A/cm$^2$ |
| maximum power density | 6.76 W/cm$^2$ | 243 W/cm$^2$ |
| minimum power cost | $81/kW | $2.25/kW |

FIG. 98

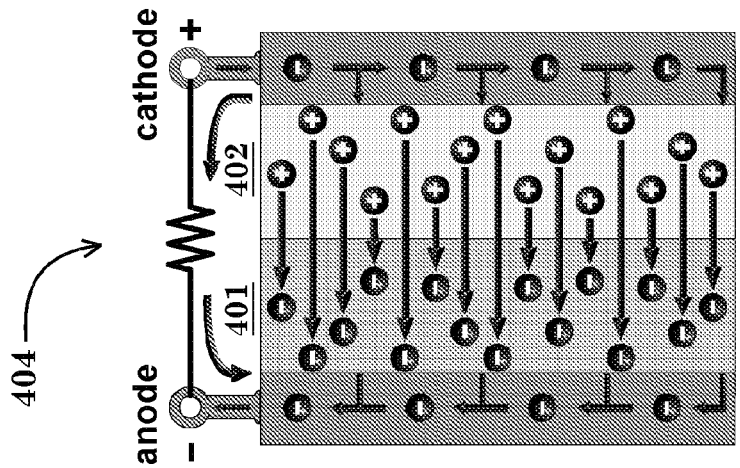
FIG. 99C Phonovoltaic Cell
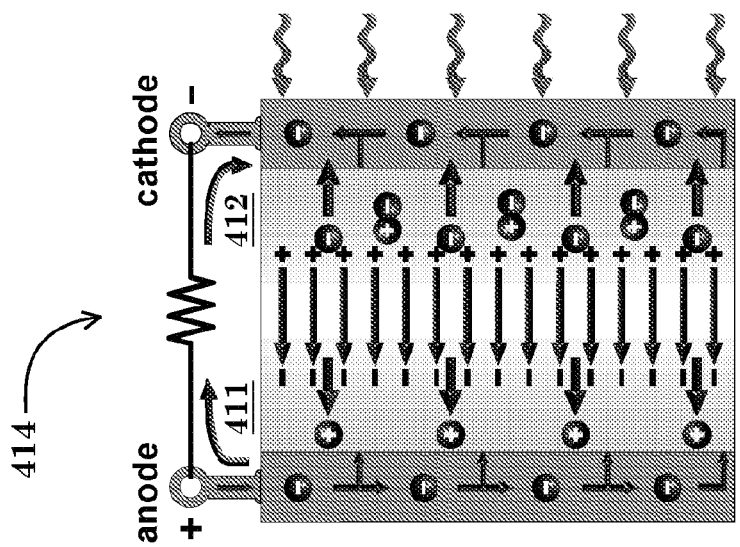
FIG. 99B Photovoltaic Cell
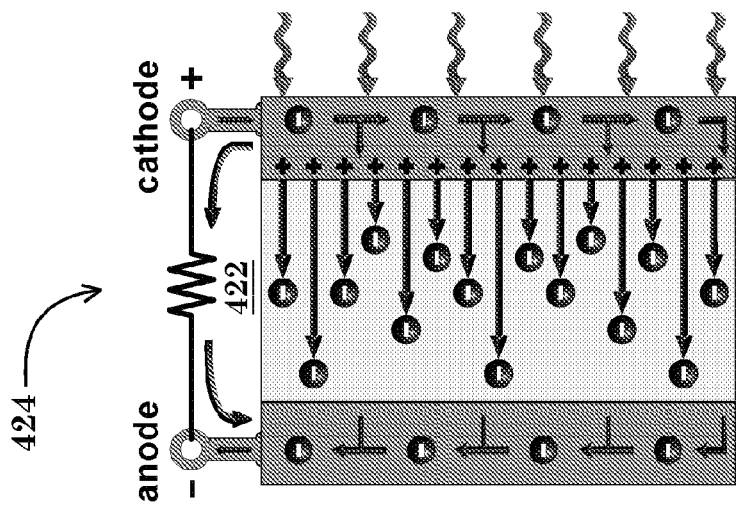
FIG. 99A Thermionic Converter

PROCESS AND MANUFACTURE OF LOW-DIMENSIONAL MATERIALS SUPPORTING BOTH SELF-THERMALIZATION AND SELF-LOCALIZATION

CLAIM OF PRIORITY

This application claims priority to International Patent Application No. PCT/US17/64020, entitled "Process and Manufacture of Low-Dimensional Materials Supporting Both Self-Thermalization and Self-Localization," filed on Nov. 30, 2017; and International Patent Application No. PCT/US16/63933, entitled "Composition and Method for Making Picocrystal-line Artificial Borane Atoms," filed on Nov. 29, 2016; and U.S. Provisional Application No. 62/471,815, entitled "Composition, Manufacture, and Method for Converting Ambient Heat into Electrical Energy," filed on Mar. 15, 2017; and U.S. Provisional Application No. 62/591,848, entitled "Process and Manufacture of Low-Dimensional Materials Supporting Both Self-Thermalization and Self-Localization," filed on Nov. 29, 2017; and the disclosures of which are hereby incorporated by reference. This application is a continuation-in-part of U.S. application Ser. No. 15/959,463, filed on Apr. 23, 2018, which is a divisional of U.S. application Ser. No. 15/363,230 filed on Nov. 29, 2016 and issued as U.S. Pat. No. 9,972,489, which is a continuation-in-part of U.S. application Ser. No. 15/167,672 entitled "Composition and Method for Making Picocrystal-line Artificial Atoms," filed on May 27, 2016 and now abandoned, and claims priority to U.S. Provisional Application No. 62/167,418 entitled "Self-Assembled Supramolecular Oxysilaborane and Method for Making Same" filed on May 28, 2015, the disclosures of which are hereby incorporated by reference.

FIELD OF THE INVENTION

This invention relates to low-dimensional materials and, specifically, to low-dimensional materials which support a quantum self-thermalization and a quantum self-localization, as well as the quantum phase transition between said quantum phases, by means of a controlled variation in the quantum entanglement of carbon-like artificial nuclei in tetravalent artificial atoms that self-assemble.

BACKGROUND OF THE INVENTION

The steam engine was responsible for the Industrial Revolution that commenced in the 18$^{th}$ century. In order to establish the assignable limit of heat in a steam engine, Sadi Carnot conceived a thermodynamic cycle in 1824 that can describe a reversible thermomechanical heat engine operating between two heat reservoirs of different temperatures. Said thermodynamic cycle is known as the Carnot cycle. Any system undergoing the Carnot cycle is referred to as a Carnot heat engine. The laws of thermodynamics evolved from numerous investigations into the Carnot cycle. In the development of his namesake thermodynamic cycle, Carnot employed the caloric theory of heat. The initial formal study of the Carnot cycle, in terms of the mechanical theory of heat, was achieved by Rudolf Clausius in the paper "On the Moving Force of Heat, and the Laws Regarding the Nature of Heat Itself Which are Deducible Therefrom," *Phil. Mag.* Ser. 4, pp. 102-119 (1851).

This paper is hereinafter referred to as Clausius (1851). The Carnot cycle represented by Clausius (1851) is shown in FIG. 1 with a somewhat different symbolic representation. The Carnot cycle in FIG. 1 comprises four infinitesimal variations in the working substance: (1) isothermal expansion A→B; (2) adiabatic expansion B→C; (3) isothermal compression C→D; and (4) adiabatic compression D→A. During isothermal expansion A→B, the working substance is expanded at a constant temperature T by the extraction of latent heat $d\,Q_{A \to B}$ from the high-temperature T heat reservoir. During adiabatic expansion B→C, the working substance is adiabatically cooled from T to T−dT without an external heat exchange.

During isothermal compression C→D, the working substance is compressed at a constant temperature T−dT by the discharge of latent heat $-d\,Q_{C \to D}$ into the low-temperature T−dT heat reservoir. During the adiabatic compression D→A, the working substance is adiabatically heated from T−dT to T without any external heat exchange. A Carnot heat engine operating in accordance with the Carnot cycle in FIG. 1 constitutes a thermomechanical motor in which the difference between a larger latent heat $d\,Q_{A \to B}$ extracted from the high-temperature T heat reservoir and a lesser latent heat $-d\,Q_{C \to D}$ thereafter discharged into a low-temperature T−dT heat reservoir is converted into mechanical work. In a cyclic thermodynamic process, the change in entropy ΔS is generally given by:

$$\Delta S = \oint \frac{dQ}{T} \geq 0 \tag{1}$$

The Carnot cycle is reversible, such that the Carnot heat engine can operate either as a motor or a refrigerator. Under such a condition, the equality holds in Eq. (1) such that entropy is therefore conserved in the Carnot cycle. The Carnot cycle in FIG. 1 can also be represented in the manner portrayed in FIG. 2, wherein the intensive thermodynamic variable along the ordinate is temperature T and the extensive thermodynamic variable along the abscissa is entropy S. The conservation of entropy in the Carnot cycle is deceptive in that the capability to perform work upon demand requires a spontaneity due to an irreversible process. In the case of a Carnot heat engine operating as a motor, the required spontaneity is associated with the generation of the high-temperature heat reservoir. During the Industrial Revolution, combustion was taken as a given in the Carnot cycle.

Combustion is a chemical reaction in thermomechanical equilibrium with its surroundings which progresses in the direction of a decrease in Gibbs free energy ΔG<0 which, in turn, progresses in the direction of a decrease in enthalpy ΔH<0 and/or an increase in entropy ΔS>0 per the following reaction.

$$\Delta G = \Delta H - T\Delta S < 0 \tag{2}$$

For chemical reactions ideally in thermomechanical equilibrium with the surroundings, the second law of thermodynamics can be expressed by:

$$\frac{-\Delta G}{T} = \frac{-\Delta H}{T} + \Delta S > 0 \tag{3}$$

The second law of thermodynamics manifests an increase in entropy in any energy transformation progressing upon its own accord. The spontaneity of most fuels is due to a decrease in enthalpy, such that Eq. (3) is more specifically:

$$\frac{-\Delta G}{T} > 0 \quad \frac{-\Delta H}{T} > \Delta S \qquad (4)$$

The total entropy of both the working substance and its surroundings −ΔG/T increases due to a decrease in the Gibbs free energy ΔG<0 as a result of the formation of molecular bonding orbitals with a greater bound energy. This manifests an enthalpy discharge ΔH<0 into the surroundings of the working substance, such that the spontaneity of the net energy transformation of combustion pertains to an entropy increase in the surroundings −ΔH/T>0 and not an entropy increase in the working substance ΔS>0. The fuel-based economy of the world increases the entropy of the biosphere, depletes the natural fuels, and discharges harmful waste products into the biosphere due to the dependence on high-enthalpy fuels.

In order to eliminate the dependence upon high-enthalpy fuels, it is necessary to replace the Carnot cycle with a novel thermodynamic cycle in which spontaneity is due to an intrinsic entropy equilibration. This capability was anticipated, in principle, by Josiah Willard Gibbs in the landmark paper "A Method of Geometrical Representation of the Thermodynamic Properties of Substances by Means of Surfaces," *Transactions of the Connecticut Academy*, II. pp. 382-404, December 1873. All references hereinafter to Gibbs (1873) are taken to pertain to this paper. In FIG. 3, some arbitrary nonequilibrium state A can be equilibrated along the surface of dissipated energy MN in one of two ways. One equilibration was cogently described by Gibbs (1873): "The problem, therefore, may be reduced to this,— to find the amount by which the energy of the body may be diminished without increasing its volume or diminishing its entropy. This quantity will be represented geometrically by the distance of the point A representing the initial state from the surface of dissipated energy measured parallel to the axis of [E]."

This process can be complemented by another type of equilibration introduced by Gibbs (1873), which was lost in the prior art over the years. Gibbs (1873) stated: "Let us consider a different problem. A certain initial state of the body is given as before. No work is allowed to be done upon or by external bodies. Heat is allowed to pass to and from them only on condition that the algebraic sum of all heat which thus passes shall be 0. From these conditions any bodies may be excepted, which shall be left at the close of these processes in their initial state. Moreover, it is not allowed to increase the volume of the body."

With this in hand, Gibbs (1873) proposed: "It is required to find the greatest amount by which it is possible under these conditions to diminish the entropy of an external system. This will be, evidently, the amount by which the entropy of the body can be increased without changing the energy of the body or increasing its volume, which is represented geometrically by the distance of the point representing the initial state from the surface of dissipated energy measured parallel to the axis of [S]. This might be called [Gibbs free entropy]."

The above entropy equilibration can never be achieved by means of the Carnot cycle. Any thermodynamic cycle that supports an intrinsic increase in entropy must involve heat radiation. The study of heat radiation originated in the paper by Gustav Kirchhoff entitled "On the Relation Between the Emissive and the Absorptive Powers of Bodies for Heat and Light," in *The Laws of Radiation and Absorption*, Translated and Edited by D. B. Brace, 1901, American Book Company, pp. 73-97. This paper is hereinafter referred to as Kirchhoff (1860).

Kirchhoff (1860) stated his law of radiation as: *"The ratio between the emissive and absorptive power is the same for all bodies at the same temperature."* Kirchhoff's radiation law can be expressed in terms of a spectral radiance K(v,T).

$$\frac{E}{A} = K(v, T) dv d\Omega \cos\theta dA \qquad (5)$$

Since Kirchhoff's universal function K(v,T) is more elementary than matter itself, German physicists intensely investigated blackbody radiation in an extended effort, over many decades, to understand the physical basis of matter.

As is very well known in the prior art, investigations into blackbody radiation eventually led to the discovery of quantum mechanics. This being said, the physical basis of Kirchhoff's universal function K(v,T) is yet unknown, such that the quantum thermodynamics of heat radiation remain incomplete. It is for this reason that the Carnot cycle has never yet been replaced by a more preferred quantum thermodynamic cycle capable of eliminating the dependence upon fuels. It is purposeful to examine the prior art of quantum thermodynamics by cogently reviewing Planck's derivation of his namesake blackbody radiation law disclosed in the 1901 paper "On the Law of Distribution of Energy in the Normal Spectrum," *Annalen der Physik*, Vol. 4, 1901, p. 553. Planck (1901) assumed that there exist N "identical resonators" that each possesses a vibrational energy U, such that:

$$U_N = NU \qquad (6)$$

As will be later established, there are actually very different types of resonators which comprise a hybridized Planckian resonator. Per Planck (1901), the total entropy $S_N$ corresponds to the average entropy S of a single resonator.

$$S_N = NS \qquad (7)$$

It warrants emphasizing that S is taken to be the average entropy of an individual Planckian resonator. Planck (1901) thereby invoked a probabilistic interpretation of a Planckian resonator in his paper: "We now set the entropy $S_N$ of the system proportional to the logarithm of its probability W, within an arbitrary additive constant, so that the N resonators together have the energy $E_N$."

$$S_N = k \log W + \text{constant} \qquad (8)$$

Per Planck (1901): "It is now a matter of finding the probability W so that the N resonators together preserve the vibrational energy $U_N$. Moreover, it is necessary to interpret $U_N$ not as a continuous, infinitely divisible quantity, but as a discrete quantity composed of an integral number of finite parts. Let us call each such part the energy element ε; consequently, we must set:"

$$U_N = P\varepsilon \qquad (9)$$

Planck (1901) derived the entropy S of each Planckian resonator as:

$$S = k \left\{ \left[ 1 + \frac{U}{\varepsilon} \right] \log\left[ 1 + \frac{U}{\varepsilon} \right] - \frac{U}{\varepsilon} \log \frac{U}{\varepsilon} \right\} \qquad (10)$$

Applying Wien's spectral displacement law to the average resonator entropy S establishes that the discrete energy $\varepsilon$ of the P discrete energy elements corresponds to resonator frequency $v$ by means of Planck's constant h.

$$\varepsilon = hv \tag{11}$$

Substituting Eq. (11) into Eq. (10) results in an expression describing the entropy S of an individual Planckian resonator on a statistical basis.

$$S = k\left\{\left[1 + \frac{U}{hv}\right]\log\left[1 + \frac{U}{hv}\right] - \frac{U}{hv}\log\frac{U}{hv}\right\} \tag{12}$$

Planck (1901) related the average resonator vibrational energy U and the average resonator entropy S by means of the following temperature relation.

$$\frac{1}{T} = \tag{13}$$

$$\frac{\partial S}{\partial U} = k\frac{\partial}{\partial U}\left\{\left[1 + \frac{U}{hv}\right]\log\left[1 + \frac{U}{hv}\right] - \frac{U}{hv}\log\frac{U}{hv}\right\} = \frac{k}{hv}\log\left[1 + \frac{hv}{U}\right]$$

The average vibrational energy U of a Planckian resonator is thus:

$$U = \frac{hv}{e^{hv/kT} - 1} \tag{14}$$

Planck (1901) established that the radiative energy density $u(v,T)dv$ within each spectral frequency interval $v$ to $v+dv$ satisfies the following relation.

$$u(v, T) = \frac{8\pi v^2}{c^3} U \tag{15}$$

Substituting Eq. (14) into Eq. (15) yields Planck's blackbody radiation law in terms of the radiation energy density $u(v,T)dv$, which will be discussed.

$$u(v, T)dv = \frac{8\pi v^2}{c^3} \frac{hv}{e^{hv/kT} - 1} dv \tag{16}$$

Although Planck statistically obtained the resonator entropy S and resonator energy U, only Planck's spectral energy density $u(v,T)$ can be experimentally measured. The blackbody radiation introduced by Kirchhoff (1860) was experimentally evaluated by the cavity radiation inside a hollow cavity formed by some insulating enclosure with walls in thermal equilibrium. The heat radiation within said cavity is allowed to achieve radiative equilibrium such that the rates of radiation emitted and absorbed by the cavity walls are the same over all of the frequencies. The cavity radiation is experimentally sampled by a small hole. At any radiator temperature T, there prevails a unique irradiance and an associated spectral irradiance spanning the frequency spectrum $v$ over a wide range.

By measuring the spectral irradiance of the cavity radiation, over a wide temperature range, Planck's blackbody radiation law in Eq. (16) has been experimentally validated.

However, the experimentation involving blackbody cavity radiation cannot provide any physical insight into the constitution of a Planckian resonator. Planck's statistical derivation also fails to provide physical insight.

Blackbody radiation constitutes a special form of heat radiation that satisfies Eq. (16), such that the emissivity thereby relates to Kirchhoff's universal function $K(v,T)$—so as to result in a unique radiation spectrum at a given radiator temperature. The infrared portion of the blackbody spectrum obeys the Rayleigh-Jeans blackbody radiation law derived from Planck's blackbody radiation law, per Eq. (17), for $hv<<kT$. Rayleigh-Jeans' blackbody radiation law governs a wavelike electromagnetic radiation subject to a conventional form of Maxwell's equations.

$$u(v, T)dv = \frac{8\pi v^2}{c^3} kTdv \quad hv << kT \tag{17}$$

The Rayleigh-Jeans blackbody radiation law results in an ultraviolet catastrophe whereby the radiation energy density $u(v,T)dv$ can become infinite at the high-frequency portion of the blackbody radiation spectrum. This catastrophe is averted by the dominance of Wien's blackbody radiation law in the ultraviolet portion of the blackbody spectrum. Wien's blackbody radiation law can be derived from Planck's blackbody radiation law in Eq. (16) as follows for $hv>>kT$.

$$u(v, T)dv = \frac{8\pi v^2}{c^3} hv e^{-hv/kT} dv \quad hv >> kT \tag{18}$$

In the paper leading to his Nobel physics prize, Einstein proved that radiation obeying Wien's blackbody radiation law constitutes particle-like electromagnetic waves that cannot be derived from Maxwell's equations. The inability to reconcile Wien's blackbody radiation and Maxwell's electromagnetic radiation has resulted in an irreconcilable wave-particle duality of light, which, in turn, caused a crisis in radiation that renders quantum theory indeterministic.

In order to remedy such a deficiency, it is first purposeful to consider Einstein's development of the heat capacity of a solid in the 1907 paper entitled "Planck's Theory of Radiation and the Theory of Specific Heat." Einstein assumed that the average energy U of each vibrating atom is that of a Planckian resonator obeying Eq. (14). As a result, the molar energy is given by the following relation:

$$E_{molar} = \frac{3N_A hv}{e^{hv/kT} - 1} \tag{19}$$

It can be readily confirmed that the above molar energy reduces into 3RT for $hv<<kT$. Einstein's molar heat capacity derives from this relation.

$$C_{molar} = \frac{\partial E_{molar}}{\partial T} = \frac{3N_A h^2 v^2}{kT^2} \frac{e^{hv/kT}}{[e^{hv/kT} - 1]^2} \tag{20}$$

The inability of the prior art to establish the physical constitution of a Planckian resonator impedes physical insight into condensed matter. The singular property that distinguishes quantum mechanics from classical mechanics is a quantum entanglement in which finite many-body groups of particles cannot be described independently. Quantum entanglement further distinguishes quantum thermodynamics from classical thermodynamics. What is needed in the art is a solid formed by artificial atoms, with artificial nuclei, that constitute Planckian resonators in which quantum entanglement can be chemically controlled. What is further needed in the art is a quantum thermodynamic cycle capable of replacing the Carnot cycle by means of a controlled variation in the entanglement entropy due to an atomic engineering. The climate change due to the combustion of fuels can only be arrested by a replacement of heat engines subject to the Carnot cycle.

SUMMARY OF THE INVENTION

Various articles and devices can be manufactured to take advantage of a what is believed to be a novel thermodynamic cycle in which spontaneity is due to an intrinsic entropy equilibration. The novel thermodynamic cycle exploits the quantum phase transition between quantum thermalization and quantum localization.

In a first aspect, a phonovoltaic cell can be produced that generates a flow of electric charge in response to an impressed electrical load. The phonovoltaic cell comprises a pair of conductors, preferably metallic electrodes with a solid semiconductive material between them that has two contiguous zones with different Seebeck coefficients. The flow of electric charge is believed to cause a decrease in the entropy of the ambient due to an uncompensated increase in the entropy of the phonovoltaic cell in response to the impressed electrical load. Preferably, the phonovoltaic cell under thermal equilibrium extracts latent heat from the ambient and converts it directly into an electromotive force without using any outside agency, any moving parts, any depletable working substance, or any impinging radiation. The electromotive force is generated by a complementary Seebeck effect due to an uncompensated increase in the quantum transition entropy, at a constant temperature, of a phase transition between a quantum localization and a quantum thermalization of artificial nuclei that behave as mobile Planckian resonators. The first zone preferably comprises the chemical elements boron and hydrogen and the second zone preferably comprises the chemical elements boron, hydrogen and oxygen.

In a preferred embodiment of the phonovoltaic cell, the first zone is a boron layer comprising icosahedral boron and hydrogen and has a higher relative atomic concentration of boron than any other atom and the second zone is a boron layer comprising icosahedral boron, oxygen and hydrogen and has a higher relative atomic concentration of boron than any other atom. Preferably both the first and second zones also contain silicon. It is further preferred that each zone has a thickness of 4 nm or less. In a particularly preferred embodiment, the first zone is a silaborane, preferably having a formula of $(B_{12}H_w)_xSi_y$, wherein $3 \leq w \leq 5$, $2 \leq x \leq 4$, and $3 \leq y \leq 5$ and the second zone is an oxysilaborane having a formula of $(B_{12}H_w)_xSi_yO_z$, wherein $3 \leq w \leq 5$, $2 \leq x \leq 4$, $3 \leq y \leq 5$ and $0 < z \leq 3$. Multiple p-isotype rectifiers are preferably in situ stacked in order to form a phonovoltaic pile comprising the phonovoltaic pile with the second conductor of a first phonovoltaic cell forming the first conductor for the next contiguous phonovoltaic cell.

In a second aspect, a p-isotype rectifier is produced such that the electrical conductivity is asymmetrical with respect to the polarity of an impressed electromotive force between the anode and cathode contact electrodes. The rectifier is produced from a solid semiconductor material having two contiguous zones, with each such zone contacted by a separate conductor. The two contiguous zones have different mobile-charge concentrations, such that the electrical conductivity is asymmetrical with respect to the polarity of an impressed electromotive force between the contact electrodes of said contiguous zones. An asymmetrical electrical conductance is considered to be a considerably greater current flow when one electrode is negatively biased relative to the other as compared to when the electrode is positively biased relative to the other.

In a preferred embodiment of the p-isotype rectifier, the first (anode) zone is a boron layer comprising icosahedral boron and hydrogen and has a higher relative atomic concentration of boron than any other atom and the second (cathode) zone is a boron layer comprising icosahedral boron, oxygen and hydrogen and has a higher relative atomic concentration of boron than any other atom. Preferably both the first and second zones also contain silicon. It is also preferred that each zone has a thickness of 4 nm or less. In a particularly preferred embodiment, the first zone is a silaborane, preferably having a formula of $(B_{12}H_w)_xSi_y$, wherein $3 \leq w \leq 5$, $2 \leq x \leq 4$, and $3 \leq y \leq 5$ and the second zone is an oxysilaborane having a formula of $(B_{12}H_w)_xSi_yO_z$, wherein $3 \leq w \leq 5$, $2 \leq x \leq 4$, $3 \leq y \leq 5$ and $0 < z \leq 3$.

In a third aspect, a conductor used in an integrated circuit can be formed where the effective resistance of the conductor is lower than that of a copper conductor having the same dimensions. The conductor is believed to displace electrical energy, in the absence of an electric field, without the actual displacement of electric charge. This is accomplished by using a solid semiconductor material whose electrical properties are modified by use of a trace amount of a metal, and in particular a coinage metal, to modify the electrical conductivity properties of the conductor. It is currently believed that this results in a microwave zitterbewegung Aharonov-Bohm effect that intrinsically generates a periodic driving force within the solid semiconductor material that is capable of displacing an electromagnetic power density through space without the aid of an outside agency. As a result of this intrinsic driving force, it is currently believed that preferred embodiments of the conductor can ideally act as a room temperature superconductor as long as the effective current density does not exceed a certain maximum. This maximum current density is currently believed to be comparable to that of graphene.

In a preferred embodiment, the conductor can connect two circuit elements, e.g. resistors, capacitors, diodes, power supplies, inductors, transformers, wires, or conductors, in an integrated circuit. In a particularly preferred embodiment the conductor can be used in the back end of line (BEOL) interconnects, including at sizes that are below 50 nm. The conductor comprises icosahedral boron, hydrogen and, optionally oxygen and has a higher relative atomic concentration of boron than any other atom. In addition, the conductor incorporates a trace amount of a coinage metal, such as gold, copper, and silver. A trace amount is an amount that is enough to alter the electrical conductivity of the conductor, which is believed to occur by partially or completely offsetting the nuclear electric quadrupole moment of the natural boron atoms, but not enough to affect the basic stoichiometric ratios of the conductor. Preferably, the coinage metal is gold and it is preferably incorporated into the conductor at an atomic concentration of about $10^{18}$ cm$^{-3}$. Preferably the conductor also contains silicon. In a particularly preferred embodiment, the conductor is a silaborane, preferably having a formula of $(B_{12}H_w)_xSi_y$, wherein $3 \leq w \leq 5$, $2 \leq x \leq 4$, and $3 \leq y \leq 5$ or, to a lesser degree of preference, an oxysilaborane having a formula of $(B_{12}H_w)_x Si_y O_z$, wherein $3 \leq w \leq 5$, $2 \leq x \leq 4$, $3 \leq y \leq 5$ and $0 < z \leq 3$.

BRIEF DESCRIPTION OF THE DRAWING

Preferred embodiments of the present invention are illustrated in the accompanying drawings in which:

FIGS. 18A-B depict energy diagrams believed to reflect the occupied energy levels by valence electrons in negatively-ionized and positively-ionized picocrystalline artificial borane atoms $B_{12}^{2-}H_4$ and $B_{12}^{2+}H_4$ 101, due to disproportionation in picocrystalline silaborane p-$(B_{12}H_4)_3Si$;

FIGS. 24A-D depict energy diagrams illustrating the proposed occupied electronic energy levels of the artificial nuclei of the first- and second-nearest neighbor picocrystalline artificial borane atoms 101 of a pair of conjoined picocrystalline silaborane p-$(B_{12}H_4)_3Si_5$ and picocrystalline oxysilaborane p-$(B_{12}^{2-}H_4)_2Si_4O_2^{2+}$ regions 401 and 402;

FIGS. 26A-D further depict a proposed mobile charge diffusion;

FIGS. 27A-D still further depict a proposed mobile charge diffusion;

FIGS. 30A-D depict a proposed disproportionation in a picocrystalline silaborane p-$(B_{12}H_4)_3Si_5$ region;

FIGS. 96A-B is an illustration comparing a phonovoltaic cell and a photovoltaic cell in which induced mobile electron-hole pairs are separated;

FIGS. 97A-B is an illustration comparing a phonovoltaic cell and a photovoltaic cell in which an electrical load is impressed;

FIG. 98 is projected manufacturing cost analysis of a phonovoltaic cell;

FIGS. 99A-C is an illustration comparing a phonovoltaic cell, a photovoltaic cell, and a thermionic converter;

DESCRIPTION OF THE PREFERRED EMBODIMENTS

Figure 1:
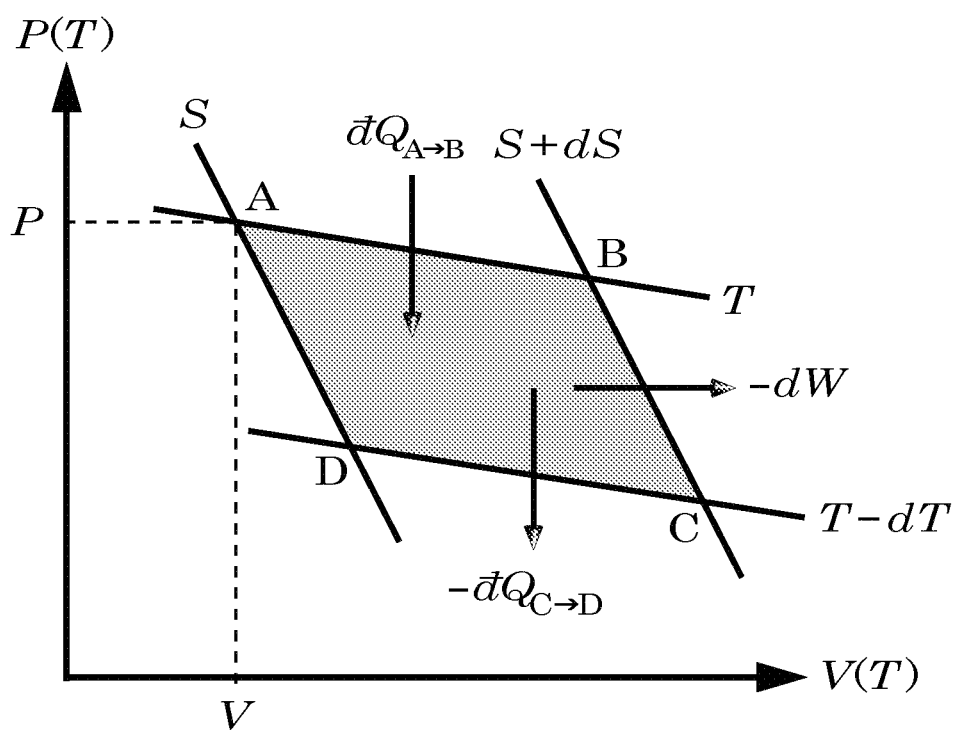
FIG. 1 is an illustration of the Carnot cycle.

Referring now to the drawings, various forms and embodiments of the invention will be described. The invention is not to be limited by any principles or embodiments described herein, but only by the scope of the appended claims.

Figure 4:
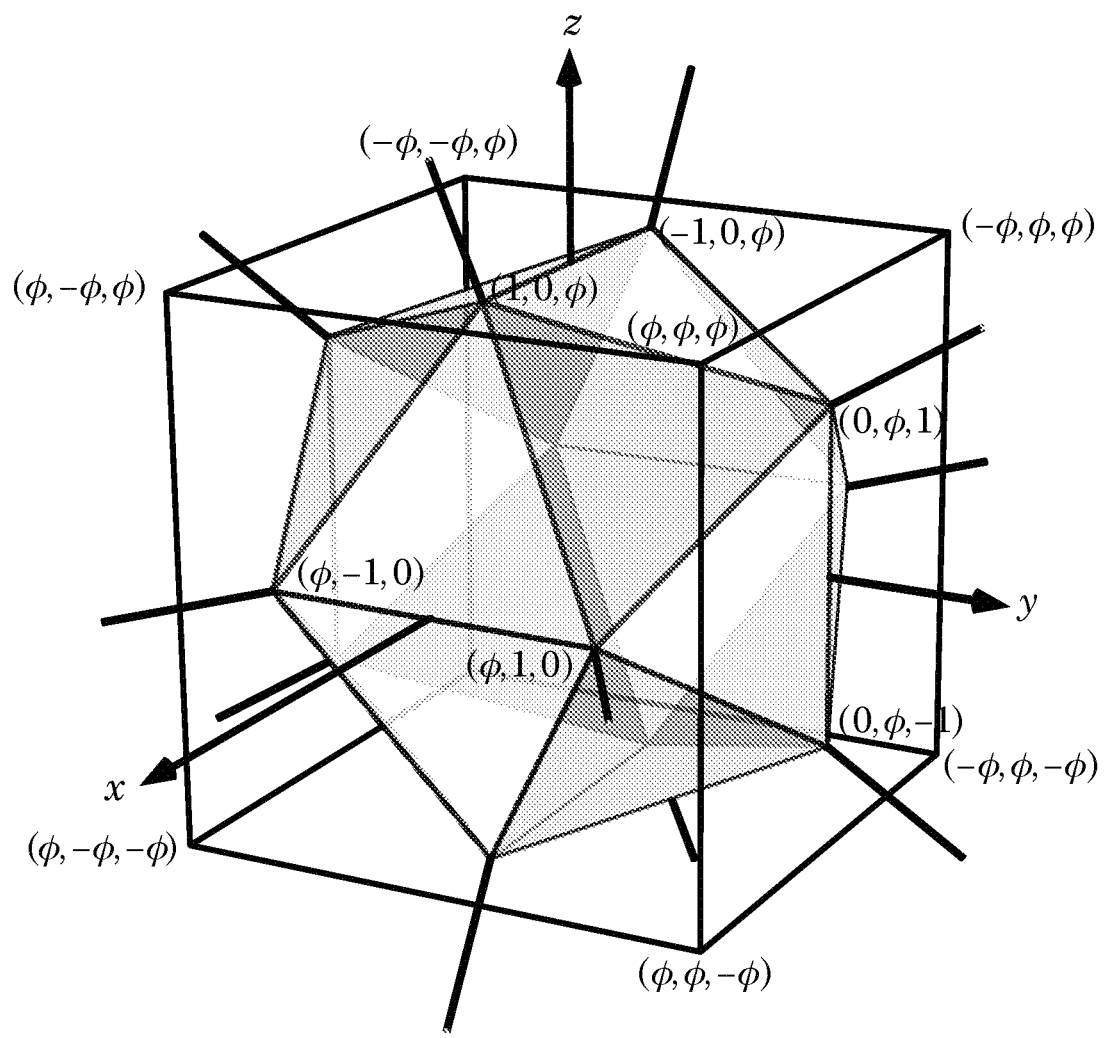
FIG. 4 depicts a regular icosahedron inscribed in a cube in the manner employed by Longuet-Higgins and Roberts.

In order to comprehend the quantum entanglement of the artificial nuclei of this invention, a regular icosahedron is inscribed in a cube in FIG. 4 such that the coordinates of the icosahedral vertices are described, subject to Eq. (21), in terms of the following position coordinates: $(\pm\phi, \pm 1, 0)$, $(0, \pm\phi, \pm 1)$, and $(\pm 1, 0, \pm\phi)$.

$$\phi - 1 = \phi^{-1} = 2 \sin 72° \approx 0.618 \quad (21)$$

Per the normal crystallographic convention, any orientation along, or parallel to, any cubic edge is generally represented by $\langle 100 \rangle$. Any particular $\langle 100 \rangle$ orientation, e.g. the [010] orientation along the positive y-axis, will be specifically denoted. A cubic face, or a plane parallel to a cubic face, is generally represented by $\{100\}$. A particular $\{100\}$ plane, e.g. the xz-plane normal to the [010] direction, is represented by (010). A particular $\langle 100 \rangle$ orientation, e.g. the [010] orientation, is always normal to the corresponding $\{100\}$ plane, viz. the (010) plane in this case. By further convention, any orientation along, or parallel to, a cubic body diagonal is represented by $\langle 111 \rangle$. There are two classes of icosahedral faces: 8 icosahedral faces are constituted by $\{111\}$ planes normal to a $\langle 111 \rangle$ cubic body diagonal and 12 icosahedral faces are constituted by $\{\phi\phi^{-1}0\}$ planes intersecting in pairs along a $\langle 100 \rangle$ orientation. Three-center bonds exist along edges of the $\{111\}$ planes.

In connection with the invention described here, a molecular orbital analysis, which describes the three-center boron bonds by a generalization of the methodology of Longuet-Higgins and Roberts performed in [0020]-[0063] of U.S. Provisional Application No. 62/591,848, is incorporated herein by reference. That generalized molecular orbital analysis describes a regular boron icosahedron 104 comprising 12 boron nuclei 102, with a nearly-symmetrical nuclear configuration, that is constituted by 24 delocalized atomic orbitals $\psi_i(p_{\{111\}})$ in a nearly-spherical spheroid wherein displacement is ideally limited to the 8 $k_{\langle 111 \rangle}$ wave vectors. The boron icosahedron 104 in FIG. 5 is referred to herein as an artificial nucleus 104.

As used herein, short-range periodic translational order is defined as a regular repetition of atomic positions over a space substantially confined to only first- and second-nearest neighbor atoms. The artificial nucleus 104 represented in FIG. 5 exhibits a short-range periodic translational order in which the 12 boron nuclei 102 ideally remain stationary at the 12 icosahedral vertices, such that all icosahedral displacement is ideally limited to only periodic vibrations along the 8 $k_{\langle 111 \rangle}$ wave vectors. As the result, the artificial nucleus 104 in FIG. 5 constitutes a quantum Floquet-many-body subsystem that behaves similar to the nucleus of a natural carbon atom. As used herein, a quantum Floquet-many-body system is a time-dependent many-body system that is periodic over time by virtue of its own dynamics. In order to understand preferred embodiments of this invention, it is purposeful to establish the quantum entanglement of the atomic orbitals $\psi_i(p_{\{111\}})$ forming the quantum Floquet-many-body subsystem of the artificial nucleus 104.

Figure 5:
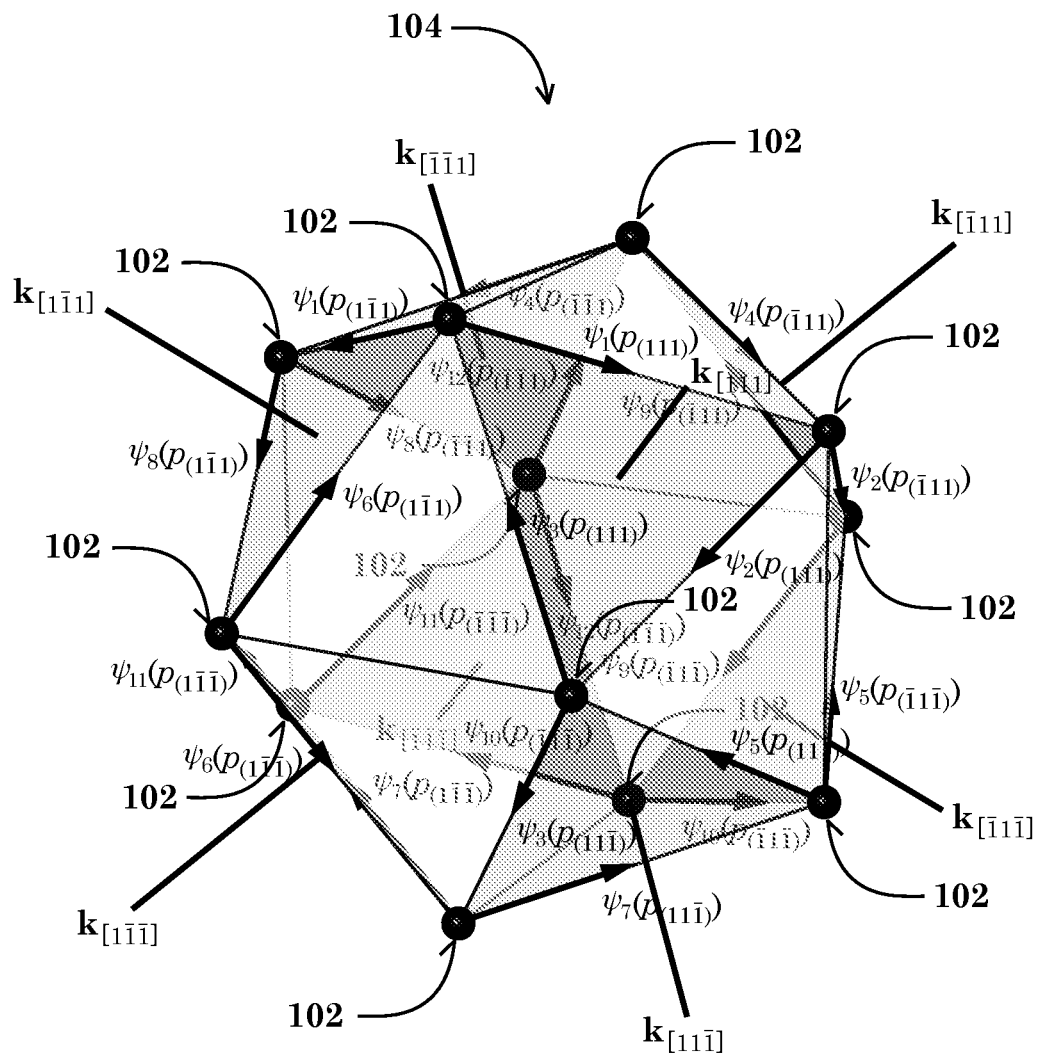
FIG. 5 depicts the proposed nearly-symmetrical nuclear configuration of a boron icosahedron wherein the three-center bonds are described in terms of 24 delocalized tangential atomic orbitals $\psi_i(p_{\{111\}})$.

The analysis of the artificial nucleus 104 in FIG. 5 was performed in terms of the group analysis of a regular icosahedron. The icosahedral symmetry group $I_h$ is unique amongst all the other symmetry groups in that it possesses the largest number of symmetry operations (120) of any symmetry group in Nature. The largest number of symmetry operations allowed in any crystallographic point group is 48, such that the icosahedral symmetry group $I_h$ is not a crystallographic point group that can support spatial crystals which exhibit a long-range periodic translational order. The inability of the icosahedral symmetry group $I_h$ to support a long-range periodic translational order allows it to, more generally, support an intrinsic spontaneous time-translational symmetry breaking to be described.

Figure 6:
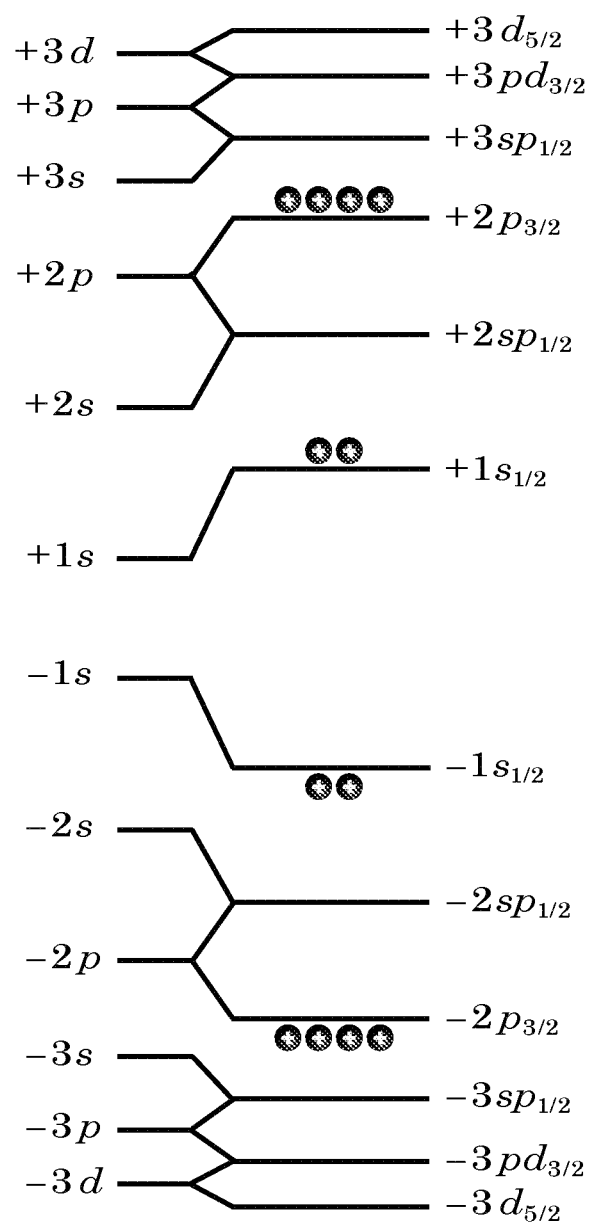
FIG. 6 depicts an energy diagram showing the proposed energy levels of the clustered nuclei of the regular boron icosahedron shown in FIG. 5.
Figure 7:
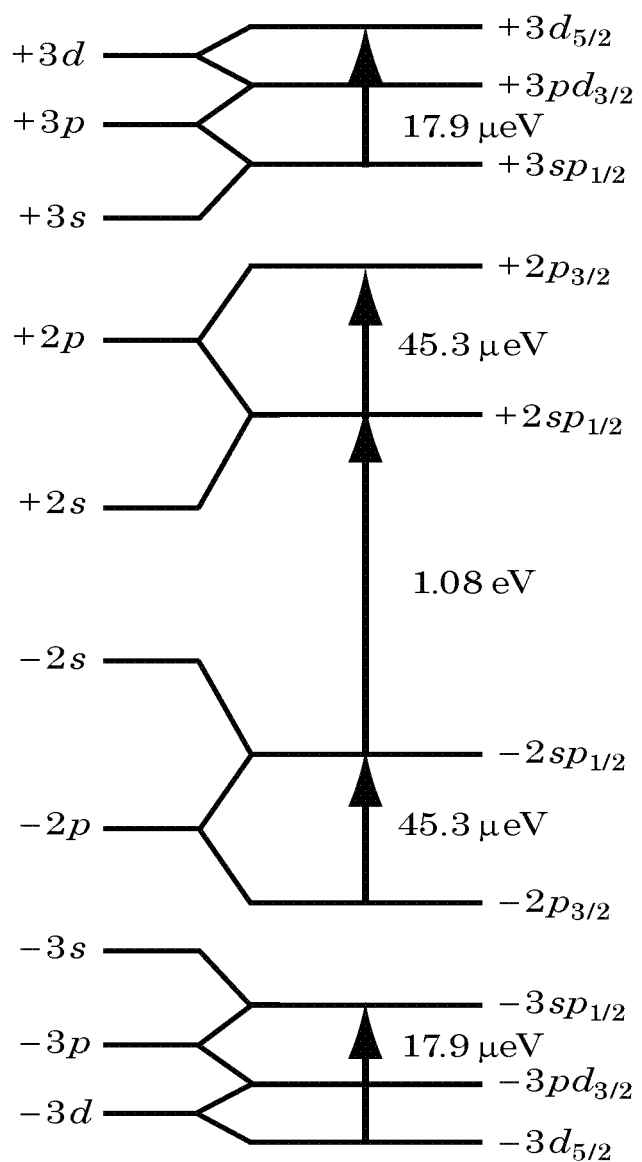
FIG. 7 depicts an energy diagram showing the proposed energy levels of the clustered valence electrons of the regular boron icosahedron shown in FIG. 5.

It is for this reason that the foregoing symmetry analysis gave rise to rectilinear vibrations along the $k_{\langle 111 \rangle}$ wave vectors of the artificial nucleus 104 in FIG. 5. The believed energy levels of the 12 boron nuclei 102 forming the artificial nucleus 104 are shown in FIG. 6. The energy levels of the 36 valence electrons of the artificial nucleus 104 are shown in FIG. 7. The nuclear energy levels in FIG. 6 and the electronic energy levels in FIG. 7 satisfy the energy eigenvalues of Dirac's relativistic wave equation. It is believed that the artificial nucleus 104 shown in FIG. 5 constitutes a quantum Floquet-many-body system analogous to that of the natural nucleus of carbon $_6^{12}C$. It is for this reason the 12 boron nuclei 102 of the artificial nucleus 104 occupy energy levels in FIG. 6 which possess the same symmetry as the energy levels of nucleons in carbon $_6^{12}C$. The valence electron energy levels in FIG. 7 are believed to be similar to the quark energy levels of carbon $_6^{12}C$.

The artificial nucleus 104 in FIG. 5 constitutes a manifestation of the quantum Floquet-many-body fermion system with the highest possible degree of symmetry in Nature. As used herein, a fermion is a subatomic particle, subject to the Pauli exclusion principle, which is characterized by Fermi-Dirac statistics, as well as, any composite particle comprised of an odd number of said subatomic particles. By definition, a quantum Floquet-many-body system comprising fermions at the vertices of a regular icosahedron will be hereinafter referred to as an icosahedral Floquet-many-fermion system. In compliance with this definition, the 12 boron nuclei 102 of the artificial nucleus 104 are initially assumed to be boron $_5^{10}B$ nuclei comprising an odd number of both protons and neutrons. An incorporation of the other natural boron isotope $_5^{11}B$ will be later considered hereinbelow.

The icosahedral Floquet-many-fermion system of the particular artificial nucleus 104 in FIG. 5 possesses the highest degree of degree of symmetry in Nature relative to the icosahedral vertices at which the 12 boron nuclei 102 reside. This symmetry is exhibited by the 12 nucleons of carbon $_6^{12}C$. There exist only two types of point displacement, viz. translation along a rectilinear axis and rotation about a rectilinear axis. Translation and rotation exhibit contrary displacements of points, such as the twelve icosahedral vertices of an icosahedral Floquet-many-fermion system. All points along a rectilinear axis of translation, and only these points, are displaced under a given translation; conversely, all points not along a rectilinear axis of rotation, and only these points, are displaced under any given rotation. Rotation complicates the analysis of a quantum many-body system.

As further described in [0020]-100631 of U.S. Provisional Application No. 62/591,848 and incorporated herein by reference, the 3 corotating Cartesian axes (x,y,z) of an icosahedron are best represented in terms of Miller indices. Due to the corotating Cartesian axes (x,y,z), it is not possible to describe the displacement of the 12 icosahedral vertices in the laboratory frame field. By a symmetry analysis, it was established that the icosahedral vertices of the artificial nucleus 104 in FIG. 5 are motionless and that all icosahedral displacement is confined to rectilinear translation along four pairs of inverted $k_{\langle 111 \rangle}$ wave vectors.

$$k_{[1\overline{1}1]} \leftrightarrow k_{[\overline{1}1\overline{1}]} \quad (22a)$$

$$k_{[11\overline{1}]} \leftrightarrow k_{[\overline{1}\overline{1}1]} \quad (22b)$$

$$k_{[\overline{1}11]} \leftrightarrow k_{[1\overline{1}\overline{1}]} \quad (22c)$$

$$k_{[\overline{1}\overline{1}\overline{1}]} \leftrightarrow k_{[111]} \quad (22d)$$

Said analysis concluded that the 12 boron nuclei 102 are confined to the motionless icosahedral vertices of the artificial nucleus 104, which, therefore, behaves as a nearly-spherical spheroid that is predisposed to be displaced along well-defined spherical harmonics. As further described in [0170]-[0207] of U.S. Provisional Application No. 62/591,848 and incorporated herein by reference, any nearly-spherical spheroid is separated into zones by the spherical harmonics. The dipole spherical harmonics associated with the $n=\pm 1$ shells in FIG. 6 separate a nearly-spherical spheroid into a pair of hemispheres by an equatorial great circle. The center-of-mass (or centroid) associated with the dipole spherical harmonics is not motionless. The quadrupole spherical harmonics associated with the $n=\pm 2$ shells in FIG. 6 separate a nearly-spherical spheroid into a pair of great circles.

The great circles associated with the quadrupole spherical harmonics contain the $k_{\langle 111 \rangle}$ wave vectors of the artificial nucleus 104 in FIG. 5. This is consistent with the displacement of an icosahedral Floquet-many-fermion system in Eqs. (22a-d). The symmetry analysis of the artificial nucleus 104 in FIG. 5 is of a general nature, without any commitment as to the physical size of the icosahedral Floquet-many-fermion system. The distance between opposite icosahedral faces of the artificial nucleus 104 is ideally 269 pm, such that it is specifically referred to as an icosahedral Floquet-many-fermion picocrystal. The distance between the opposite icosahedral faces of the natural nucleus of carbon $_6^{12}C$ can be measured in terms of femtometers, such that the natural nucleus of carbon $_6^{12}C$ constitutes an icosahedral Floquet-many-fermion femtocrystal. It is believed that the artificial nucleus 104 exhibits the same symmetry as the natural nucleus of carbon $_6^{12}C$.

An icosahedral Floquet-many-fermion picocrystal (femtocrystal) lifts the intraicosahedral electronic (quark) orbital degeneracies by way of a spin-orbit coupling, so as to escape Jahn-Teller distortion. In the landmark paper "Stability of Polyatomic Molecules in Degenerate Electronic States. I. Orbital Degeneracy," *Proceedings of the Royal Society A*, 161, 1937, pp. 220-235, H. A. Jahn and E. Teller developed by means of group theory that: All nonlinear nuclear configurations are unsuitable for an orbitally-degenerate electronic state. The Jahn-Teller effect results in a symmetry-breaking that lifts electronic orbital degeneracies by normal displacements of the 12 boron nuclei 102, known as Jahn-Teller-active modes, that distort polyatomic ions and molecules in the absence of spin-orbit coupling.

In their analysis, Jahn and Teller intentionally ignored spin effects. Spin-orbit coupling is essential to preserving the intraicosahedral bonding of the icosahedral Floquet-many-fermion picocrystal of the artificial nucleus 104, subject to the intraicosahedral bonding and antibonding orbitals portrayed in FIG. 7. Said another way, the quantum entanglement of the electronic eigenstates shown in FIG. 7 cannot exist in the presence of any Jahn-Teller distortion. By lifting the electronic orbital degeneracies by means of spin-orbit coupling—instead of Jahn-Teller distortion—quantum entanglement causes the icosahedral Floquet-many-fermion picocrystal comprising the artificial nucleus 104 to physically behave as a Planckian resonator that can be chemically modified in novel and useful ways by controlled variations in the quantum entanglement of the energy levels.

In order to practice preferred embodiments of the present invention, it is purposeful to cogently consider certain elements of the icosahedral Floquet-many-fermion picocrystal comprising the artificial nucleus 104 shown in FIG. 5. Preferred embodiments of the invention constitute novel and useful embodiments of a quantum thermodynamics capable of supporting a quantum thermodynamic cycle that self-thermalizes, so as to eliminate the dependence of a heat engine on fuels. The novel and useful embodiments of this invention cannot be described by means of classical thermodynamics due to the role of quantum entanglement. In order to describe preferred embodiments of this invention, it is necessary to draw on predictions of Dirac's wave equation. The first-principles are disclosed in U.S. Provisional Application No. 62/591,848 and are incorporated herein by reference.

Considerable effort has been devoted, by reference, to the symmetry operations of the icosahedral Floquet-many-fermion picocrystal of the artificial nucleus 104. This is due to the belief that the symmetry of the artificial nucleus 104 endows it novel and useful properties that are unique to this specific type of quantum many-body system. The derivation of Einstein's $E=mc^2$, by the special theory of relativity, governs the loss of inertia of a uniformly-translating body. By virtue of this derivation, Einstein established that energy E and mass m are, in actuality, two "phases" of the same quantity. Einstein formed this conclusion by a consideration of the relativistic translational Doppler shift of a radiative body. In extending his special theory of relativity to include rotation in his general theory of relativity, Einstein was unable to derive a relativistic rotational Doppler shift.

Since a rotating fermion necessarily emits radiation, then a rotating fermion can only stabilize as a member of a quantum many-body system in which pairs of complementary rotational Doppler shifts stabilize said quantum many-body system. The icosahedral Floquet-many-fermion picocrystal of the artificial nucleus 104 constitutes a stabilized quantum many-body system of fermions that can be described by Dirac's relativistic wave equation. Dirac's energy eigenvalues for a Dirac many-body system of fermions obtained within [0086]-[0167] of U.S. Provisional Application No. 62/591,848 are incorporated herein by reference.

$$E = \begin{cases} +mc^2 - \dfrac{\alpha^2 mc^2}{2n^2} - \dfrac{\alpha^4 mc^2}{2\kappa n^3} < mc^2 & \begin{cases} n = +1, +2, +3, \ldots \\ \kappa = \mp 1, \mp 2, \ldots, -n \end{cases} & (23a) \\ -mc^2 + \dfrac{\alpha^2 mc^2}{2n^2} + \dfrac{\alpha^4 mc^2}{2\kappa n^3} > -mc^2 & \begin{cases} \kappa = \pm 1, \pm 2, \ldots, +n \\ n = -1, -2, -3, \ldots \end{cases} & (23b) \end{cases}$$

The positive-energy eigenstates of the antibonding suborbitals in Eq. (23a) and the negative-energy eigenstates of the bonding suborbitals in Eq. (23b) of the artificial nucleus 104 shown in FIG. 5 are tabulated below.

TABLE 1

Antibonding suborbitals of the artificial nucleus 104

| orbital | | spin-orbital | | | radial harmonics | | | $\hbar\omega_n^\kappa$ | $\nu_n^\kappa$ |
|---|---|---|---|---|---|---|---|---|---|
| n | l | | $\sigma \cdot L$ | $j_{|\kappa|}$ | | $\kappa$ | multipole | μeV | GHz |
| +1 | 0 | +1s | 1 + ½ | ½ | +1s$_{1/2}$ | −(l + 1) | −1 | +1s$_{1/2}$ dipole | 0 | 0 |
| +2 | 1 | +2p | 1 + ½ | 3/2 | +2p$_{3/2}$ | −(l + 1) | −2 | +2p$_{3/2}$ quadrupole | 45.3 | 10.9 |
| | | | 1 − ½ | ½ | +2p$_{1/2}$ | 1 | +1 | +2sp$_{1/2}$ inner lobes | 0 | 0 |
| +2 | 0 | +2s | 1 + ½ | ½ | +2s$_{1/2}$ | −(l + 1) | −1 | | | |
| +3 | 2 | +3d | 1 + ½ | 5/2 | +3d$_{5/2}$ | −(l + 1) | −3 | +3d$_{5/2}$ octupole | 17.9 | 4.31 |
| | | | 1 − ½ | 3/2 | +3d$_{3/2}$ | 1 | +2 | +3pd$_{3/2}$ inner lobes | 13.4 | 3.22 |
| +3 | 1 | +3p | 1 + ½ | 3/2 | +3p$_{3/2}$ | −(l + 1) | −2 | | | |
| | | | 1 − ½ | ½ | +3p$_{1/2}$ | 1 | +1 | +3sp$_{1/2}$ inner lobes | 0 | 0 |
| +3 | 0 | 3s | 1 + ½ | ½ | +3s$_{1/2}$ | −(l + 1) | −1 | | | |

TABLE 2

Bonding suborbitals of the artificial nucleus 104

| orbital | | spin-orbital | | | radial harmonics | | | $\hbar\omega_n^\kappa$ | $\nu_n^\kappa$ |
|---|---|---|---|---|---|---|---|---|---|
| n | l | | $\sigma \cdot L$ | $j_{|\kappa|}$ | | $\kappa$ | multipole | μeV | GHz |
| −1 | 0 | −1s | 1 − ½ | ½ | −1s$_{1/2}$ | 1 | +1 | −1s$_{1/2}$ dipole | 0 | 0 |
| −2 | 1 | −2p | 1 − ½ | 3/2 | −2p$_{3/2}$ | 1 | +2 | −2p$_{3/2}$ quadrupole | 45.3 | 10.9 |
| | | | 1 + ½ | ½ | −2p$_{1/2}$ | −(l + 1) | −1 | −2sp$_{1/2}$ inner lobes | 0 | 0 |
| −2 | 0 | −2s | 1 − ½ | ½ | −2s$_{1/2}$ | 1 | +1 | | | |
| −3 | 2 | −3d | 1 − ½ | 5/2 | −3d$_{5/2}$ | 1 | +3 | −3d$_{5/2}$ octupole | 17.9 | 4.31 |
| | | | 1 + ½ | 3/2 | −3d$_{3/2}$ | −(l + 1) | −2 | −3pd$_{3/2}$ inner lobes | 13.4 | 3.22 |
| −3 | 1 | −3p | 1 − ½ | 3/2 | −3p$_{3/2}$ | 1 | +2 | | | |
| | | | 1 + ½ | ½ | −3p$_{1/2}$ | −(l + 1) | −1 | −3sp$_{1/2}$ inner lobes | 0 | 0 |
| −3 | 0 | −3s | 1 − ½ | ½ | −3s$_{1/2}$ | 1 | +1 | | | |

Spin-orbit coupling lifts the orbitally-degenerate energy orbitals into the half-integer-quantized antibonding suborbitals with a positive-definite energy per Table 1. Spin-orbit coupling lifts orbitally-degenerate energy orbitals into half-integer-quantized bonding suborbitals of a negative-definite energy per Table 2. The antibonding and bonding suborbitals for both the n=±2 and n=±3 shells of the artificial nucleus 104, subject to Eqs. (23a-b), are shown in FIG. 7. The n=±1 shells are not shown since they contain inner electrons not involved in the fusion of the artificial nucleus 104. There are several significant aspects of the bonding and the antibonding suborbitals of the artificial nucleus 104 in FIG. 7. Spin-orbit coupling lifts orbital degeneracies, as exemplified below for the n=+2 shell.

$$+2p(\ell = 1) \xrightarrow{\text{red shift}} +2p_{3/2}(j = \ell + 1/2) \Leftrightarrow \kappa = -(\ell + 1) = -2 \quad (24a)$$

$$+2p(\ell = 1) \xrightarrow{\text{blue shift}} +2p_{1/2}(j = \ell - 1/2) \Leftrightarrow \kappa = +\ell = +1 \quad (24b)$$

$$+2p(\ell = 0) \xrightarrow{\text{red shift}} +2p_{1/2}(j = \ell + 1/2) \Leftrightarrow \kappa = -(\ell + 1) = -1 \quad (24c)$$

The +2p orbital is subjected to both a Doppler red-shift ($\kappa=-2$) into a $+2p_{3/2}$ suborbital and Doppler blue-shift ($\kappa=+1$) into a $+2p_{1/2}$ suborbital. The +2s orbital is subjected to a Doppler red-shift ($\kappa=-1$) into a $+2s_{1/2}$ suborbital, which, in turn, is entangled with the $+2p_{1/2}$ suborbital, so as to thereby result in the $+2sp_{1/2}$ suborbital ($\kappa=\pm 1$). These are rotational Doppler shifts that are incomprehensible by E=mc². Einstein derived his E=mc² in a follow-up paper to his seminal paper that initially introduced the special theory of relativity: "On the Electrodynamics of Moving Bodies," 1905, in *The Principle of Relativity*, Dover, 1952, pp. 37-65.

Fusion is generally taken herein to be any process in which fermions are bonded together by the transformation of a quantity of matter in into energy. Einstein's E=mc² is widely assumed to govern a nuclear fusion in which nucleons are bonded together by the transformation of a small quantity of matter m into an energy E manifested in the form of photons. By generalizing Einstein's E=mc² in a rotating frame field, a heretofore-unknown chemical fusion can be established by atoms chemically bonded together by the transformation of a small quantity of matter m into some energy E of a Dirac quasiparticle. For the purposes at hand, a Dirac quasiparticle is a quantum Floquet-many-fermion system due to a dynamic interaction between fermions that entangles the individual energy levels.

The quantum entanglement of the artificial nucleus 104 in FIG. 5 is associated with the entangled eigenfunctions $\psi_i(p_{\{111\}})$ due to chemical fusion. No attempt is made to directly claim a generalization of Einstein's E=mc² to support chemical fusion. Present focus is on the real-world application of chemical fusion. Pursuant to this objective, the relations in Eqs. (23a-b) are rearranged as follows in order to frame the generalization of Einstein's E=mc². These relations specify the energy eigenvalues of a Dirac quasiparticle in Dirac's forbidden energy region mc²>E>−mc², with entangled positive-energy (E>0) and negative-energy (E<0) eigenstates that comprise the antibonding and bonding suborbitals.

$$mc^2 - E = +\frac{a^2 mc^2}{2n^2} + \frac{a^4 mc^2}{2\kappa n^3} > 0 \quad E > 0 \quad (25a)$$

$$-mc^2 - E = -\frac{a^2 mc^2}{2n^2} - \frac{a^4 mc^2}{2\kappa n^3} < 0 \quad E < 0 \quad (25b)$$

Were Einstein's E=mc² to be satisfied in a rotating frame field, then the bound-energy terms on the right side of Eqs. (25a-b) would vanish—since the energy eigenstates in Eq. (25b) are negative-definite (E<0). The first term on the right side of Eq. (25a) comprises energy eigenvalues obeying Schrödinger's wave equation. For the present purposes, it is sufficient that the highest bound-energy eigenstates satisfying Schrödinger's wave equation exist in the n=+1 shell. The successive higher-order shells thus comprise lower bound-energy eigenstates. The orbital angular momentum remains degenerate in the bound-energy eigenstates obeying Schrödinger's equation. This degeneracy is lifted by Dirac's equation.

The second bound-energy term on the right side of Eq. (25a) is due to the fine structure of a spinning fermion. The salient properties of a fermion fine structure are cogently described in order to better understand real-world devices comprising preferred embodiments of this invention. Pursuant to this particular objective, the energy eigenvalues of a Dirac quasiparticle, per Eqs. (25a-b), are rearranged below for the n=±2 and n=±3 shells of a quantum many-body system.

$$mc^2 - E = mc^2 \left[ \frac{a^2}{2n^2} + \frac{a^4}{2\kappa n^3} \right] > 0 \begin{cases} n = +1, +2, +3 \\ \kappa = \mp 1, \mp 2, \ldots, -n \end{cases} \quad (26a)$$

$$mc^2 + E = mc^2 \left[ \frac{a^2}{2n^2} + \frac{a^4}{2\kappa n^3} \right] > 0 \begin{cases} \kappa = \pm 1, \pm 2, \ldots, -n \\ n = -1, -2, -3 \end{cases} \quad (26b)$$

Whereas the quantity of matter of the reactants and products is invariant in classical chemistry, quantum chemistry involves a finite variation in the quantity of matter of the chemical reactants and products due to fusion. The role of quantum chemistry in this invention will be further discussed below.

Since neither energy E nor mass m is actually conserved, then there must exist another conserved physical entity that wholly contains energy E and mass m. Electric charge e is rigorously conserved in Nature. Although not known in the prior art, the strict conservation of electric charge e results in a heretofore-unknown physical entity $\Xi=ec^2$ that wholly contains Einstein's E=mc².

$$\Xi = ec^2 \supset E = mc^2 \quad (27)$$

The new entity $\Xi = ec^2$ is named apeiron, which is a transliteration of the Greek word ἄπειρων meaning "boundless." The concept of apeiron was initially conceived by Anaximander of Miletus circa 585 BC. The ability to exploit electric charge e in a quantum thermodynamic cycle, capable of replacing a Carnot cycle, can only be achieved when electric charge e is provided a mechanical basis. The mechanical basis of electric charge e is fundamentally derived in [0794]-[0846] of U.S. Provisional Application No. 62/591,848 and incorporated herein by reference.

$$e = \frac{h}{2c} = 1.7588363 \times 10^{-43} \text{kg} \cdot \text{m} \quad (28)$$

The MKS equivalent of a coulomb C follows from the above relation.

$$1\, C = 1.09778 \times 10^{-24} \text{ kg} \cdot m \quad (29)$$

The following relationship is believed to govern the resonator of the icosahedral Floquet-many-fermion picocrystal of the artificial nucleus 104 as well as the icosahedral Floquet-many-fermion femtocrystal of the carbon $_6^{12}C$ nucleus. Apeiron $\Xi=ec^2$ and Kirchhoff's universal function K(v,T) can be related.

$$\Xi = ec^2 = mc^2\frac{\overline{\lambda}}{2} = \hbar\omega\frac{\overline{\lambda}}{2} = \frac{hc}{2} \quad (30)$$

Wilhelm Wien actually derived his blackbody radiation law from the perspective of the resonator by way of two very important papers. In 1893, Wien derived his namesake spectral displacement law, which bears directly on certain preferred embodiments of this present invention. A derivation of Wien's spectral displacement law is carried out in a modern formulation in [0931]-[0996] of U.S. Provisional Application No. 62/591,848 and is incorporated herein by reference. Wien derived his spectral displacement law by considering the mechanical work done on electromagnetic radiation, which is manifested in two ways: (1) radiative energy is spectrally displaced from the lower-frequency interval (v,v+dv) into the higher-frequency interval (v',v'+dv') and (2) work further introduces energy in the higher-frequency interval (v',v'+dv'). The total energy $|E \times H|_{in} dAdt$ entering into the higher-frequency interval is expressed by the following relation:

$$|E \times H|_{in} dAdt = \int_0^{2\pi} K(v,T) dv \cos\theta d\Omega dA dt + dF\dot{s}dt \quad (31)$$
$$= \int_0^{2\pi} K(v,T) dv \left[1 + 2\frac{\dot{s}}{c}\cos\theta\right] \cos\theta d\Omega dA dt$$
$$= \int_0^{2\pi} K(v,T) dv' \cos\theta d\Omega dA dt$$

As actually derived in [0931]-[0996] of U.S. Provisional Application No. 62/591,848 and incorporated herein by reference, Wien's spectral displacement law supports the following spectral displacement (i.e., a shift in frequency) at the constant irradiance $|E \times H|$ that is characteristic of blackbody radiation. Spectral displacement is capable of quantum mechanically supporting a heat engine.

$$hv' = hv\left[1 + 2\frac{\dot{s}}{c}\cos\theta\right] \quad |E \times H|_{v'} = |E \times H|_v \quad (32)$$

In Eq. (32), $\dot{s}$ is the phase velocity of electromagnetic radiation. For a positive phase velocity $\dot{s}>0$, work is done upon electromagnetic radiation in order to cause it to undergo a spectral displacement from some lower frequency interval (v,v+dv) into a higher frequency interval (v',v'+dv'). Such a spectral displacement results in the increase in radiative energy at a constant irradiance $|E \times H|$, which is significant in that the irradiance of blackbody radiation uniquely corresponds to the radiator temperature in thermal equilibrium. Such a capability is built into Wien's blackbody radiation law, albeit in a way that is not known in the prior art. A form of Wien's blackbody radiation law was given hereinabove in Eq. (18).

$$u(v,T)dv = \frac{8\pi v^2}{c^3} hv e^{-hv/kT} dv \quad hv \gg kT \quad (18)$$

Wien's blackbody radiation law supports the following relation.

$$hv\frac{\lambda}{2} = hv'\frac{\lambda'}{2} = \frac{\hbar c}{2} = \hbar\omega'\frac{\lambda'}{2} = \hbar\omega\frac{\lambda}{2} = \hbar\omega\frac{\lambda}{4\pi} \quad (33)$$

Over an entire solid angle, Kirchhoff's universal function K(v,T) is:

$$K(v,T) = \frac{c}{4\pi} u(v,T) = 2\frac{v^2}{c^2} \frac{hv}{e^{hv/kT}-1} \quad (34)$$

Near the ultraviolet blackbody radiation extreme hv≫kT, Kirchhoff's universal function K(v,T) is dependent upon electric charge e so as to thus exhibit a dependency upon apeiron $\Xi=ec^2$ in accordance with the following relation that can be applied to the artificial nucleus 104. The boron nuclei 102 of the artificial nucleus 104 are packed sufficiently close together that the boron nuclei 102 are radiatively coupled to form a self-assembled picocrystalline radiation cavity.

$$K(v,T) = 8\pi ec^2 \frac{v^3}{c^3} e^{-hv/kT} = 2\frac{v^2}{c^2} hv e^{-hv/kT} \quad hv \gg kT \quad (35)$$

Kirchhoff's universal function K(v,T) at the infrared spectral extreme hv≪kT is dominated by the continuous thermal resonator energy kT while, very differently, Kirchhoff's universal function K(v,T) near the ultraviolet spectral extreme hv≫kT is dominated by the discrete vibrational energy $hv_n^\kappa$.

$$K(v,T) = 2\frac{v^2}{c^2} kT \quad hv \ll kT \quad (36a)$$

$$K(v_n^\kappa, T) = 2\left[\frac{v_n^\kappa}{c}\right]^2 hv_n^\kappa \exp\left[-\frac{hv_n^\kappa}{kT}\right] \quad hv_n^\kappa \gg kT \quad (36b)$$

It is purposeful to express Planck's resonator entropy S in Eq. (12) in terms of discrete energy elements $hv_n^\kappa$ obeying Dirac's relativistic wave equation.

$$S = k\left\{\left[1 + \frac{U}{hv_n^\kappa}\right]\ln\left[1 + \frac{U}{hv_n^\kappa}\right] - \frac{U}{hv_n^\kappa}\ln\frac{U}{hv_n^\kappa}\right\} \quad (37)$$

It is purposeful to define the quantum temperature $\Theta_T$ in accordance with Planck's relation in Eq. (13), subject to the quantization in Eq. (36b).

$$\frac{1}{\Theta_T} = \frac{\partial S}{\partial U} = \frac{h}{hv_n^\kappa}\ln\left[1 + \frac{hv_n^\kappa}{U}\right] \quad (38)$$

Einstein's molar heat capacity in Eq. (20) can be simplified as follows for a low-frequency Planckian resonator frequency, such that hv≪kT.

$$C_{molar} = 3R\left[1 + \frac{hv}{kT}\right] \quad hv \ll kT \quad (39)$$

The heat capacity associated with a microwave Planckian resonator of an individual atom in a solid governed by Dirac's relativistic wave equation is described by the following relation derived from Einstein's molar heat capacity.

$$C_n^\kappa = 3h\left[1 + \frac{h\nu_n^\kappa}{kT}\right] \quad h\nu_n^\kappa \ll kT \tag{40}$$

Figure 8:
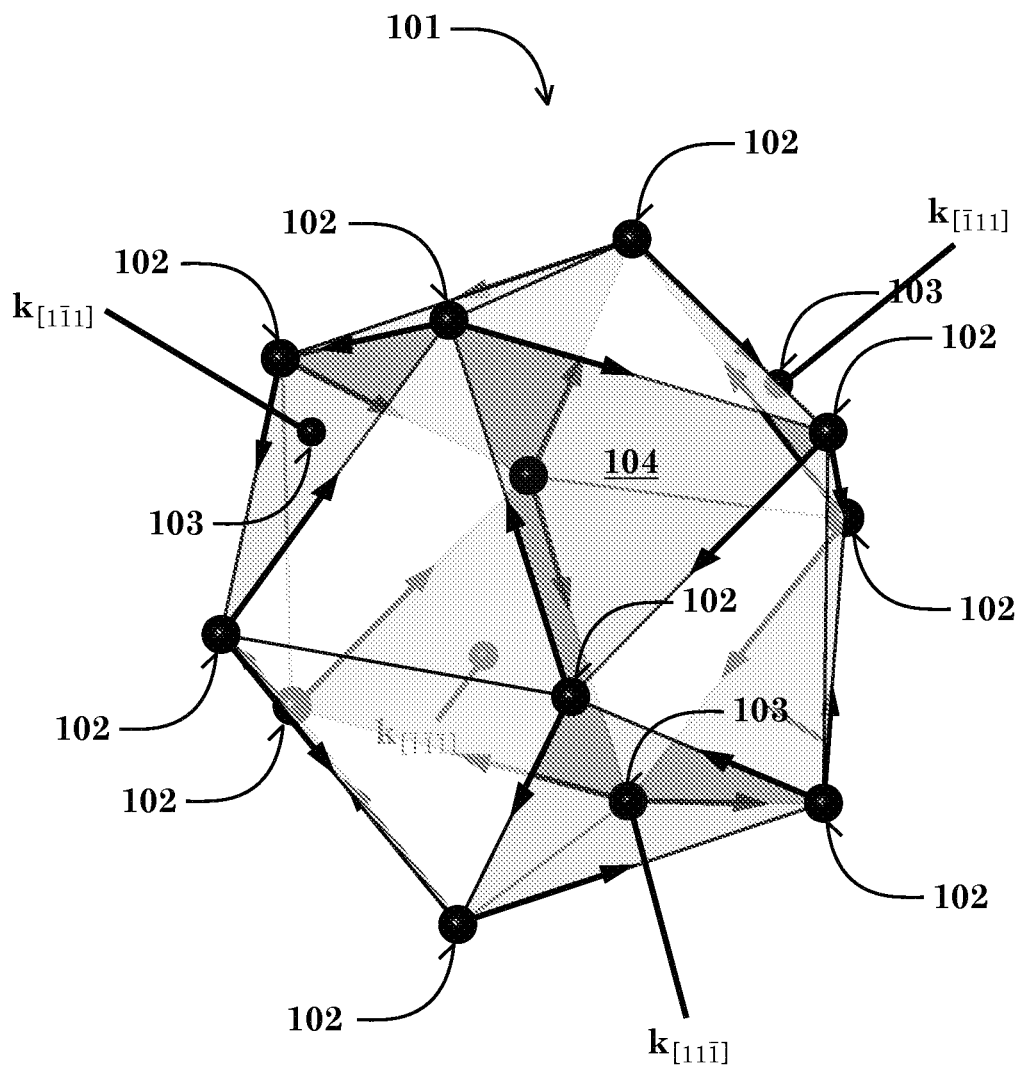
FIG. 8 is an illustration of a regular boron icosahedron with a symmetrical nuclear configuration shown with four hydrogens bonded by a Debye force.

As shown in FIG. 8, a picocrystalline artificial borane atom 101 constitutes: (1) an artificial nucleus 104 formed by a boron icosahedron comprising 12 natural boron nuclei 102 with a nearly-symmetrical nuclear configuration and (2) 4 artificial valence electrons constituted by 4 natural hydrogen atoms with the hydrogen nuclei 103 bonded to a boron icosahedron such that the 4 hydrogen valence electrons are aligned along a $\mathbf{k}_{\langle 111 \rangle}$ wave vector. The picocrystalline artificial borane atom 101 comprises a boron icosahedron with 36 boron valence electrons occupying intraicosahedral molecular orbitals, such that intericosahedral chemical bonds are by the hydrogen valence electrons. An electric quadrupole moment along the $\mathbf{k}_{\langle 111 \rangle}$ vectors causes an electric dipole moment in hydrogen atoms, such that the hydrogen nuclei 103 bond by a Debye force to the artificial nucleus 104.

Figure 9:
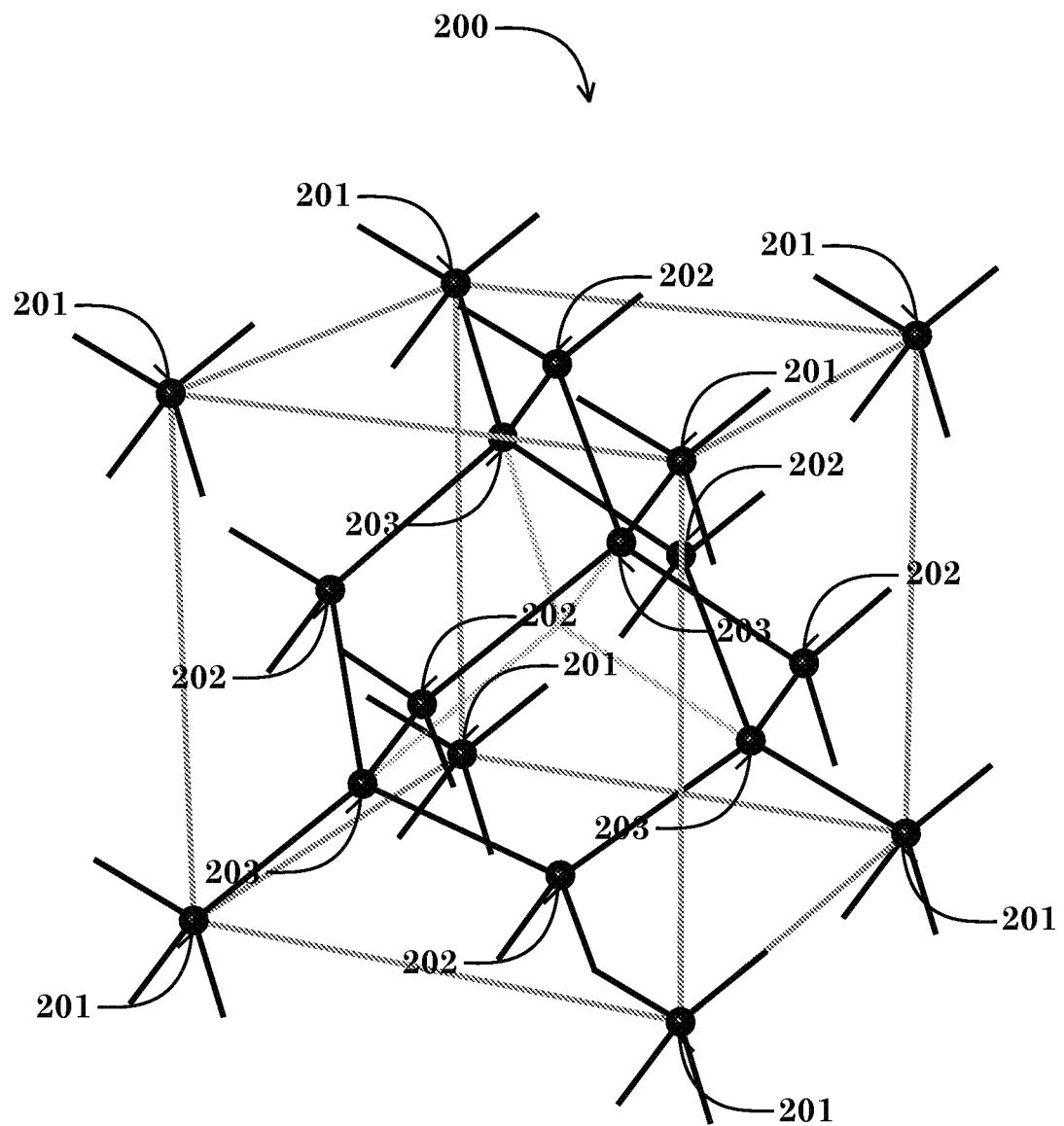
FIG. 9 is an illustration of a monocrystalline silicon unit cell.

A chemical bonding of the picocrystalline artificial borane atoms 101 is explained by a self-selective atomic replacement in the monocrystalline silicon unit cell 200 in FIG. 9, which is comprised of 8 silicon vertex atoms 201, 6 silicon face-center atoms 202, as well as, 4 silicon basis atoms 203. The 4 basis atoms 203 reside along a ⟨111⟩ cubic body diagonal in a tetrahedral arrangement. The monocrystalline silicon unit cell 200 is periodically translated over space so as to form a monocrystalline silicon lattice wherein the silicon vertex atoms 201 and the silicon face-center atoms 202 are covalently bonded to, and only to, the four silicon basis atoms 203 along a ⟨111⟩ crystal orientation. The resultant monocrystalline silicon lattice has a long-range periodic translational order in terms of cubic unit cells of ~0.5431 nm along each edge, without any ⟨100⟩ chemical bonds.

Figure 10:
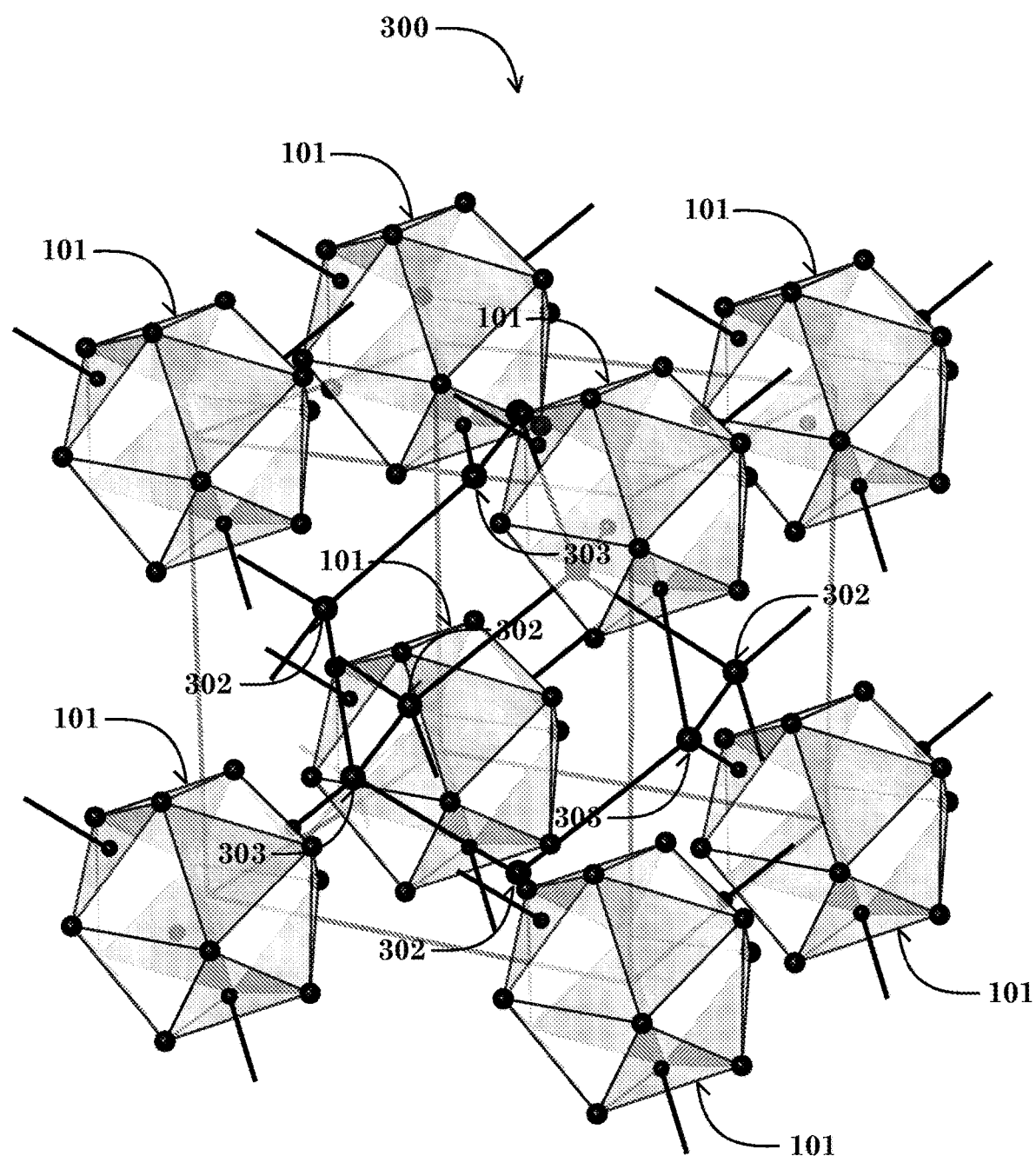
FIG. 10 is an illustration of a diamond-like picocrystalline unit cell.

A diamond-like picocrystalline silaborane unit cell 300 is constructed by replacing each silicon vertex atom 201 within the monocrystalline silicon unit cell 200 with a borane molecule 101, as shown in FIG. 10. The 8 borane molecules 101 at the vertices of the silaborane unit cell 300 in FIG. 10 are shared amongst 8 picocrystalline silaborane unit cells 300 in an extended solid lattice (not shown). The periodic translation of the picocrystalline silaborane unit cell 300 over space would, thereby, result in a picocrystalline silaborane ($B_{12}H_4)Si_7$ solid lattice that effectively acts as a self-assembled diamond-like picocrystalline lattice structurally similar to monocrystalline silicon. Picocrystalline artificial borane atoms 101 in FIG. 8, with a nearly-symmetrical nuclear configuration, replace the 8 silicon vertex atoms 201 in FIG. 10 in the picocrystalline silaborane ($B_{12}H_4)Si_7$ lattice.

The picocrystalline oxysilaboranes of this invention constitute nearly transparent solids that are believed to be formed by a continuous random network of polyatomic unit cells obeying a modification of rules developed by Zachariasen in a paper "The Atomic Arrangement in Glass," *Journal of the American Chemical Society*, Vol. 54, 1932, pp. 3841-3851. All references hereinafter to Zachariasen are understood as referring to this paper. Zachariasen focused on oxide glasses and, more particularly, on amorphous $SiO_2$ and amorphous $B_2O_3$. Zachariasen proved that amorphous $SiO_2$ is constituted by a continuous random network of $SiO_4$ tetrahedra. Similarly, the picocrystalline oxysilaboranes are believed to be constituted by the continuous random network of polyhedra with a nearly-symmetrical boron icosahedron at each of the eight polyhedra corners.

Whereas usual oxide glasses are constituted by a continuous random network of oxygen tetrahedra or oxygen triangles, picocrystalline oxysilaboranes constitute solids formed by the continuous random network of borane hexahedra which, by definition, are constituted by hexahedra with picocrystalline artificial borane atoms 101 at the hexahedral corners. Whereas the monocrystalline silicon unit cell 200 portrayed in FIG. 9 is a regular hexahedron (cube), the diamond-like picocrystalline silaborane unit cell 300 in FIG. 10, while portrayed for description purposes as a cube, is in actuality an irregular hexahedron. Whereas Zachariasen represented the atomic arrangement of an oxide glass by the continuous random network of polymorphic oxygen tetrahedra or triangles, the atomic arrangement in a borane solid is described by a random network of irregular hexahedra.

The eight corners of the borane hexahedron 300 in FIG. 10 are comprised of picocrystalline artificial borane atoms 101. Each corner picocrystalline artificial borane atom 101 is, ideally, bonded to four tetravalent natural atoms 303 which are surrounded by eight corner picocrystalline artificial borane atoms 101. The preferred tetravalent natural atoms 303 are natural silicon atoms. Each of the tetravalent natural atoms 303 bonds to one or more face-center atom 302 in the borane hexahedron 300 shown in FIG. 10. Each face-center atom 302 can be any of, but not limited to: a tetravalent natural atom such as silicon; a hexavalent natural atom such as oxygen; or, possibly, a tetravalent picocrystalline artificial borane atom 101. With the help of the irregular borane hexahedron 300 shown in FIG. 10, the atomic arrangement of a borane solid can be understood.

First, four tetravalent natural atoms 303 are surrounded by 8 corner picocrystalline artificial borane atoms 101 in a solid borane lattice. Secondly, the conjoined irregular borane hexahedra 300 share common corner picocrystalline artificial borane atoms 101 within the continuous random network. The centroid of the corner picocrystalline artificial borane atoms 101 is, ideally, motion-invariant. Thirdly, each corner picocrystalline artificial borane atom 101 covalently bonds to four tetravalent natural atoms 303 along a ⟨111⟩ crystalline orientation. It is noteworthy to recognize that the tetravalent natural atoms 303 are in the positions of the silicon basis atoms 203 (as shown in FIG. 9 in the unit cell of monocrystalline silicon) that undergo a spatial displacement to preserve the unit cell dimension.

The above-described structure can be understood by considering the believed structure of an extreme, $(B_{12}H_4)_4Si_4$, of a new genus of the to-be-defined picocrystalline oxysilaboranes. In $(B_{12}H_4)_4Si_4$, each irregular borane hexahedron 300 forming a solid lattice is ideally constituted by 8 corner picocrystalline artificial borane atoms 101, 6 face-center picocrystalline artificial borane atoms 101, and 4 natural silicon atoms 303. Due to the sharing of 8 hexahedral corners and the sharing of 2 hexahedral faces, the translation of irregular borane hexahedra 300 over space ideally gives rise to picocrystalline silaborane $(B_{12}H_4)_4Si_4$. In this manner, picocrystalline silaborane $(B_{12}H_4)_4Si_4$ forms a picocrystalline polymorph, similar to monocrystalline silicon, comprised of tetravalent natural silicon atoms 303 and tetravalent picocrystalline artificial borane atoms 101. It is by means of this type of structure that spin-orbit coupling becomes physically important.

Preferred embodiments of this invention involve a type of order not known in the prior art. Long-range periodic translational order is defined herein as the regular repetition of a certain invariant arrangement of atoms, known as a unit cell, through space so as to thereby form a translationally-invariant tiling in a regular array of natural atoms well beyond first- and second-nearest neighbor natural atoms. Monocrystalline and polycrystalline materials exhibit a long-range periodic translational order throughout space. The periodic repetition of atomic positions is preserved throughout the entire space of a monocrystalline material. In a polycrystalline material, the periodic repetition of atomic positions is maintained over the limited finite space in grains, which can be themselves arbitrarily oriented over space. As used herein, a nanocrystalline material is any polycrystalline material in which the grain sizes range between 300 pm and 300 nm.

Short-range periodic translational order is defined hereinafter as the repetition of natural atomic positions over a space substantially confined to only the first- and second-nearest neighbor natural atoms. The radii of isolated neutral atoms range between 30 and 300 pm. As the result, and as used herein, any picocrystalline material is a material exhibiting a short-range periodic translational order confined to repeating atomic positions in finite groups of first- and second-nearest neighbor natural atoms. An amorphous material, as used hereinafter, is a material void of regularly repeating arrangements of atoms, so as to thus be incapable of supporting a constructive interference of x-rays. Short-range periodic translational order is dominant in picocrystalline silaborane $(B_{12}H_4)_4Si_4$.

It might appear that these definitions of various types of crystalline materials completely describe the allowable order of repeating atomic positions in space. But, these definitions remain yet limited in the sense that they are based strictly upon repeating positions of individual atoms over space. They cannot be applied to materials which include tightly packed clusters of atoms arranged in space, such that the clusters may themselves be bonded to single natural atoms which are not so clustered. These definitions must be extended to comprehend a quantum dot, which is defined, for purposes herein, as a cluster of natural atoms in which a discrete quantization of energy levels exists. The size of a quantum dot in the prior art is typically on the order of 10 nm. The above noted definitions of various types of crystalline solids are also dependent on an energy quantization.

This leads to the requirement for a new definition that comprehends both the spatial arrangement of atoms and the presence of a discrete quantization of energy levels. Therefore, as used herein, a "picocrystalline artificial atom" is a cluster, of a size less than 300 pm, of natural atoms that are mutually bonded together so as to support a short-range periodic translational order and an internal discrete quantization of energy levels. As further described below, special types of picocrystalline artificial atoms can be bonded to other natural atoms in order to form an extended lattice of natural atoms and picocrystalline artificial atoms. As used herein, a natural atom is any isotope of a stable chemical element contained in the periodic chart. A special type of picocrystalline artificial atom comprises a boron icosahedron with a nearly-symmetrical nuclear configuration.

The singular material most responsible for the solid-state electronic revolution over the past six decades is monocrystalline silicon. As the scaling of feature sizes of monolithic integrated circuits approaches molecular dimensions, the displacement of electric charge in extended energy bands over space increasingly breaks down due to fundamental quantum conditions. In a related manner, electric charge conduction in extended energy bands in low-dimensional metallic interconnects further degrades the performance of monolithic integrated circuits. In recent years, there has been extensive research into the incorporation of monolayer graphene in monolithic integrated circuits in a determined effort to remedy fundamental scaling limitations. Monolayer graphene presents a challenge to an incorporation into monolithic integrated circuits due to the absence of a bandgap energy and an incompatible deposition process with integrated circuits.

Preferred embodiments of this invention remedy scaling limitations of monolithic integrated circuits by a material amalgamation of monocrystalline silicon and graphene that supports a displacement of electrical action over space. Referring, now, to FIG. 10, it can be observed that picocrystalline artificial borane atoms 101 replace the silicon vertex atoms 201 in FIG. 10. In the specific case of picocrystalline silaborane $(B_{12}H_4)_4Si_4$, the six face-center atoms 302 are (although not shown in FIG. 10) picocrystalline artificial borane atoms 101. Due to the preservation of a short-range icosahedral symmetry in each picocrystalline artificial borane atom 101, picocrystalline silaborane $(B_{12}H_4)_4Si_4$ does not possess any long-range periodic translational order in the manner of monocrystalline silicon.

Due to the absence of a long-range periodic translational order, picocrystalline silaborane $(B_{12}H_4)_4Si_4$ cannot physically support extended conduction and valence energy bands over space. The existence of van der Waals forces (and more particularly, Debye forces) between picocrystalline artificial borane atoms 101 further eliminates extended conduction and valence energy bands over space in picocrystalline silaborane $(B_{12}H_4)_4Si_4$. However, the icosahedral symmetry of the picocrystalline artificial borane atoms 101 gives rise to a highly novel type of displacement of electrical action which is not known in the prior art. In order to more fully understand the profound novelty and utility of preferred embodiments of this invention, consider the low-frequency extremes of Eqs. (36a-b).

$$K(v, T) = 2\frac{v^2}{c^2}kT \quad hv \ll kT \tag{41a}$$

$$K(v_n^k, T) = 2\left[\frac{v_n^k}{c}\right]^2 hv_n^k \quad hv_n^k \ll kT \tag{41b}$$

A Planckian resonator constitutes a hybridization of two resonators: (1) the thermal resonator with the vibrational energy U=kT and (2) the quantum resonator with the vibrational energy $U=hv_n^k$. The quantum temperature $\Theta_T$ of a discrete quantum resonator with $U=hv_n^k$ is specifically given by Eq. (38) as:

$$\Theta_T = \frac{hv_n^k}{k\ln 2} \tag{42}$$

At the microwave frequency $v_n^k=10.9$ GHz in Tables 1-2, the quantum temperature $\Theta_T=0.77°$ K of the artificial nucleus 104 is well below the absolute temperature 2.72° K associated with the cosmic microwave background radiation.

$$\Theta_T(10.9 \text{ GHz}) = \frac{h\nu_n^\kappa}{k \ln 2} = 0.77° \text{ K}. \quad (43)$$

By contrast, the quantum temperature $\Theta_T$ of the continuous thermal resonator, with U=kT, is much greater than the ambient temperature T. Since the artificial nuclei 104 forming picocrystalline silaborane $(B_{12}H_4)_4Si_4$ constitute open icosahedral Floquet-many-fermion picocrystals, then the quantum temperature $\Theta_T$ of any artificial nucleus 104 is clamped at the ambient temperature T. In order to better understand the thermal equilibration of picocrystalline silaborane $(B_{12}H_4)_4Si_4$, it is purposeful to consider the ordered filling of the intraicosahedral antibonding and bonding eigenstates by electrons in accordance with Eqs. (23a-b) and Tables 1-2. The antibonding and bonding energy levels within the n=±2 and n=±3 shells are greatly exaggerated relative to the forbidden energy region.

Figure 11:
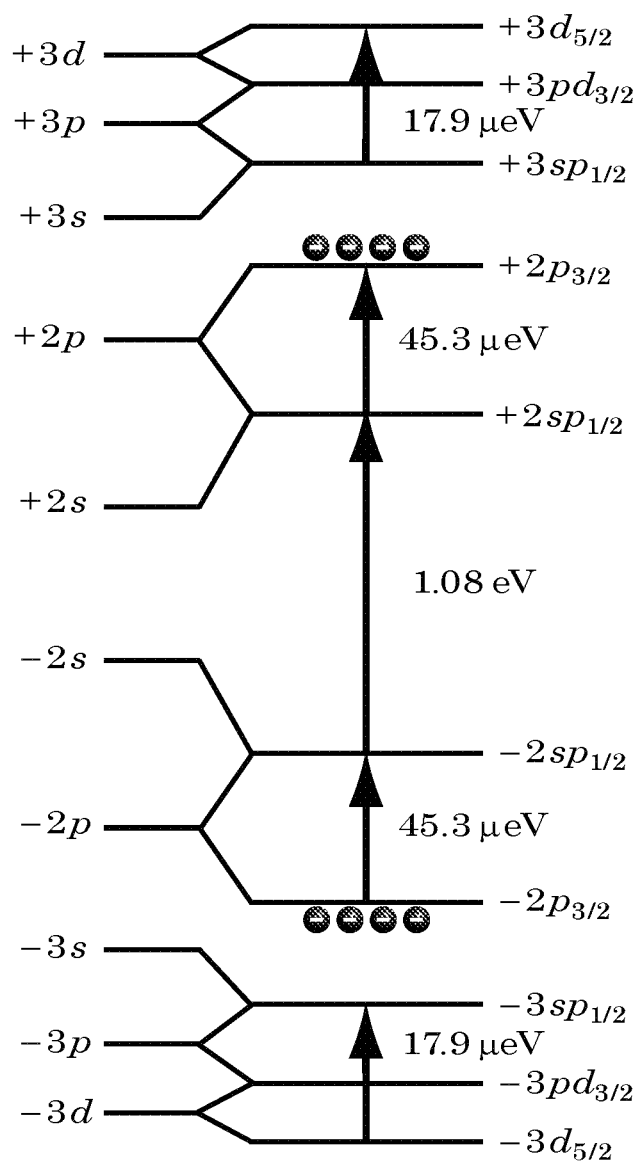
FIG. 11 is an energy level diagram depicting the occupied energy levels of the first eight valence electrons obeying Dirac's relativistic wave equation.

Per FIG. 11 four electrons initially occupy the $+2p_{3/2}^4$ antibonding suborbital and four electrons initially occupy the $-2p_{3/2}^4$ bonding suborbital of a Dirac quasiparticle. Two consequences of FIG. 11 distinguish Dirac quasiparticles from fermions obeying Schrödinger's nonrelativistic wave equation. First of all, there is a charge-conjugation symmetry between positive-energy electrons in the antibonding suborbitals and negative-energy electrons in the bonding suborbitals of a Dirac quasiparticle. No charge-conjugation symmetry exists in a fermion governed by Schrödinger's nonrelativistic equation, which assumes all the energy levels to be positive-definite. Per Schrödinger's equation, charge conduction in the valence energy band formed by bonding orbitals is taken to be due to mobile holes arising from electron vacancies. The physical relation between a negative-energy electron and a positive-energy hole (electron vacancy) will be later developed.

Secondly, the higher-angular-momentum suborbitals $\pm 2p_{3/2}^4$ are filled by electrons while, curiously, the lower-angular-momentum suborbitals $\pm 2sp_{1/2}^0$ are void of electrons per FIG. 11. Spin-orbit coupling creates a doublet of half-integer-quantized suborbitals from a whole-integer-quantized orbital, as represented per Eqs. (24a-b). By a yet-unknown natural phenomenon (referred to hereinafter as spectral induction), it will be shown that the higher-angular-momentum $(j=\ell+\frac{1}{2})$ suborbital of any doublet due to spin-orbit coupling is initially occupied before the lower-angular-momentum $(j=\ell-\frac{1}{2})$ suborbital in a Dirac quasiparticle. Although spectral induction is not known in the prior art, it is used in the successful operation of preferred embodiments of the present invention.

The bound-energy eigenstates of a Dirac quasiparticle are involved in the chemical fusion of boron icosahedra comprising preferred embodiments of this invention. The inner electrons occupying the n=±1 shells are not involved in the chemical bonding of the boron icosahedra. As will be established hereinbelow, the spectral quantum number κ of the electron fine structure is polarized—except for the highest bound-energy eigenstate in a shell. It is noteworthy that the spectral quantum number κ is negative-definite in, and only in, the highest bound-energy eigenstate in the n=+2 and n=+3 shells of the positive-energy antibonding suborbitals of a Dirac quasiparticle per Eq. (23a). It is further noteworthy that the spectral quantum number κ is positive-definite in, and only in, the highest bound-energy eigenstate in the n=−2 and n=−3 shells of the negative-energy bonding suborbitals of a Dirac quasiparticle in accordance with Eq. (23b).

Spin-orbit coupling separates whole-integer-quantized orbitals into doublets of positive-energy half-integer-quantized suborbitals (n>0) per FIG. 11. In a complementary way, spin-orbit coupling separates whole-integer-quantized orbitals into pairs of negative-energy half-integer-quantized suborbitals (n<0) in FIG. 11. The half-integer-quantized suborbitals in FIG. 11 obey the energy eigenvalues of a Dirac quasiparticle in Eqs. (23a-b). The quantum entanglement of the half-integer-quantized suborbitals of a Dirac quasiparticle results in the highest-energy level in each shell possessing the highest bound energy in said shell. This seemingly strange phenomenon (which is further discussed hereinbelow) will be described in terms of relative changes in the Gibbs free energy.

The $|+2p_{3/2}^4\rangle$ and $|-2p_{3/2}^4\rangle$ eigenstates of the n=±2 shells are filled by four electrons in FIG. 11 due to a decrease in Gibbs free energy, per Eqs. (44a-b).

$$-\Delta G_n^\kappa(|+2p_{3/2}\rangle) = -[G_2^1(|+2p_{3/2}\rangle) - G_2^2(|+2s_{1/2}\rangle)] = \quad (44a)$$
$$-\frac{\alpha^4 mc^2}{16}\left[+\frac{1}{2}-1\right] = +45.3\,\mu\text{eV}$$

$$-\Delta G_n^\kappa(|-2p_{3/2}\rangle) = -[G_2^1(|-2s_{1/2}\rangle) - G_2^2(|-2p_{3/2}\rangle)] = \quad (44b)$$
$$-\frac{\alpha^4 mc^2}{16}\left[-1+\frac{1}{2}\right] = +45.3\,\mu\text{eV}$$

The occupancy of the $|\pm 2p_{3/2}^4\rangle$ eigenstates, along with the vacancy of the $|\pm 2sp_{1/2}^0\rangle$ eigenstates, in FIG. 11 is due to the fact that the Gibbs free energy of the $|\pm 2p_{3/2}\rangle$ eigenstates is lower than the Gibbs free energy of the $|\pm 2sp_{1/2}\rangle$ eigenstates. A principal attribute of the artificial nucleus 104 comprising the picocrystalline oxysilaboranes of this invention is the existence of excited eigenstates of a lower Gibbs free energy than that of the ground eigenstate in each shell.

Figure 12:
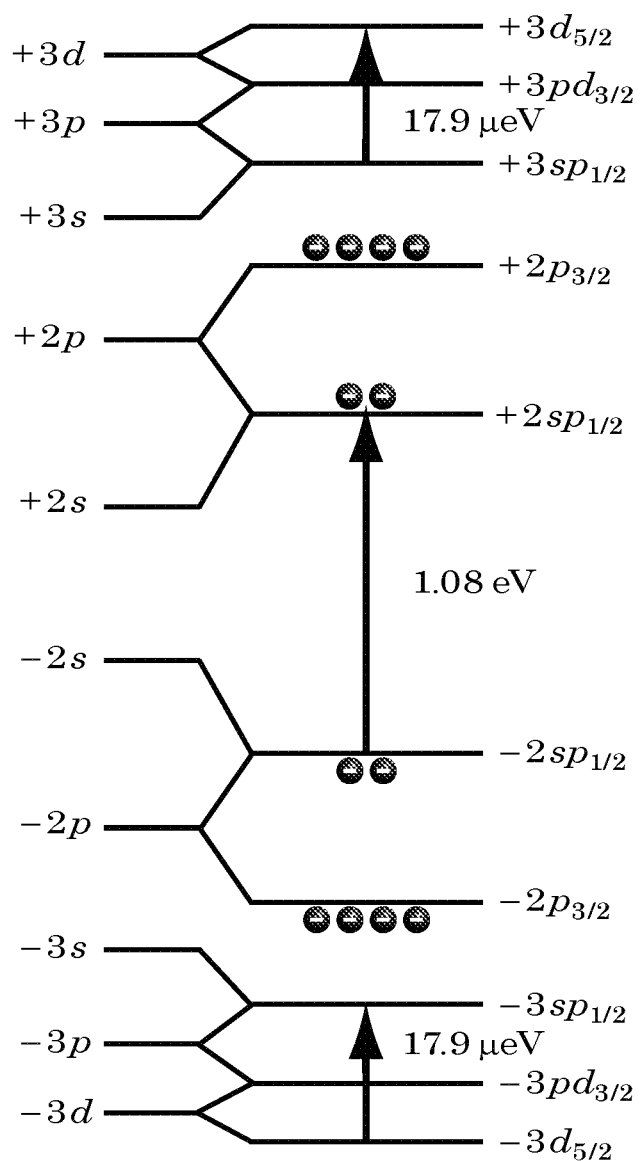
FIG. 12 is an energy level diagram depicting the occupied energy levels of the first twelve valence electrons obeying Dirac's relativistic wave equation.

The stable unfilled shell condition in FIG. 11 is due to a spontaneous excitation of valence electrons into the higher-angular-momentum suborbital of a doublet generated by spin-orbit coupling. This spontaneous excitation of electrons is due to a decrease in Gibbs free energy in the higher-angular-momentum eigenstates $|+2p_{3/2}\rangle$ relative to the lower-angular-momentum eigenstates $|+2sp_{1/2}\rangle$, per Eqs. (44a-b). The n=±2 shells are completely closed if valence electrons fill the $|\pm 2sp_{1/2}^2\rangle$ eigenstates in FIG. 12. In the n=+3 shell, the decrease in the Gibbs free energy of electrons in the $|+3d_{5/2}\rangle$ and $|+3p_{3/2}\rangle$ eigenstates relative to the $|+3s_{1/2}\rangle$ eigenstate is positive, such that electrons are elevated by spin-orbit coupling.

$$-\Delta G_n^\kappa(|+3d_{5/2}\rangle) = -[G_3^1(|+3s_{1/2}\rangle) - G_3^3(|+3d_{5/2}\rangle)] = \quad (45a)$$
$$-\frac{\alpha^4 mc^2}{54}\left[-1+\frac{1}{3}\right] = +17.9\,\mu\text{eV}$$

$$-\Delta G_n^\kappa(|+3p_{3/2}\rangle) = -[G_3^1(|+3s_{1/2}\rangle) - G_3^2(|+3d_{3/2}\rangle)] = \quad (45b)$$
$$-\frac{\alpha^4 mc^2}{54}\left[-1+\frac{1}{2}\right] = +13.4\,\mu\text{eV}$$

In the n=−3 shell, the decrease in Gibbs free energy of electrons in the $|-3d_{5/2}\rangle$ and $|-3p_{3/2}\rangle$ eigenstates relative to the $|-3s_{1/2}\rangle$ eigenstate is positive-definite, such that valence electrons are lowered by spin-orbit coupling.

$$-\Delta G_n^\kappa(|-3d_{5/2}\rangle) = -[G_3^1(|-3s_{1/2}\rangle) - G_3^3(|-3d_{5/2}\rangle)] = \quad (46a)$$
$$+\frac{\alpha^4 mc^2}{54}\left[+1 - \frac{1}{3}\right] = +17.9\,\mu eV$$

$$-\Delta G_n^\kappa(|-3p_{3/2}\rangle) = -[G_3^1(|-3s_{1/2}\rangle) - G_3^2(|-3p_{3/2}\rangle)] = \quad (46b)$$
$$+\frac{\alpha^4 mc^2}{54}\left[+1 - \frac{1}{2}\right] = +13.4\,\mu eV$$

A change in Gibbs free energy $-\Delta G_n^k(|+3d_{5/2}\rangle)$>0 in Eq. (45a) causes electrons to occupy the $|+3d_{5/2}\rangle$ eigenstate while a change in the Gibbs free energy $-\Delta G_n^k(|-3d_{5/2}\rangle)$>0 in Eq. (46a) causes electrons to occupy the $|-3d_{5/2}\rangle$ eigenstate.

Figure 13:
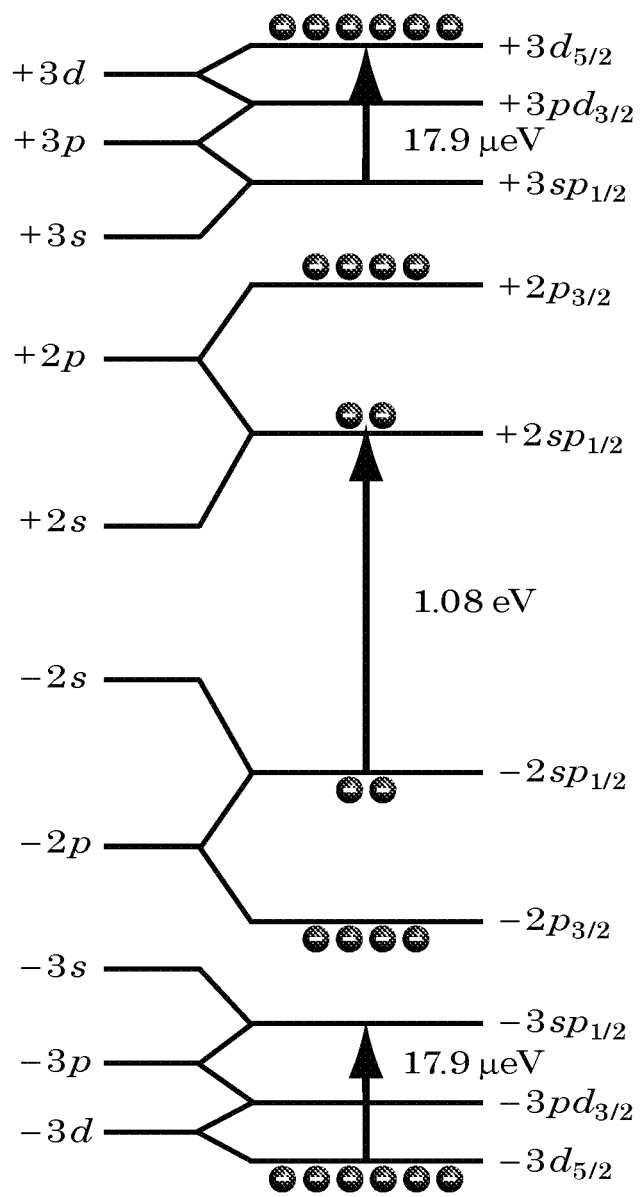
FIG. 13 is an energy level diagram depicting the occupied energy levels of the first twenty-four valence electrons obeying Dirac's relativistic wave equation.
Figure 14:
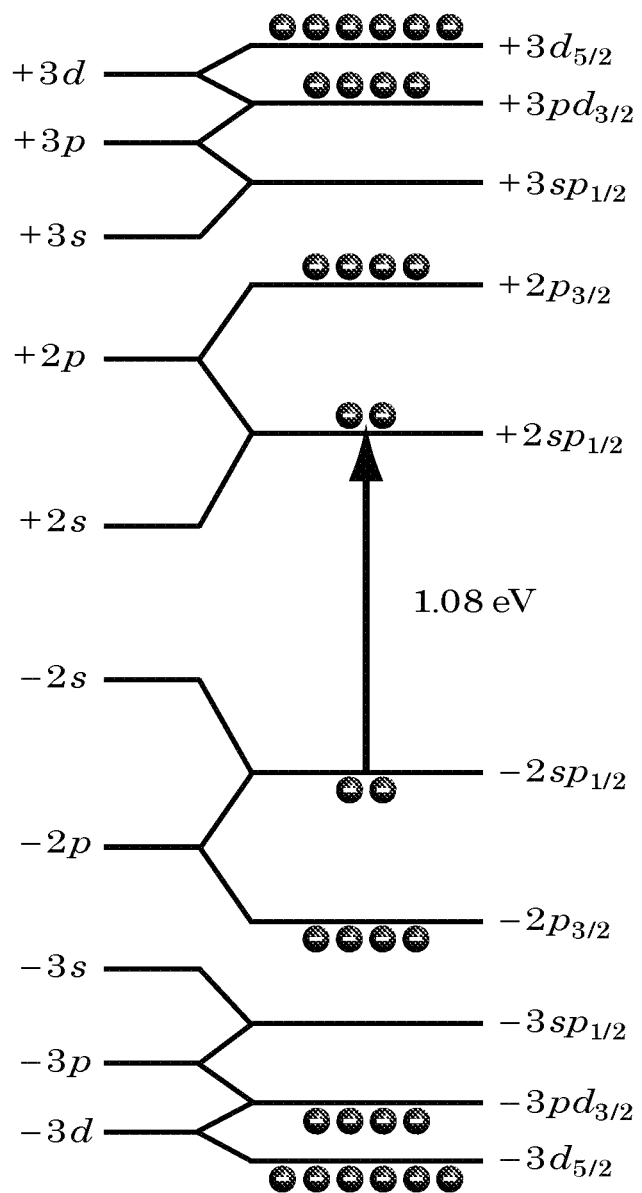
FIG. 14 is an energy level diagram depicting the occupied energy levels of the first thirty-two valence electrons obeying Dirac's relativistic wave equation.
Figure 15:
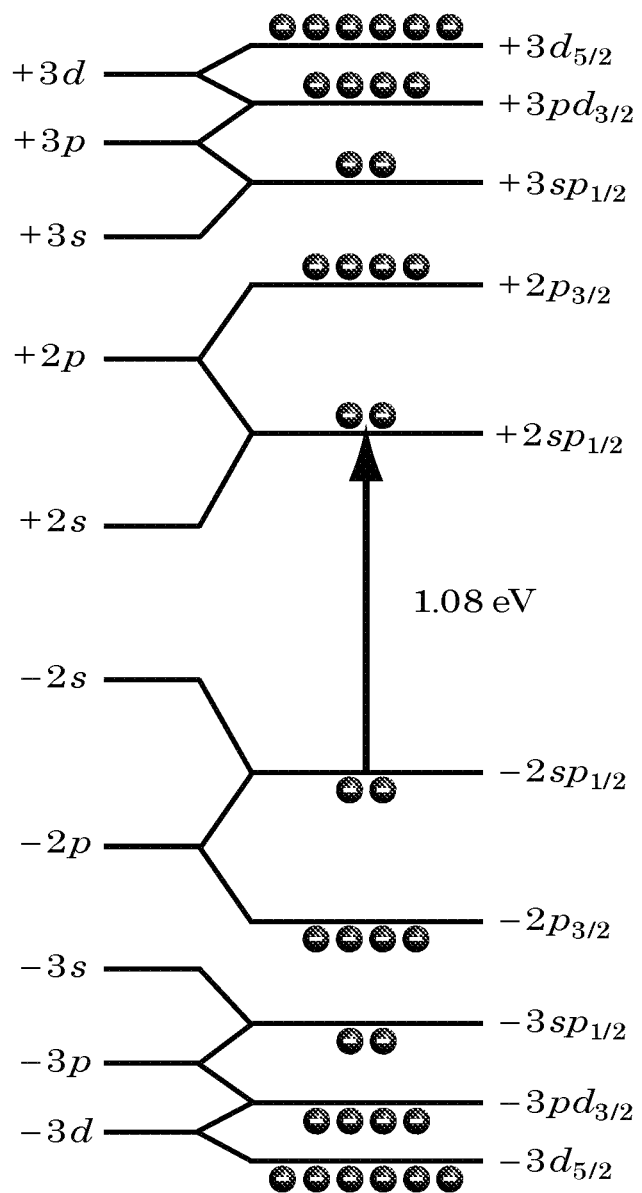
FIG. 15 is an energy level diagram depicting the occupied energy levels of the thirty-six valence electrons obeying Dirac's relativistic wave equation.

The changes in Gibbs free energy $-\Delta G_n^k(|+3d_{5/2}\rangle)$=+17.9 µeV subject to Eq. (45a) and $-\Delta G_n^k(|-3d_{5/2}\rangle)$=+17.9 µeV subject to Eq. (46a) support the partial occupancy of the n=±3 shells of the Dirac quasiparticle, as shown in FIG. 13. The even smaller decreases in Gibbs free energy $-\Delta G_n^k(|+3p_{3/2}\rangle)$=+13.4 µeV subject to Eq. (45b) and $-\Delta G_n^k(|-3p_{3/2}\rangle)$=+13.4 µeV subject to Eq. (46b) cause the occupancy of the n=±3 shells of the Dirac quasiparticle represented in FIG. 14. Finally, the n=±3 shells of the Dirac quasiparticle are closed, as shown in FIG. 15, when the $|\pm 3sp_{1/2}\rangle$ eigenstates are totally filled. The ordered occupancy of the n=±2 and n=±3 shells shown in FIGS. 11-15 is not known in the prior art.

A Dirac quasiparticle physically constituted by a boron icosahedron, with a nearly-symmetrical nuclear configuration, is a quantum many-body system that is ideally closed to its surroundings due to entangled intraicosahedral antibonding and bonding orbitals occupied by valence electrons in the manner shown in FIG. 15. A boron icosahedron, with a nearly-symmetrical nuclear configuration, can be transformed into a semi-open quantum many-body system able to interact with its surroundings due to the boron nuclei. There are two naturally-occurring stable boron isotopes, $_5^{10}B$ and $_5^{11}B$, with a spherically deformed nucleus. An oblate spheroidal nucleus exhibits a negative electric quadrupole moment and, conversely, a prolate spheroidal nucleus exhibits a positive electric quadrupole moment. Of the stable nuclides, boron $_5^{10}B$ constitutes the stable nuclide exhibiting the largest nuclear electric quadrupole moment per nucleon, due to a deformed nucleus.

Boron $_5^{10}B$ has a nuclear angular momentum $3\hbar$ and a large positive nuclear electric quadrupole moment of +0.085×10$^{-28}$ e-m$^2$ whereas boron $_5^{11}B$ has a nuclear angular momentum $3/2\hbar$ and, also, a nuclear electric quadrupole moment of +0.041×10$^{-28}$ e-m$^2$. The energy associated with the nuclear electric quadrupole moment of the boron nuclei is expressed as follows with the aid of Gauss' law.

$$E_Q(B) = 4\pi Q(B) 4\pi \nabla \cdot E(B) = \frac{(4\pi)^3}{\varepsilon_0} Q(B)\rho(B) = \frac{(4\pi)^3 e}{\varepsilon_0} Q(B)n(B) \quad (47)$$

The energy associated with the nuclear electric quadrupole moment Q(B) of boron relates to the boron concentration n(B) in picocrystalline silaborane. Assuming for present purposes that the principal boron isotopes $_5^{10}B$ and $_5^{11}B$ are in a naturally-occurring ratio, the nuclear electric quadrupole moment of boron is:

$$Q(B)=0.1988\ Q(_5^{10}B)+0.8012\ Q(_5^{11}B)=+0.050\times 10^{-28}\ \text{e-m}^2 \quad (48)$$

Applying this value to Eq. (47) yields the quadrupole energy $E_Q(B)$.

$$E_Q(B) = \frac{(4\pi)^3 e^2}{\varepsilon_0}(0.050\times 10^{-28} m^2)(1.75\times 10^{29} m^{-3}) = 31.3\,\mu eV \quad (49)$$

Figure 16:
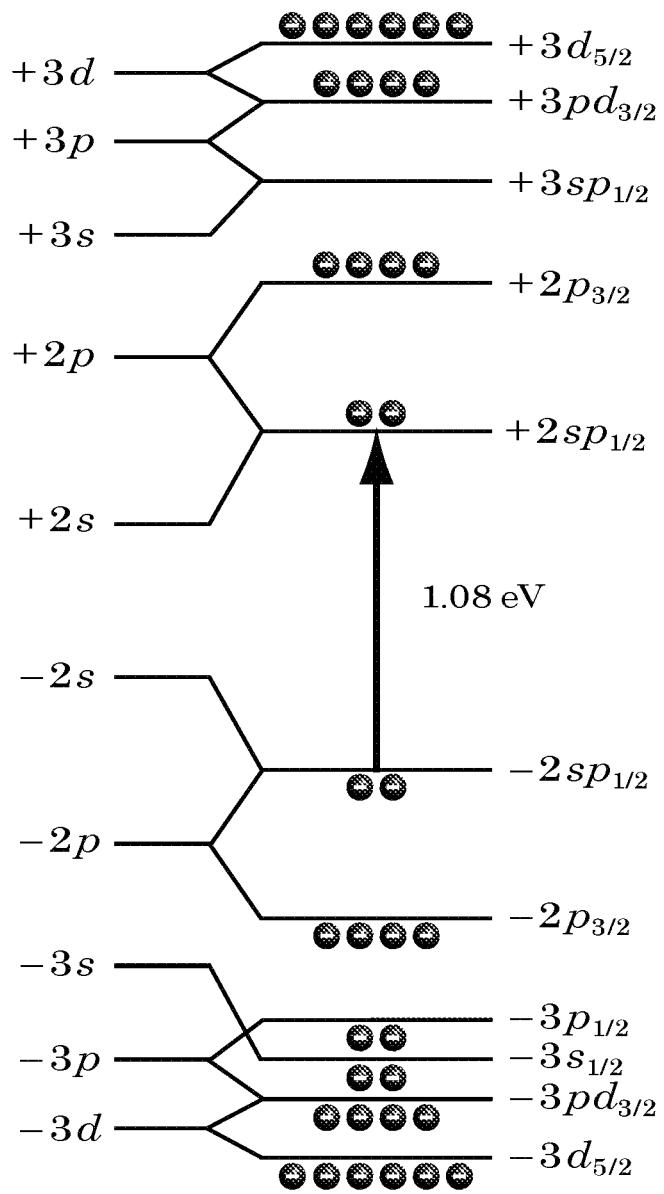
FIG. 16 depicts an energy level diagram illustrating a proposed first disentanglement of the $|-3sp_{1/2}\rangle$ energy level into the $|-3s_{1/2}\rangle$ and $|-3p_{1/2}\rangle$ energy levels, such that a pair of electrons fall from the $|+3sp_{1/2}\rangle$ energy level.
Figure 17:
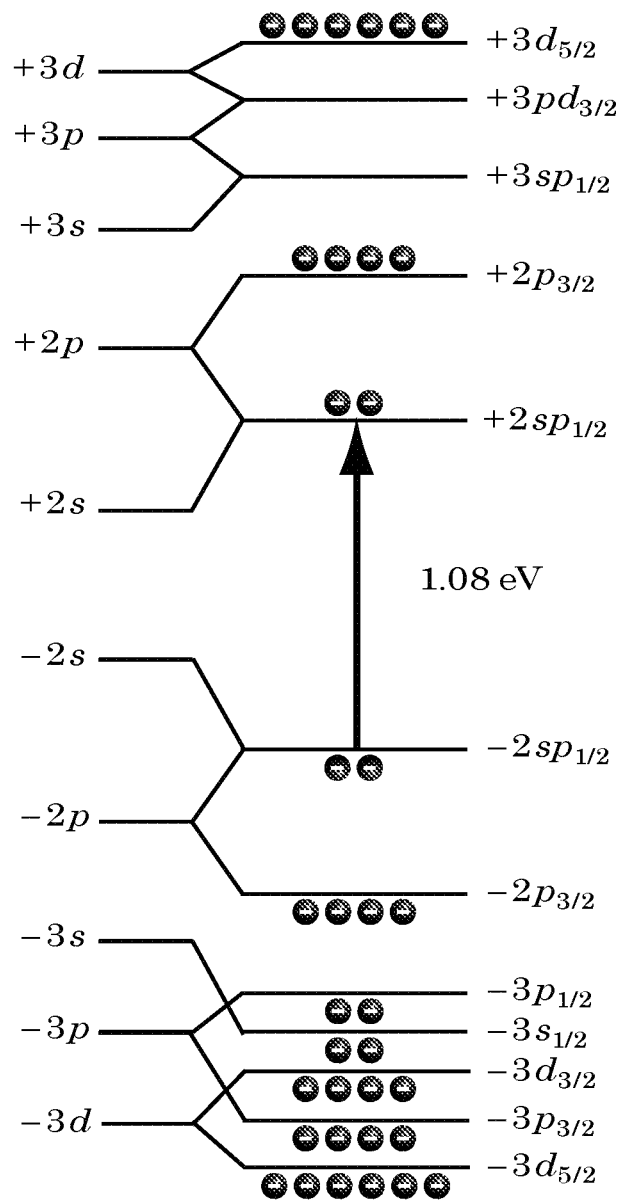
FIG. 17 depicts an energy level diagram illustrating a proposed second disentanglement of the $|-3pd_{3/2}\rangle$ energy level into the $|-3p_{3/2}\rangle$ and $|-3d_{3/2}\rangle$ energy levels, such that a pair of electrons fall from the $|+3pd_{3/2}\rangle$ energy level.

This energy is associated with the disentanglement of the $|-3sp_{1/2}\rangle$ eigenstate in FIG. 15 into the two disentangled $|-3s_{1/2}\rangle$ and $|-3p_{1/2}\rangle$ eigenstates in FIG. 16 and, also, the disentanglement of the $|-3pd_{3/2}\rangle$ eigenstate in FIG. 15 into the two disentangled $|-3p_{3/2}\rangle$ and $|-3d_{3/2}\rangle$ eigenstates in FIG. 17. The total energy $E_Q(B)$=17.9 µeV+13.4 µeV= 31.3 µeV released by a disentanglement of the bonding $|-3sp_{1/2}\rangle$ and $|-3pd_{3/2}\rangle$ eigenstates, due to the nuclear electric quadrupole moment of boron, was previously given hereinabove by the $\hbar\omega_n^k$ column in Table 2.

The total energy $E_Q(B)$=17.9 µeV+13.4 µeV=31.3 µeV released by the disentanglement of the $|-3sp_{1/2}\rangle$ and $|-3pd_{3/2}\rangle$ bonding eigenstates results in the self-thermalization of a relatively small number of host picocrystalline artificial borane atoms 101 in picocrystalline silaborane $(B_{12}H_4)_4Si_4$. In that the quantum temperature $\Theta_T$ is clamped at the ambient temperature $T_0$, a small concentration $2p_0$ of the host picocrystalline artificial borane atoms 101 are self-thermalized.

$$E_Q(B)n(B)=3kT_0(2p_0)\hbar v_n^k<<kT_0 \quad (50)$$

Whereas the concentration of picocrystalline artificial borane atoms 101 in picocrystalline silaborane $(B_{12}H_4)_4Si_4$ is ~$10^{22}$ cm$^{-3}$, the trace concentration of ionized picocrystalline artificial borane atoms 101 at room temperature $T_0$ is:

$$p_0\approx 2\times 10^{18}\ \text{cm}^{-3}\ \text{for}\ T_0=300°\ K \quad (51)$$

A self-thermalization of picocrystalline artificial borane atoms 101, per FIG. 17, causes picocrystalline silaborane $(B_{12}H_4)_4Si_4$ to essentially behave as a p-type semiconductor. This is due to the fact that the local disentanglement of the $|-3sp_{1/2}\rangle$ and $|-3pd_{3/2}\rangle$ eigenstates in FIG. 17 causes picocrystalline artificial borane atoms 101 to interact with their surroundings, so as to thereby exhibit a profound tendency to disentangle the remaining entangled $|-2sp_{1/2}\rangle$ energy eigenstates by the capture of a pair of electrons. Absent the ability to capture a pair of electrons from any external source, picocrystalline silaborane $(B_{12}H_4)_4Si_4$ undergoes a disproportionation that causes an ionization of the partially-disentangled picocrystalline artificial borane atoms 101 into pairs of dianions and dications.

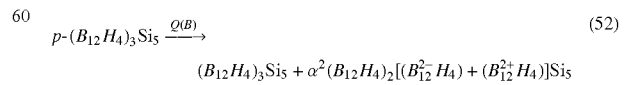

$$p\text{-}(B_{12}H_4)_3Si_5 \xrightarrow{Q(B)} (B_{12}H_4)_3Si_5 + \alpha^2(B_{12}H_4)_2[(B_{12}^{2-}H_4) + (B_{12}^{2+}H_4)]Si_5 \quad (52)$$

Based on actual experimental data, p-type picocrystalline silaborane is better chemically represented as p-$(B_{12}H_4)_3Si_5$. In Eq. (52) $\alpha^2$ is the square of the fine structure constant— which provides an approximate magnitude of a trace disproportionation of dianion-dication pairs in p-type picocrystalline silaborane p-$(B_{12}H_4)_3Si_5$. It thus follows that p-type picocrystalline silaborane p-$(B_{12}H_4)_3Si_5$ is a semi-open mixed quantum many-body system comprising ~$10^{18}$ cm$^{-3}$ ionized picocrystalline artificial borane atoms 101 $B_{12}{}^{2-}H_4$ and $B_{12}{}^{2+}H_4$ distributed amongst ~$10^{22}$ cm$^{-3}$ picocrystalline artificial borane atoms 101 $B_{12}H_4$ which host the p-type picocrystalline silaborane p-$(B_{12}H_4)_3Si_5$ solid. An ionization of the artificial nuclei 104 of stationary picocrystalline artificial borane atoms 101 provides for a charge displacement by means of free charge trapped in various artificial nuclei 104.

Under the mutual ionization of disproportionation, a pair of valence electrons hop from the disentangled eigenstate $|-3p_{1/2}{}^2\rangle \rightarrow |-3p_{1/2}{}^0\rangle$ of an artificial nucleus 104 into some neighboring artificial nucleus 104, so as to disentangle the only remaining entangled bonding eigenstate $|-2sp_{1/2}{}^2\rangle \rightarrow |-2s_{1/2}{}^2\rangle + |-2p_{1/2}{}^2\rangle$ per FIGS. 18A-B. Disproportionation gives rise to a trace concentration of oppositely-ionized pairs of picocrystalline artificial borane atoms 101 $B_{12}{}^{2-}H_4$ and $B_{12}{}^{2+}H_4$. The total concentration of neutral picocrystalline artificial borane atoms 101 $B_{12}H_4$ is ~$10^{22}$ cm$^{-3}$ while a much smaller trace concentration of the ionized picocrystalline artificial borane atoms 101 $B_{12}{}^{2-}H_4$ and $B_{12}{}^{2+}H_4$ is ~$10^{18}$ cm$^{-3}$. It is to be understood that an ionization of two neutral picocrystalline artificial borane atoms 101 $B_{12}H_4$ is by virtue of the ionization of the associated artificial nuclei 104 $B_{12}{}^{2-}$ and $B_{12}{}^{2+}$.

The ~$10^{18}$ cm$^{-3}$ trace dianions $B_{12}{}^{2-}H_4$ and dications $B_{12}{}^{2+}H_4$ effectively hop amongst ~$10^{22}$ cm$^{-3}$ neutral picocrystalline artificial borane atoms 101 $B_{12}H_4$, which results in the thermalization of picocrystalline silaborane p-$(B_{12}H_4)_3$ $Si_5$. In thermal equilibrium with the ambient $T_0$, the average vibrational energy $U(T_0)$ of the Planckian resonators of the picocrystalline artificial borane atoms 101 is:

$$U(T_0)=3kT_0+hv_n{}^k \quad hv_n{}^k<<kT_0 \tag{53}$$

Under thermal equilibrium with the ambient, the vibrational energy in Eq. (53) is the same for the neutral and ionized picocrystalline artificial borane atoms 101 in picocrystalline silaborane p-$(B_{12}H_4)_3Si_5$. The concentration of ~$10^{18}$ cm$^{-3}$ ionized picocrystalline artificial borane atoms 101 is much smaller than that of neutral picocrystalline artificial borane atoms 101 in silaborane p-$(B_{12}H_4)_3Si_5$.

Electric charge can become self-trapped within an induced potential well, so as to be displaced through space with the self-trapped potential well as a quasiparticle. This type of quasiparticle is referred to as a polaron. It is possible to self-trap a charge pair, which is known as a bipolaron. By way of example, see Emin, *Polarons*, Cambridge University Press, 2013. The pair of trapped charges in a bipolaron can generally be either a pair of electrons or a pair of holes. Boron-rich solids are particularly well suited for bipolaron formation due to the strong tendency of boron icosahedra to ionize, $B_{12} \rightarrow B_{12}{}^{2-}$, in order to attain an electronic stability by filling unoccupied intraicosahedral bonding orbitals. Mobile charge displacement is sufficiently different in the picocrystalline oxysilaboranes that it is better described in terms of a special type of bipolaron.

Two different types of bipolarons have been identified in the prior art of icosahedral boron-rich solids. Electronic orbital degeneracies can be lifted by symmetry-breaking atomic displacements such that a pair of holes of an opposite spin can be self-trapped in a singlet Jahn-Teller bipolaron. In a quite different manner, a pair of holes of opposite spin can be self-trapped in a softening singlet bipolaron by symmetry-breaking vibrations in a specific vibronic (i.e., vibrational and electronic) eigenstate. These two types of singlet bipolarons exhibit different physical properties. Whereas the self-trapped hole-pair in a singlet Jahn-Teller bipolaron can be excited from the ground eigenstate by a photo-absorption, a self-trapped hole-pair in a singlet softening bipolaron cannot be similarly excited. The hole-pairs remain self-trapped in singlet softening bipolarons, with a stabilization occurring by a lowering of the free energy of atomic vibrations of the lattice.

Although an anomalously high Seebeck coefficient is known to occur in boron carbide $B_{12+x}C_{3-x}$ over the compositional range $0.15 \leq x \leq 1.7$, the physical basis of the Seebeck coefficient and the conduction mechanism of boron carbide is disputed within the literature. As established by Emin in "Unusual Properties of Icosahedral Boron-Rich Solids," *Journal of Solid-State Chemistry*, Vol. 179, 2006, pp. 2791-2798, a low thermally-activated Hall mobility, consistent with a hopping of bipolaronic holes, is observed in hot-pressed boron carbide. In spite of the high bipolaronic hole concentration of ~$10^{21}$ cm$^{-3}$, a lower spin density of ~$10^{19}$ cm$^{-3}$ is confirmed in boron carbide by a magnetic susceptibility measurement. This disparity is attributed to the self-trapping of hole-pairs of opposite spin.

Since no carrier-induced photo-absorption band has been observed in boron carbide, Emin and other researchers have assumed the apparent reduction in the spin density in hot-pressed boron carbide to be due to symmetry-breaking vibrations giving rise to the formation of singlet softening bipolaronic hole-pairs. The carrier-induced formation of singlet softening bipolarons contributes to an increase in the Seebeck coefficient due to the softening of symmetry-breaking lattice vibrations. Another enhancement of the Seebeck coefficient within boron carbide $B_{12+x}C_{3-x}$ over the compositional range $0.15 \leq x \leq 1.7$ can be related to a change in entropy due to a hopping of softening bipolaronic holes. The contributions to the Seebeck coefficient by a carrier-induced softening of the lattice vibrations and by the hopping of singlet softening bipolaronic hole-pairs are largely insensitive to a compositional variation. There exists a variation in the Seebeck coefficient over a compositional range of boron carbide $B_{12+x}C_{3-x}$ due, in part, to disproportionation.

Disproportionation in boron carbide is extremely different from that in picocrystalline silaborane p-$(B_{12}H_4)_3Si_5$ due to the Jahn-Teller distortion of the boron icosahedra in boron carbide. The electronic orbital degeneracies are lifted in picocrystalline silaborane p-$(B_{12}H_4)_3Si_5$ by spin-orbit coupling, so as to maintain a symmetrical nuclear configuration that escapes Jahn-Teller distortion. In their paper, Jahn and Teller ignored spin effects. The three-center chemical bonds supporting boron icosahedra with a symmetrical nuclear configuration, in FIG. 5, result in vibrations along the $k_{(111)}$ wave vectors normal to the three-center bonds, per Eqs. (22a-d), due to intertwined rotational and vibrational degrees of freedom.

Intertwined rotational and vibrational degrees of freedom in which a change in the rotational degrees of freedom necessarily corresponds to a change in the vibrational degrees of freedom, and vice versa, are hereinafter referred to as rovibrational degrees of freedom. It is here that picocrystalline oxysilaborane $(B_{12}H_4)_xSi_yO_z$ of this invention departs from conventional chemistry. On page 113 of the book entitled *Symmetry and Spectroscopy*, Oxford Univ. Press, 1978, Harris and Bertolucci stated that: "Since neither θ nor φ depends on the form of V(r), the rotational wave functions will be the same regardless of the model we choose for vibration of the molecule." This is not the case for boron icosahedra with a symmetrical nuclear configuration—due to intertwined rovibrational degrees of freedom that impact disproportionation in picocrystalline silaborane p-$(B_{12}H_4)_3Si_5$.

Disproportionation is an irreversible non-cyclic process in which the entropy of mixing is maximized per the second law of thermodynamics. In order to quantify disproportionation, the fraction of ionized borane molecules that are ionized into borane dications is designated by c. The entropy of mixing associated with mobile ions can generally be described by the following relation.

$$S_{mix} = -Nk[c \ln c + (1-c)\ln(1-c)] \qquad (54)$$

The disproportionation in picocrystalline silaborane p-$(B_{12}H_4)_3Si_5$, in Eq. (52), causes a maximization in the charge-induced entropy of mixing, such that there is an equal number of dianions and dications (with c=0.5) supporting:

$$p\text{-}(B_{12}H_4)_3Si_5 \to \alpha_{mix} = \frac{1}{2eN}\frac{dS_{mix}}{dc}\bigg|_{c=0.5} = \frac{3k}{2e}\ln\left[\frac{1-c}{c}\right]\bigg|_{c=0.5} = 0 \qquad (55)$$

Figure 19:
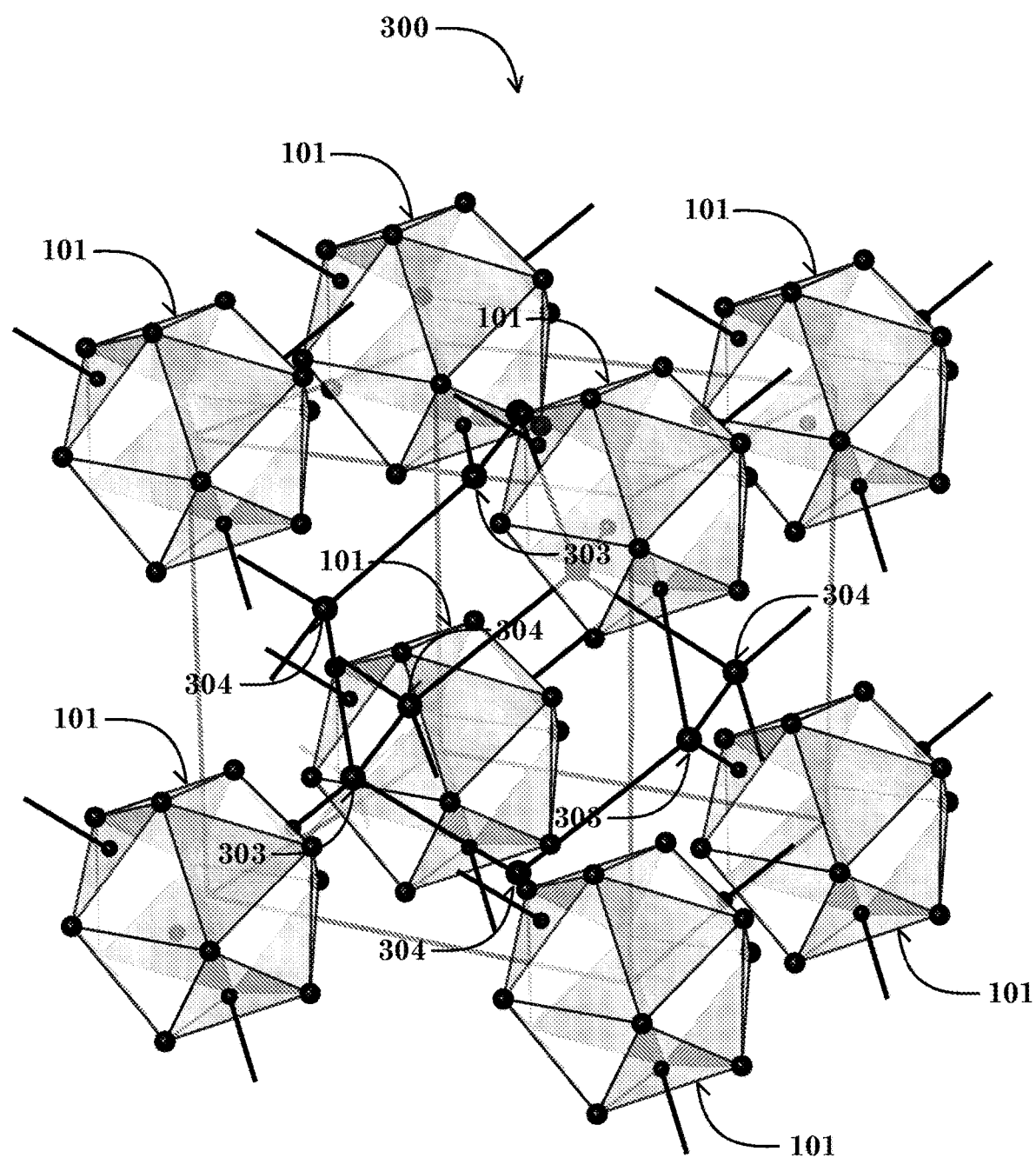
FIG. 19 is an illustration of a diamond-like picocrystalline unit cell with the incorporation of natural oxygen atoms.

The profound novelty and utility of the self-thermalization and disproportionation of picocrystalline silaborane p-$(B_{12}H_4)_3Si_5$ can be appreciated by considering the opposite extreme, p-$(B_{12}{}^{2-}H_4)_2Si_4O_2{}^{2+}$, of the new genus of the to-be-defined picocrystalline oxysilaboranes. In a real sense, the ionized eigenstates are displaced among the artificial nuclei 104 of the stationary picocrystalline artificial borane atoms 101 by an atomic engineering by controlled variations in quantum entanglement. This requires an oxygen-bearing species of picocrystalline oxysilaborane, with p-$(B_{12}{}^{2-}H_4)_2Si_4O_2{}^{2+}$ being a preferred oxygen-bearing species. Natural oxygen atoms 304 occupy the six face-center atoms in the unit cell per FIG. 19.

Figure 20:
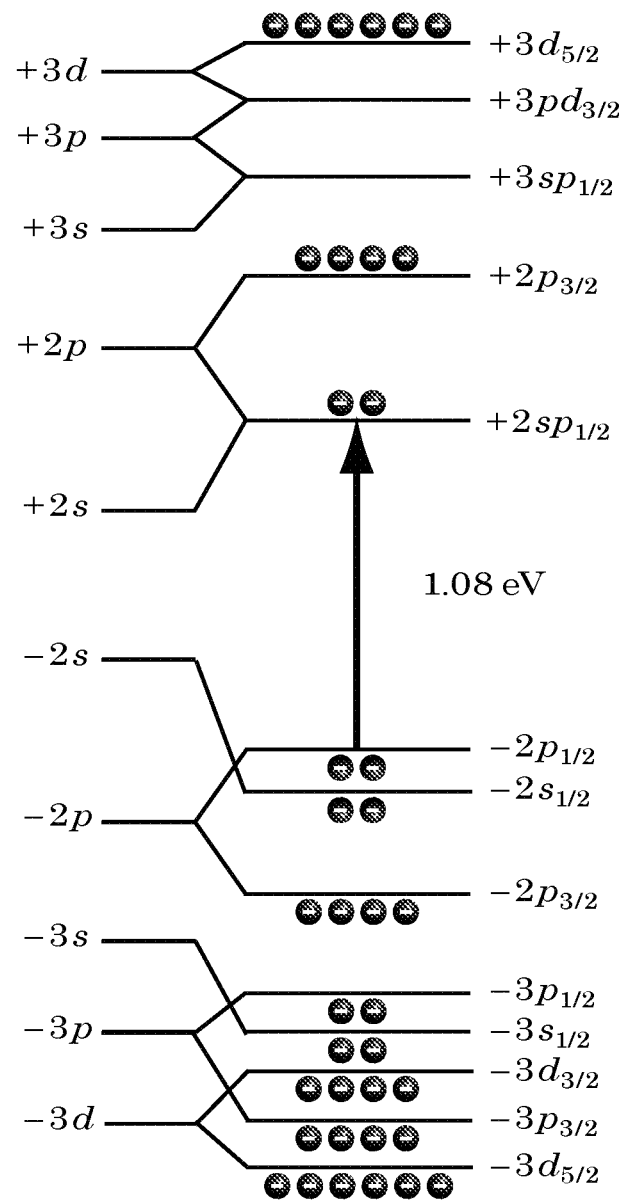
FIG. 20 depicts an energy level diagram illustrating a proposed disentanglement of the $|-2sp_{1/2}\rangle$ energy level into the $|-2s_{1/2}\rangle$ and $|-2p_{1/2}\rangle$ energy levels, such that a pair of electrons are donated by an oxygen atom.

In the development of electronegativity in his book *The Nature of the Chemical Bond*, Cornell University Press, Third Edition, 1960, pp. 64-108, Linus Pauling established electronegativity as the measure of the ionicity of a covalent bond. Pauling's concept of electronegativity assumed two-center chemical bonds, which are not directly applicable to the picocrystalline oxysilaboranes of this invention. The picocrystalline artificial borane atoms 101 are covalently bonded to other natural atoms by hydrogen valence electrons. The utility of picocrystalline silaborane p-$(B_{12}H_4)_3Si_5$ rests with the strong affinity to capture an electron pair so as to thereby disentangle the $|{-}2sp_{1/2}\rangle$ eigenstate, which, otherwise, is the only entangled intraicosahedral bonding suborbital. When the capture of an electron pair is realized, the neutral picocrystalline artificial borane atom 101 $B_{12}H_4$ is thus transformed into an ionized picocrystalline artificial borane atom 101 $B_{12}{}^{2-}H_4$, such that the electron configuration in FIG. 17 becomes that represented in FIG. 20.

Figure 21:
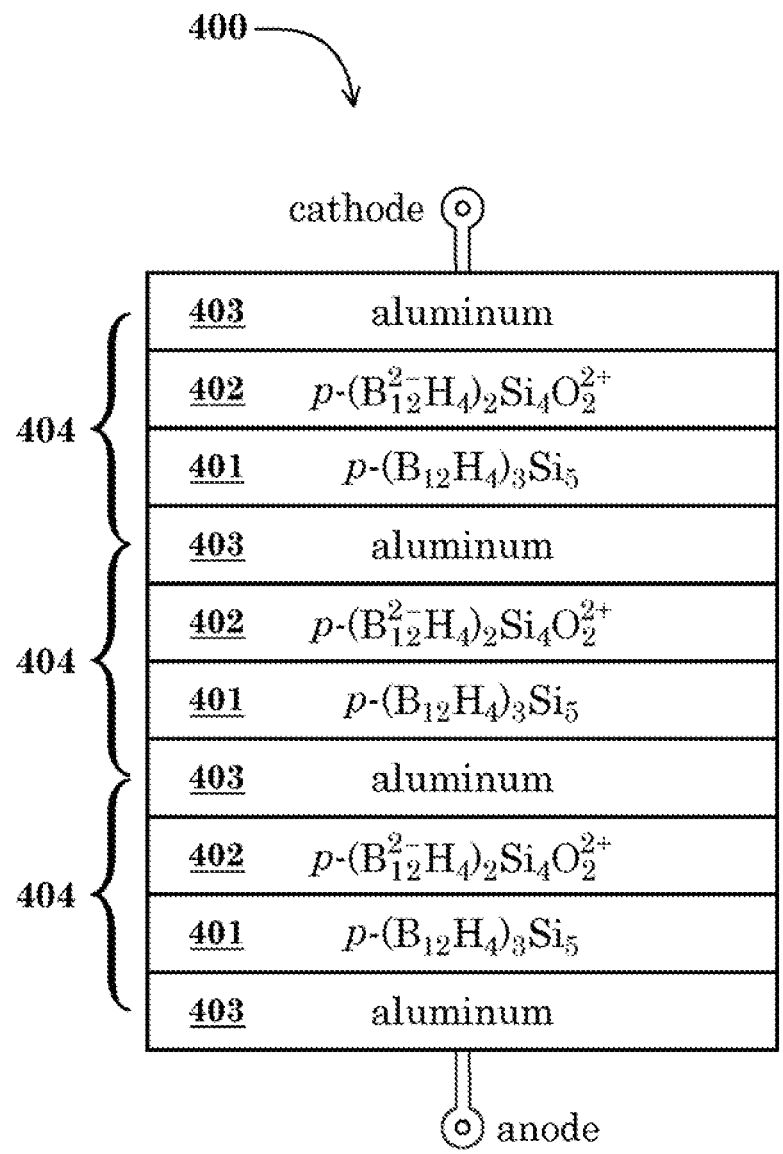
FIG. 21 depicts a phonovoltaic cell 400 comprising multiple pairs of contiguous picocrystalline silaborane p-$(B_{12}H_4)_3Si_5$ regions and picocrystalline oxysilaborane p-$(B_{12}^{2-}H_4)_2Si_4O_2^{2+}$ regions intervened by metallic electrodes.

Picocrystalline silaborane p-$(B_{12}H_4)_3Si_5$ is thereby said to possess a large quantum electronegativity. Picocrystalline oxysilaborane p-$(B_{12}{}^{2-}H_4)_2Si_4O_2{}^{2+}$ conversely possesses a low quantum electronegativity due to totally disentangled intraicosahedral negative-energy bonding eigenstates. The phonovoltaic cell 400 in FIG. 21 is constituted by multiple conjoined pairs of picocrystalline silaborane p-$(B_{12}H_4)_3Si_5$ regions 401 and thin picocrystalline oxysilaborane p-$(B_{12}{}^{2-}H_4)_2Si_4O_2{}^{2+}$ regions 402 intervened by the metallic electrodes 403. It is to be understood that the phonovoltaic cell 400 is, generally, constituted by any number of such pairs of conjoined regions 401 and 402 intervened by metallic electrodes 403.

Any two conjoined picocrystalline silaborane p-$(B_{12}H_4)_3Si_5$ and oxysilaborane p-$(B_{12}{}^{2-}H_4)_2Si_4O_2{}^{2+}$ regions constitute, respectively, the anode region 401 and the cathode region 402 of a p-isotype rectifier 404. A phonovoltaic cell 400 is comprised of a number of p-isotype rectifiers 404 intervened by metal electrodes 403, with aluminum being the preferred metal. Whereas the picocrystalline oxysilaborane p-$(B_{12}{}^{2-}H_4)_2Si_4O_2{}^{2+}$ region 402 is substantially void of mobile holes, the conjoined picocrystalline silaborane p-$(B_{12}H_4)_3Si_5$ anode region 401 at room temperature contains mobile holes at the trace concentration of ~$10^{18}$ cm$^{-3}$. Mobile holes therefore diffuse upon their own accord from the picocrystalline silaborane p-$(B_{12}H_4)_3Si_5$ anode region 401 into the conjoined picocrystalline oxysilaborane p-$(B_{12}{}^{2-}H_4)_2Si_4O_2{}^{2+}$ cathode region 402 of each p-isotype rectifier 404, so as to maximize the entropy of mixing between the regions 401 and 402 in accordance with:

$$-d\,G_{mix} = T\,d\,S_{mix} > 0 \qquad (56)$$

Under ideal conditions, there does not exist any contribution due to a change in enthalpy. As a result, the contribution to the Seebeck coefficient due to a carrier-induced change in the entropy of mixing vanishes in p-$(B_{12}H_4)_3Si_5$.

$$p\text{-}(B_{12}H_4)_3Si_5 \to \alpha_{mix} = \frac{1}{2eN}\frac{dS_{mix}}{dc}\bigg|_{c=0.5} = \frac{3k}{2e}\ln\left[\frac{1-c}{c}\right]\bigg|_{c=0.5} = 0 \qquad (55)$$

In profound contrast to picocrystalline silaborane p-$(B_{12}H_4)_3Si_5$, picocrystalline oxysilaborane p-$(B_{12}{}^{2-}H_4)_2Si_4O_2{}^{2+}$ exhibits an infinite Seebeck coefficient of mixing due to the absence of bipolaronic hole-pairs under ideal conditions.

$$p\text{-}(B_{12}^{2-}H_4)_2Si_4O_2^{2+} \to \alpha_{mix} = \frac{3k}{2e}\ln\left[\frac{1-c}{c}\right]\bigg|_{c=0} \to \infty \qquad (57)$$

It warrants emphasizing that the above mixing conditions are ideal. The occupied energy levels of the boron icosahedra that comprise picocrystalline silaborane p-$(B_{12}H_4)_3Si_5$ are, ideally, represented in FIGS. 18A-B. Similarly, the occupied energy levels of the boron icosahedra that comprise picocrystalline oxysilaborane p-$(B_{12}{}^{2-}H_4)_2Si_4O_2{}^{2+}$ are, ideally, further represented within FIG. 20. The conjoined regions 401 and 402 in the phonovoltaic cell 400 support the diffusion of bipolaronic hole-pairs from each picocrystalline silaborane p-$(B_{12}H_4)_3Si_5$ region 401 into the conjoined picocrystalline oxysilaborane p-$(B_{12}{}^{2-}H_4)_2Si_4O_2{}^{2+}$ region 402. Bipolaronic hole-pairs diffuse on their own accord from the $|{-}3p_{1/2}{}^0\rangle$ eigenstate of a picocrystalline silaborane p-$(B_{12}H_4)_3Si_5$ region 401 into the $|{-}2p_{1/2}{}^0\rangle$ eigenstate of the conjoined picocrystalline oxysilaborane p-$(B_{12}{}^{2-}H_4)_2Si_4O_2{}^{2+}$ region 402. A mixing of mobile holes between the anode and cathode regions 401 and 402 of each p-isotype rectifier 404 is due to conjoined regions of different compositions.

Figure 2:
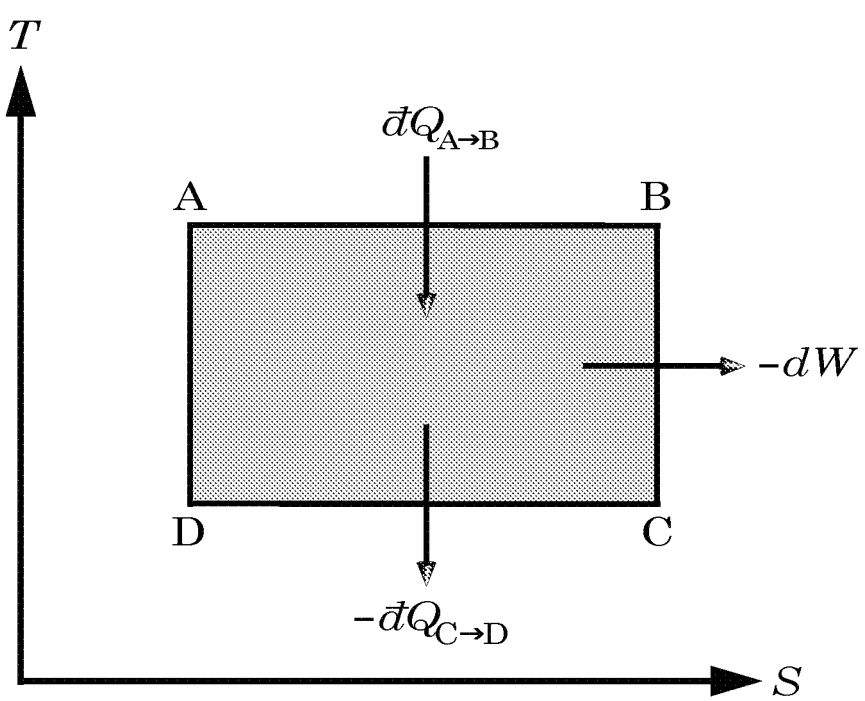
FIG. 2 is an another illustration of the Carnot cycle.
Figure 3:
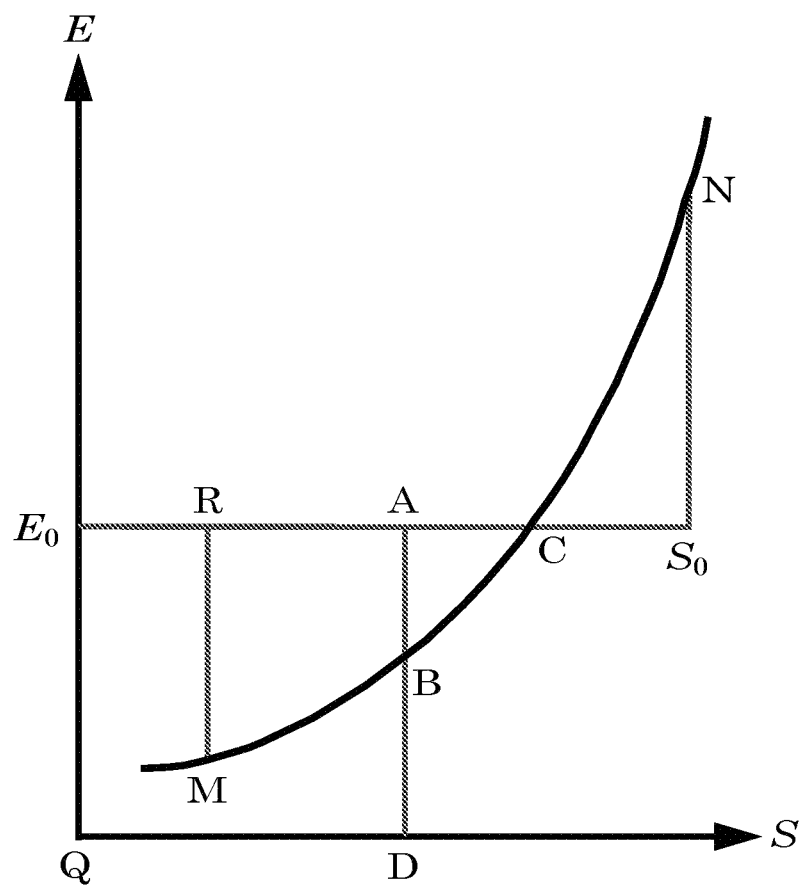
FIG. 3 is an illustration of Gibbs equilibration of a nonequilibrium state.

The mixing of the mobile holes between the anode region 401 and the cathode region 402 is an irreversible process that proceeds on its own accord until the entropy of mixing $S_{mix}$ is maximized. This process can be continuously sustained in the phonovoltaic cell 400 shown in FIG. 21 if, and only if, electric charge delivered to an electrical load is fully replenished by the self-thermalization and disproportionation of mobile electron-hole pairs in the picocrystalline silaborane p-$(B_{12}H_4)_3Si_5$ anode region 401 of each p-isotype rectifier 404. This can be better explained in terms of a quantum thermodynamic cycle that generalizes a Carnot cycle. Pursuant to said objective, it is next purposeful to construct the quantum thermodynamic cycle governing the phonovoltaic cell 400 in a way comparable to the Carnot cycle in FIG. 2. In order to compare these two thermodynamic cycles, the states labeled by Clausius (1851) in FIG. 2 are relabeled per FIG. 22.

Figure 22:
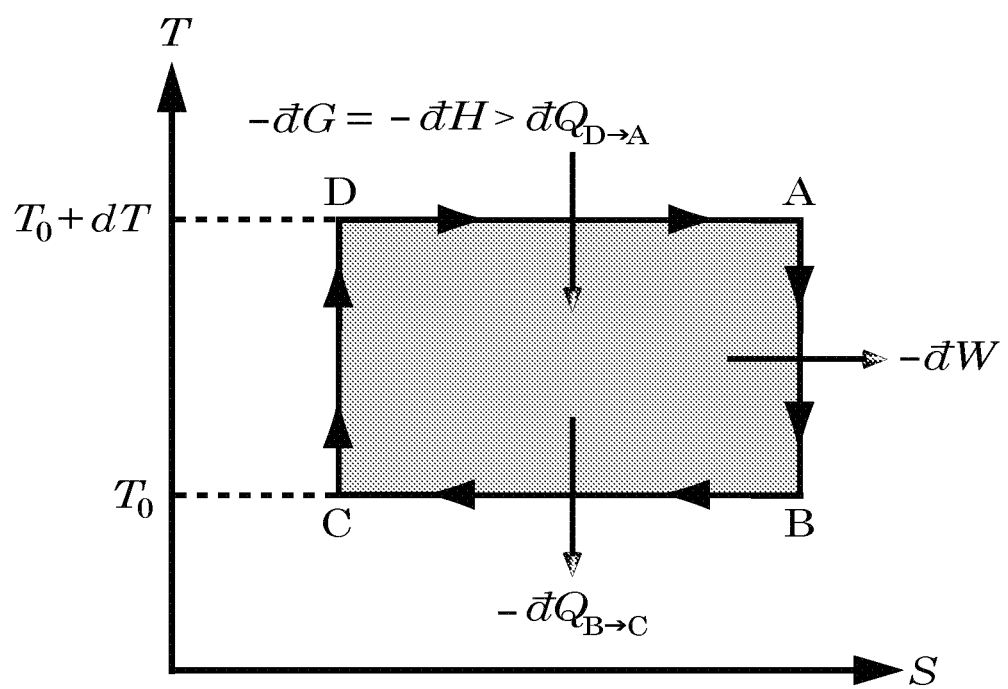
FIG. 22 is an another illustration of the Carnot cycle.
Figure 23:
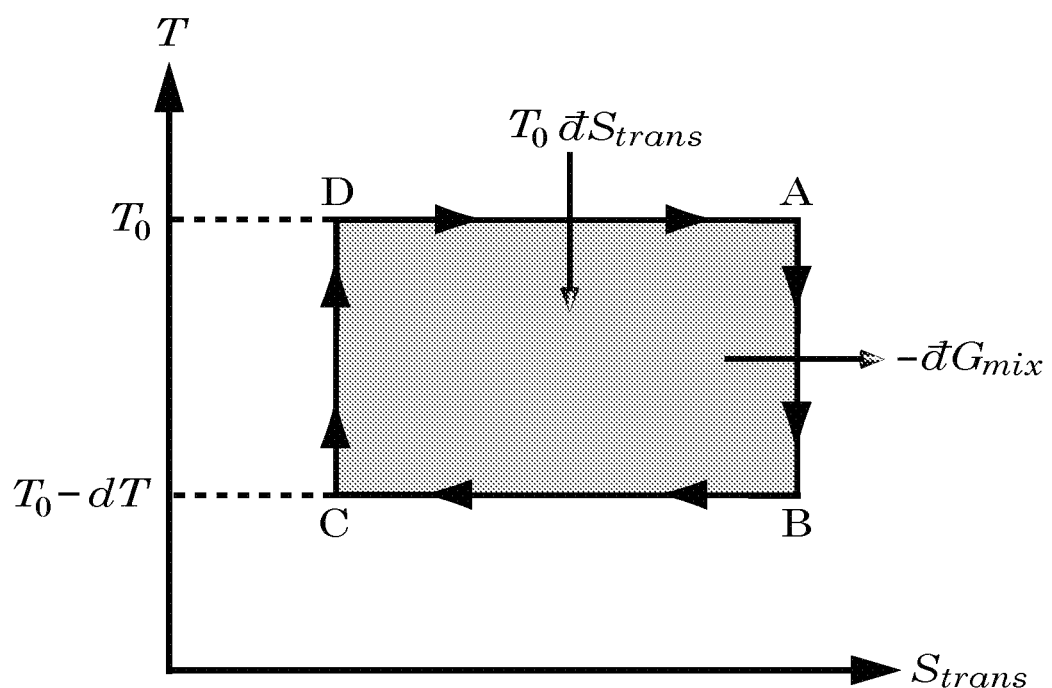
FIG. 23 is an illustration of a proposed quantum thermodynamic cycle.

The power stroke of the Carnot cycle within FIG. 22 is the adiabatic expansion A→B of the ideal gas working substance under spontaneous cooling. During adiabatic expansion A→B in FIG. 22, the ideal gas working substance is spontaneously cooled from the elevated temperature $T_0+dT$ until it is clamped at the lower ambient temperature $T_0$. Thermomechanical work is performed by the working substance during adiabatic expansion A→B. By comparison, the power stroke of the quantum thermodynamic cycle in FIG. 23 is the adiabatic mixing A→B of the mobile-hole working substance under spontaneous cooling. During adiabatic mixing A→B per FIG. 23, there exists a change in Seebeck coefficient (entropy per unit charge) due to a change in the entropy of mixing.

The Seebeck coefficient $\alpha_{mix}$ due to a change in the entropy of mixing $S_{mix}$ ranges from zero for $B_{13}C_2$ to 105 µV/K for $B_{12.15}C_{2.85}$ over the compositional range $0.15 \leq x \leq 1.7$ of single-phase boron carbide $B_{12+x}C_{3-x}$. Although the generation of an electromotive force by the phonovoltaic cell 400 shown in FIG. 21 is due to a difference in the Seebeck coefficients of conjoined regions, it is impossible for this to be realized by conjoined compositions of boron carbide. This is due to the fact that the icosahedral symmetry breaking in boron carbide, per the Jahn-Teller theorem, eliminates the ability to sustain the difference in the entropy of mixing between conjoined boron carbide regions while continuously delivering electrical energy upon demand to an impressed load. This can be remedied by the conjoined silaborane p-$(B_{12}H_4)_3Si_5$ regions 401 and oxysilaborane p-$(B_{12}{}^{2-}H_4)_2Si_4O_2{}^{2+}$ regions 402 in the phonovoltaic cell 400 shown in FIG. 21, as will be now explained.

At the initial state A in FIG. 23, each softening bipolaronic hole-pair within the picocrystalline silaborane p-$(B_{12}H_4)_3Si_5$ anode region 401 comprises an electric charge $2e^+$ and a vibrational energy $U(T_0)=3kT_0$ (since $h\nu_n^k \ll kT_0$). At the initial state A, each softening bipolaronic electron-pair within the picocrystalline silaborane p-$(B_{12}H_4)_3Si_5$ anode region 401 comprises an electric charge $2e^-$ and a vibrational energy $U(T_0)=3kT_0$ (since $h\nu_n^k \ll kT_0$). During adiabatic mixing A→B, bipolaronic hole-pairs diffuse upon their own from the picocrystalline silaborane p-$(B_{12}H_4)_3Si_5$ anode region 401 into the conjoined picocrystalline oxysilaborane p-$(B_{12}{}^{2-}H_4)_2Si_4O_2{}^{2+}$ cathode region 402, under low-level ejection whereby the concentration of diffused bipolaronic hole-pairs is well below the concentration $p_0$.

The injected bipolaronic hole-pairs $2e^+$ under adiabatic mixing A→B into the picocrystalline oxysilaborane p-$(B_{12}{}^{2-}H_4)_2Si_4O_2{}^{2+}$ region 402 diffuse to the conjoined metallic electrode 403, whereupon they are collected. At the same time, bipolaronic electron-pairs $2e^-$ diffuse on their own accord from the picocrystalline silaborane p-$(B_{12}H_4)_3Si_5$ anode region 401 into the conjoined metal electrode 403, whereupon they are collected. In this manner, a transient current flows, in the positive sense, from the anode electrode 403 to the cathode electrode 403 during adiabatic mixing A→B in the phonovoltaic cell 400 shown in FIG. 21. Under low-level ejection, the bipolaronic electron-hole concentration in the picocrystalline silaborane p-$(B_{12}H_4)_3Si_5$ anode region 401 at B remains $p_0$ while the temperature is decreased during adiabatic mixing A→B from $T_0$ at A to $T_0-dT$ at B in FIG. 23.

Any such decrease in temperature during adiabatic mixing A→B can only be sustained if the irreversible increase in the entropy of mixing $S_{mix}$ during adiabatic mixing A→B is complemented by an irreversible increase in some other type of entropy in the irreversible quantum thermodynamic cycle in FIG. 23. By so doing, fundamental limitations of the Carnot cycle in FIG. 22 can be remedied. Rudolf Clausius introduced entropy into physics in his 1865 paper entitled "On Different Forms of the Fundamental Equations of the Mechanical Theory of Heat and Their Convenience for Application," in *The Second Law of Thermodynamics*, edited by J. Kestin, Dowden, Hutchinson & Ross, 1976, p. 162. This paper will be referred to as Clausius (1865). Clausius (1865) introduced the word "entropy" as the transliteration of the Greek word ἐντροπή that means "a turning towards."

Although not explicitly employed as such by Clausius (1865), a path-independent exact infinitesimal variation is denoted herein by d while any path-dependent inexact infinitesimal variation is denoted herein by $\dbar$. The distinction between these two infinitesimal variations bears on the general statement of the second law of thermodynamics. Equation (2) in Clausius (1865) is expressed as:

$$\Delta S = \oint \frac{\dbar Q}{T} \geq 0 \qquad (1)$$

It warrants emphasizing that Clausius (1865) denoted the numerator of the integrand as dQ—even though he recognized the integrand as being path-dependent. The direction of the inequality in Eq. (1) is due to the fact that $\dbar Q$ is defined to be the path-dependent infinitesimal heat extracted by the working substance. The inequality is reversed if $\dbar Q$ is defined in terms of heat emitted by the working substance. As appreciated by Clausius (1865), the inequality denotes irreversibility: "Here the equality sign is to be used when all the changes making up the cyclic process are reversible. If the changes are not reversible, the inequality sign prevails." Clausius (1865) provided for an irreversible cycle: "If now the body has suffered a change or a series of changes that do not form a cyclic process but in which a final state is reached that differs from the initial state, we can make a cyclic process out of this series of changes if we introduce additional changes of such a character that they enable the body to proceed from this final state back to the initial state." As will be described, the quantum thermodynamic cycle of the phonovoltaic cell 400 in FIG. 23 constitutes an irreversible cycle subject to:

$$\Delta S = \oint \frac{\dbar Q}{T} > 0 \qquad (58)$$

The intraicosahedral electron energy conditions within the conjoined picocrystalline silaborane p-$(B_{12}H_4)_3Si_5$ anode region 401 in the phonovoltaic cell 400 at the initial state A in FIG. 23 are shown in FIGS. 24A-B. A bipolaronic hole-pair $2e^+$ in the ionized artificial nucleus 104 is due to the missing electron-pair in the $|-3p_{1/2}{}^0\rangle$ eigenstate shown in FIG. 24B. These missing valence electrons hop into a neighboring artificial nucleus 104 so as to result in a bipolaronic electron-pair $2e^-$ in the disentangled eigenstate $|-2sp_{1/2}{}^2\rangle \rightarrow |-2s_{1/2}{}^2\rangle + |-2p_{1/2}{}^2\rangle$ portrayed in FIG. 24A. The existence of a bipolaronic electron-pair $2e^-$ within the $|-2p_{1/2}{}^2\rangle$ eigenstate in FIG. 24A and a complementary bipolaronic hole-pair $2e^+$ within the $|-3p_{1/2}{}^0\rangle$ eigenstate in FIG. 24B is due to an ionic disproportionation.

Figures 25A, 25B, 25C, 25D:
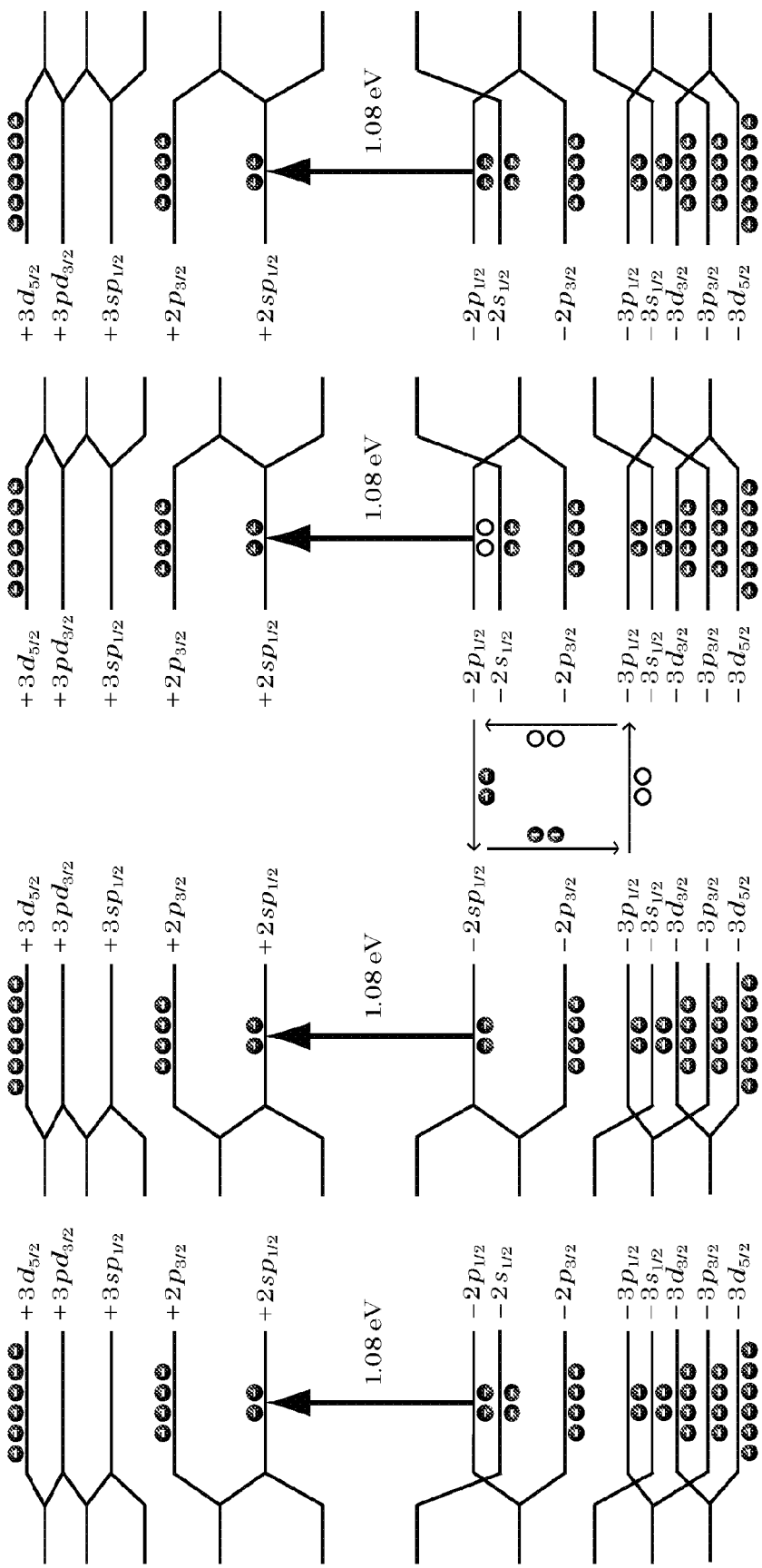
FIGS. 25A-D depict a proposed spontaneous mobile charge diffusion.

As described hereinabove, disproportionation results in a trace concentration of $\sim 10^{18}$ cm$^{-3}$ bipolaronic electron-hole pairs distributed amongst the $\sim 10^{22}$ cm$^{-3}$ neutral artificial nuclei 104 comprising the picocrystalline silaborane p-$(B_{12}H_4)_3Si_5$ anode region 401 of each p-isotype rectifier 404 of the phonovoltaic cell 400. As shown in FIGS. 24C-D, no bipolaronic holes ideally exist in the picocrystalline oxysilaborane p-$(B_{12}{}^{2-}H_4)_2Si_4O_2{}^{2+}$ cathode region 402 in the phonovoltaic cell 400 at the initial state A in FIG. 23. Charge neutrality exists in both the picocrystalline silaborane p-$(B_{12}H_4)_3Si_5$ anode region 401 per FIGS. 24A-B as well as the picocrystalline oxysilaborane p-$(B_{12}{}^{2-}H_4)_2Si_4O_2{}^{2+}$ cathode region 402 shown per FIGS. 24C-D. During adiabatic mixing A→B, bipolaronic hole-pairs diffuse from picocrystalline silaborane p-$(B_{12}H_4)_3Si_5$ anode regions 401 into the picocrystalline oxysilaborane p-$(B_{12}{}^{2-}H_4)_2Si_4O_2{}^{2+}$ cathode regions 402 per FIGS. 25B-C.

Bipolaronic hole-pairs injected into the picocrystalline oxysilaborane p-$(B_{12}{}^{2-}H_4)_2Si_4O_2{}^{2+}$ cathode region 402 hop towards the metallic electrode 403 contacting said cathode region 402 per FIGS. 26C-D. At the conclusion of adiabatic mixing A→B, mobile bipolaronic hole-pairs $2e^+$ hopping in the picocrystalline oxysilaborane p-$(B_{12}{}^{2-}H_4)_2Si_4O_2{}^{2+}$ cathode region 402 are then collected by the metallic electrode 403 contacting said cathode region 402. Also at the same conclusion of adiabatic mixing A→B in FIG. 23, mobile bipolaronic electron-pairs $2e^-$ hopping in the picocrystalline silaborane p-$(B_{12}H_4)_3Si_5$ anode regions 401 are collected by the metallic electrodes 403 contacting said anode regions 401. The conclusion of adiabatic mixing A→B in FIG. 23 is represented, in part, by the electron energy levels of the phonovoltaic cell 400 shown in FIGS. 27A-D.

It is to be understood that only a relatively low number of bipolaronic electron-hole pairs are collected by the anode and cathode electrodes 403 of each p-isotype rectifier 404 in FIGS. 27A-D. There still remain $\sim 10^{18}$ cm$^{-3}$ bipolaronic electron-hole pairs in the picocrystalline silaborane p-$(B_{12}H_4)_3Si_5$ anode regions 401, although not explicitly shown in FIGS. 27A-B. The bipolaronic electron-hole pair concentration is an extensive thermodynamic variable that depends on the quantity of matter. Since low-level ejection is assumed, the bipolaronic electron-hole pair concentration $p_0$ is substantially unchanged in adiabatic mixing A→B. The same cannot be said for the temperature. Since temperature is an intensive thermodynamic variable, the temperature decreases by an infinitesimal quantity dT as the result of adiabatic mixing A→B in the phonovoltaic cell 400 in FIG. 21.

The displaced bipolaronic electron-hole pairs under adiabatic mixing A→B are ionized mobile Planckian resonators comprising a pair of charges $2e^-$ or $2e^+$ and a vibrational energy $3kT_0$ (since $h\nu_n{}^k \ll kT_0$). In this manner, the energy of each mobile charge collected by the electrodes 403 is 3/2 $kT_0$ per the equipartition theorem. The loss of heat energy during adiabatic mixing A→B causes a decrease in temperature from $T_0$ at A to $T_0$-dT at B in FIG. 23. This decrease in temperature perturbs the extrinsic concentration of the ionized artificial nuclei 104 in the picocrystalline silaborane p-$(B_{12}H_4)_3Si_5$ anode regions 401 of p-isotype rectifiers 404 comprising the phonovoltaic cell 400. Since the nuclear electric quadrupole moments of the stationary natural boron nuclei 102 remain unchanged, the left side of Eq. (50) remains invariant. As the result, the decrease in temperature due to adiabatic mixing A→B manifests a localization of bipolaronic hole-pairs.

The extrinsic concentration p>$p_0$ is increased in the picocrystalline silaborane p-$(B_{12}H_4)_3Si_5$ anode region 401 during the isothermal transition B→C.

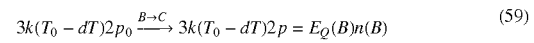
$$3k(T_0 - dT)2p_0 \xrightarrow{B \rightarrow C} 3k(T_0 - dT)2p = E_Q(B)n(B) \qquad (59)$$

Under the isothermal phase transition B→C, the extrinsic hole-pair concentration p>$p_0$ of the bipolaronic hole-pairs increases in the picocrystalline silaborane p-$(B_{12}H_4)_3Si_5$ anode region 401. This constitutes the quantum phase transition between a quantum thermalization and quantum localization whereby the entropy of transition $S_{trans}$ is decreased. Entropy can decrease if, and only if, said entropy decrease is exactly compensated by an entropy increase elsewhere.

The decrease in the entropy of transition $S_{trans}$ under the isothermal phase transition B→C in FIG. 23 involves a latent heat exchange. In the classical case of the Carnot cycle per FIG. 22, a latent heat $-đQ_{B \rightarrow C}$ is discharged into the ambient during isothermal compression B→C. No latent heat discharge exists in the phonovoltaic cell 400 during the isothermal phase transition B→C. It is here that quantum thermodynamics differs from classical thermodynamics in a fundamental way. As previously discussed, entanglement fundamentally distinguishes quantum mechanics from classical mechanics. As further discussed hereinabove, the icosahedral symmetry operations maximize the entanglement of the atomic orbitals $\psi_i(p_{\{111\}})$ so as to result in intraicosahedral antibonding and bonding electron energy levels obeying Dirac's relativistic energy eigenvalues in Eqs. (23a-b).

Due to said entanglement, the electronic orbital degeneracies of the artificial nuclei 104 are lifted by a spin-orbit coupling in lieu of a Jahn-Teller distortion. It is by this means that the picocrystalline oxysilaboranes of the present invention are distinguished from all other icosahedral boron-rich solids. That is to say, the icosahedral symmetry is broken by Jahn-Teller distortion in all known icosahedral boron-rich solids in the prior art. For present purposes, it is sufficient that any lowering of the temperature of picocrystalline silaborane p-$(B_{12}H_4)_3Si_5$ necessarily results in an increase in the entropy of entanglement $S_{ent}$ such that electrons are excited from the condition in FIG. 27B into the condition shown in FIG. 28B by an extraction of latent heat. The increase in the entropy of entanglement $S_{ent}$ exactly compensates the decrease in the entropy of transition $S_{trans}$.

Figures 28A, 28B, 28C, 28D:
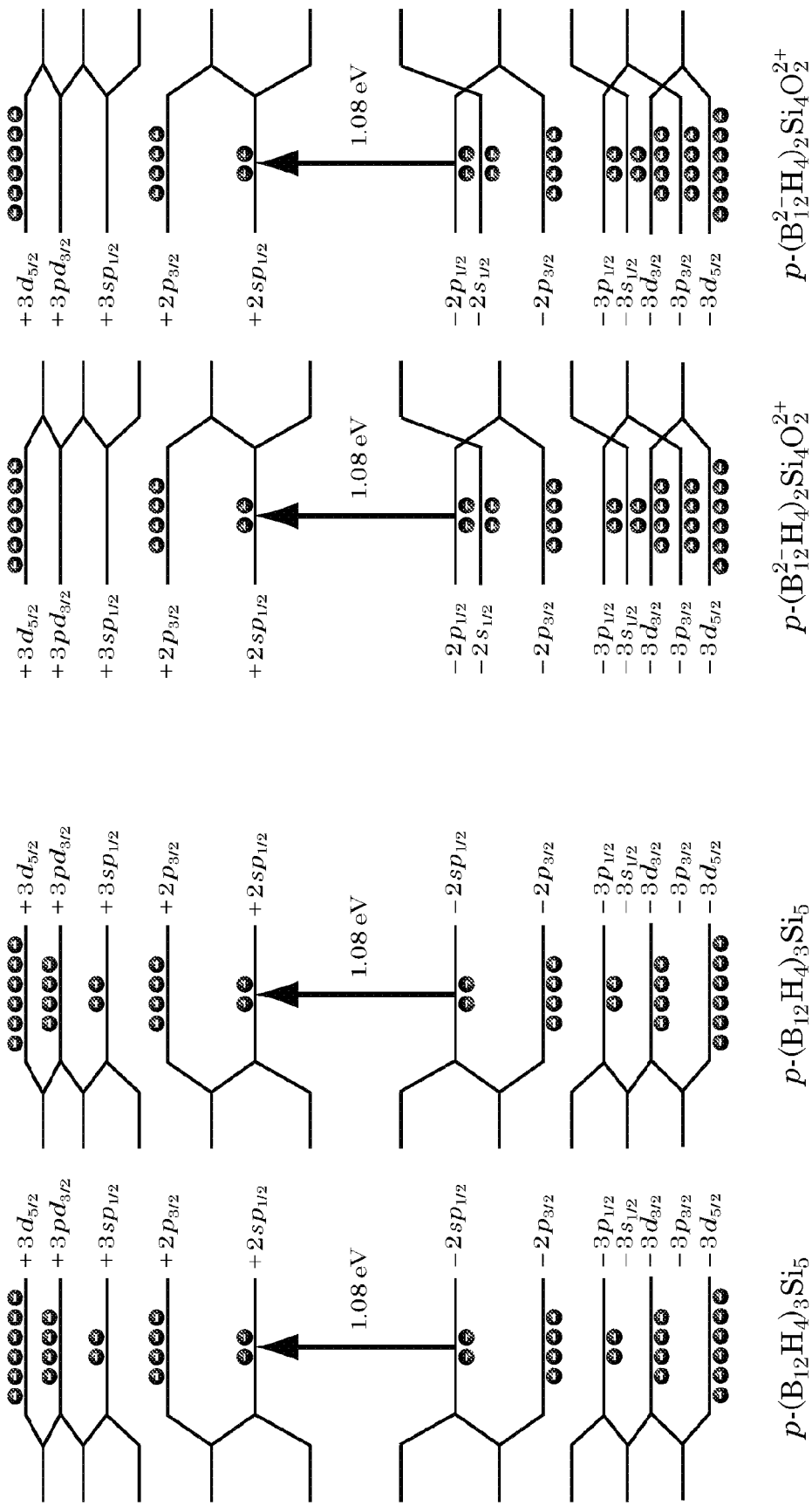
FIGS. 28A-D depict a proposed spectral induction of valence electrons from intraicosahedral bonding suborbitals into intraicosahedral antibonding suborbitals in a picocrystalline silaborane p-$(B_{12}H_4)_3Si_5$ region.

The extracted latent heat in the isothermal phase transition B→C is physically transformed into stored electrical energy by virtue of the excitation of valence electrons in FIG. 28B. The physical means by which this is accomplished will be described hereinbelow. For present purposes, it suffices that—unlike the Carnot cycle—no latent heat is discharged into the ambient during the isothermal phase transition B→C. Quantum localization is a dominant phenomenon due to the physical nature of quantum entanglement. The extrinsic bipolaronic electron-hole pair concentration p>$p_0$ is increased within the picocrystalline silaborane p-$(B_{12}H_4)_3Si_5$ anode regions 401 due to an increased quantum localization under the isothermal phase transition B→C. When the bipolaronic electron-hole pairs are sufficiently localized, the nuclear electric quadrupole moments of the boron nuclei 102 cause a self-thermalization C→D of localized bipolaronic electron-hole pairs.

Figures 29A, 29B, 29C, 29D:
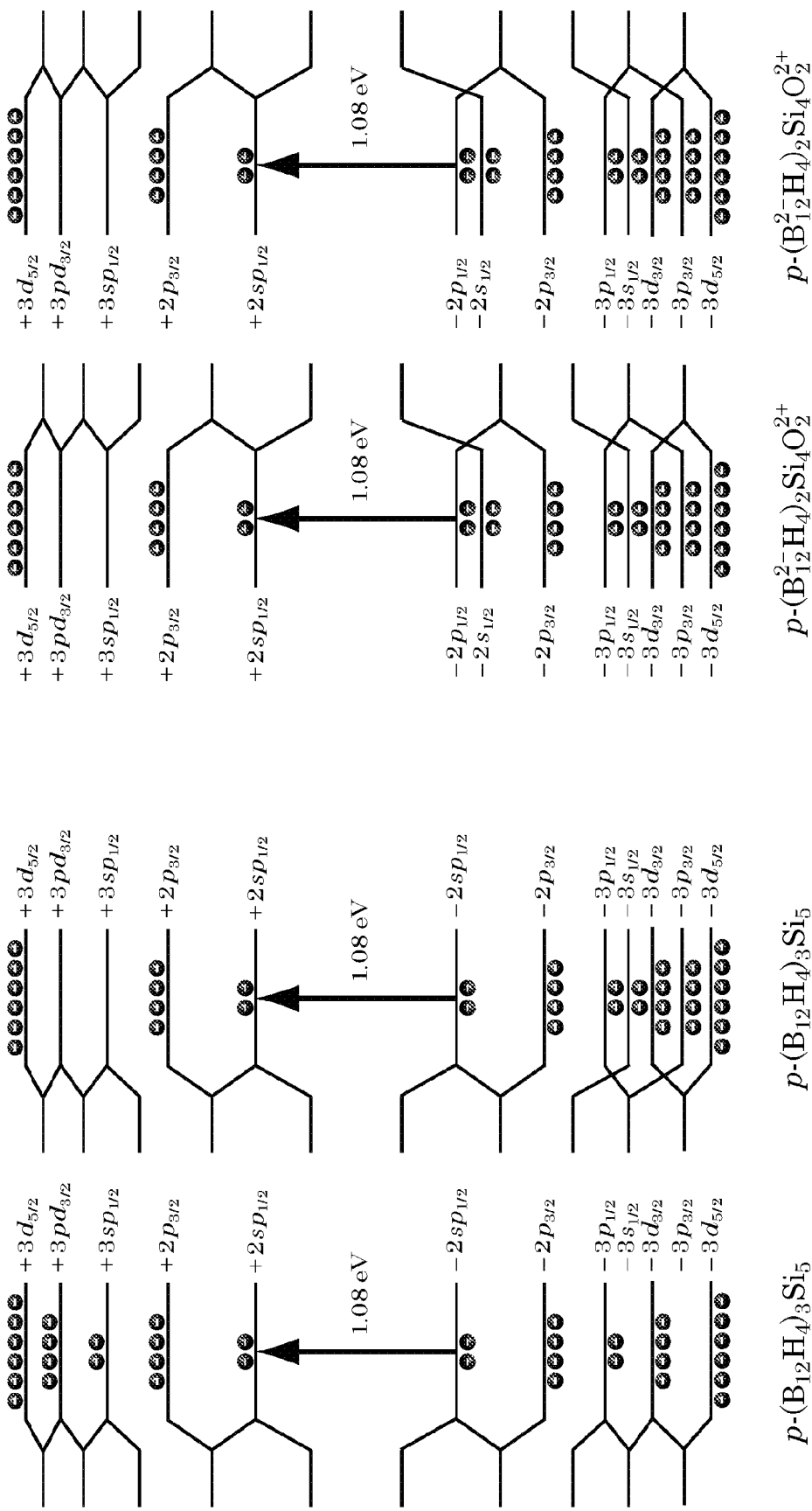
FIGS. 29A-D depict a proposed self-thermalization of valence electrons in a picocrystalline silaborane p-$(B_{12}H_4)_3$ $Si_5$ region due to the nuclear electric quadrupole moment of the natural boron atoms.

Said self-thermalization is shown in FIG. 29B. The energy released, when electrons fall from the entangled intraicosahedral antibonding suborbitals into the disentangled bonding suborbitals, increases the temperature of localized neutral artificial nuclei 104 in FIG. 29B. This increased temperature, due to the self-thermalization C→D, is clamped at the ambient temperature $T_0$. Under self-thermalization C→D, the self-thermalized neutral artificial nuclei 104 undergo an ionized disproportionation in the manner represented in FIGS. 30A-B. The resultant bipolaronic hole-pair concentration $p>p_0$ remains localized during the adiabatic self-thermalization C→D per FIG. 23. The quantum phase transition is then induced by the nuclear electric quadrupole moments of the boron nuclei 102.

As the result, an isothermal phase transition D→A causes a decrease in the bipolaronic hole-pair concentration p within the picocrystalline silaborane p-$(B_{12}H_4)_3Si_5$ anode regions 401 in the phonovoltaic cell 400 in accordance with:

$$3kT_0(2p) \xrightarrow{D \to A} 3kT_0(2p_0) = E_Q(B)n(B) \qquad (60)$$

The isothermal phase transition D→A in FIG. 23 is associated with an uncompensated increase in the entropy of transition $S_{trans}$ from the localized state at D to the original thermalized state at A in FIG. 23 per FIGS. 24A-B. The isothermal phase transition D→A constitutes an uncompensated increase in the entropy of transition $S_{trans}$, since the entropy of entanglement $S_{ent}$ of the artificial nuclei 104 can never decrease on its own accord. The decrease in the entropy of entanglement $S_{ent}$ associated with a disentanglement of intraicosahedral energy levels is due to the nuclear electric quadrupole moments of the boron nuclei 102 during the adiabatic self-thermalization C→D represented in FIG. 23.

The isothermal phase transition D→A necessarily extracts the latent heat $T_0 \, dS_{trans}$ from the ambient. The extraction of latent heat $T_0 \, dS_{trans}$ during the isothermal phase transition D→A of the phonovoltaic cell 400 constitutes the entropy equilibration originally conceived, but never physically implemented, by Gibbs (1873). As a result of an entropy equilibration during the isothermal phase transition D→A, the extracted latent heat $T_0 \, dS_{trans}$ from the ambient is directly transformed into a decrease in Gibbs free energy of mixing $-dG_{mix}$ during A→B.

$$T_0 \, dS_{trans} = -dT \, dS_{mix} = -dG_{mix} \qquad (61)$$

Since the Seebeck coefficient constitutes the entropy per unit electric charge, the above relation can be expressed in terms of the Seebeck coefficient.

$$T_0 \, dS_{trans} = -edT \, d\alpha_{mix} = -dG_{mix} = eV_{out} \qquad (62)$$

This relation supports a complementary Seebeck effect described by:

$$V_{out} = T_0 \, d\alpha_{trans} \qquad (63)$$

Figure 31:
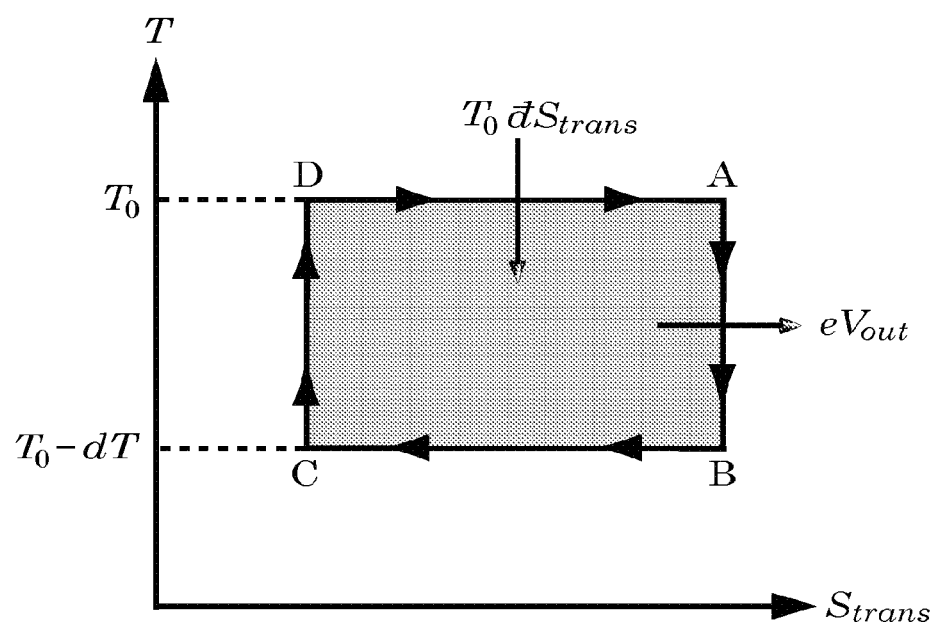
FIG. 31 is an illustration of a proposed quantum thermodynamic cycle.

The quantum thermodynamic cycle in FIG. 23 is modified in FIG. 31 in order to describe the phonovoltaic cell 400 in FIG. 21. Whereas the reversible Carnot cycle in FIG. 22 transforms the net consumed latent heat $dQ_{D \to A} - dQ_{B \to C}$ into thermomechanical work $-dW$ associated with the adiabatic expansion A→B of an ideal gas working substance, the irreversible quantum thermodynamic cycle per FIG. 31 transforms the extracted latent heat $eT_0 \, d\alpha_{trans}$ into an electromotive force $eV_{out}$ associated with the adiabatic mixing A→B of a unique electric charge working substance. It is extremely important that: The output voltage $V_{out}$ of the phonovoltaic cell 400 in FIG. 21 is due to the isothermal extraction of latent heat $eT_0 \, d\alpha_{trans}$ from the ambient without the need for a second heat reservoir.

Whereas a Carnot engine constitutes a reversible thermomechanical engine that operates between two heat reservoirs of different temperatures, the phonovoltaic cell 400 in FIG. 21 is an irreversible thermoelectric engine operating in thermal equilibrium with the ambient heat reservoir, without the requirement of a second heat reservoir at a different temperature. The phonovoltaic cell 400 in FIG. 21 remedies fundamental limitations of all heat engines in the prior art.

First, and foremost, the phonovoltaic cell 400 eliminates the need to generate a high-temperature heat reservoir by means of combustion or any other process using a depletable energy source. The energy source of the phonovoltaic cell 400 in FIG. 21 is latent entropy in the biosphere. An engine performing work upon demand necessarily increases the entropy of the biosphere by virtue of said work. The thermoelectric work $eV_{out}$ delivered by the phonovoltaic cell 400 to an electrical load is directly transformed from an entropy reduction of the ambient, as originally conceived by Gibbs (1873), such that there is no net entropy change in the biosphere by virtue of the performance of work upon demand. That is to say, the entropy decrease of the biosphere due to the operation of the phonovoltaic cell 400 is compensated by the entropy increase of the biosphere associated with the work done upon demand by an impressed electrical load.

Figure 32:
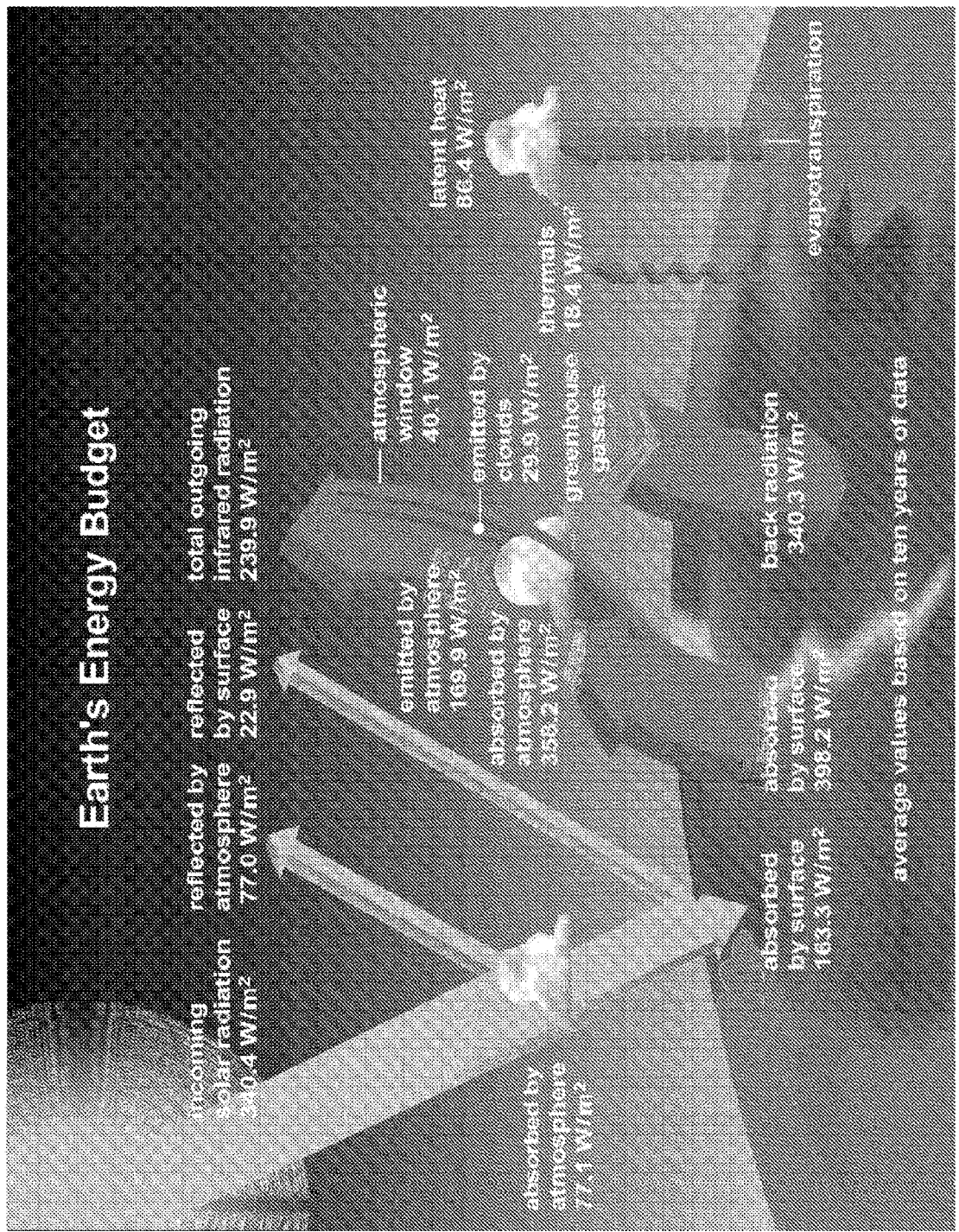
FIG. 32 is an illustration of the Earth's energy budget.

The profound novelty and utility of the embodiments of this present invention can be framed in terms of the Earth's energy budget in FIG. 32, which was prepared by NASA by means of actual data averaged over a ten year period. The solar radiation impinging upon Earth's atmosphere is emitted from the Sun's photosphere, which is at an effective temperature of 5,777° K that corresponds to a radiation frequency of 120 THz. The infrared radiation emitted by the Earth at 300° K is at a frequency of 6.2 THz. The irradiance of the back radiation from the atmosphere in FIG. 32 is 340 W/m² (or, also, 34 mW/cm²). The Earth's energy budget can be framed by means of Planck's blackbody radiation law in Eq. (16).

$$u(v, T)dv = \frac{8\pi v^2}{c^3} \frac{hv}{e^{hv/kT} - 1} dv \qquad (16)$$

Figure 33:
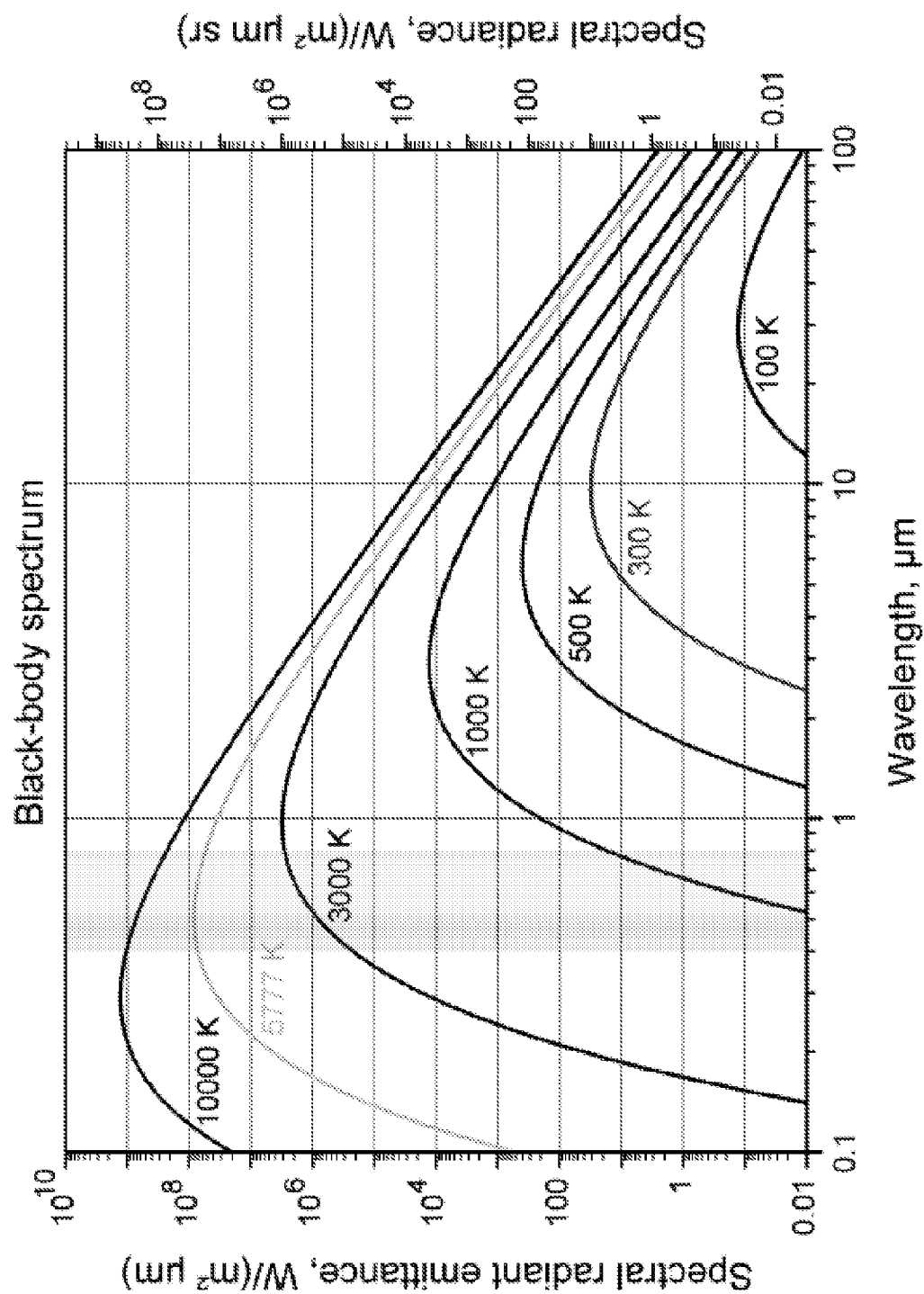
FIG. 33 is an illustration of the spectral radiance of a blackbody.

Planck's blackbody radiation law in Eq. (16) completely describes the spectral radiance emitted by a blackbody radiator in thermal equilibrium at any given temperature. A plot of various spectral radiance curves subject to Planck's blackbody radiation law for various radiator temperatures is provided in FIG. 33. The integral of each spectral radiance curve over all wavelengths and the entire solid angle results in the power flux density |E×H| known as the irradiance. The irradiance of blackbody radiation is a function of only the radiator temperature. To a first order approximation, the Earth's surface can be treated as a blackbody in thermal equilibrium with the atmosphere at a temperature $T_0$=300° K and an irradiance of |E×H|=34 mW/cm². Wien's spectral displacement law supports the relation in Eq. (32), which can be applied to the Earth's surface at $T_0=300°$ K.

$$\hbar v' = \hbar v \left[1 + 2\frac{\dot{s}}{c}\cos\theta\right] \quad |E \times H|_{v'} = |E \times H|_v = 34\,\text{mW/cm}^2 \quad (64)$$

Wien's spectral displacement law provides for work being done on, or by, radiation at a constant irradiance $|E \times H|=34$ mW/cm$^2$ that corresponds to the radiator temperature. The frequency of the radiation of the Sun's photosphere at $T=5,777°$ K is $v'=120$ THz. By way of a comparison, the frequency of the infrared terrestrial radiation emitted by the Earth's surface at $T_0=300°$ K is $v=6.2$ THz. Assuming the Earth's surface to be in thermal equilibrium with the atmosphere at $T_0=300°$ K, the 120 THz solar radiation impinging upon the Earth's surface and the 6.2 THz terrestrial radiation emitted by Earth's surface occur at a constant irradiance $|E \times H|=34$ mW/cm$^2$ per Eq. (64). The energy of a photon at 120 THz is 0.50 eV while the energy of a photon at 6.2 THz is 25.9 meV.

The energy budget of Earth's biosphere can be viewed as the energy difference between the incoming solar radiation and the outgoing terrestrial radiation at a constant irradiance $|E \times H|=34$ mW/cm$^2$. Although this energy budget of Earth's biosphere is cursory, it is useful in describing the novelty and utility of preferred embodiments of the present invention. The work done upon demand by thermomechanical engines, necessarily limited in efficiency by the Carnot cycle, discharges latent heat into the biosphere, so as to thereby increase the entropy of the biosphere. This results from the fact that the Carnot heat engine is the only reversible thermomechanical engine that operates between two heat reservoirs at different temperatures. All other thermomechanical engines are irreversible heat engines with a lower efficiency than the Carnot heat engine.

The Carnot heat engine extracts latent heat from a high-temperature heat reservoir and discharges some lesser latent heat into a low-temperature heat reservoir associated with the biosphere. Due to the reversibility of a Carnot heat engine, the entropy associated with the discharged latent heat is the same as that associated with the extracted latent heat. The ability of the Carnot heat engine to perform thermomechanical work upon demand is due to the spontaneity of the irreversible exothermic chemical reaction (typically combustion) that generates the high-temperature heat reservoir. Combustion perturbs the biosphere by the discharge of heat energy into the atmosphere and, moreover, by the discharge of chemical by-products deleteriously perturbing the atmosphere. The performance of work by thermomechanical engines increases the entropy of the biosphere.

The tipping point, due to thermomechanical engines, of an unnatural uncompensated increase in entropy of the biosphere, in regard to climate change, is argumentative at present. It is irrefutable, however, that the widespread proliferation of thermomechanical engines deleteriously perturbs the biosphere due to an ever-increasing entropy. The only means to remedy the deleterious increase in the entropy of the biosphere, by the performance of work upon demand, is the exploitation of the entropy equilibration conceived by Gibbs (1873): "It is required to find the greatest amount by which it is possible under these conditions to diminish the entropy of an <u>external</u> system. This will be, evidently, the amount by which the entropy of the body can be increased without changing the energy of the body or increasing its volume." This is the Gibbs free entropy.

There does not exist any known way in the prior art to increase the entropy of a body without varying the energy of the body or increasing its volume. This deficiency is remedied by preferred embodiments of the present invention by exploiting Kirchhoff's blackbody in a way not known in the prior art. Although a description of radiation emitted by Kirchhoff's blackbody is accurately provided by Planck's law of blackbody radiation, the physical basis of the Planckian resonator that emits said radiation remains unknown in the prior art. It is known in the prior art that radiation can generate an electromotive force in a photovoltaic cell that escapes limitations imposed by the Carnot cycle. The radiative generation of mobile electron-hole pairs is limited by the solar irradiance, such that the power density of a photovoltaic cell is way too small for direct energy conversion.

The low power density of all known forms of renewable energy in the prior art is remedied by a novel and useful exploitation of the vibrational energy of the Planckian resonators of the artificial nuclei 104 in the phonovoltaic cell 400 in FIG. 21. An uncompensated increase in the entanglement entropy $S_{ent}$ during the isothermal phase transition B→C in the phonovoltaic cell 400 is responsible for a decrease in the entropy of the ambient, as prophesized by Gibbs (1873). The only way to perform work on demand in harmony with Earth's energy budget in FIG. 32 is to cause a decrease in the entropy of the biosphere that is compensated by the entropy increase associated with the work performed upon demand. The uniqueness of the phonovoltaic cell 400 in FIG. 21 is the performance of work on demand by an induced decrease in entropy of the biosphere, as will be discussed.

The invention involves a new type of solid-state composition of matter derived from the heating of boron and silicon hydrides in the presence of hydrogen and, optionally, an oxidizing chemical agent. The compositional range of materials hereinafter referred to as "picocrystalline oxysilaboranes" and represented by the formula "$(B_{12}H_4)_xSi_yO_z$" and comprise $(B_{12}H_4)_4Si_4$ and $(B_{12}{}^{2-}H_4)_2Si_4O_2{}^{2+}$ respectively at the extremes, with x, y, and z being numbers in the respective ranges: $2 \leq x \leq 4$, $3 \leq y \leq 5$ and $0 \leq z \leq 2$. Picocrystalline oxysilaborane $(B_{12}H_4)_xSi_yO_z$ is contained in a broader compositional range of solid-state materials hereinafter referred to as "oxysilaborane" and represented by "$(B_{12}H_w)_xSi_yO_z$", with w, x, y, and z being numbers in the respective ranges: $3 \leq w \leq 5$, $2 \leq x \leq 4$, $3 \leq y \leq 5$ and $0 \leq z \leq 3$. These novel compositions can be described as "boranes" because of the hydrogen content.

Figure 34:
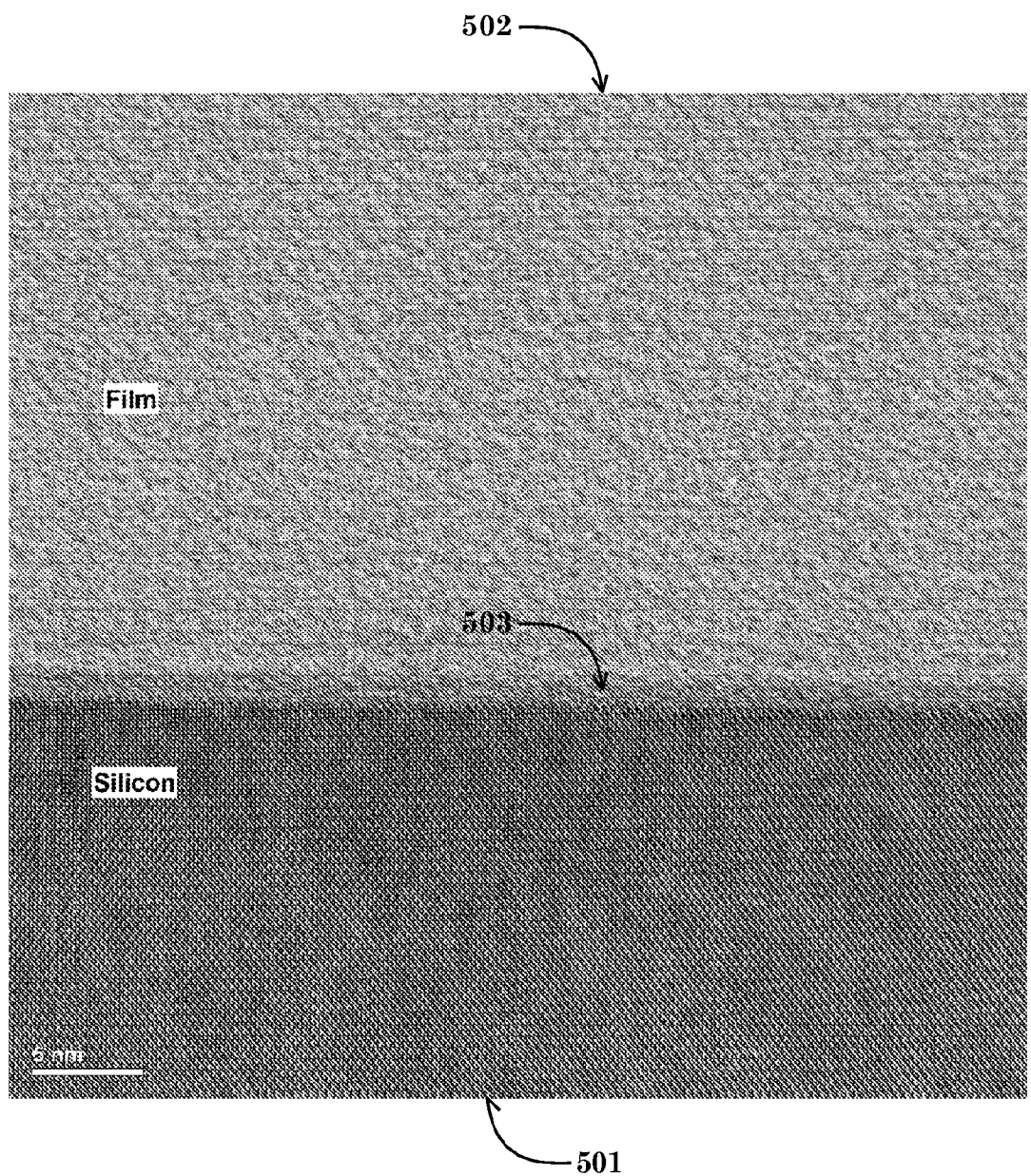
FIG. 34 is a micrograph obtain by high-resolution transmission microscopy (HRTEM) of a picocrystalline borane solid deposited on monocrystalline silicon.
Figure 35:
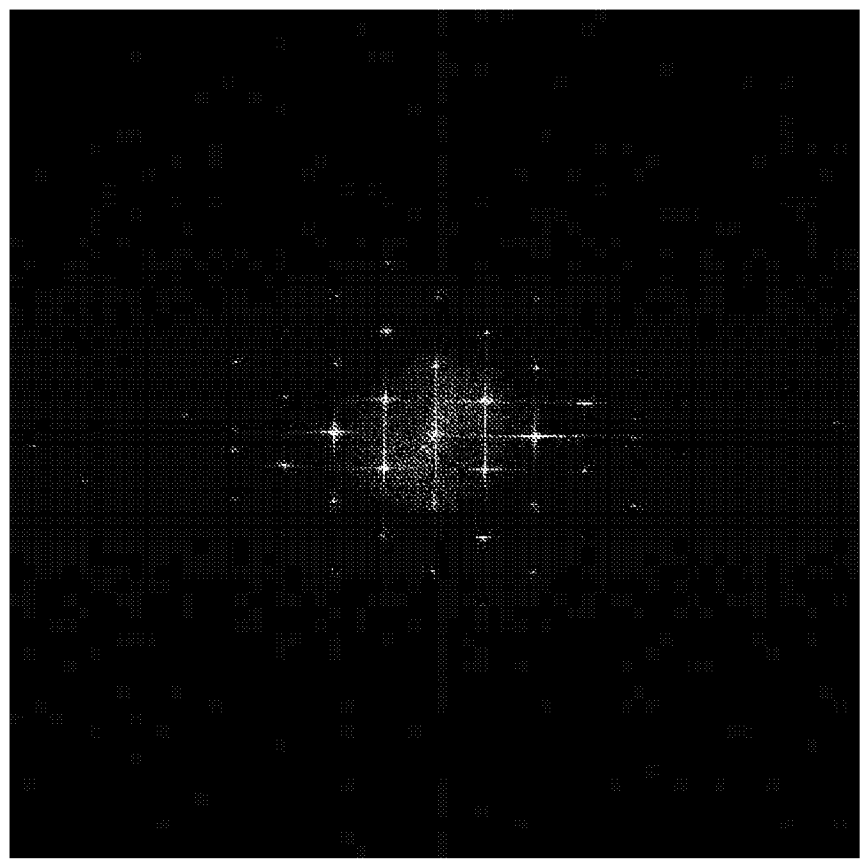
FIG. 35 is an HRTEM fast Fourier transform (FFT) image of the monocrystalline silicon substrate.
Figure 36:
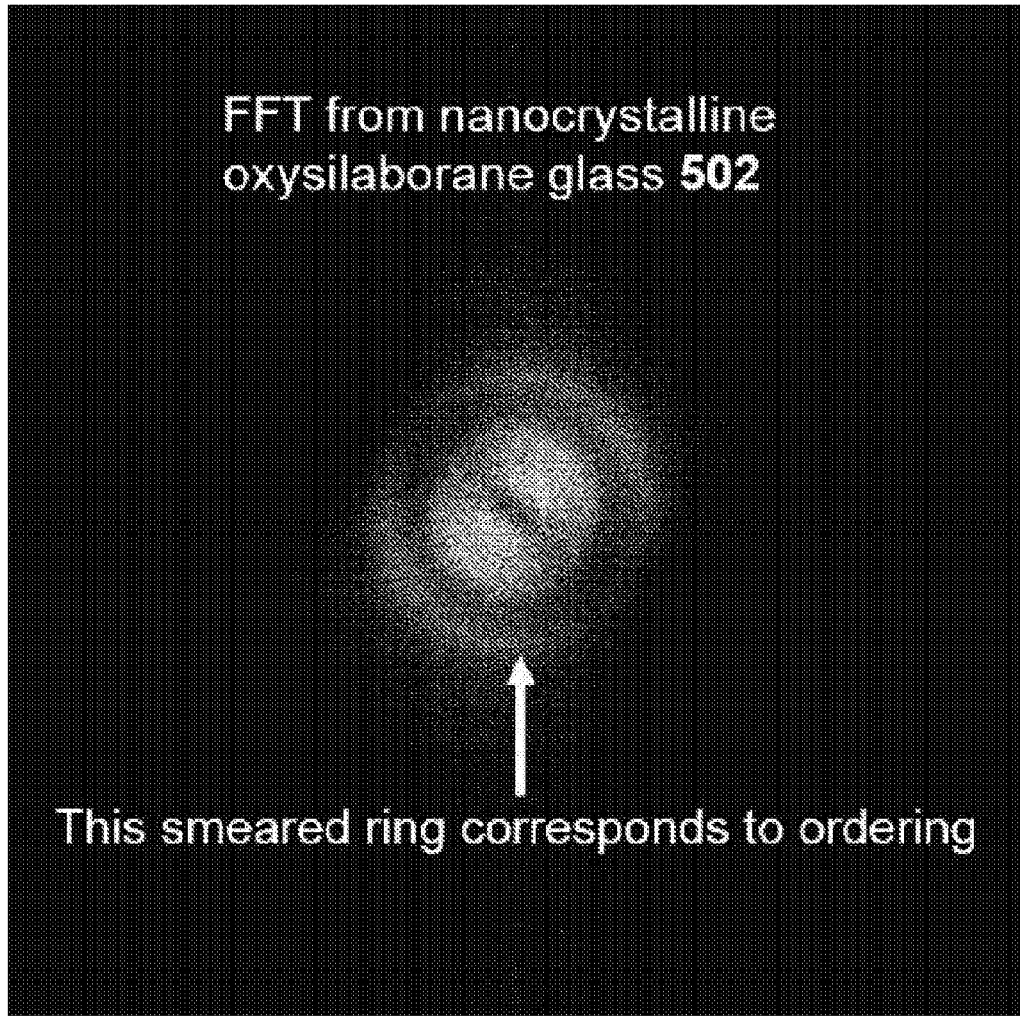
FIG. 36 is an FFT image of the picocrystalline borane solid.

FIG. 34 shows a micrograph obtained by high-resolution transmission electron microscopy (HRTEM) of picocrystalline oxysilaborane 502 deposited on a monocrystalline (001) silicon substrate 501. The interfacial layer 503 is due to specific deposition conditions, as will be explained later hereinbelow. An HRTEM fast Fourier transform (FFT) image of the monocrystalline silicon substrate 501 is shown in FIG. 35. An FFT image of the picocrystalline oxysilaborane film 502 is shown in FIG. 36. Whereas the FFT image of the silicon substrate 501 in FIG. 35 is typical of a monocrystalline lattice with a long-range periodic translational order, the FFT image of the picocrystalline oxysilaborane film 502 in FIG. 36 exhibits a short-range order that is not characteristic of a monocrystalline lattice or an amorphous glass—for reasons affecting embodiments of this invention.

Figure 37:
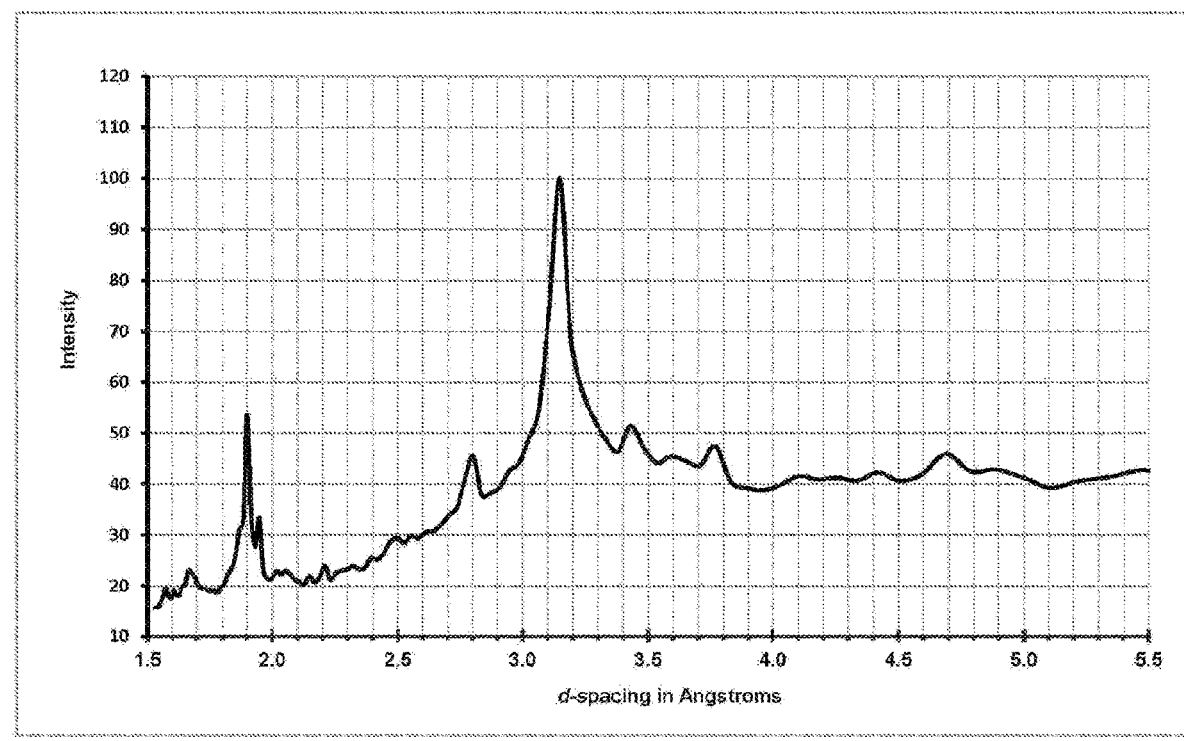
FIG. 37 is a graph in terms of interplanar lattice d-spacings of the HRTEM diffraction intensity of the monocrystalline substrate.

In order to better understand the short-range order of picocrystalline oxysilaborane 502, the HRTEM diffraction intensity of the monocrystalline silicon substrate 501 is graphed in FIG. 37 in terms of the interplanar lattice d-spacings between parallel Bragg planes of atoms supporting a constructive electron wave interference. The highest-intensity peak shown in FIG. 37 is associated with the interplanar lattice d-spacing of 3.135 Å between parallel {111} planes of atoms in the monocrystalline silicon substrate 501. The other high-intensity peak in FIG. 37 is associated with an interplanar d-spacing of 1.920 Å between parallel {220} planes of atoms in the monocrystalline silicon substrate 501. No singular high-intensity peak exists in the FFT diffraction pattern of the picocrystalline oxysilaborane film 502 shown in FIG. 38 that was obtained by HRTEM microscopy.

Figure 38:
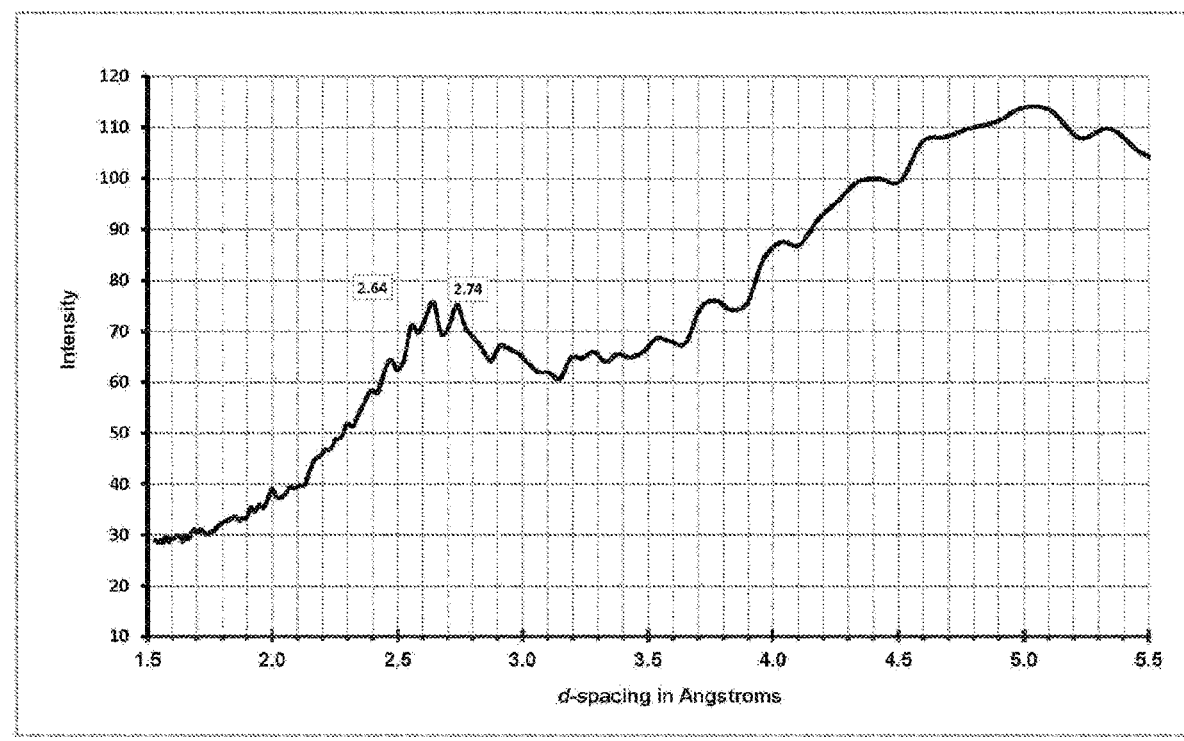
FIG. 38 is a graph in terms of interplanar lattice d-spacings of the HRTEM diffraction intensity of the picocrystalline borane solid.
Figure 39:
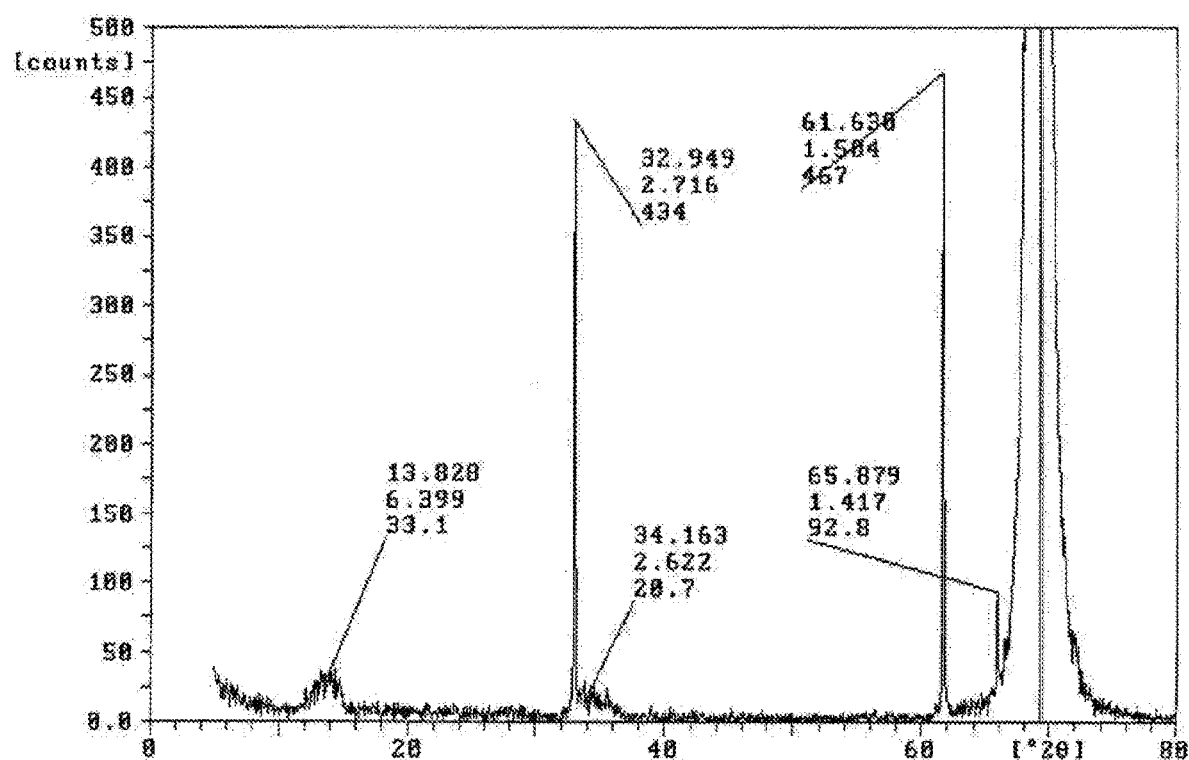
FIG. 39 is a conventional $\omega$-$2\theta$ x-ray diffraction (XRD) pattern of a self-assembled picocrystalline borane solid.

The smeared circular ring in the FFT image of the picocrystalline borane film 502 in FIG. 36 corresponds to smeared interplanar lattice spacings between d=2.64 Å and d=2.74 Å in FIG. 38. In order to more fully understand the significance of this smeared ring, it is purposeful to consider a conventional $\omega$-$2\theta$ x-ray diffraction (XRD) pattern of a thin picocrystalline borane film, as shown in FIG. 39. In a conventional $\omega$-$2\theta$ XRD diffraction pattern, the angle of incidence $\omega$ of the x-ray beam and the angle $2\theta$ of the diffracted x-ray beam are both relatively constant and collectively varied over the x-ray diffraction angle $2\theta$. By so doing, a set of regularly-spaced lattice planes results in a sharp diffraction peak. The thin picocrystalline borane film scanned in FIG. 39 was also deposited over a monocrystalline (001) silicon substrate. The high-intensity peaks in FIG. 39 are associated with x-ray diffraction from regularly-spaced silicon lattice planes.

Figure 40:
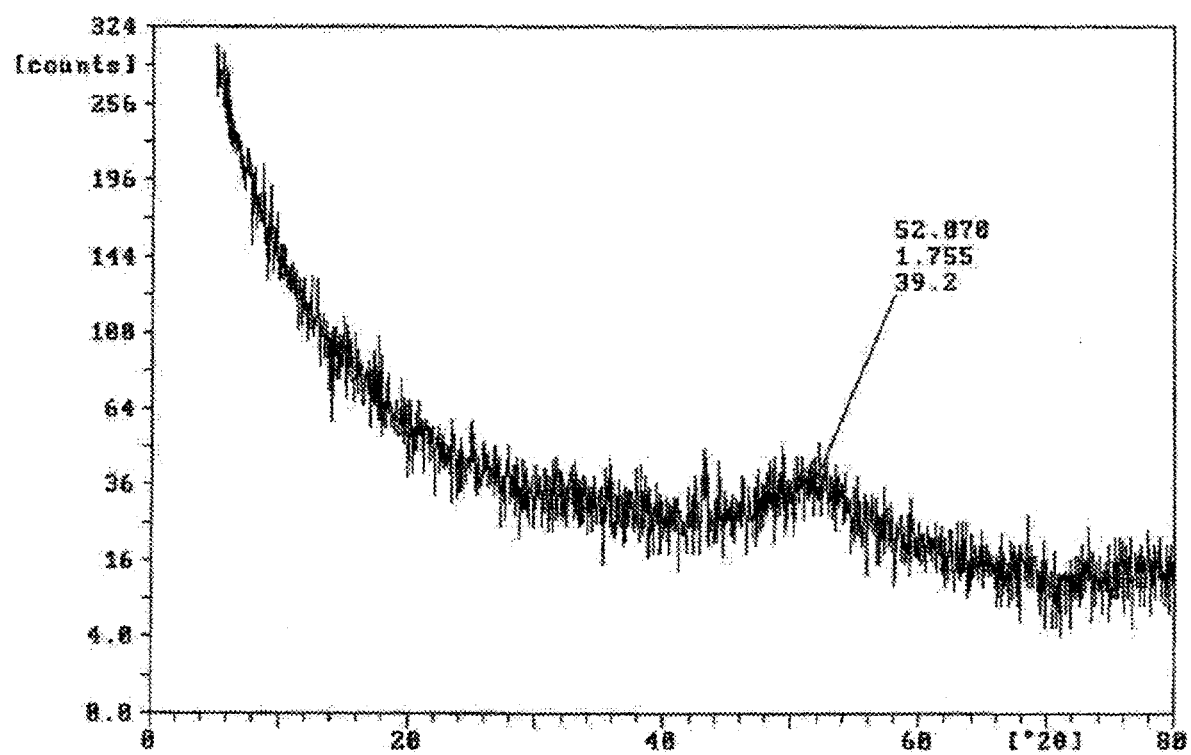
FIG. 40 is a grazing incidence x-ray diffraction (GIXRD) scan of the same self-assembled picocrystalline borane solid in FIG. 39.

There exist two smeared diffraction peaks centered near $2\theta=13.83°$ and $2\theta=34.16°$ in FIG. 39. Both of these low-intensity smeared diffraction peaks are associated with the thin picocrystalline borane film. In order to separate the diffraction peaks associated with the thin film from those associated with the substrate, grazing incidence x-ray diffraction (GIXRD) spectroscopy was utilized. This type of spectroscopy is also referred to as glancing angle x-ray diffraction. Both of the two terms will be employed interchangeably. A GIXRD scan of the same picocrystalline borane film scanned in FIG. 39 is shown in FIG. 40. For any low glancing angle $\omega$, GIXRD diffraction peaks are due to regularly-spaced lattice planes of atoms in the thin picocrystalline borane film—not the silicon substrate.

Figure 41:
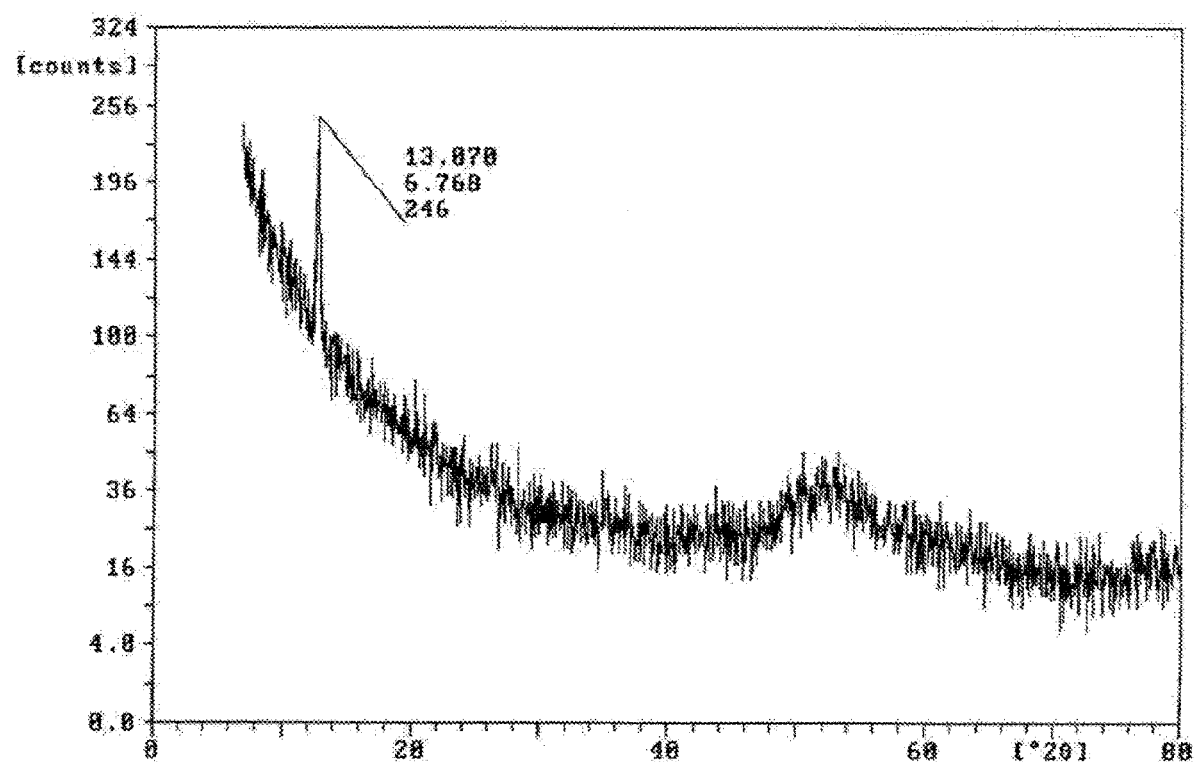
FIG. 41 is a second grazing incidence x-ray diffraction (GIXRD) scan of the same self-assembled picocrystalline borane solid scanned in FIG. 39.

The picocrystalline borane film appears to be an amorphous film in FIG. 40 except, perhaps, for a short-range order due to smeared diffraction peaks near the diffraction angle $2\theta=52.07°$. In the GIXRD scan of the picocrystalline borane film scanned in FIG. 41, the fixed angle of incidence of the x-ray beam was $\omega=6.53°$ and the x-ray detector was varied over a range of diffraction angles from $2\theta=7.0°$ to $2\theta=80°$. A sharp low-intensity x-ray peak exists at $2\theta=13.07°$ in FIG. 41. This x-ray diffraction peak corresponds to an interplanar lattice d-spacing of d=6.76 Å, which is contained in the broad range of low-intensity x-ray peaks near $2\theta=13.83°$ in FIG. 39. This x-ray diffraction peak relates to the Bragg condition of the fixed x-ray angle of incidence $\omega=6.53°$. If the fixed x-ray angle of incidence $\omega$ is changed, a different Bragg peak is obtained in correspondence to the new x-ray angle of incidence $\omega$ in some other GIXRD scan. This behavior is strange since the existence of a range of low-intensity x-ray peaks, related to the x-ray angle of incidence $\omega$ in GIXRD scans, proves a picocrystalline borane film is not amorphous.

However, the analysis further develops that a picocrystalline borane film is not polycrystalline. A polycrystalline film is comprised of a large number of crystalline grains that are randomly ordered, such that all sets of regular interplanar lattice spacings are brought into the Bragg condition in any GIXRD scan by virtue of the random ordering of the polycrystalline grains. This is not the case in FIGS. 40-41. A possible explanation of the structure of a picocrystalline borane film is, now, introduced by reconciling the experimental diffraction data with the theoretical symmetry analysis provided hereinabove.

The 20 $C_3$ icosahedral symmetry operations leave any regular icosahedron unchanged under an 120° rotation about an axis connecting the midpoints of the ten pairs of parallel (albeit inverted) triangular faces. For a regular boron icosahedron with an edge of 1.77 Å, the interplanar lattice spacing of the parallel triangular faces is d=2.69 Å. This intraicosahedral lattice spacing corresponds to a diffraction angle of $2\theta=33.27°$ for 1.54 Å x-rays (which is the x-ray wavelength used in all XRD scans in the figures hereinabove). This diffraction angle is contained in the broadened, low-intensity diffraction peaks at $2\theta=34.16°$ in the $\omega$-$2\theta$ XRD scan in FIG. 39—which, in turn, are related to the smeared circular electron diffraction ring in FIG. 36. It is next purposeful to provide a possible explanation for the broadening of the x-ray and electron diffraction peaks and rings.

The symmetrical nuclear configuration of boron icosahedra assumes that the boron nuclei at the 12 icosahedral vertices are all the same. This is not actually the case. There exist two naturally-occurring stable boron isotopes, $_5^{10}B$ and $_5^{11}B$, with spherically deformed nuclei. An oblate spheroidal nucleus exhibits a negative electric quadrupole moment while a prolate spheroidal nucleus exhibits a positive electric quadrupole moment. Of the 267 stable nuclides, boron $_5^{10}B$ is the stable nuclide with the greatest nuclear electric quadrupole moment per nucleon, which tends to destabilize the boron nuclei. Boron $_5^{10}B$ exhibits a nuclear angular momentum $3\hbar$, as well as, a large positive nuclear electric quadrupole moment of $+0.111\times10^{-24}$ e-cm$^2$. Boron $_5^{11}B$ exhibits a nuclear angular momentum $3/2\hbar$, as well as, a positive nuclear electric quadrupole moment of $+0.0355\times10^{-24}$ e-cm$^2$.

The naturally-occurring isotopes of boron are ~20% $_5^{10}B$ and ~80% $_5^{11}B$. Assuming, for present purposes, that the boron nuclei comprising the boron icosahedra of the picocrystalline oxysilaboranes of this invention are distributed per the naturally-occurring isotopic ratio, the center of gravity of the boron nuclei is shifted from the geometric center of the icosahedral faces. This tends to deform the symmetrical nuclear configuration of boron icosahedra. This deformation can be related to an isotopic enrichment discussed by Nishizawa, "Isotopic Enrichment of Tritium by Using Guest-Host Chemistry," in *Journal of Nuclear Materials*, Vol. 130, 1985, p. 465. Nishizawa employed a guest-host thermochemistry to eliminate radioactive tritium from waste water at a nuclear facility by a crown ether and an ammonium complex. Ammonium $NH_3$ weakly trapped by a crown ether exists in a symmetrical triangle with the three hydrogen nuclei at the triangle corners and the center of gravity at the geometric center. The distance between the hydrogen nuclei along the triangular edges is 1.62 Å. If one hydrogen atom is replaced by a tritium atom, the center of gravity is shifted by 0.28 Å towards the tritium atom.

The shift of the center of gravity away from the triangular geometric center in tritiated ammonium is associated with a decrease in Gibbs free energy due to an increase in entropy. It necessarily follows that an isotopic enrichment of tritiated ammonium (weakly trapped by a crown ether) constitutes a spontaneous thermochemical reaction in which the decrease in Gibbs free energy results from a positive increase in entropy which exceeds the positive increase in enthalpy. A similar condition can be established in the picocrystalline oxysilaboranes.

The geometric distortion due to the mixture of boron isotopes $_5^{10}B$ and $_5^{11}B$, in boron icosahedra comprising the picocrystalline oxysilaboranes, causes a broadening of the Bragg peaks associated with the intraicosahedral constructive x-ray diffraction patterns due to the ten sets of nearly-parallel plane faces of the constituent boron icosahedra. However, it is believed that this isotopic distortion is similarly preserved in most of the boron icosahedra, such that Bragg peaks are associated with intericosahedral constructive x-ray diffraction patterns between parallel planes formed by boron icosahedra at the corners of a continuous random polyhedral network. The distance between the body centers of the corner boron icosahedra varies randomly, such that sharp Bragg peaks occur between parallel icosahedral faces for each x-ray angle of incidence over a range near $2\theta=13.83°$.

A nanocrystalline solid is typically taken to be a polycrystalline solid with small grains, with the grain size being less than 300 nm. As the grain size is reduced, then the periodic translational order is of a shorter range and the x-ray diffraction peaks are broadened. Whereas any typical nanocrystalline material is void of any long-range order, the picocrystalline oxysilaboranes of this invention possess a short-range periodic translational order along with a long-range bond-orientational order that is believed to be due to the self-alignment of boron icosahedra with a nearly-symmetrical nuclear configuration. By a definition herein, a picocrystalline borane solid is a solid, comprised of at least boron and hydrogen, that exhibits a long-range bond-orientational order due to sharp x-ray diffraction peaks when subjected to grazing-incidence x-ray diffraction (GIXRD).

In order to understand the long-range bond-orientational order that characterizes the picocrystalline oxysilaboranes, it is purposeful to focus on the artificial nuclei 104. The artificial nuclei 104 which constitute the picocrystalline oxysilaboranes are boron icosahedra with a nearly-symmetrical nuclear configuration, so as to support the short-range periodic translational order. The ten pairs of parallel faces of the artificial nuclei 104 are, ideally, separated by d=269 pm, which supports a broad intraicosahedral x-ray diffraction peak at $2\theta=33.27°$. As discussed hereinabove, the intraicosahedral x-ray diffraction peaks in artificial nuclei 104 are broadened by a mixture of the two boron isotopes $_5^{10}B$ and $_5^{11}B$. It is purposeful to more precisely define as to what is meant by "broad" and "sharp" x-ray diffraction peaks in preferred embodiments of this invention.

Any sharp x-ray diffraction peak is characterized by a peak width at half intensity that is at least ten times smaller than the peak height. Conversely, a broad x-ray diffraction peak is characterized by a peak width at half intensity that is greater than half the peak height. The x-ray diffraction peak at $2\theta=52.07°$ in FIG. 40 is a broad x-ray diffraction peak that is characteristic of small grains. The x-ray diffraction peak at $2\theta=34.16°$ in the $\omega-2\theta$ XRD scan in FIG. 39 is a broad x-ray diffraction peak due to a constructive intraicosahedral x-ray diffraction by the artificial nuclei 104. Preferred embodiments of this invention are constituted by artificial nuclei 104 supporting a broad x-ray diffraction peak near $2\theta=33.27°$. The extended three-dimensional network of the picocrystalline oxysilaboranes is formed by a translation through space of an irregular hexahedron.

The fivefold symmetry of a regular icosahedron is incompatible with the fourfold symmetry of a regular hexahedron (cube), such that it is impossible to periodically translate a regular hexahedral unit cell, with icosahedral quantum dots at the vertices, over space in a translationally invariant manner. Symmetry breaking must occur in the irregular borane hexahedra 300 shown in FIG. 10. In most known boron-rich solids in the prior art, the fivefold icosahedral symmetry is broken by Jahn-Teller distortion—such that the intericosahedral bonds tend to be stronger than the intraicosahedral bonds. It is for this reason that the boron-rich solids in the prior art are referred to as inverted molecules. The elimination of fivefold icosahedral symmetry, by icosahedral symmetry breaking, reduces the spherical aromaticity associated with bond delocalization in boron icosahedra.

The fivefold rotational symmetry of the icosahedral artificial nuclei 104 is maintained, such that the fourfold symmetry of the irregular borane hexahedra 300 is therefore broken. Each irregular borane hexahedron 300 is formed by artificial nuclei 104 at the hexahedral corners. It is to be understood that an artificial nucleus 104 is formed by a boron icosahedron, with a nearly-symmetrical nuclear configuration that preserves a fivefold rotational symmetry. Although the fivefold rotational symmetry cannot be observed by x-ray or electron diffraction, novel electronic and vibrational properties due to a fivefold rotational symmetry of the artificial nuclei 104 are observable. The artificial nuclei 104 are comprised by the regular arrangement of first- and second-nearest neighbor natural boron atoms 102 that supports a short-range translational order.

Similar to natural atoms, the artificial atoms 101 of the picocrystalline oxysilaboranes confine a discrete quantization of energy levels in a region of space less than 300 pm. However, the discrete energy levels of the artificial nuclei 104 are fundamentally different from the discrete energy levels of natural atoms. At issue are spectroscopic principles of conventional chemistry. The spectroscopic principles are framed by references to a book by Harris and Bertolucci, *Symmetry and Spectroscopy*, Oxford Univ. Press, 1978. On pages 1-2 of their book, Harris and Bertolucci emphasized that: "Light of infrared frequencies can generally promote molecules from one vibrational energy level into another. Hence, we call infrared spectroscopy vibrational spectroscopy. Visible and ultraviolet light are much more energetic and can promote the redistribution of electrons in a molecule such that the electronic potential energy of the molecule is changed. Hence, we call visible and ultraviolet spectroscopy electronic spectroscopy."

In the artificial nuclei 104 of the picocrystalline oxysilaboranes, the rotational, vibrational, and electronic degrees of freedom are totally intertwined in rovibronic energy levels which support a redistribution of electrons in response to microwave radiation. A redistribution of electrons between microwave energy levels is due to an internal quantization of energy levels arising from the fivefold rotational symmetry, of a nearly-symmetrical icosahedron, capable of supporting a broadened diffraction peak at a diffraction angle $2\theta=33.27°$ that corresponds to an ideal spacing of d=269 pm between opposite pairs of icosahedral faces. Unlike natural nuclei, the artificial nuclei 104 have a detectable infrastructure.

Since the corners of the irregular borane hexahedra 300 of the picocrystalline oxysilaboranes are occupied by artificial nuclei 104, intericosahedral x-ray diffraction peaks are associated with nearest-neighbor artificial nuclei 104. Referring to FIG. 10, the corresponding icosahedral faces of the artificial nuclei 104 are ideally self-aligned in picocrystalline oxysilaborane $(B_{12}H_4)_xSi_yO_z$ over the preferred compositional range, wherein $2\leq x\leq 4$, $3\leq y\leq 5$ and $0\leq z\leq 2$. Due to the symmetry breaking of the irregular borane hexahedra 300, the self-alignment of the icosahedral faces of the artificial nuclei 104 is maintained in the presence of a random separation between the icosahedral body centers of the artificial nuclei 104. The alignment of natural atoms in molecules is typically described in terms of the bond angle of the atomic valence electrons. This property relates to the fact that a natural atom is void of any externally apparent nuclear infrastructure.

The artificial nuclei 104 in the picocrystalline oxysilaboranes exhibit an infrastructure associated with a nearly-symmetrical icosahedron, with a boron nucleus 102 at each icosahedral vertex per FIG. 5. In order to maintain a nearly-symmetrical nuclear configuration, the boron nuclei 102 of an artificial nucleus 104 are chemically constituted by three-center bonds, such that a peak electron density ideally exists near the center of the eight icosahedral faces normal to the four $\mathbf{k}_{\langle 111 \rangle}$ wave vectors, per FIG. 5. It is significant that the artificial nuclei 104 comprise a caged boron icosahedron with no radial boron valence electrons. The artificial atoms 101 bond to natural atoms in picocrystalline oxysilaboranes by means of hydrogen atoms that are, in turn, bonded by a Debye force.

The self-alignment of the artificial atoms 101 in the irregular borane hexahedra 300 results in the valence electrons of the hydrogen nuclei 103 being aligned along $\mathbf{k}_{\langle 111 \rangle}$ wave vectors. In that the four valence electrons of the tetravalent atoms 303 in the irregular borane hexahedra 300 are aligned along a $\mathbf{k}_{\langle 111 \rangle}$ wave vector, then the artificial atoms 101 are covalently bonded to the tetravalent atoms 303 along $\mathbf{k}_{\langle 111 \rangle}$ wave vectors by means of hydrogen atoms. The bond angle between the artificial atoms 101 and the natural tetravalent atoms 303 is aligned along $\mathbf{k}_{\langle 111 \rangle}$ wave vectors if the 20 icosahedral faces of the artificial atoms 101 are self-aligned and the icosahedral body centers randomly vary over a finite range.

The self-alignment of the icosahedral faces and the random spatial variations of the icosahedral body centers of artificial nuclei 104 can be evaluated by x-ray diffraction spectroscopy. This is due to a fact that, unlike natural atoms, the artificial nuclei 104 possess an infrastructure of periodically repeating first- and second-nearest neighbor boron atoms. The short-range periodic translational order of the artificial nuclei 104 is detected by intraicosahedral diffraction peaks associated with an interplanar spacing of d=269 pm between parallel icosahedral faces. The short-range periodic translational order of the picocrystalline oxysilaboranes is characterized by a broad x-ray diffraction peak, under conventional ω-2θ x-ray diffraction, that exists, at least partly, within the diffraction angle range 32°<2θ<36°. The short-range periodic translational order of the artificial nuclei 104 supports the detection of the corners of the irregular borane hexahedra 300 forming the picocrystalline oxysilaboranes over a preferred compositional range.

Intericosahedral x-ray diffraction peaks, due to parallel faces within nearest-neighbor artificial nuclei 104, collectively result in a broad x-ray diffraction peak, under conventional x-ray diffraction, that is included in the diffraction angle range 12°<2θ<16°. In a conventional ω-2θ x-ray diffraction, the x-ray angle of incidence ω and the diffraction angle 2θ are held relatively constant and, then, collectively varied over a very wide range of diffraction angles. Conventional ω-2θ x-ray diffraction, by itself, cannot establish the self-alignment of artificial nuclei 104 in the picocrystalline oxysilaboranes. This deficiency can be remedied when conventional ω-2θ x-ray diffraction is further augmented by a grazing-incidence x-ray diffraction (GIXRD). Whereas a number of Bragg conditions can be detected under conventional ω-2θ x-ray diffraction, only one specific Bragg condition exists in GIXRD diffraction for each fixed x-ray angle of incidence ω.

For any given fixed x-ray angle of incidence ω, in the range 6°<ω<8°, a sharp x-ray diffraction peak exists in the picocrystalline oxysilaboranes due to intericosahedral constructive x-ray interference between parallel faces of corner artificial nuclei 104. The icosahedral body centers of the nearest-neighbor corner artificial nuclei 104 are randomly separated over the limited, finite range of ~640 pm. A random separation of the corner artificial nuclei 104 in the irregular borane hexahedra 300 of the picocrystalline oxysilaboranes results in a range of sharp x-ray diffraction peaks. The existence of a sharp x-ray diffraction peak for any fixed angle of incidence ω is a characteristic of the long-range bond-orientational order. Preferred picocrystalline oxysilaboranes will be described by actual examples.

A method for making the oxysilaborane films of the present invention is a chemical vapor deposition causing the precipitation of a solid film by passing gas vapors containing boron, hydrogen, silicon, and oxygen over a heated substrate in a sealed chamber maintained at a pressure below that of the atmosphere. The preferred vapors are nitrous oxide $N_2O$ and the lower-order hydrides of boron and silicon, with diborane $B_2H_6$ and monosilane $SiH_4$ being the most preferred. Both hydrides can be diluted in a hydrogen carrier gas. By passing hydrogen-diluted diborane and monosilane, and optionally nitrous oxide, over a sample heated above ~200° C. at a pressure of ~1-30 torr, a solid oxysilaborane film self-assembles over the substrate in a picocrystalline oxysilaborane under preferred conditions.

The heating can be realized with equipment generally known to those skilled in the art of semiconductor processing. A molybdenum susceptor, by way of example, can provide a solid substrate carrier that can be resistively or inductively heated. The substrate can be heated without any susceptor in a resistively-heated quartz tube. In all these methods there can exist heated surfaces (other than the intended deposition substratum) on which an oxysilaborane film is deposited. The substrate can be heated without a susceptor in a cold-wall reactor by radiative heat by halogen lamps in a low-pressure rapid thermal chemical vapor deposition that minimizes reactor outgassing from heated surfaces coated by prior depositions. A preferred method for preparing the picocrystalline oxysilaboranes of the present invention is described after the processing in various examples is considered.

Whenever the deposition temperature exceeds ~350° C. hydrogenation effects can be substantially eliminated. Conversely, by decreasing the deposition temperature below ~350° C. the thin picocrystalline solid can become significantly hydrogenated, such that hydrogen can be actively incorporated in chemical bonds. The relative atomic concentration of hydrogen in a picocrystalline oxysilaborane solid deposited below ~350° C. is usually within the range of 10-25% depending on the degree of oxygen incorporation. When hydrogen is not actively incorporated in the chemical bonds of a picocrystalline oxysilaborane solid, it is more specifically referred to as an oxysilaboride solid. An oxysilaborane solid substantially void of oxygen is more specifically referred to as a silaborane solid.

Oxygen can be introduced into a picocrystalline oxysilaborane solid by either individual oxygen atoms or as part of water molecules. Any picocrystalline oxysilaborane solid containing water molecules is said to be hydrous while a picocrystalline oxysilaborane solid constituted by individual hydrogen and oxygen atoms with a relatively negligible amount of water is said to be anhydrous. It has been observed that hydrous picocrystalline oxysilaborane solids tend to undergo a change in color and stoichiometry over time due, apparently, to the change in the trapped water. Unless explicitly asserted otherwise, picocrystalline oxysilaborane solids in embodiments described hereinbelow are understood to be anhydrous. In order to minimize hydration, a deposition reactor is fitted with a load-lock chamber isolating the reaction chamber from the direct exposure to the ambient moisture. However, adsorbed moisture is difficult to fully eliminate during sample loading.

In addition to color changes, hydration can alter the boron-to-silicon ratio. In one preferred embodiment of oxysilaborane, the boron-to-silicon ratio is ideally six. An incorporation of atomic oxygen without hydration in oxysilaborane reduces the boron-to-silicon ratio while the incorporation of water molecules into hydrous oxysilaborane tends to increase the boron-to-silicon ratio. Both of these effects can exist concurrently. A preferred introduction of oxygen into anhydrous oxysilaborane is by means of nitrous oxide. The relative atomic concentration of boron in oxysilaborane amongst boron, silicon, and oxygen atoms is ideally ~83%. In the absence of any hydration effects, the relative atomic concentration of boron amongst boron, silicon, and oxygen atoms does not significantly exceed ~89%. The susceptibility to hydration depends, in part, on the relative oxygen atomic concentration in an oxysilaborane film and the method by which oxygen is introduced.

Self-assembled picocrystalline oxysilaborane has characteristics that are useful in electronic integrated circuits using covalent semiconductors, such as monocrystalline silicon. The electronic properties of oxysilaborane solids can be modified in a controlled manner by processing conditions during wafer deposition. Picocrystalline oxysilaborane exhibits a long-range bond-orientational order. X-ray photoelectron spectroscopy (XPS) established the binding energy of the boron 1s electron in picocrystalline oxysilaborane as ~188 eV, which is characteristic of chemical bonds in an icosahedral boron molecule. The oxygen 1s electron binding energy, ~532 eV, is very similar to that of the oxygen 1s electron binding energy in a metallic oxide and different from that of the oxygen 1s electron in a solid.

The silicon 2p electron binding energy in the oxysilaborane solids of this invention exhibits a sharp energy peak of ~99.6 eV over the compositional range. This is important for several reasons. First of all, the absence of two energy peaks in oxysilaborane implies that the Si—Si and Si—B bonds possess an identical binding energy. Secondly, the measured binding energy of a silicon 2p electron in oxysilaborane is essentially that of monocrystalline silicon formed by tetrahedral chemical bonds in the diamond lattice. The silicon 2p electron binding energy in silicon dioxide is ~103.2 eV. When oxysilaborane is deposited on amorphous silicon dioxide, there exists a distinct difference in the silicon 2p electron binding energy in the two compositions. The silicon 2p electron binding energy in oxysilaborane is that of monocrystalline silicon in a diamond lattice, despite being deposited over an amorphous oxide, due to the self-assembly of picocrystalline oxysilaboranes.

By suitably controlling the chemical vapor deposition processing conditions, picocrystalline oxysilaborane $(B_{12}H_4)_xSi_yO_z$ self-assembles in a preferred compositional range ($2 \leq x \leq 4$, $3 \leq y \leq 5$, $0 \leq z \leq 2$) bounded by picocrystalline silaborane $(B_{12}H_4)_4Si_4$ at one compositional extreme and by picocrystalline oxysilaborane $(B_{12}^{2-}H_4)_2Si_4O_2^{2+}$ at the other compositional extreme. The self-assembly of picocrystalline oxysilaborane $(B_{12}H_4)_xSi_yO_z$ in the preferred compositional range is due to reasons to be developed later hereinbelow. In order to better understand the preferred processing conditions, the processing of nonpreferred species in the broader range ($0 \leq w \leq 5$, $2 \leq x \leq 4$, $3 \leq y \leq 5$, $0 \leq z \leq 3$) of oxysilaborane $(B_{12})_xSi_yO_zH_w$ will be taught by a limited number of examples of a picocrystalline boron solid.

Now, various embodiments of oxysilaborane compositions according to the invention are described by examples, but the scope of the invention is not limited thereto. As will be understood by those skilled in the art, this invention may be embodied in other forms without a departure from the spirit or essential characteristics thereof. The disclosure and descriptions hereinbelow are intended to be illustrative, but not limiting, of the scope of the invention. The first several examples teach the preferred processing of picocrystalline silaborane $(B_{12}H_4)_4Si_4$ with the help of two examples in which processing of silaboride and oxysilaborane in a broader range ($0 \leq w \leq 5$, $2 \leq x \leq 4$, $3 \leq y \leq 5$, $0 \leq z \leq 3$) of $(B_{12})_xSi_yO_zH_w$ is taught.

Example 1

Phosphorous was diffused into the 100 mm diameter monocrystalline (001) p-type silicon substrate 504 with a resistivity of 15 Ω-cm so as to result in an 8.7 ohm per square resistance, as measured by a four-point probe. The oxide was removed from the sample wafer by a hydrofluoric acid deglaze. The sample was inserted into a rapid thermal chemical vapor deposition (RTCVD) chamber of the type described by Gyurcsik et al. in "A Model for Rapid Thermal Processing," *IEEE Transactions on Semiconductor Manufacturing*, Vol. 4, No. 1, 1991, p. 9. After loading the sample wafer upon a quartz ring, the RTCVD chamber was then closed and mechanically pumped down to a pressure of 10 mtorr. A 3% mixture, by volume, of diborane in hydrogen $B_2H_6(3\%)/H_2(97\%)$ at a flow rate of 364 sccm and a 7% mixture, by volume, of monosilane in hydrogen $SiH_4(7\%)/H_2(93\%)$ at a flow rate of 390 sccm were introduced into the evacuated RTCVD deposition chamber.

Figure 42:
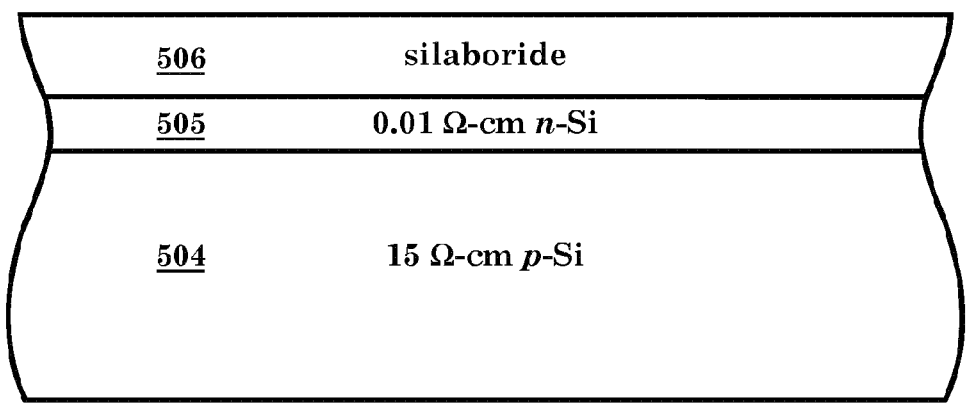
FIG. 42 is an illustration of a silaboride film deposited on a donor-doped region of a monocrystalline substrate.

The reactant gas flow rate stabilized at a pressure of 3.29 torr, whereupon the tungsten-halogen lamps were turned on for 30 seconds and regulated so as to maintain the sample wafer at 605° C. As shown in FIG. 42, a thin silaboride solid 506 was deposited over the donor-doped region 505. The composition of the silaboride solid 506 was investigated by means of x-ray photoelectron spectroscopy (XPS). The binding energy of the boron 1s electron was measured as being 187.7 eV, which is consistent with icosahedral boron. The binding energy of the silicon 2p electron was measured to be 99.46 eV, which is characteristic of monocrystalline (001) n-type silicon. An XPS depth profile of the silaboride solid 506 measured the relative atomic concentrations of boron and silicon within the silaboride solid 506 as being 86% and 14% respectively. Rutherford backscattering spectroscopy (RBS) measured the relative atomic concentrations of boron and silicon in the thin silaboride solid 506 as being 83.5% and 16.5% respectively.

The relative hydrogen concentration within the thin silaboride solid 506 was measured by a hydrogen forward scattering (HFS) in which the hydrogen atoms are elastically scattered by incident high-energy helium atoms. Hydrogen forward scattering (HFS) is not as quantitative as the Rutherford backscattering spectroscopy (RBS), due to the oblique angle of incident helium atoms that causes a variation in the charge integration in various samples. Although the hydrogen counts per unit solid angle are constant, the solid angle itself can change between different samples. No hydrogen was detected. Any solid comprised of boron and silicon in the absence of hydrogen is referred to as a silaboride composition.

Figure 43:
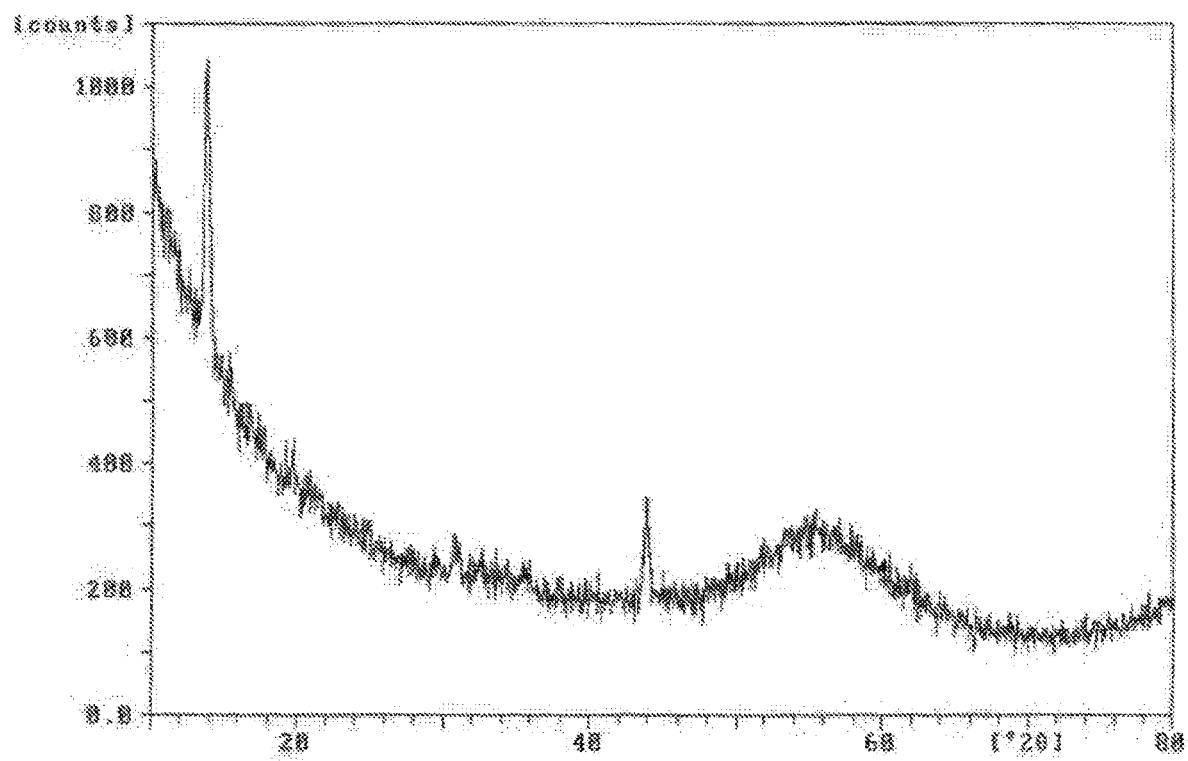
FIG. 43 is a graph of a GIXRD scan of the picocrystalline silaboride solid of Example 1.

A secondary ion mass spectroscopy (SIMS) analysis established the $_5^{11}B/_5^{10}B$ ratio of the silaboride solid 506 as the naturally-occurring ratio 4.03. The absence of any hydrogen or isotopic enrichment in the silaboride solid 506 of this example is due to the deposition temperature. A hydrogenation of silaborane can be realized when the deposition temperature is below ~350° C. or when oxygen is introduced, as will be discussed in examples hereinbelow. The silaboride solid 506 of this example was confirmed by x-ray diffraction as being a picocrystalline boron solid. A GIXRD scan of the picocrystalline silaboride solid 506 of this example is shown in FIG. 43. The diffraction peak at $2\theta=14.50°$ corresponds to the Bragg condition associated with the x-ray angle of incidence $\omega=7.25°$ of the GIXRD scan.

Example 2

Figure 44:
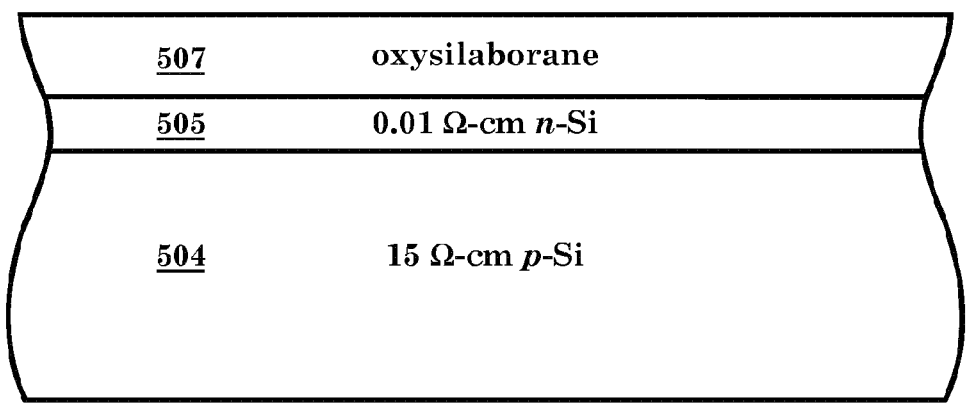
FIG. 44 is an illustration of an oxysilaborane film deposited over a donor-doped silicon region in accordance with Example 2.

The procedure described above in Example 1 was carried out with the two exceptions that undiluted nitrous oxide $N_2O$ was introduced at a flow rate of 704 sccm and the flow rates of the two hydride gases were doubled. A 3% mixture by volume of diborane in hydrogen $B_2H_6(3\%)/H_2(97\%)$ at a flow rate of 728 sccm, a 7% mixture by volume of monosilane in hydrogen $SiH_4(7\%)/H_2(93\%)$ at a flow rate of 780 sccm, and undiluted nitrous oxide $N_2O$ at a flow rate of 704 sccm were introduced. The vapor flow rate was stabilized at 9.54 torr, whereupon the tungsten-halogen lamps were turned on for 30 seconds, and regulated, in order to maintain the sample substrate 504 at 605° C. As shown in FIG. 44, an oxysilaborane solid 507 was deposited upon the donor-doped region 505. The composition of the thin oxysilaborane solid 507 was evaluated by x-ray diffraction spectroscopy.

Figure 45:
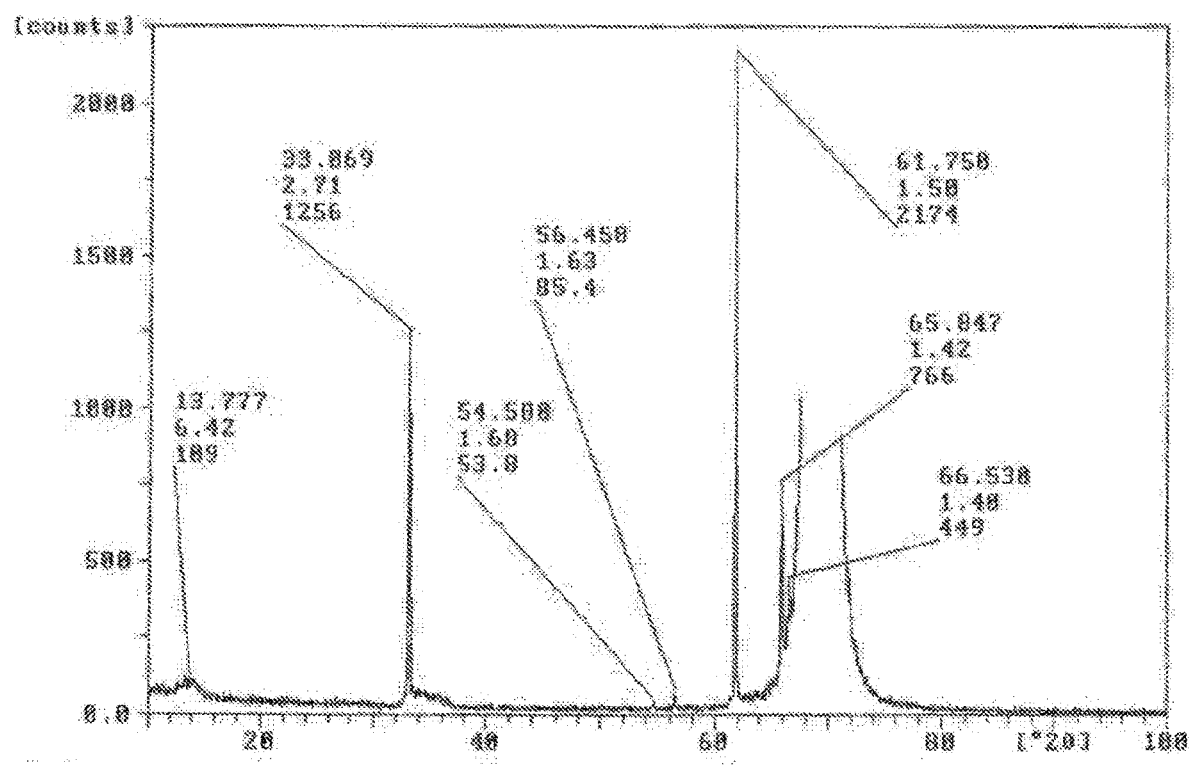
FIG. 45 is a conventional ω-2θ x-ray diffraction (XRD) pattern of the thin oxysilaborane solid of Example 2.
Figure 46:
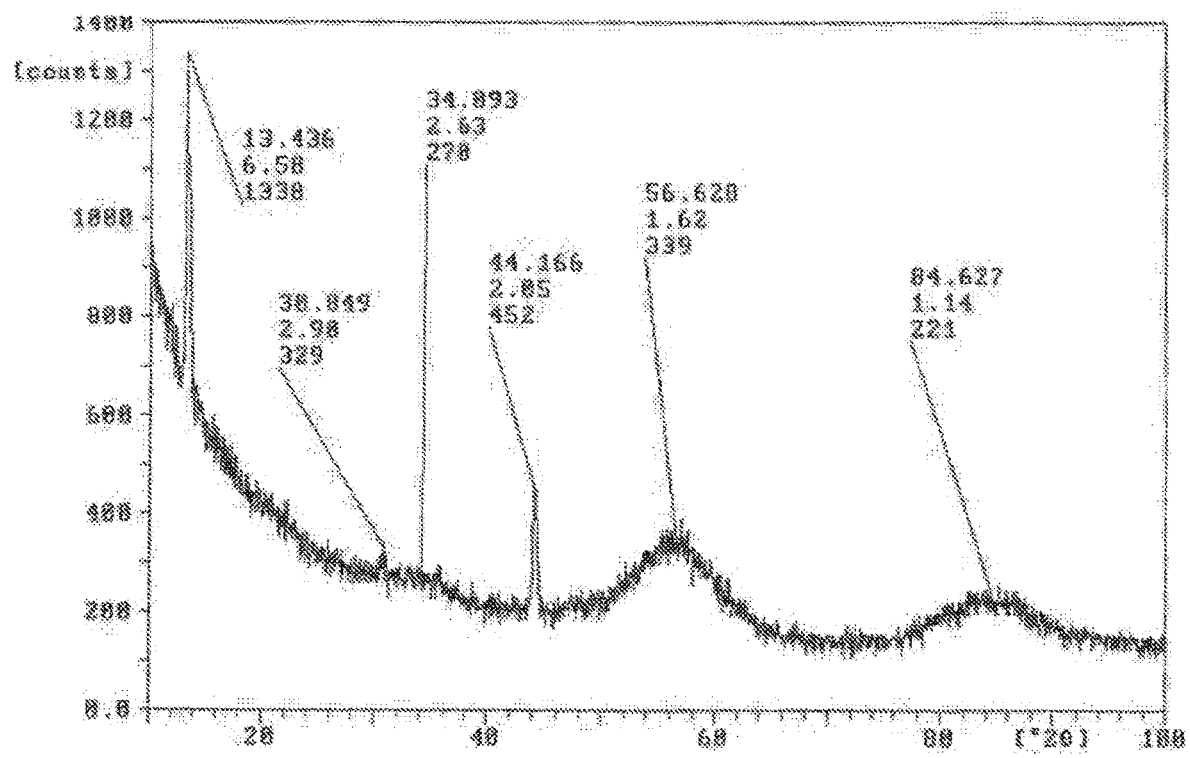
FIG. 46 is a graph of a GIXRD scan of the oxysilaborane solid of Example 2.

A conventional $\omega$-$2\theta$ XRD scan of the thin oxysilaborane solid 507 is shown in FIG. 45. The smeared diffraction peaks near $2\theta=13.78°$ and $2\theta=33.07°$ are characteristic of a picocrystalline boron solid. This is further corroborated by the GIXRD scan in FIG. 46, in which a diffraction peak at $2\theta=13.43°$ corresponds to the Bragg condition associated with the x-ray angle of incidence $\omega=6.70°$. The composition of the oxysilaborane solid 507 was established by XPS spectroscopy. The binding energy of the boron 1s electron was 187.7 eV and the binding energy of the silicon 2p electron was 99.46 eV, which are the same as Example 1. The binding energy of the oxygen 1s electron was 524 eV. As measured by XPS, the relative bulk atomic concentrations of boron, silicon, and oxygen were 81%, 12%, and 7%.

By both Rutherford backscattering spectroscopy (RBS) and hydrogen forward scattering (HFS) the relative bulk atomic concentrations of boron, hydrogen, silicon, and oxygen within the oxysilaborane film 507 of this example were all respectively determined as being: 72%, 5.6%, 13.4%, and 9.0%. The picocrystalline boron solid 507 of the present example is not a borane solid but, rather, is much better characterized as an oxygen-rich composition $(B_{12})_2Si_{3.5}O_{2.5}H$ in which the hydrogen atoms are, most likely, bonded to the oxygen atoms. Secondary ion mass spectroscopy (SIMS) established the isotopic ratio $_5^{11}B/_5^{10}B$ as being the naturally-occurring ratio of the two boron isotopes, to within the experimental error. As will be soon established, the existence of a naturally-occurring isotopic ratio in $_5^{11}B/_5^{10}B$ is indicative of the absence intertwined rovibronic energy levels that are capable of promoting the redistribution of electrons in response to microwave radiation.

Example 3

The pyrolysis of boron and silicon hydrides was carried out by a low-pressure chemical vapor deposition (LPCVD) within a horizontal resistively-heated reactor comprising a five inch diameter quartz deposition tube, which was fixed on a table. The resistive heating element was mounted upon a motorized track, such that 75 mm silicon substrates could be loaded onto a quartz holder in the front of the tube at room temperature. Water vapor adsorbed onto the quartz walls during the sample loading provided a source of water vapor for the subsequent chemical reaction. A 75 mm diameter monocrystalline (001) n-type silicon substrate 508 of a resistivity of 20 $\Omega$-cm was loaded onto a quartz holder in the quartz tube, which was sealed and mechanically pumped down to a base pressure of 30 mtorr.

Figure 47:
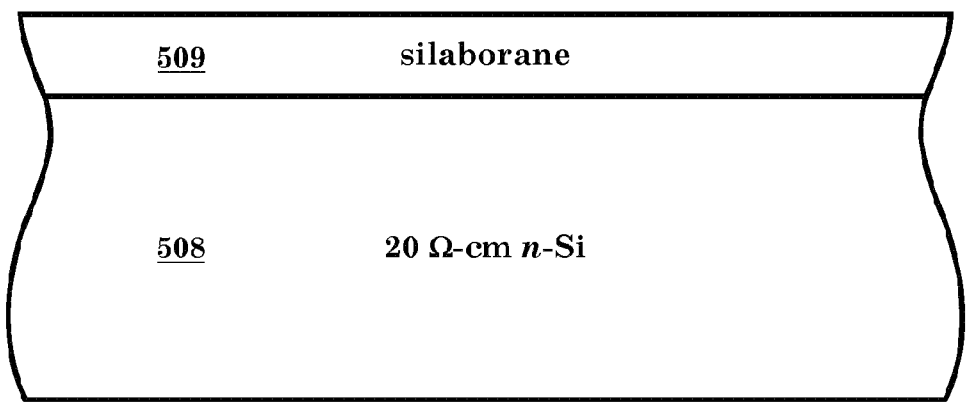
FIG. 47 is an illustration of a silaborane film deposited on an n-type silicon substrate in accordance with Example 3.

As shown in FIG. 47, a boron-rich film 509 was deposited on the (001) n-type silicon substrate 508 by introducing a 3% mixture, by volume, of diborane in hydrogen $B_2H_6(3\%)/H_2(97\%)$ at the flow rate of 180 sccm and a 10% mixture, by volume, of monosilane in hydrogen $SiH_4(10\%)/H_2(90\%)$ at a flow rate of 120 sccm. The gas flow rates stabilized at a deposition pressure of 360 mtorr. The motorized heating element was transferred over the sample. The deposition temperature was stabilized at 230° C. after a ~20 minute temperature ramp due to the thermal mass of the quartz tube and the quartz sample holder. The pyrolysis was sustained for 8 minutes at 230° C., whereupon the motorized heating element was retracted and the reactive gases were secured. The relative atomic concentrations of boron and silicon in the silaborane film 509 were measured by different types of spectroscopy.

Figure 48:
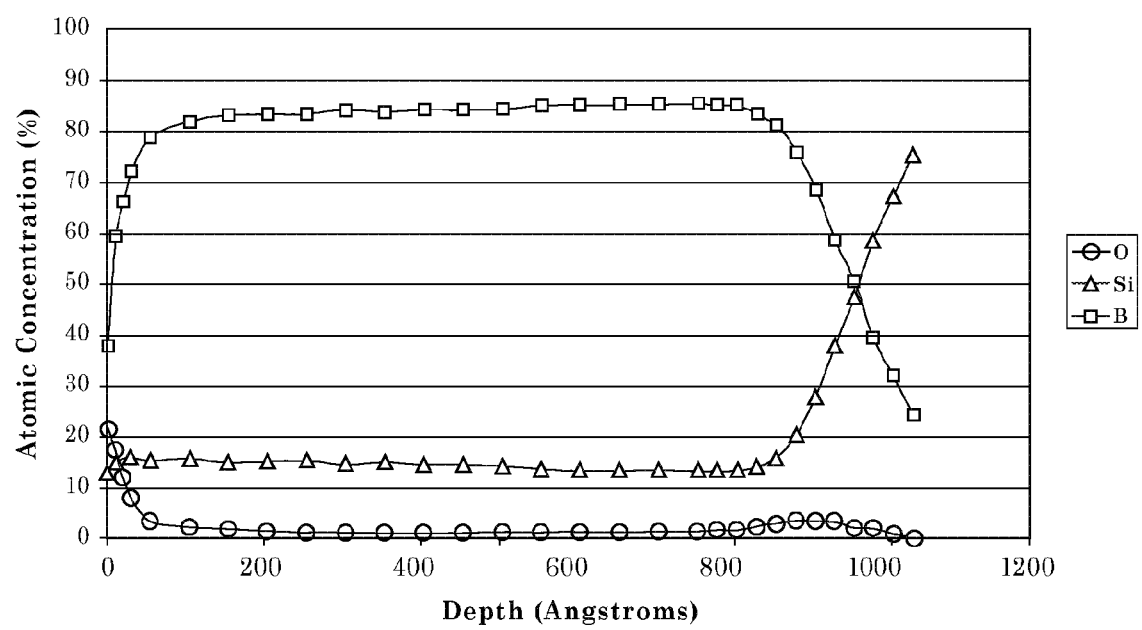
FIG. 48 is an x-ray photoelectron spectroscopy (XPS) depth profile of the silaborane film deposited in Example 3.

An x-ray photoelectron spectroscopy (XPS) depth profile of the silaborane film 509 was performed. The oxygen in the silaborane film 509 is due to an outgassing of water vapor from the quartz walls. FIG. 48 shows the relative atomic concentrations of boron, silicon and oxygen in the silaborane solid 509 as being respectively: 85%, 14%, and 1%. The binding energy of the boron 1s electron was 187 eV, which is characteristic of the bonds in icosahedral boron molecules. The XPS binding energy of the silicon 2p electron was 99.6 eV, which is characteristic of the silicon 2p electron in (001) monocrystalline silicon. The XPS binding energy of the oxygen 1s electron was measured as 532 eV. A depth analysis of the solid 509 by Rutherford backscattering spectroscopy (RBS) measured the relative bulk atomic concentrations of boron and silicon as 82.6% and 17.4% respectively.

Figure 49:
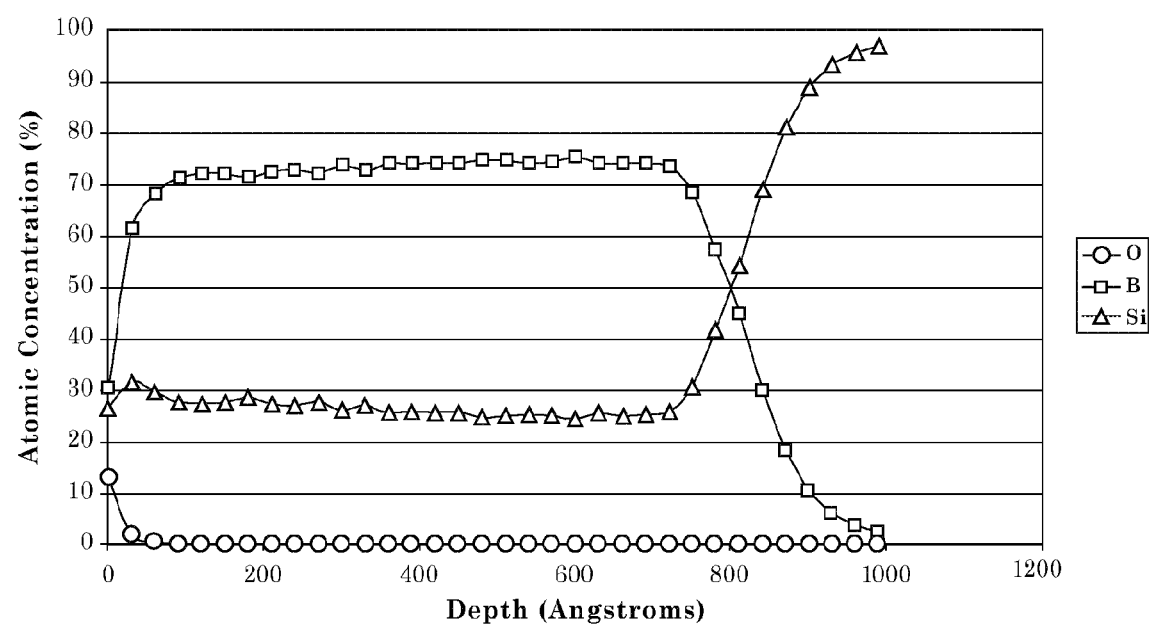
FIG. 49 is an Auger electron spectroscopy (AES) depth profile of the silaborane film deposited in Example 3.

The Auger electron spectroscopy (AES) depth profile in FIG. 49 shows the relative atomic concentrations of boron, silicon, and oxygen in the silaborane solid 509 as being respectively: 73.9%, 26.1% and 0.1%. The thickness of the solid 509 was established by XPS, AES, and RBS as 998 Å, 826 Å, and 380 Å. The relative bulk atomic concentrations of boron, hydrogen and silicon were all established by RBS/HFS depth profiles of the silaborane solid 509 of this example as: 66.5%, 19.5%, and 14.0%. A secondary ion mass spectroscopy (SIMS) depth profile was carried out in order to establish the existence of any isotopic enrichment. An isotopic enrichment of boron $_5^{10}B$ relative to boron $_5^{11}B$ was proven by the SIMS depth profile. Whereas the naturally-occurring $_5{}^{11}B/_5{}^{10}B$ ratio is 4.03, the SIMS analysis measured the $_5{}^{11}B/_5{}^{10}B$ ratio in the silaborane solid 509 as 3.81.

The film in Example 3 is referred to as a silaborane solid 509 since the small relative atomic concentration of oxygen is believed to be in the form of water. As a result, this film is better referred to as a hydrous silaborane solid 509. The conventional ω-2θ XRD diffraction pattern in FIG. 39 and the GIXRD diffraction pattern in FIG. 41 were both obtained from the hydrous silaborane solid 509 in Example 3. As the result, the hydrous silaborane solid 509 is a picocrystalline borane solid by the definition hereinabove. Although the conventional ω-2θ XRD diffraction pattern of the hydrous silaborane solid 509 in FIG. 39 is substantially that of the oxysilaborane solid 507 in FIG. 45, the picocrystalline boron solids are fundamentally distinguished by the isotopic enrichment of boron $_5{}^{10}B$ relative to boron $_5{}^{11}B$. This distinction impacts preferred embodiments of this invention.

One objective of the present invention is to establish a novel genus of self-assembled picocrystalline oxysilaboranes promoting a redistribution of electrons amongst rovibronic energy levels in response to microwave radiation due to an uncompensated increase in entropy characterized by an isotopic enrichment of boron $_5{}^{10}B$ relative to boron $_5{}^{11}B$. The novelty and utility of such a redistribution of electrons by microwave radiation can be further appreciated by other examples.

Example 4

Figure 50:
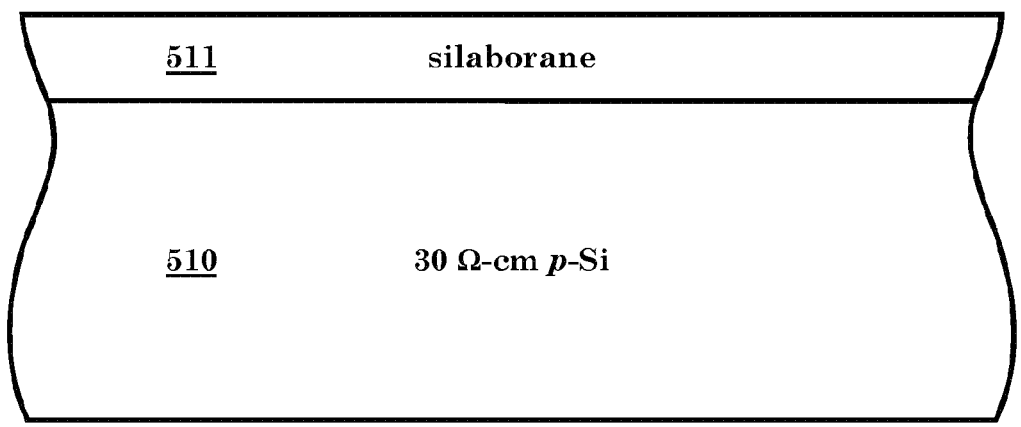
FIG. 50 is an illustration of a silaborane film deposited on a p-type silicon substrate in accordance with Example 4.

Referring to FIG. 50, a 100 mm diameter monocrystalline (001) p-type silicon substrate 510 with a resistivity of 30 Ω-cm was inserted onto a resistively-heated molybdenum susceptor in an EMCORE D-125 MOCVD reactor by a load-lock system that isolated the deposition chamber from the ambient. The chamber was pumped below 50 mtorr, whereupon a 3% mixture, by volume, of diborane in hydrogen $B_2H_6(3\%)/H_2(97\%)$ at the flow rate of 360 sccm and a 2% mixture, by volume, of monosilane in hydrogen $SiH_4$ (2%)/$H_2$(98%) at a flow rate of 1300 sccm were introduced into the chamber, after which the reactant gases were permitted to mix. Upon stabilization of the gas flow rate, the chamber pressure was regulated at 9 torr and the molybdenum susceptor was rotated at 1100 rpm.

Figure 51:
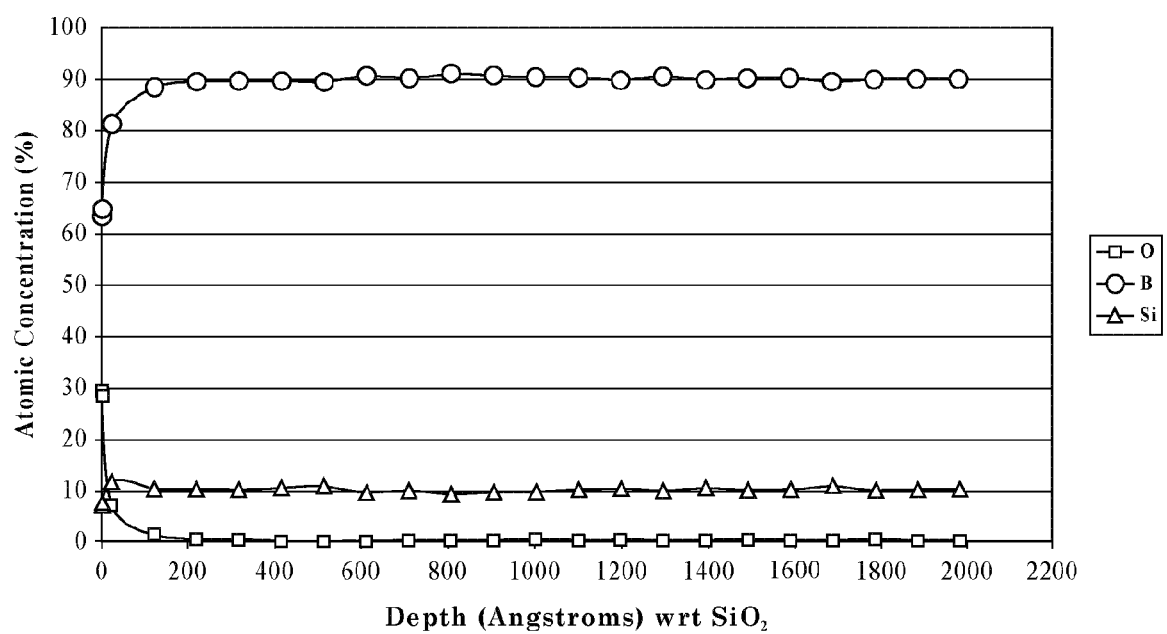
FIG. 51 is an x-ray photoelectron spectroscopy (XPS) depth profile of the silaborane film deposited in Example 4.

The substrate temperature was increased to 280° C. by the resistively-heated rotating susceptor. Upon the stabilization at the deposition temperature of 280° C., the chemical reaction was allowed to proceed for 5 minutes, whereupon the susceptor heating was arrested and the sample was allowed to cool to below 80° C. before removing it from the deposition chamber. A thin film 511 with a polymeric semitransparent color was deposited upon the substrate 510, as shown in FIG. 50. The silaborane solid 511 thickness was measured by variable-angle spectroscopic ellipsometry to be 166 nm. The silaborane solid 511 was smooth with no signs of a grain structure. The silaborane solid 511 did not exhibit visible hydration effects. The XPS depth profile in FIG. 51 measured the relative atomic concentrations of boron and silicon in the bulk solid 511 as being 89% and 10% respectively.

Figure 52:
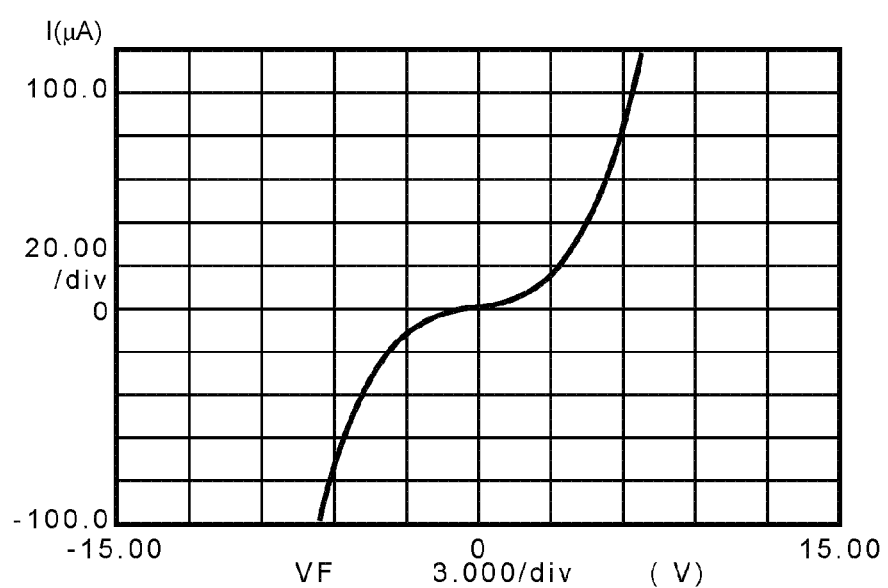
FIG. 52 is a linear graph of the current-voltage characteristics of the silaborane film deposited in Example 4, as measured by an HP-4145 parameter analyzer with the sweep signals obtained by a mercury probe.
Figure 53:
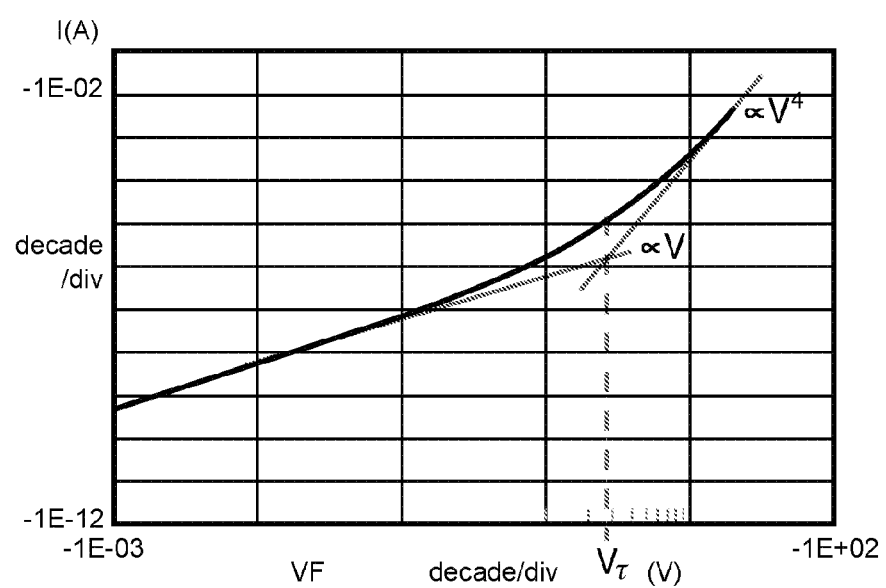
FIG. 53 is a log-log graph of the current-voltage characteristics of the silaborane film deposited in Example 4, as measured by an HP-4145 parameter analyzer with the sweep signals obtained by a mercury probe.

RBS and HFS analysis determined the relative atomic concentrations of boron, hydrogen, and silicon as being: 66%, 22%, and 11%. The silaborane solid 511 of this example is very similar to the silaborane solid 509 in Example 3 except that the silaborane solid 511 of this example did not exhibit measurable hydration effects. Electrical characteristics of the silaborane solid 511 were measured by an HP-4145 parameter analyzer, with sweep signals by a mercury probe. Linear and log-log graphs of the current-voltage characteristics of the silaborane solid 511 are shown in FIGS. 52-53. The nonlinear current-voltage characteristics of the silaborane solid 511 are due to a space-charge-limited conduction current which deviates from Ohm's law beyond an onset of relaxation in accordance with FIG. 53.

Space-charge-limited current conduction in any solid was proposed by Mott and Gurney, *Electronic Processes in Ionic Crystals*, Oxford University Press, second edition, 1948, pp. 168-173. In analogy to Child's law of vacuum-tube devices, Mott and Gurney developed that a space-charge-limited current density J between electrodes, intervened by a solid dielectric, quadratically varies with an impressed electromotive force V, where d is the electrode separation, μ is the charge mobility, and ε is the permittivity of the solid-state dielectric or semiconductor. The Mott-Gurney law is satisfied whenever a unipolar excess mobile charge exists due to a nonvanishing divergence of the electric field per Gauss' law. As will be developed, the space-charge-limited conduction current in the picocrystalline oxysilaboranes is due to a charge conduction mechanism not heretofore known in the prior art.

$$J = \frac{9}{8}\varepsilon\mu\frac{V^2}{d^3} \tag{65}$$

When the net charge density vanishes in any solid, such that charge neutrality is preserved, the conduction current density J linearly varies with V per Ohm's law per the relation below, where n is the mobile-charge concentration. A demarcation between the conduction mechanisms relates to the relaxation time τ.

$$J = e\mu n\frac{V}{d} = \sigma\frac{V}{d} = \frac{\varepsilon}{\tau}\frac{V}{d} \tag{66}$$

A conduction current density in a solid is conventionally bounded by Ohm's law, Eq. (65), and the Mott-Gurney law, Eq. (65). If Ohm's law is satisfied, the mobile-charge transit time t is necessarily greater than the relaxation time τ such that charge neutrality is thus preserved. If the transit time is less than the relaxation time, a conduction current becomes space-charge-limited in accordance with the Mott-Gurney law. The condition for a space-charge-limited current is:

$$V \geq V_\tau = \frac{end^2}{\varepsilon} = \frac{d^2}{\tau\mu} \tag{67}$$

The development of a solid-state space-charge-limited conduction by Mott and Gurney focused on dielectrics, due to the low mobile-charge density that is inherent in dielectrics. However, dielectrics usually possess a large trap density that opposes the existence of mobile space-charges. As established by Lampert in "Simplified Theory of Space-Charge-limited Currents in an Insulator with Traps," in *Physical Review*, Vol. 103, No. 6, 1956, p. 1648, the one-carrier current-voltage characteristic in a semiconductor is typically bounded by three curves: Ohm's law, the Mott-Gurney law, and a trap-filled limit curve. The quadratic current-voltage dependence is extended to a cubic dependence for two-carrier charge conduction.

Example 5

Figure 54:
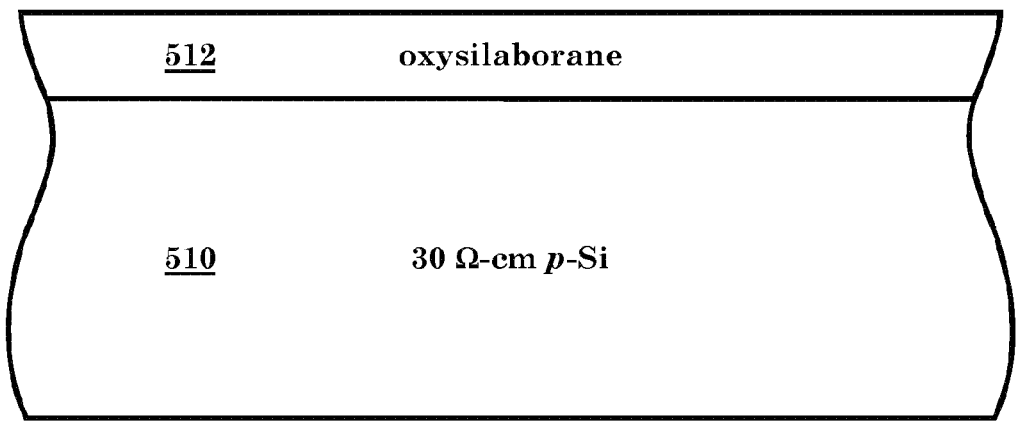
FIG. 54 is an illustration of an oxysilaborane film deposited on a p-type silicon substrate in accordance with Example 5.
Figure 55:
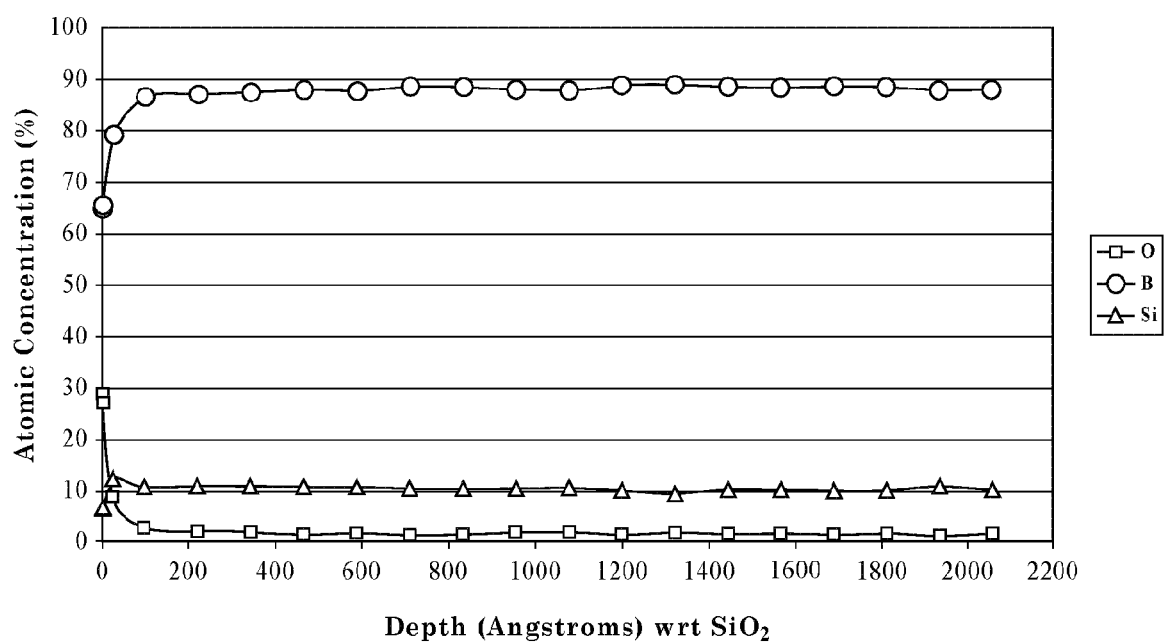
FIG. 55 is an x-ray photoelectron spectroscopy (XPS) depth profile of the oxysilaborane film deposited in Example 5.

The procedure described in Example 4 was carried out with the sole exception that nitrous oxide was introduced at a flow rate of 40 sccm. As shown in FIG. 54, a thin oxysilaborane film 512 with a polymeric semitransparent color was deposited over the (001) monocrystalline p-type silicon substrate 510. The oxysilaborane film thickness measured by variable-angle spectroscopic ellipsometry as being 159 nm. The XPS depth profile in FIG. 55 established the relative atomic concentrations of boron, silicon, and oxygen in the bulk oxysilaborane solid 512 as respectively being: 88.0%, 10.4%, and 1.6%. The inclusion of oxygen transformed the silaborane solid 511 in FIG. 50 of Example 4 into the oxysilaborane solid 512 in FIG. 54 of this example. The incorporation of oxygen altered the oxysilaborane solid 512 of this example relative to the silaborane solid 511 of Example 4.

Figure 56:
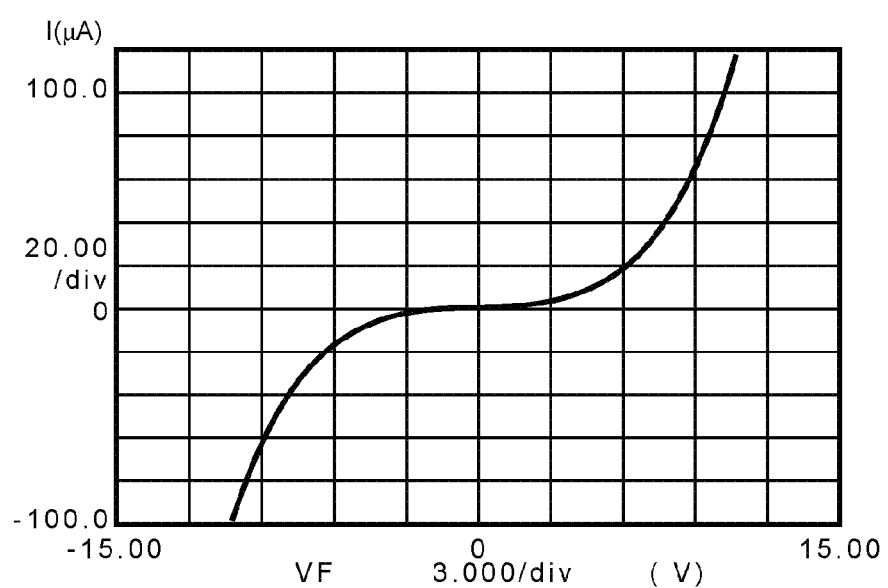
FIG. 56 is a linear graph of the current-voltage characteristics of the oxysilaborane film deposited in Example 5, as measured by an HP-4145 parameter analyzer with the sweep signals obtained by a mercury probe.
Figure 57:
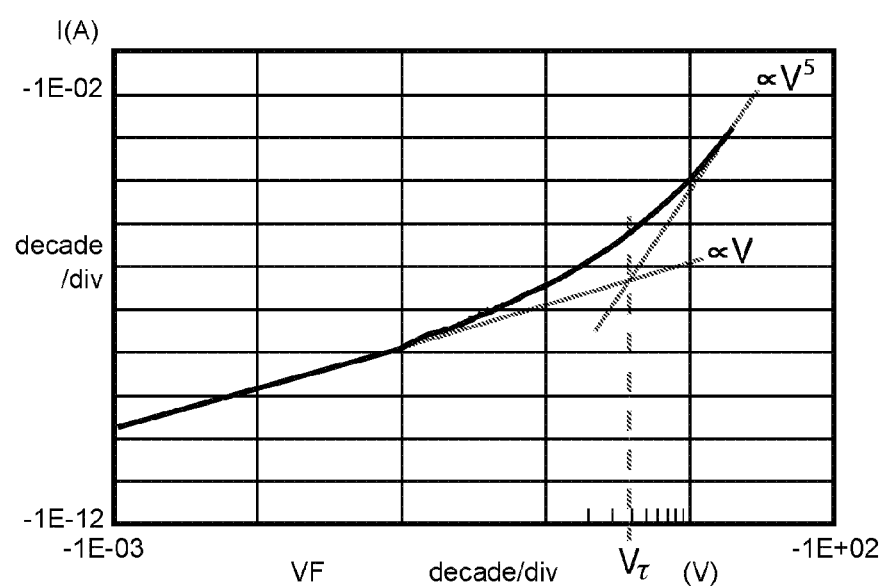
FIG. 57 is a log-log graph of the current-voltage characteristics of the oxysilaborane film deposited in Example 5, as measured by an HP-4145 parameter analyzer with the sweep signals obtained by a mercury probe.

The electrical impedance of the oxysilaborane film 512 of the present example was measured by an HP-4145 parameter analyzer, with the sweep signals provided by a mercury probe. Linear and log-log graphs of the impedance characteristics of the oxysilaborane solid 512 of this example are respectively shown in FIGS. 56-57. The impedance of the oxysilaborane solid 512 of the present example increased relative to the silaborane solid 511 in Example 4. Whereas the space-charge-limited current in the silaborane solid 511 saturated at a quartic current-voltage characteristic, the space-charge-limited current in the oxysilaborane solid 512 of this present example saturated at a quintic current-voltage characteristic, as shown FIG. 57. The space-charge current is limited by mobile charge drift.

Example 6

Figure 58:
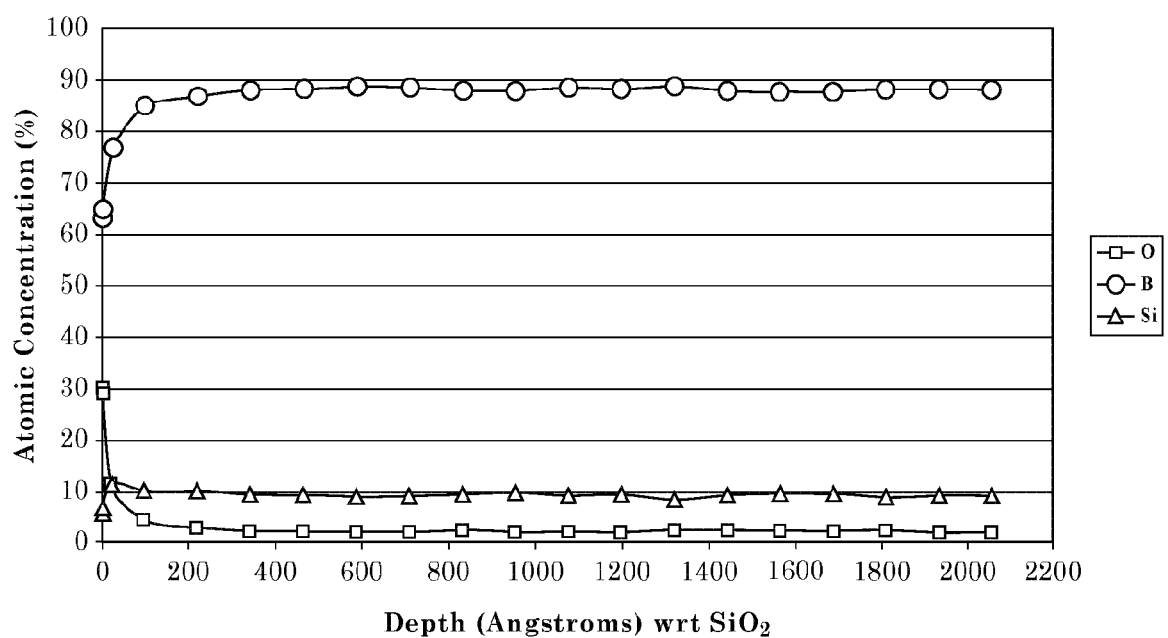
FIG. 58 is an x-ray photoelectron spectroscopy (XPS) depth profile of another embodiment of an oxysilaborane film deposited per Example 6.

The procedure described in Example 5 was carried out with a single exception that the flow rate of the nitrous oxide was increased from 40 sccm to 80 sccm. The thickness of the oxysilaborane solid 512 of this example was measured by variable-angle spectroscopic ellipsometry as being 147 nm. The XPS depth profile in FIG. 58 established the relative atomic concentrations of boron, silicon, and oxygen in the bulk oxysilaborane solid 512 as respectively: 88.1%, 9.5%, and 2.5%. The relative atomic concentration of boron in the oxysilaborane solid 512 of this example is the same as the oxysilaborane solid 512 within Example 5. The atomic concentration of silicon in the oxysilaborane solid 512 of this example decreased relative to that of the oxysilaborane solid 512 in Example 5. The bulk atomic concentration of oxygen in the oxysilaborane solid 512 of this example was increased relative to that of the picocrystalline oxysilaborane solid 512 in Example 5.

Figure 59:
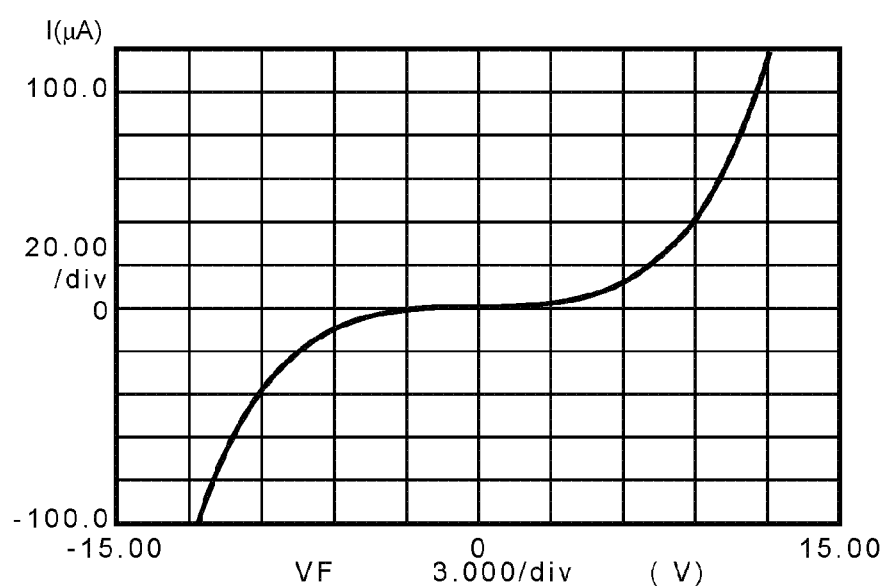
FIG. 59 is a linear graph of the current-voltage characteristics of the oxysilaborane film characterized in Example 6, as measured by an HP-4145 parameter analyzer with the sweep signals obtained by a mercury probe.
Figure 60:
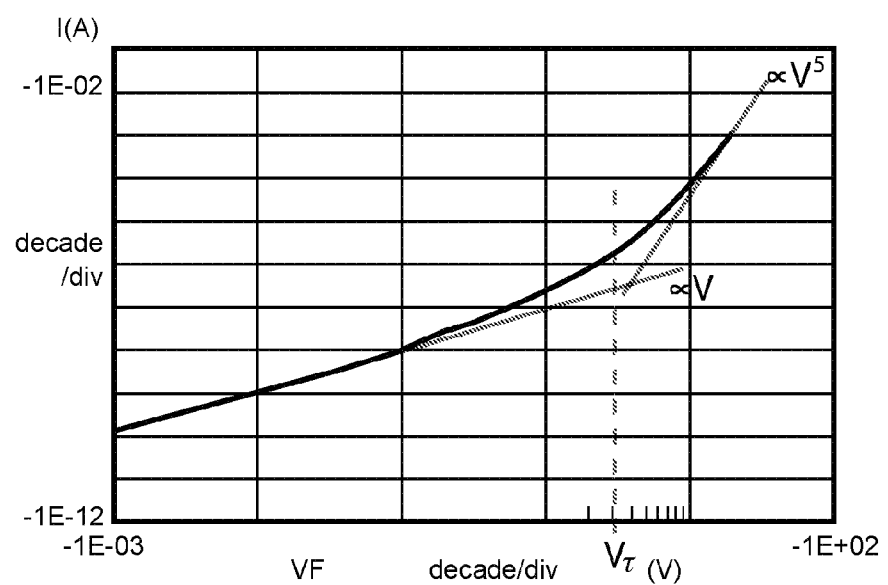
FIG. 60 is a log-log graph of the current-voltage characteristics of the oxysilaborane film characterized in Example 6, as measured by an HP-4145 parameter analyzer with the sweep signals obtained by a mercury probe.

An RBS and HFS analysis measured the bulk relative atomic concentrations of boron, hydrogen, silicon, and oxygen as being: 63%, 23%, 11%, and 3%. The relative atomic concentration of oxygen is close to its RBS detection limit and, thus, is not accurate. The impedance of the oxysilaborane film of this example was measured by an HP-4145 parameter analyzer, with the sweep signals obtained by a mercury probe. Linear and logarithm graphs of the impedance characteristics of the oxysilaborane solid 512 are respectively shown in FIGS. 59-60. The impedance characteristics of the oxysilaborane solid 512 of this example exhibited a modestly greater impedance than that of the oxysilaborane solid 512 in Example 5.

Example 7

Figure 61:
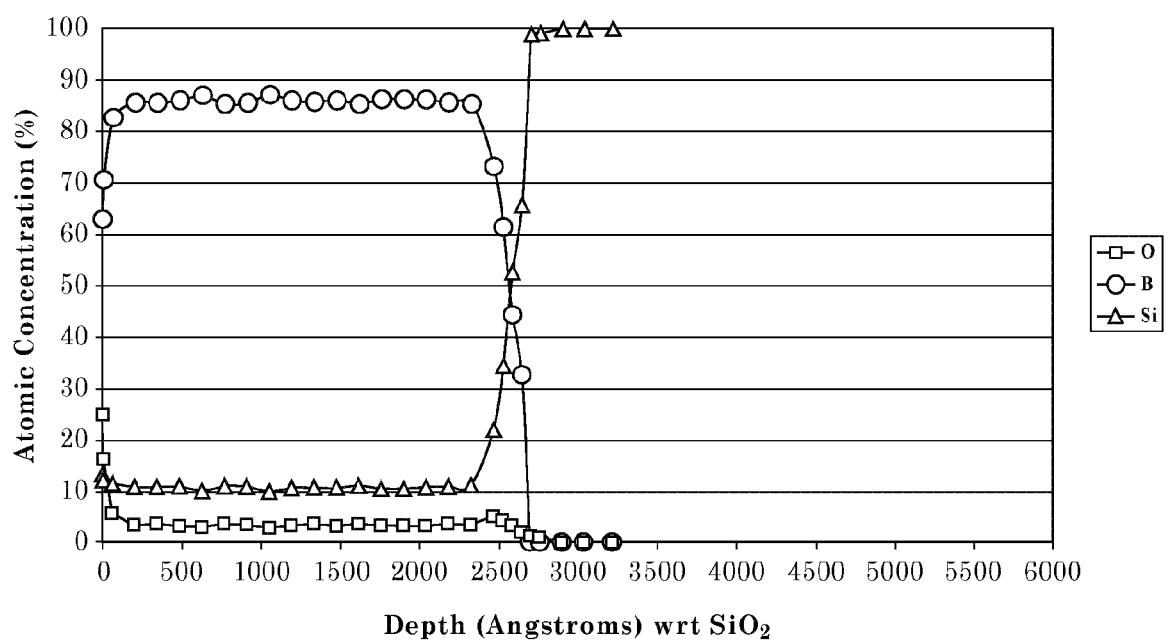
FIG. 61 is an x-ray photoelectron spectroscopy (XPS) depth profile of yet another embodiment of an oxysilaborane film deposited per Example 7.
Figure 62:
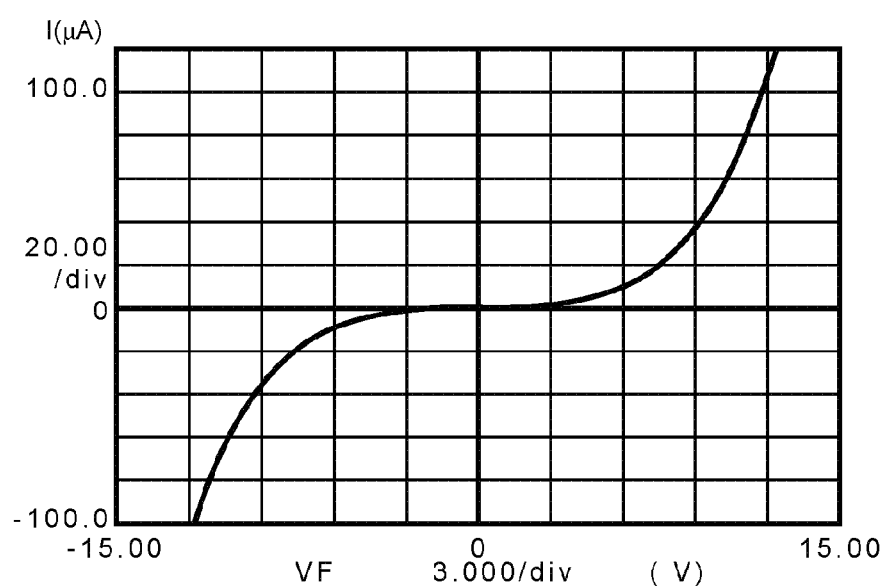
FIG. 62 is a linear graph of the current-voltage characteristics of the oxysilaborane film characterized in Example 7, as measured by an HP-4145 parameter analyzer with the sweep signals obtained by a mercury probe.
Figure 63:
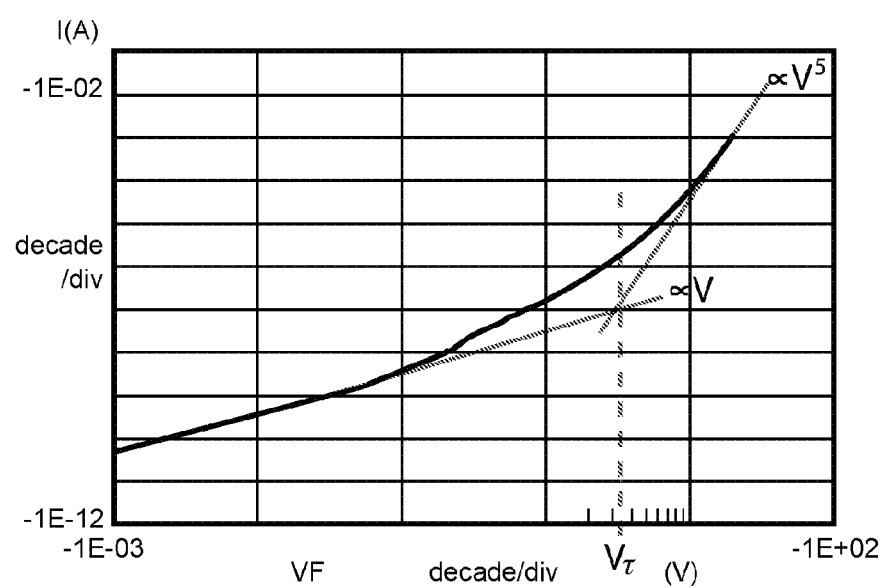
FIG. 63 is a log-log graph of the current-voltage characteristics of the oxysilaborane film characterized in Example 7, as measured by an HP-4145 parameter analyzer with the sweep signals obtained by a mercury probe.

The procedure described in Example 6 was carried out with the sole exception that the flow rate of the nitrous oxide was increased from 80 sccm to 100 sccm. The thickness of the oxysilaborane solid 512 of this example was measured by variable-angle spectroscopic ellipsometry as 140 nm. The XPS depth profile in FIG. 61 measured the relative atomic concentrations of boron, silicon, and oxygen in the oxysilaborane solid 512 as being respectively: 85.9%, 10.7%, and 3.4%. The impedance of the oxysilaborane solid 512 of this example was measured by an HP-4145 analyzer, with the two sweep signals obtained by a mercury probe. Linear and log-log graphs of the current-voltage characteristics of the oxysilaborane solid 512 of this example are shown in FIGS. 62-63. The oxysilaborane solid 512 of this example exhibited a slightly higher impedance than that of Example 6.

Example 8

Figure 64:
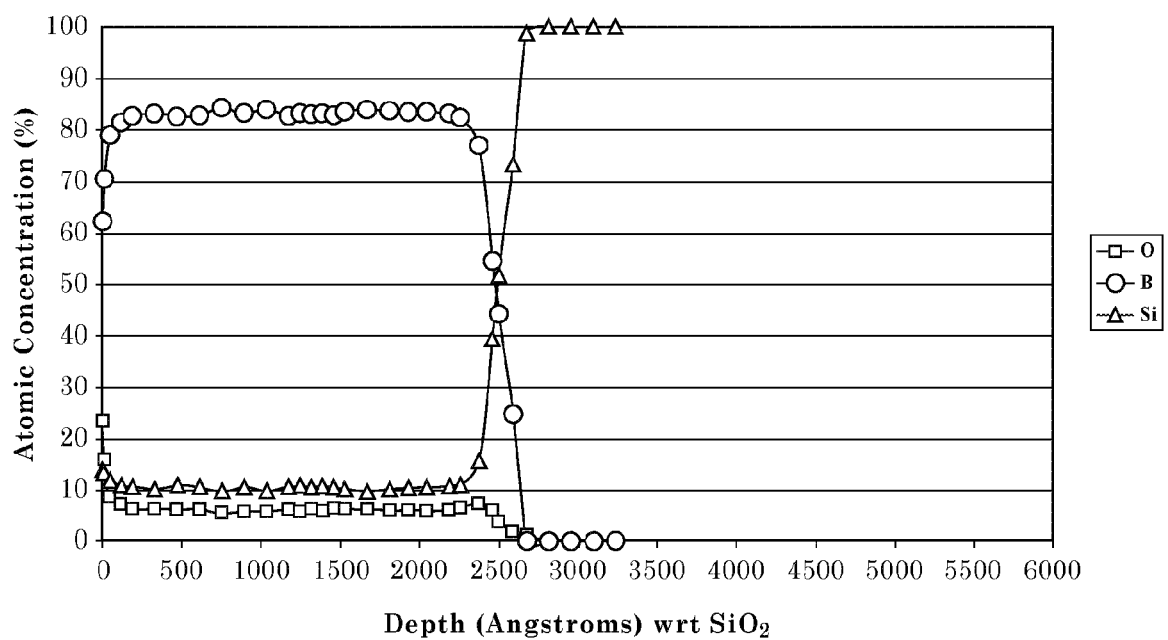
FIG. 64 is an x-ray photoelectron spectroscopy (XPS) depth profile of still another embodiment of an oxysilaborane film deposited in Example 8.
Figure 65:
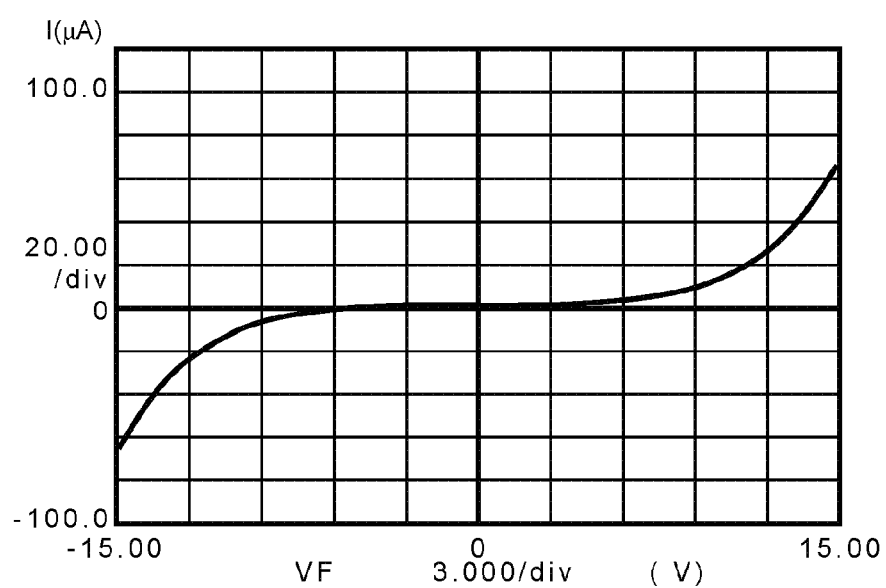
FIG. 65 is a linear graph of the current-voltage characteristics of the oxysilaborane film characterized in Example 8, as measured by an HP-4145 parameter analyzer with the sweep signals obtained by a mercury probe.
Figure 66:
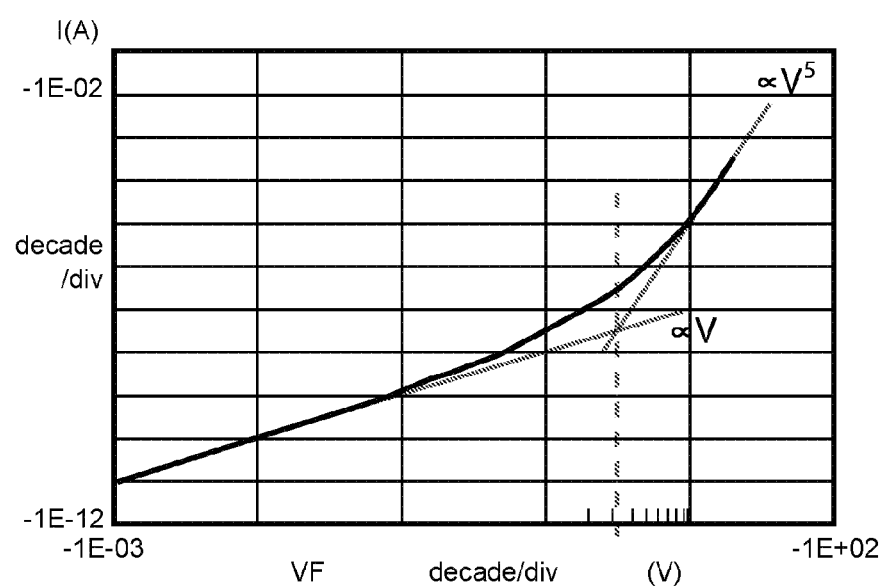
FIG. 66 is a log-log graph of the current-voltage characteristics of the oxysilaborane film characterized in Example 8, as measured by an HP-4145 parameter analyzer with the sweep signals obtained by a mercury probe.

The procedure described in Example 7 was carried out with a sole exception that the flow rate of nitrous oxide was increased from 100 sccm to 300 sccm. The thickness of the thin oxysilaborane solid 512 of this example was measured by variable-angle spectroscopic ellipsometry as being 126 nm. The XPS depth profile in FIG. 64 measured the relative atomic concentrations of boron, silicon, and oxygen in the oxysilaborane solid 512 of this example as: 83.4%, 10.5%, and 6.2%. The impedance of the oxysilaborane solid 512 was measured by an HP-4145 parameter analyzer. The linear and log-log graphs of the impedance characteristics of the oxysilaborane solid 512 of this example are shown in FIGS. 65-66.

Example 9

Figure 67:
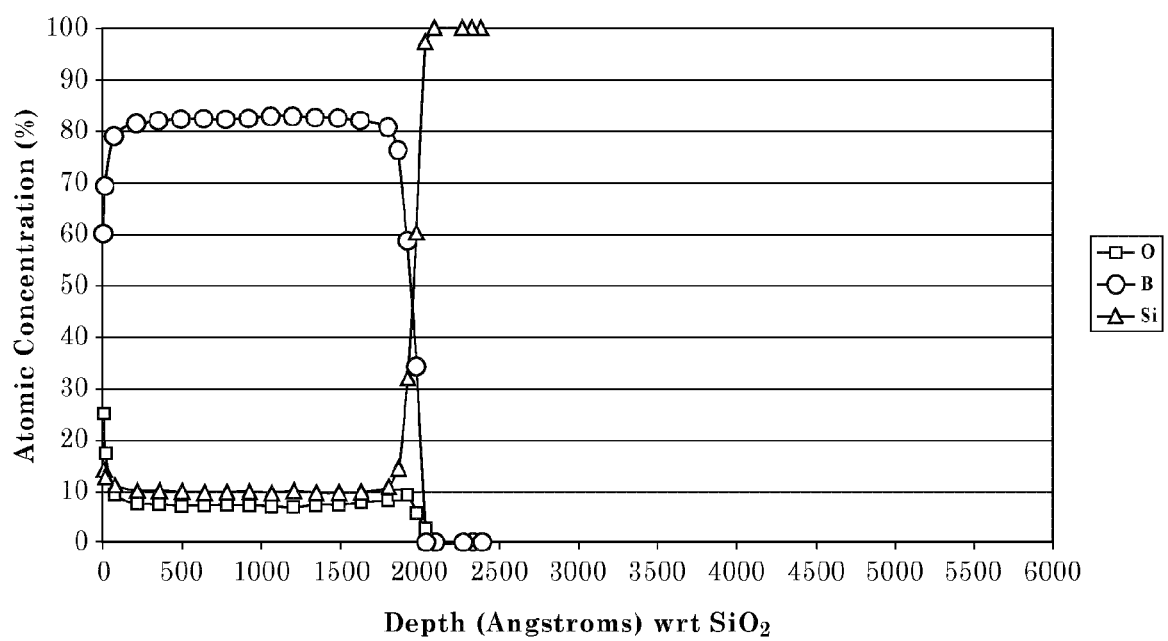
FIG. 67 is an x-ray photoelectron spectroscopy (XPS) depth profile of yet still another embodiment of an oxysilaborane film deposited in Example 9.
Figure 68:
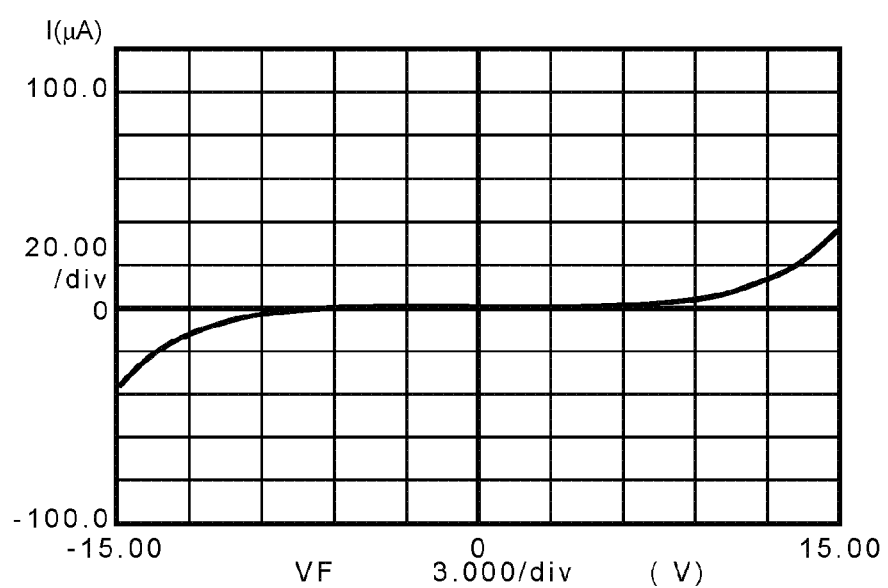
FIG. 68 is a linear graph of the current-voltage characteristics of the oxysilaborane film characterized in Example 9, as measured by an HP-4145 parameter analyzer with the sweep signals obtained by a mercury probe.
Figure 69:
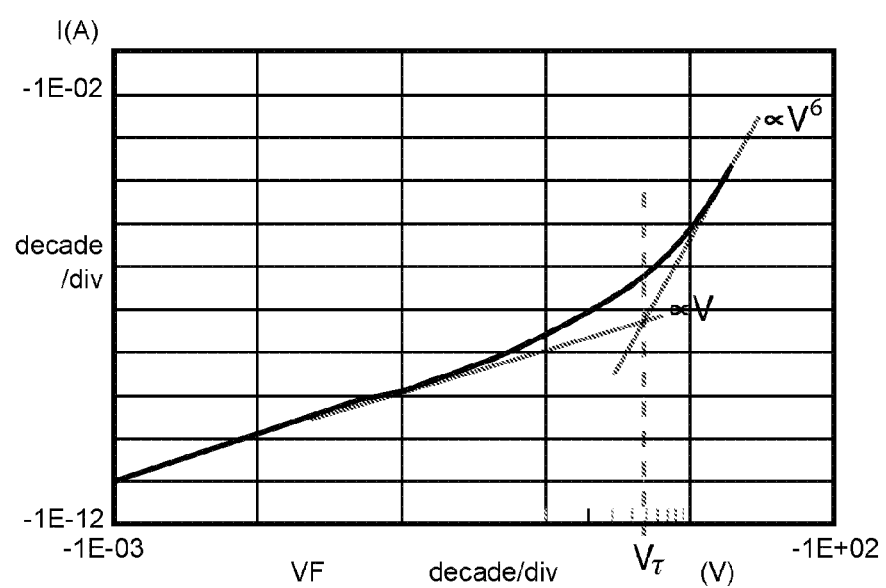
FIG. 69 is a log-log graph of the current-voltage characteristics of the oxysilaborane film characterized in Example 9, as measured by an HP-4145 parameter analyzer with the sweep signals obtained by a mercury probe.

The procedure in Example 8 was carried out with the exception that the nitrous oxide flow rate was increased from 300 to 500 sccm. The thickness of the thin oxysilaborane solid 512 of this example was measured by variable-angle spectroscopic ellipsometry as 107 nm. The XPS depth profile in FIG. 67 established the relative atomic concentrations of boron, silicon and oxygen in the bulk oxysilaborane solid 512 of this example as being: 82.4%, 10.0%, and 7.6%. RBS and HFS analysis established the bulk relative atomic concentrations of boron, hydrogen, silicon, and oxygen: 66%, 20%, 9%, and 5%. The relative atomic concentration of oxygen is near its RBS detection limit. The impedance of the oxysilaborane solid 512 of this example was measured by an HP-4145 parameter analyzer, with sweep signals obtained by a mercury probe. Linear and log-log graphs of the impedance characteristics of the oxysilaborane solid 512 of this example are in FIGS. 68-69.

The oxysilaborane solid 512 of this example is oxygen-rich, such that it does not exist in the preferred compositional range ($2 \leq x \leq 4$, $3 \leq y \leq 5$, $0 \leq z \leq 2$) of picocrystalline oxysilaborane $(B_{12}H_4)_x Si_y O_z$ but is contained in a broader compositional range ($0 \leq w \leq 5$, $2 \leq x \leq 4$, $3 \leq y \leq 5$, $0 \leq z \leq 3$) of oxysilaborane $(B_{12})_x Si_y O_z H_w$. It is significant that picocrystalline oxysilaborane unpins the surface Fermi level of monocrystalline silicon so as to modulate the surface electrochemical potential of monocrystalline silicon and, at the same time, conducts electricity. In order to more fully appreciate this property, it is purposeful to consider examples in which an electrochemical rectifier is formed with monocrystalline silicon.

It is not possible in the prior art to vary the electrochemical potential of a monocrystalline silicon region throughout the forbidden energy region, while also conducting electric charge, due to an undesirable contact potential associated with mobile-charge diffusion between a monocrystalline silicon region and a conjoined material of a different work function. This deficiency is remedied by self-assembled picocrystalline oxysilaborane by means of actual examples.

Example 10

Monocrystalline silicon was epitaxially deposited over a (001) boron-doped p-type monocrystalline substrate 521 with a 100 mm diameter and 525 µm thickness. The resistivity of the degenerate monocrystalline silicon substrate 521 was 0.02 Ω-cm, which corresponds to an acceptor concentration of ~4×10$^{18}$ cm$^{-3}$. A nondegenerate p-type monocrystalline silicon layer 522 was deposited on the silicon substrate 521. The epitaxial silicon layer 522 had a thickness of 15 µm and a resistivity of 2 Ω-cm, which corresponds to an acceptor impurity concentration of ~7×10$^{15}$ cm$^{-3}$. All oxide was removed by a hydrofluoric acid deglaze. After the acid deglaze, the silicon substrate 521 was inserted onto a resistively-heated susceptor in an EMCORE MOCVD reactor by a load-lock system that isolated the deposition chamber from the ambient. The deposition chamber was pumped below 50 mtorr, whereupon a 3% mixture by volume of diborane in hydrogen $B_2H_6(3\%)/H_2(97\%)$ at the flow rate of 150 sccm and a 2% mixture by volume of monosilane in hydrogen $SiH_4(2\%)/H_2(98\%)$ at the flow rate of 300 sccm were introduced into the deposition chamber. Nitrous oxide $N_2O$ was introduced at a flow rate of 100 sccm.

The gases were permitted to mix before entering into the deposition chamber. Upon the stabilization of the reactant gases, the chamber pressure was regulated at 1.5 torr while the susceptor was rotated at 1100 rpm. The substrate temperature was increased to 230° C. for 2 minutes. The susceptor temperature was yet further increased to 260° C., whereupon it stabilized and the chemical reaction was permitted to proceed for 12 minutes. The susceptor heating was secured and the sample was permitted to cool below 80° C. in the reactant gases before it was removed from the deposition chamber. An oxysilaborane film 523 was deposited. The thickness was measured by variable-angle spectroscopic ellipsometry as being 12.8 nm. Due to the thickness, the oxysilaborane film 523 showed no coloration.

Figure 70:
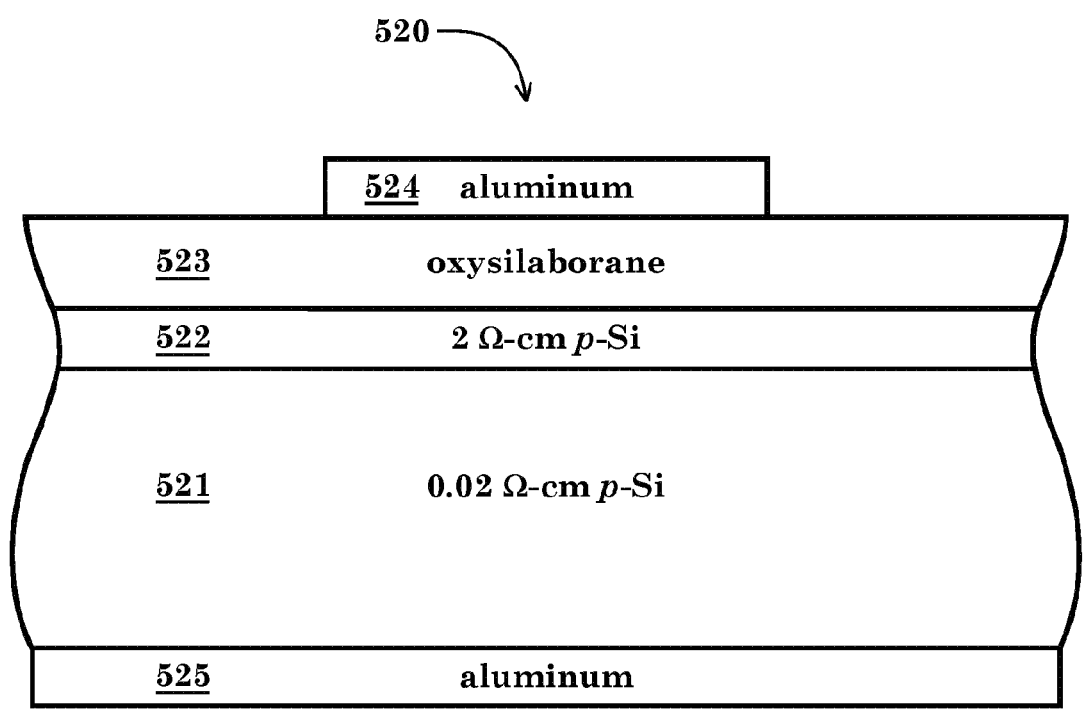
FIG. 70 is an illustration of a p-isotype electrochemical rectifier comprising oxysilaborane film produced in accordance with Example 10.

Aluminum was evaporated over the entire substrate 521 backside in a bell-jar evaporator, after which, a similar layer of aluminum was evaporated on the oxysilaborane film 523 through a shadow mask in the bell-jar evaporator. The topside aluminum formed the cathode electrode 524 and the backside aluminum formed the anode electrode 525, as shown in FIG. 70. The electrical characteristics of the p-isotype electrochemical rectifier 520 of this example were measured by an HP-4145 parameter analyzer, with the sweep signals obtained from the anode and cathode electrodes 525 and 524 by means of microprobes. Linear current-voltage characteristics of the p-isotype electrochemical rectifier 520 of this example are shown at two distinct current-voltage ranges in FIGS. 71-72. The electrochemical rectifier 520 achieves an asymmetrical electrical conductance without the aid of a p-n junction by means of a variation in the surface electrochemical potential.

Figure 71:
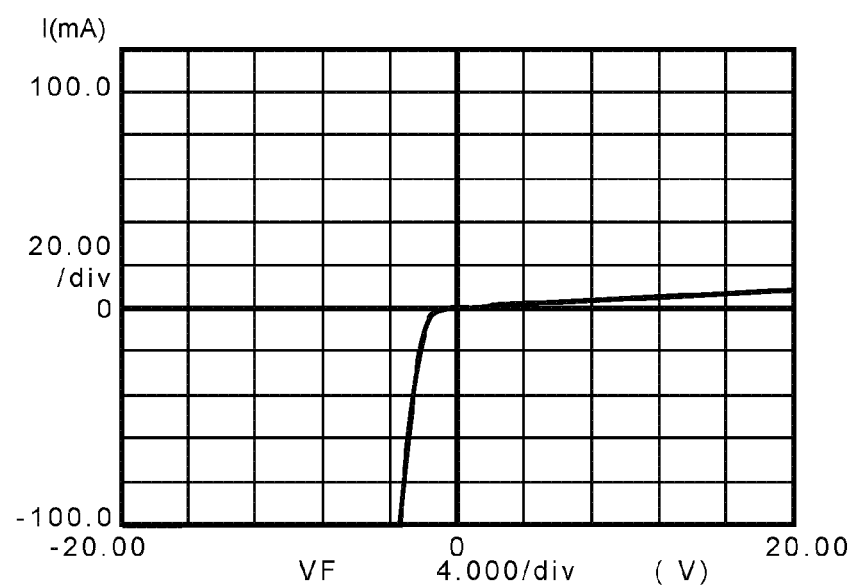
FIG. 71 is a linear graph of the current-voltage characteristics of the p-isotype electrochemical rectifier in Example 10, as measured by an HP-4145 parameter analyzer with the sweep signals obtained by microprobes.
Figure 72:
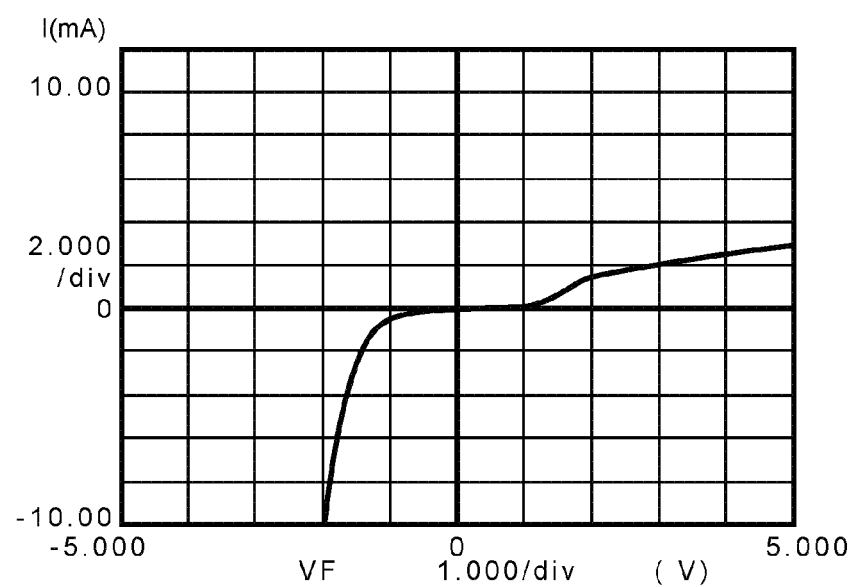
FIG. 72 is a linear graph of a different current-voltage range of the p-isotype electrochemical rectifier in Example 10, as measured by an HP-4145 parameter analyzer with the sweep signals obtained by microprobes.
Figure 73:
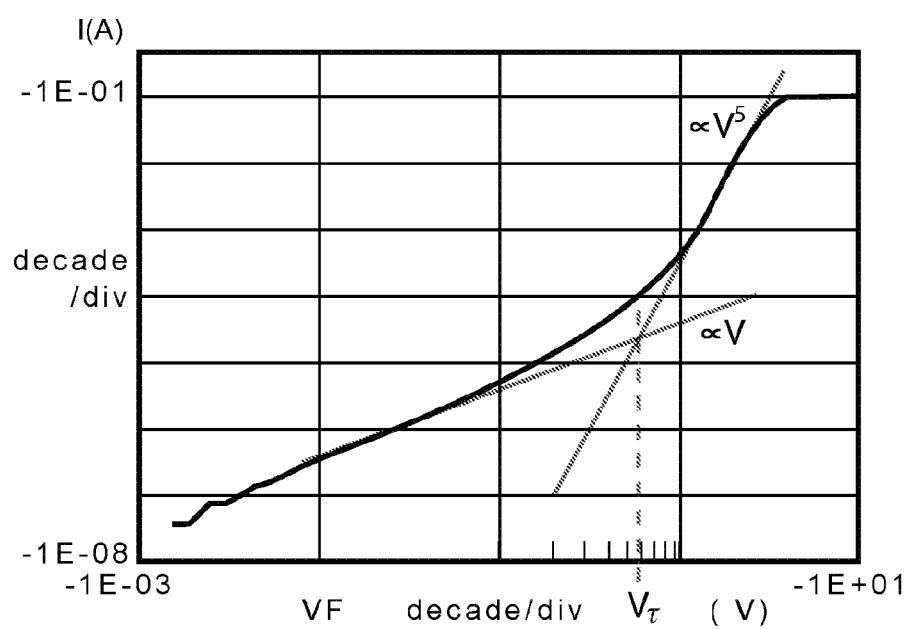
FIG. 73 is a log-log graph of forward-bias current-voltage characteristics of the p-isotype electrochemical rectifier in Example 10, as measured by an HP-4145 parameter analyzer with the sweep signals obtained by microprobes.
Figure 74:
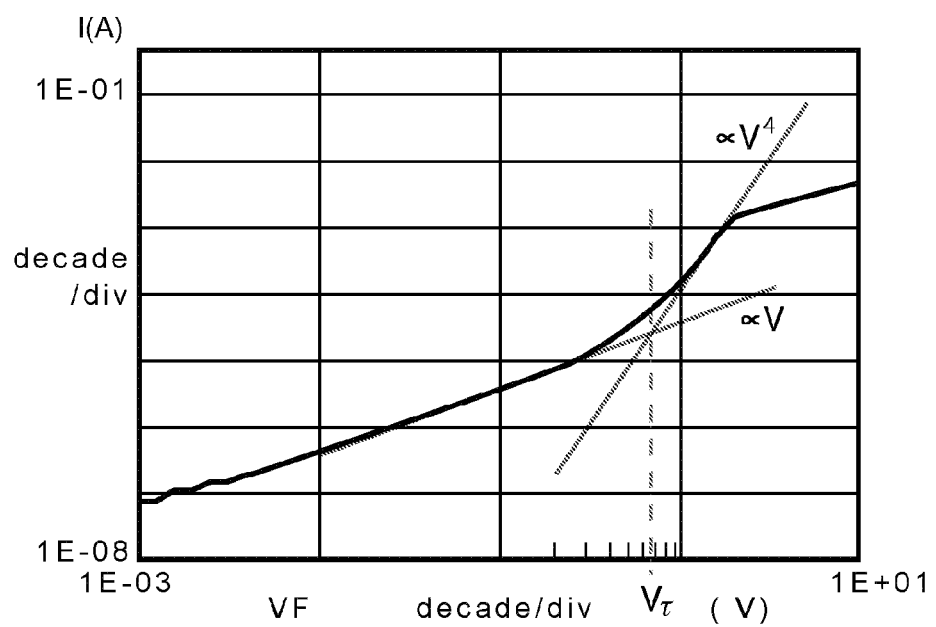
FIG. 74 is a log-log graph of reverse-bias current-voltage characteristics of the p-isotype electrochemical rectifier in Example 10, as measured by an HP-4145 parameter analyzer with the sweep signals obtained by microprobes.

As shown in FIG. 71, a considerably greater current flows when the cathode electrode 524 is negatively-biased (forward-biased) relative to the anode electrode 525. When the cathode electrode 524 is positively-biased (reverse-biased) relative to the anode electrode 525, the much smaller current increases with an increased reverse bias beyond ~1V. The increased reverse-bias current is believed to be due to deleterious interfacial effects due to non-ideal processing conditions. Forward-bias and reverse-bias logarithm current-voltage plots are represented in FIGS. 73-74. The asymmetrical current conduction is due to a built-in field.

Example 11

Figure 76:
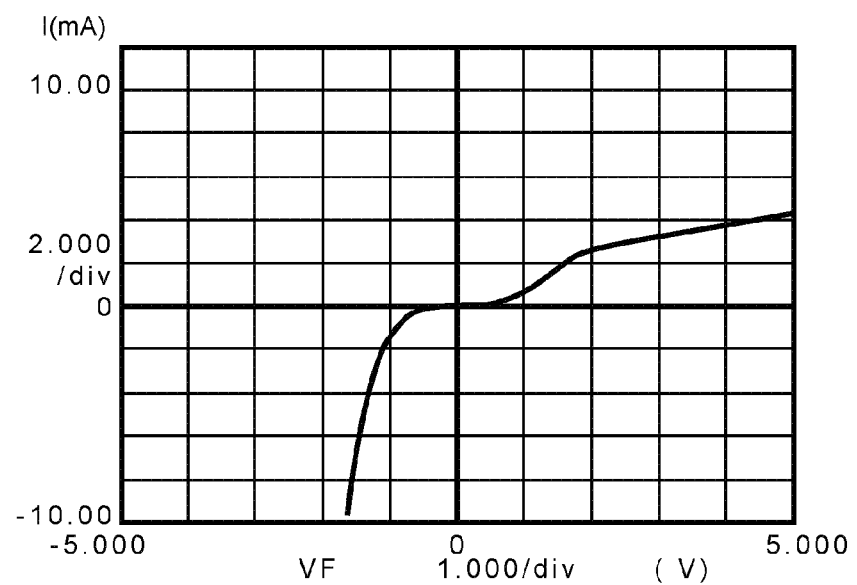
FIG. 76 is a linear graph of a different current-voltage range of the p-isotype electrochemical rectifier in Example 11, as measured by an HP-4145 parameter analyzer with the sweep signals obtained by microprobes.
Figure 77:
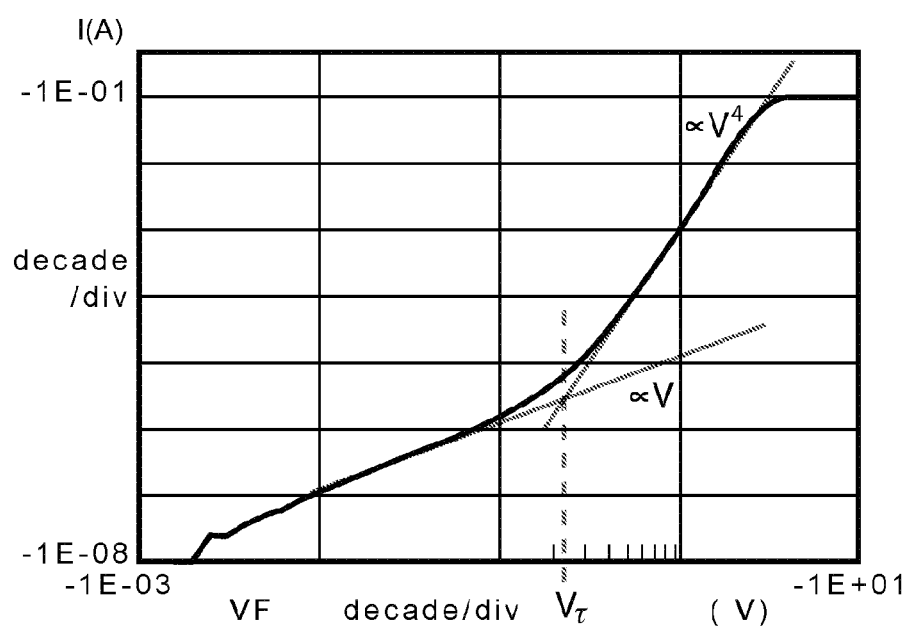
FIG. 77 is a log-log graph of forward-bias current-voltage characteristics of the p-isotype electrochemical rectifier in Example 11, as measured by an HP-4145 parameter analyzer with the sweep signals obtained by microprobes.
Figure 78:
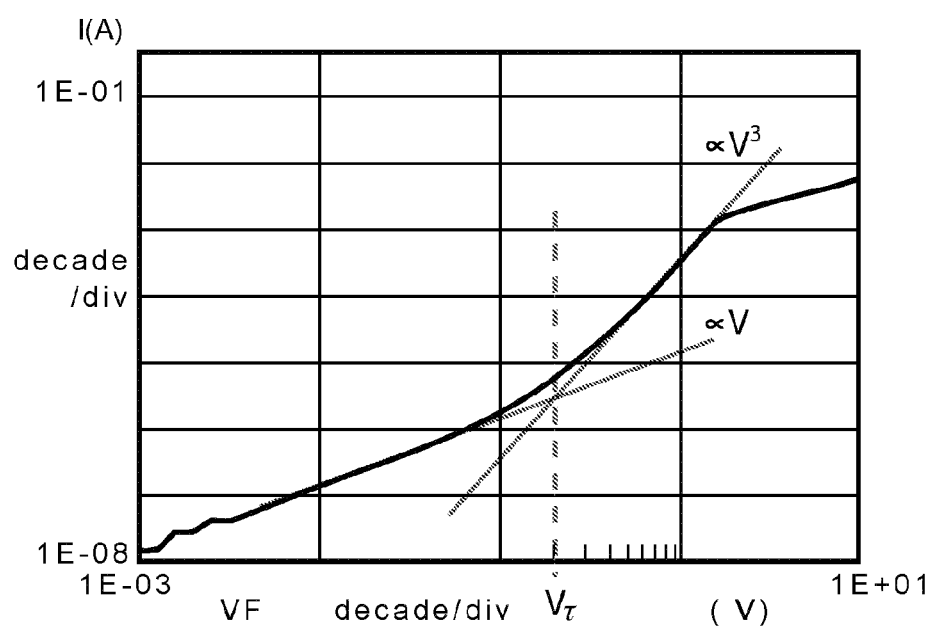
FIG. 78 is a log-log graph of reverse-bias current-voltage characteristics of the p-isotype electrochemical rectifier in Example 11, as measured by an HP-4145 parameter analyzer with the sweep signals obtained by microprobes.

The procedure described in Example 10 was carried out with the sole exception that the flow rate of nitrous oxide $N_2O$ was increased from 20 sccm to 65 sccm. The thickness of the oxysilaborane film 523 of this example was measured by variable-angle spectroscopic ellipsometry as 12.4 nm. The electrical characteristics of the p-isotype electrochemical rectifier 520 of this example were measured by an HP-4145 parameter analyzer, with sweep signals obtained from the anode and cathode electrodes 525 and 524 by means of microprobes. The linear current-voltage characteristics of the p-isotype electrochemical rectifier 520 of this present example are shown at two different ranges in FIGS. 75-76. Forward-bias and reverse-bias logarithm current-voltage plots are shown in FIGS. 77-78. Although the bulk composition of the oxysilaborane film 523 of this example is substantially that of prototypical oxysilaborane $(B_{12}^{2-}H_4)_2Si_4O_2^{2+}$, rectification does not appear to be ideal for reasons that will be discussed later hereinbelow.

Example 12

Figure 79:
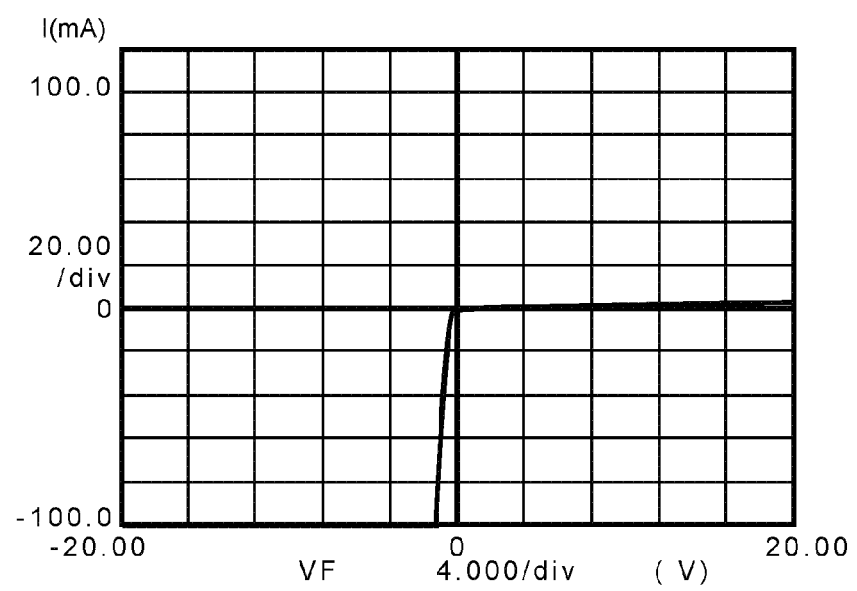
FIG. 79 is a linear graph of a first current-voltage range of the p-isotype electrochemical rectifier in Example 12, as measured by an HP-4145 parameter analyzer with the sweep signals obtained by means of microprobes.
Figure 80:
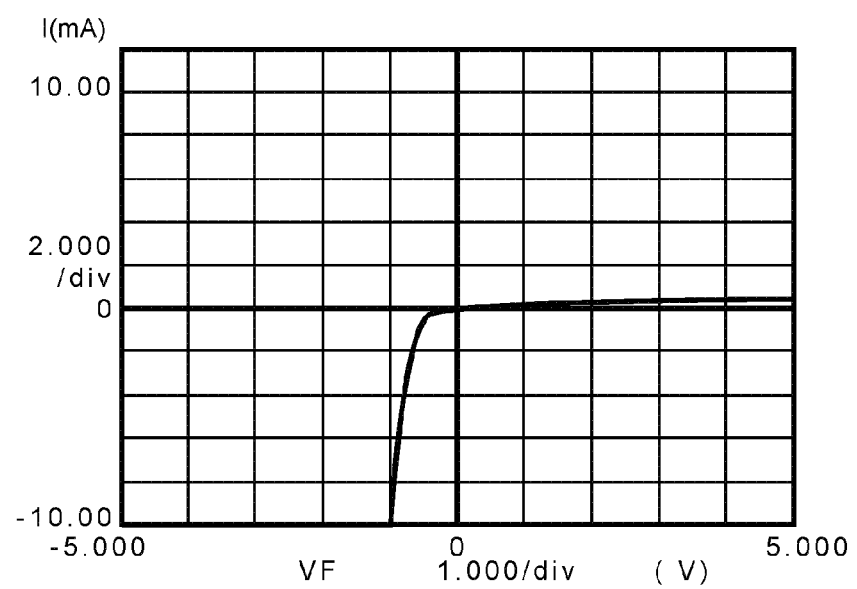
FIG. 80 is a linear graph of a second current-voltage range of the p-isotype electrochemical rectifier in Example 12, as measured by an HP-4145 parameter analyzer with the sweep signals obtained by means of microprobes.
Figure 81:
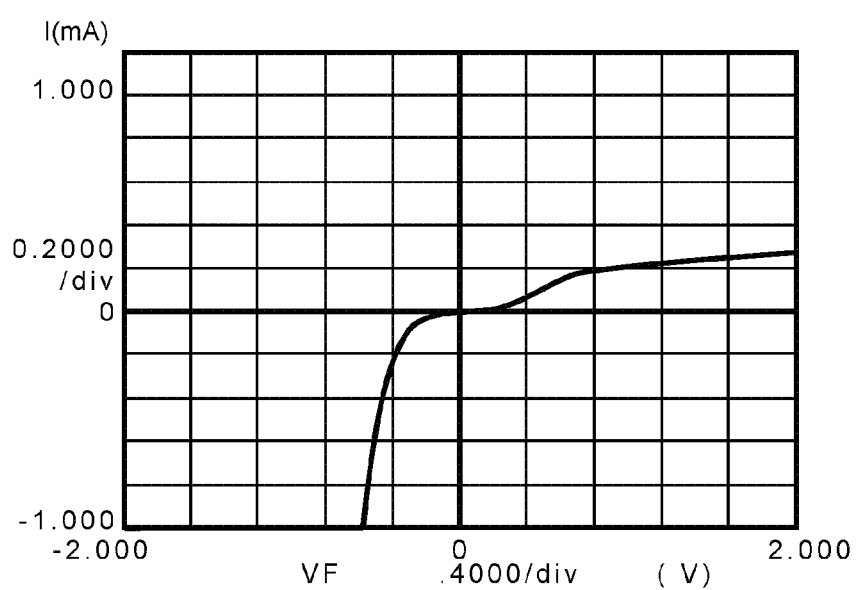
FIG. 81 is a linear graph of a third current-voltage range of the p-isotype electrochemical rectifier in Example 12, as measured by an HP-4145 parameter analyzer with the sweep signals obtained by means of microprobes.
Figure 82:
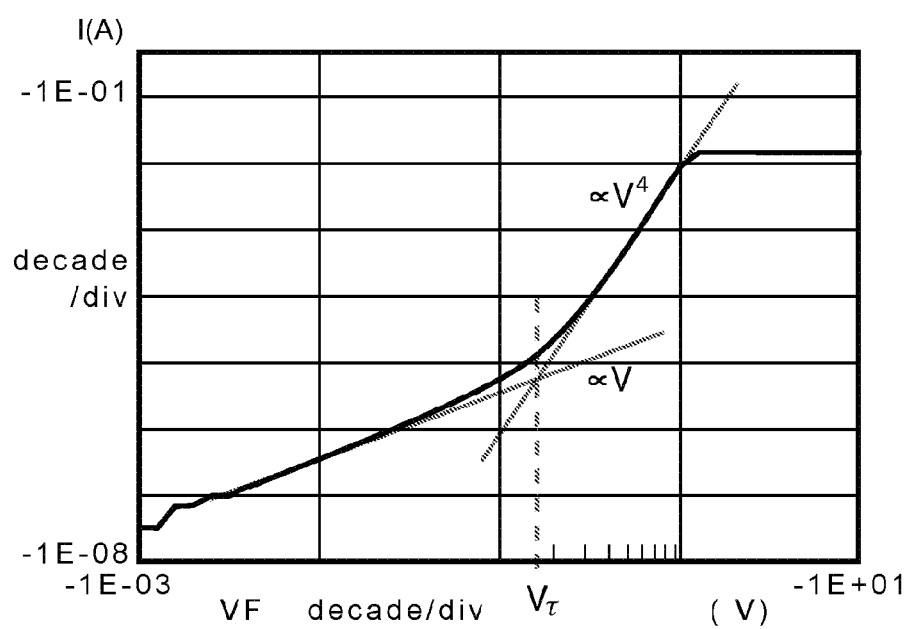
FIG. 82 is a log-log graph of forward-bias current-voltage characteristics of the p-isotype electrochemical rectifier in Example 12, as measured by an HP-4145 parameter analyzer with the sweep signals obtained by microprobes.
Figure 83:
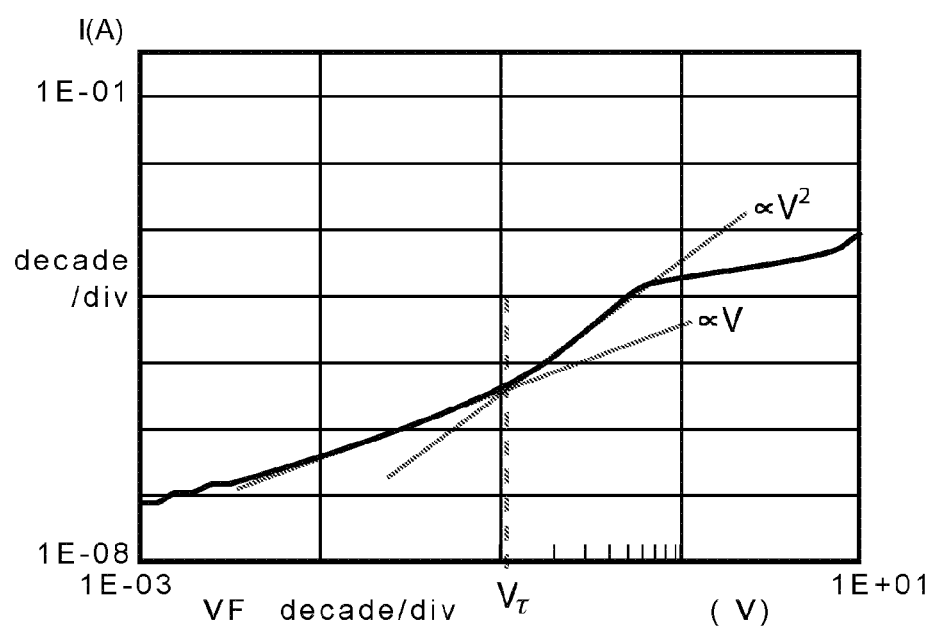
FIG. 83 is a log-log graph of reverse-bias current-voltage characteristics of the p-isotype electrochemical rectifier in Example 12, as measured by an HP-4145 parameter analyzer with the sweep signals obtained by microprobes.

The procedure described above in Example 11 was carried out with the exception that the reaction time at 260° C. was decreased from 12 minutes to 6 minutes. The thickness of the oxysilaborane film 523 of this present example was measured by variable-angle spectroscopic ellipsometry as 7.8 nm. The electrical characteristics of the p-isotype electrochemical rectifier 520 of this example were measured by an HP-4145 parameter analyzer, with sweep signals obtained from the anode and cathode electrodes 525 and 524 by two microprobes. Linear current-voltage characteristics of the p-isotype electrochemical rectifier 520 of the present example are shown at three different current-voltage ranges in FIGS. 79-81. The forward-bias and reverse-bias logarithm current-voltage characteristics are presented in FIGS. 82-83. The rectification properties of this example are improved relative to Examples 10-11 due, in large part, to the thinner film 523.

Example 13

Figure 84:
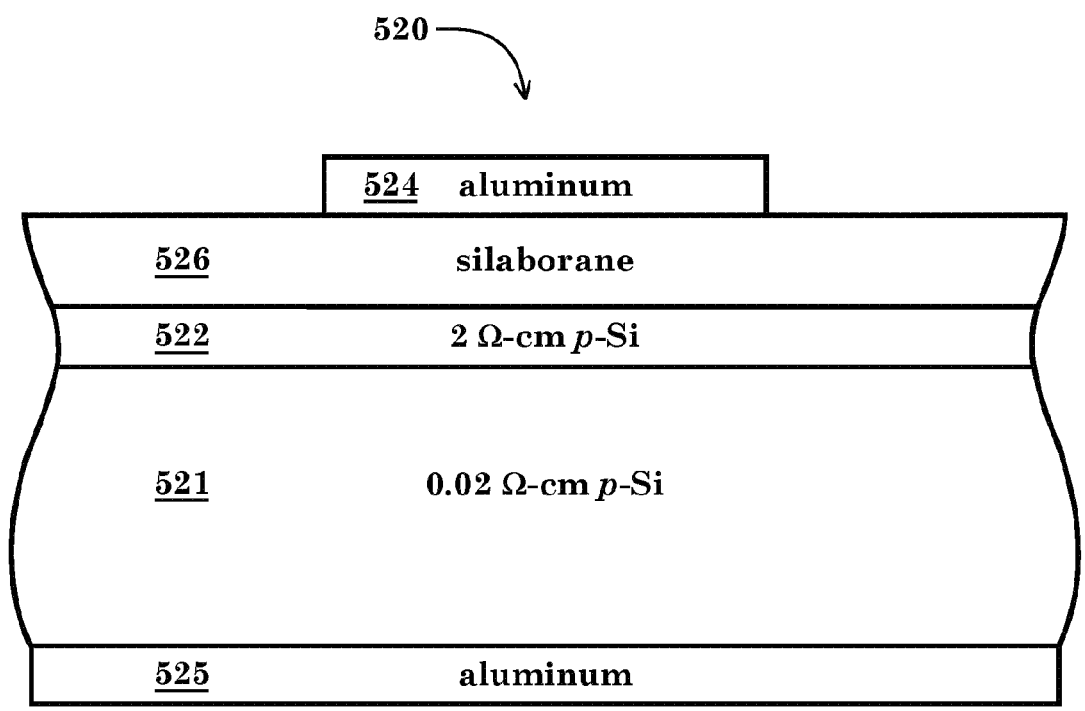
FIG. 84 is an illustration of an electrochemical device comprising a silaborane film produced in accordance with Example 13.
Figure 85:
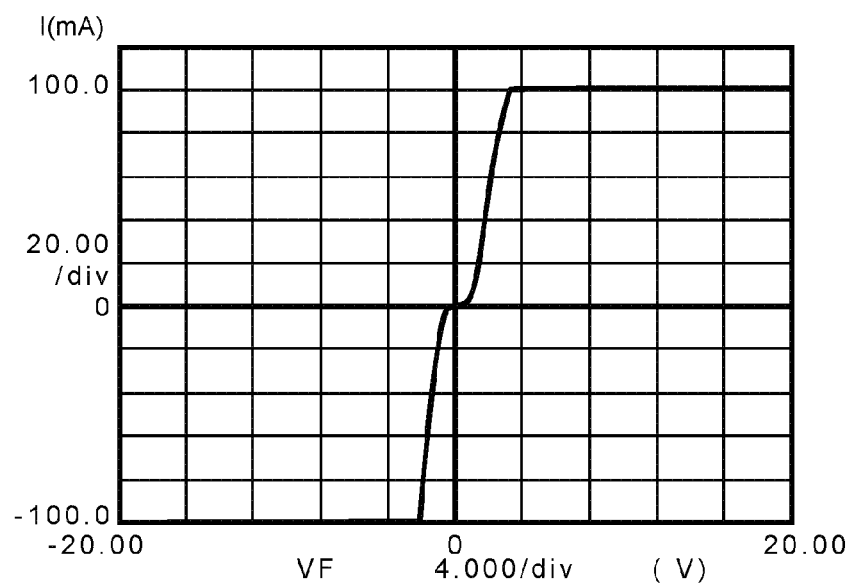
FIG. 85 is a linear graph of the current-voltage characteristics of the electrochemical device in Example 13, as measured by an HP-4145 parameter analyzer with the sweep signals obtained by microprobes.
Figure 86:
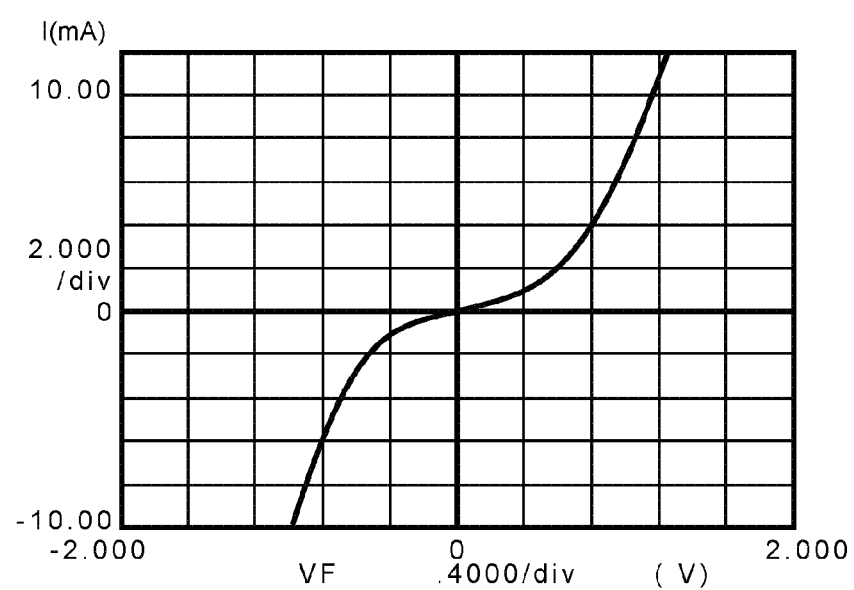
FIG. 86 is a linear graph of a second current-voltage characteristics of the electrochemical device in Example 13, as measured by an HP-4145 parameter analyzer with the sweep signals obtained by microprobes.
Figure 87:
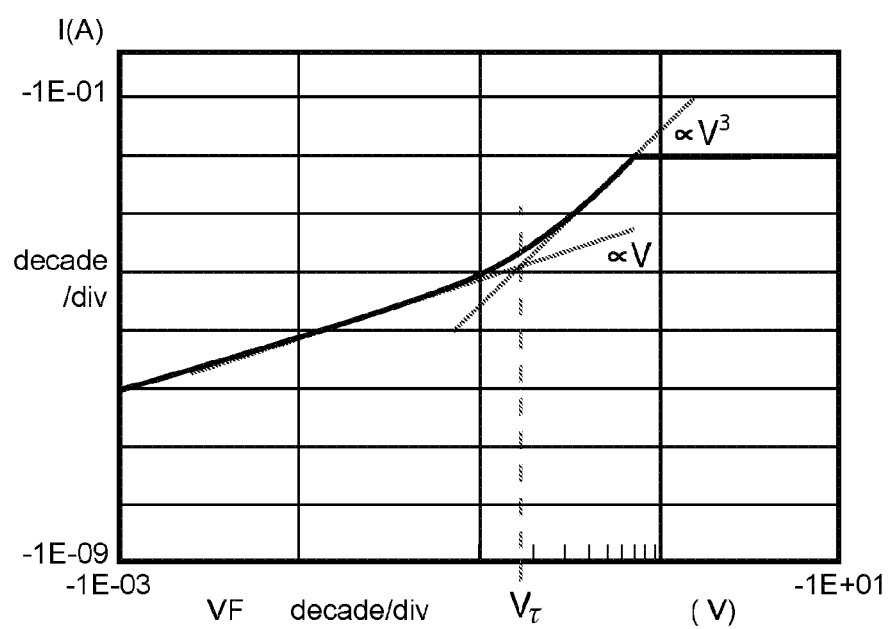
FIG. 87 is a log-log graph of forward-bias current-voltage characteristics of the electrochemical device in Example 13, as measured by an HP-4145 parameter analyzer with the sweep signals obtained by microprobes.
Figure 88:
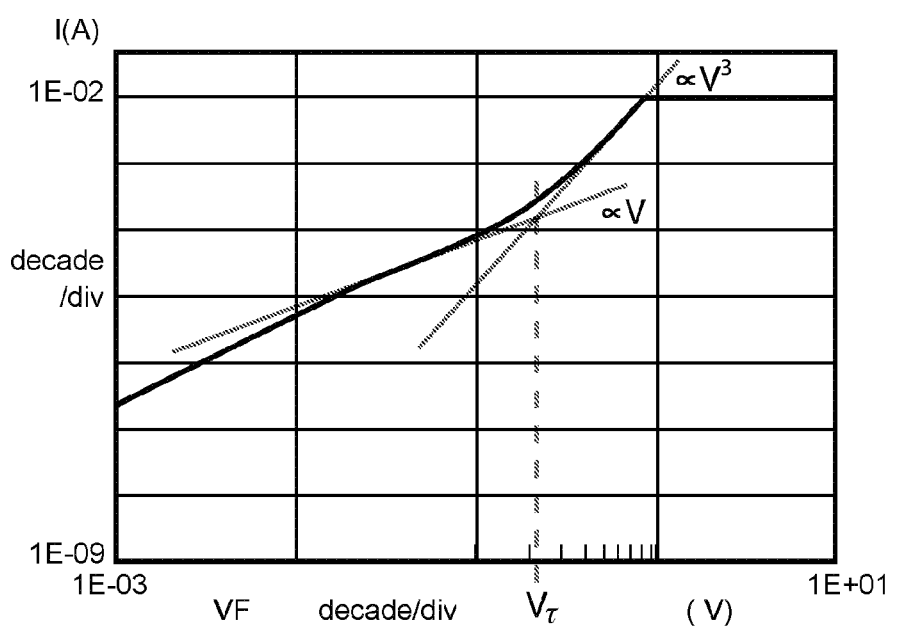
FIG. 88 is a log-log graph of reverse-bias current-voltage characteristics of the electrochemical device in Example 13, as measured by an HP-4145 parameter analyzer with the sweep signals obtained by microprobes.

The procedure in Example 12 was carried out with the exception that nitrous oxide $N_2O$ was never introduced. The thickness of the silaborane film 526 represented in FIG. 84 was measured by variable-angle spectroscopic ellipsometry as being 11.4 nm. The electrical characteristics of the device 520 were measured by an HP-4145 parameter analyzer, with the sweep signals obtained from the anode and cathode electrodes 525 and 524 by means of microprobes. The linear current-voltage characteristics of the device 520 are shown in FIGS. 85-86. The forward-bias and reverse-bias logarithm current-voltage plots are shown in FIGS. 87-88.

Figure 75:
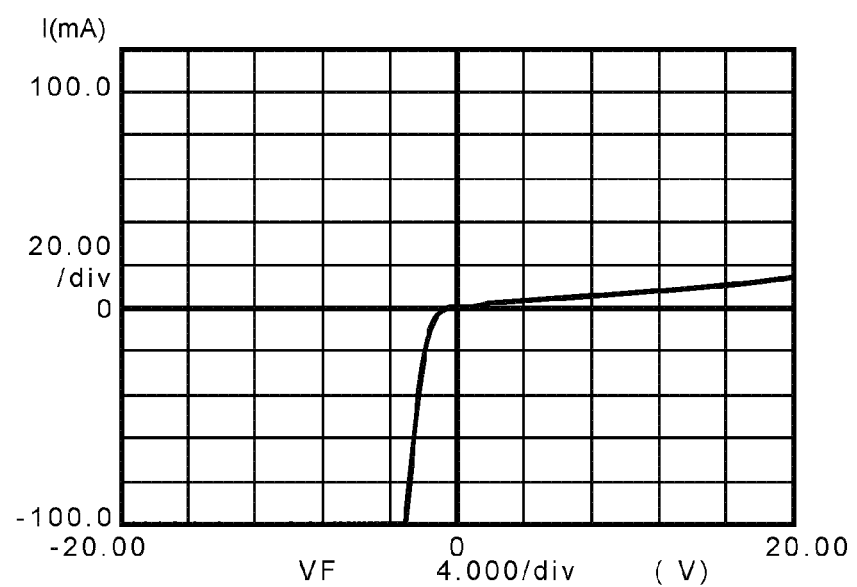
FIG. 75 is a linear graph of the current-voltage characteristics of the p-isotype electrochemical rectifier in Example 11, as measured by an HP-4145 parameter analyzer with the sweep signals obtained by microprobes.

The fundamental difference between picocrystalline oxysilaborane p-$(B_{12}{}^{2-}H_4)_2Si_4O_2{}^{2+}$ and picocrystalline silaborane p-$(B_{12}H_4)_3Si_5$ is exemplified by the fundamental difference in the rectification of the electrochemical devices 520 in Example 11 and Example 13 due to the critical role of oxygen. The difference in devices 520 of these examples is the oxygen concentration of the picocrystalline films 523 and 526. Referring, now, to FIG. 75, the electric current in the p-isotype electrochemical rectifier 520 in Example 11 increases significantly as the cathode electrode 524 is increasingly forward-biased (i.e. negatively-biased) relative to the anode electrode 525. As shown in FIG. 77, a forward-bias current in the p-isotype electrochemical rectifier 520 in Example 11 increases linearly with the bias voltage at a low current and increases with a quartic voltage dependence beyond the relaxation voltage. The forward-bias current-voltage characteristic of the rectifier 520 in Example 11 is space-charge-limited by the oxysilaborane film 523 beyond a relaxation voltage, whereupon the transit time is less than the relaxation time.

A different situation occurs when the electrochemical rectifier 520 is reverse-biased. Referring to FIG. 75, the current of the p-isotype electrochemical rectifier 520 in Example 11 increases at a reduced rate as the cathode electrode 524 is reverse-biased (i.e. positively-biased) relative to the anode electrode 525. This is believed due to the fact that the oxysilaborane film 523 in Example 11 is nearly picocrystalline oxysilaborane p-$(B_{12}{}^{2-}H_4)_2Si_4O_2{}^{2+}$, which constitutes a solid in a closed-shell electronic configuration. The conduction current represented by the log-log graph in FIG. 77 is characteristic of an injected charge plasma.

When a charge plasma is injected into a semiconductor or a dielectric, the electric current density and voltage vary linearly until a sufficiently high level of charge injection results in a space-charge-limited current density due to a break-down in charge neutrality. High-level charge injection in a semiconductor tends to result in a quadratic dependence of the space-charge-limited current density upon voltage while a high-level charge injection in a dielectric tends to result in a cubic dependence of a space-charge-limited current density upon voltage. The principal difference between a semiconductor and a dielectric is that the former is characterized by a large mobile-charge concentration, of a negative or a positive polarity, while the latter is characterized by a negligible mobile-charge concentration.

In principle, the log-log current-voltage characteristic of the rectifier 520 shown in FIG. 77 should be characteristic of the charge plasma injected into a dielectric since the oxysilaborane film 523 in Example 11 has a bulk composition of picocrystalline oxysilaborane p-$(B_{12}{}^{2-}H_4)_2Si_4O_2{}^{2+}$ with an ideally closed-shell electronic configuration similar to that of a dielectric. As established by Lampert and Mark in the book titled *Current Injection in Solids*, Academic Press, 1970, pp. 250-275, mobile-charge diffusion dominates a plasma-injected current-voltage characteristic of any dielectric within a diffusion length of either contact—such that the current density varies exponentially with voltage. If the dielectric length is much greater than a diffusion length, mobile-charge drift dominates the current-voltage characteristics—such that current varies linearly with voltage up to the relaxation voltage $V_\tau$, whereupon it becomes space-charge-limited with a cubic variation.

For example, per the above reference by Lampert and Mark, a silicon p-i-n diode with an intrinsic silicon region length of 4 mm exhibits a space-charge-limited current-voltage characteristic with a cubic dependency of the current density on the impressed voltage beyond a relaxation voltage of 10V. When the length of the intrinsic silicon region of the p-i-n diode is decreased to approximately 1 mm, the current density varies exponentially with an impressed voltage due to a dominance of mobile-charge diffusion. Referring, again, to FIG. 77, the electrochemical rectifier 520 in Example 11 possesses a drift space-charge-limited current-voltage characteristic in the thin oxysilaborane film 523 of only 12.4 nm, which has a bulk composition substantially that of picocrystalline oxysilaborane p-$(B_{12}{}^{2-}H_4)_2Si_4O_2{}^{2+}$.

This is only possible when the extrinsic mobile-charge concentration is sufficiently large that the Debye length of the oxysilaborane film 523 is less than approximately 4 nm. The extrinsic mobile-charge concentration of self-assembled picocrystalline oxysilaborane $(B_{12}H_4)_xSi_yO_z$ over a preferred compositional range ($2 \le x \le 4$, $3 \le y \le 5$, $0 \le z \le 2$) is ideally constant near $p_0 \approx 10^{18}$ cm$^{-3}$ due to the nuclear electric quadrupole moment of the boron icosahedra with an ideally symmetrical nuclear configuration. The extrinsic concentration $p_0$ corresponds to the impurity doping concentration in monocrystalline silicon attributed to an onset of bandgap narrowing. Picocrystalline oxysilaborane $(B_{12}H_4)_xSi_yO_z$ is a novel composition in that it exhibits a closed-shell electronic configuration and also an extrinsic mobile-charge concentration near the onset of bandgap narrowing in silicon.

A key element of charge conduction in picocrystalline oxysilaborane $(B_{12}H_4)_xSi_yO_z$ over the preferred compositional range ($2 \le x \le 4$, $3 \le y \le 5$, $0 \le z \le 2$) is an invariant extrinsic charge concentration $p_0$ resulting from the nuclear electric quadrupole moment of the boron icosahedra and, as a result, is not affected by the conventional semiconductor impurity doping. The extrinsic charge concentration $p_0$ is not affected by the incorporation of oxygen in an oxysilaborane film. In order to understand this, Eqs. (66)-(67) are combined to obtain the following relation.

$$V_\tau = \frac{d^2}{\tau\mu} = \frac{\sigma}{\varepsilon}\frac{d^2}{\mu} = \frac{e\mu p_0}{\varepsilon}\frac{d^2}{\mu} = \frac{e p_0 d^2}{\varepsilon} \quad (68)$$

Whereas the relaxation time $\tau$ depends upon both the charge mobility $\mu$ and the extrinsic charge concentration $p_0$, the relaxation voltage $V_\tau$ depends on the latter—which is invariant in picocrystalline oxysilaborane $(B_{12}H_4)_xSi_yO_z$ over the preferred compositional range ($2 \le x \le 4$, $3 \le y \le 5$, $0 \le z \le 2$). As the result, oxysilaborane films with a common thickness have a common relaxation voltage $V_\tau$. The picocrystalline silaborane p-$(B_{12}H_4)_3Si_5$ solid 526 deposited per Example 13 has a thickness of 11.4 nm and a relaxation voltage $V_\tau \approx 0.2V$ in FIGS. 87-88. The picocrystalline oxysilaborane p-$(B_{12}{}^{2-}H_4)_2Si_4O_2{}^{2+}$ solid 523 per Example 11 exhibits a thickness of 12.4 nm and relaxation voltage $V_\tau \approx 0.2V$ in FIGS. 77-78. Although the picocrystalline silaborane p-$(B_{12}H_4)_3Si_5$ solid 526 deposited per Example 13 and the picocrystalline oxysilaborane p-$(B_{12}{}^{2-}H_4)_2Si_4O_2{}^{2+}$ solid 523 per Example 11 share a common relaxation voltage $V_\tau \approx 0.2V$, they have different conductivities $\sigma$ due to different charge mobilities $\mu$. As the result, the enthalpy is essentially constant such that charge diffusion is principally due to the entropy of mixing.

Bipolaronic hole-pairs diffuse into the picocrystalline oxysilaborane p-$(B_{12}{}^{2-}H_4)_2Si_4O_2{}^{2+}$ cathode region 402 of the phonovoltaic cell 400 by approximately two Debye lengths. In the space-charge region about the metallurgical junction of regions 401 and 402, an open-circuit electric field E emanates from oxysilaborane dications in region 402 and terminates upon silaborane dianions in region 401 of the phonovoltaic cell 400 in FIG. 21. Since field lines are associated with charge pairs and since the extension of the field is approximately two Debye lengths $L_D$ into region 402, the open-circuit electric field E between the conjoined regions 401 and 402 of the phonovoltaic cell 400 is given, by a first approximation, as follows:

$$|E| = \frac{T_0 \mathcal{d} S_{mix}}{2eL_D} = \frac{eT_0 \mathcal{d} \alpha_{trans}}{2eL_D} \quad (69)$$

Since a Planckian resonator generated by a quantum thermalization has an ideal heat capacity of 3 k, then the electric field in Eq. (69) becomes:

$$|E| = \frac{eT_0 \mathcal{d} \alpha_{trans}}{2eL_D} = \frac{3kT_0}{2eL_D} \quad (70)$$

At room temperature, the electric field E per Eq. (70) is $\sim 5 \times 10^4$ V/cm for a Debye length $L_D$ of $\sim 4$ nm. Only if the thickness of the cathode region 402 of the phonovoltaic cell 400 in FIG. 21 is less than the diffusion length will the open-circuit electric field in Eq. (70) manifest itself, in part, as an open-circuit electromotive force V between the conjoined anode and cathode regions 401 and 402. At room temperature, the electrical energy stored in the electric field is $\sim 39$ meV. The electric field in Eq. (70) can manifest itself at external electrodes if, and only if, the space-charge-limited current density is, at least in part, diffusion limited.

Whereas the thinnest picocrystalline oxysilaborane film in the above examples is 7.8 nm in Example 12, the film thickness is not sufficiently thin that the space-charge-limited current density is, at least in part, due to mobile charge diffusion. In order to generate an open-circuit voltage $V_{out}$ between the external cathode electrode 403 and external anode electrode 403 in the phonovoltaic cell 400, the thickness of the picocrystalline silaborane p-$(B_{12}H_4)_3Si_5$ anode regions 401 and picocrystalline oxysilaborane p-$(B_{12}^{2-}H_4)_2Si_4O_2^{2+}$ cathode regions 402 must be less than $\sim 4$ nm. This presents a problem, as described in the example below.

Example 14

Figure 89:
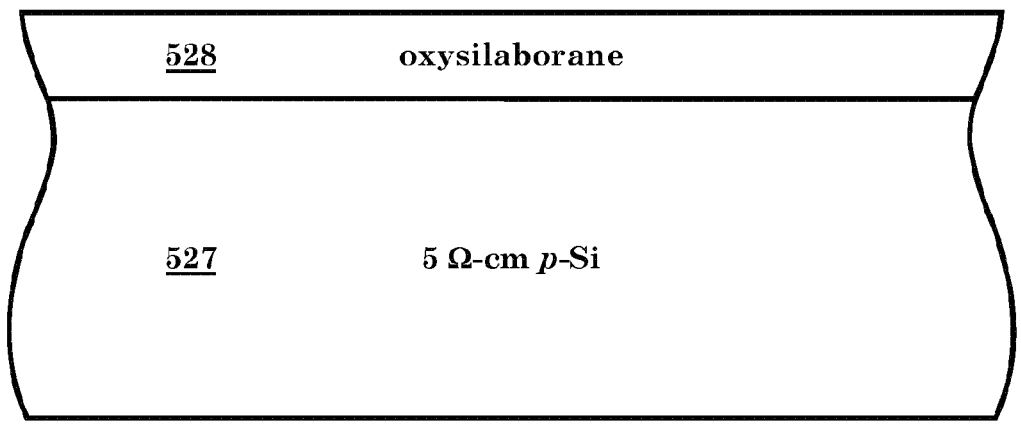
FIG. 89 is an illustration of an oxysilaborane film deposited on a p-type silicon substrate in accordance with Example 14.

Referring to FIG. 89, a 100 mm diameter monocrystalline (001) p-type silicon substrate 527 with a resistivity of 5 Ω-cm was loaded on a resistively-heated molybdenum susceptor in an EMCORE D-125 MOCVD reactor by a load-lock system which isolates the deposition chamber. The deposition chamber was pumped down below 50 mtorr, whereupon a 3% mixture, by volume, of diborane in hydrogen $B_2H_6(3\%)/H_2(97\%)$ at a flow rate of 150 sccm along with a 2% mixture, by volume, of monosilane in hydrogen $SiH_4(2\%)/H_2(98\%)$ at a flow rate of 300 sccm were introduced into the deposition chamber. At the same time, undiluted nitrous oxide $N_2O$ was introduced at a flow rate of 20 sccm. The reactant gases were allowed to mix together before entering into the deposition chamber. Upon stabilization of the reactant gases, the chamber pressure was regulated at 1.2 torr while the susceptor was rotated at 1100 rpm. The substrate temperature was increased to 230° C. by the resistively-heated susceptor, prior to further increasing the temperature.

After 2 minutes, the susceptor temperature was further increased to 260° C., whereupon it stabilized and the chemical reaction was allowed to proceed for 12 minutes. The susceptor heating was secured and the sample was allowed to cool below 80° C. in the reactant gases before it was removed from the deposition chamber. As shown in FIG. 89, a thin oxysilaborane film 528 was deposited on the silicon substrate 527. The thickness of the oxysilaborane film 528 of this example was established by variable-angle spectroscopic ellipsometry as being 8.2 nm. The small thickness introduces deleterious anomalies in the oxysilaborane film 528.

Figure 90:
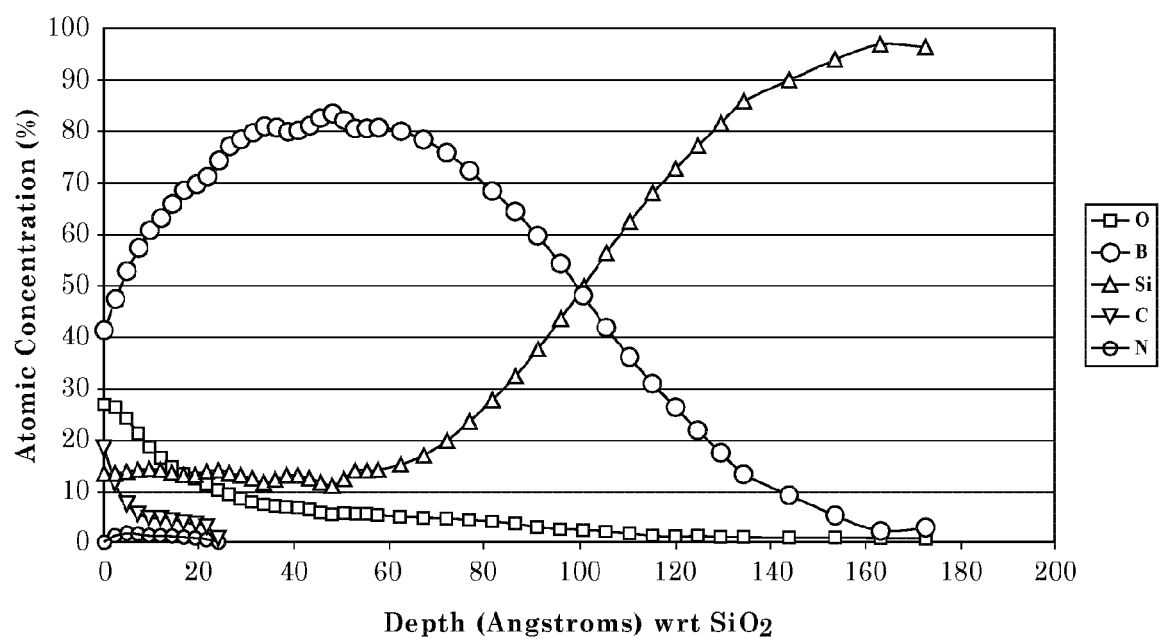
FIG. 90 is an x-ray photoelectron spectroscopy (XPS) depth profile of the oxysilaborane film deposited in Example 14.

X-ray photoelectron spectroscopy (XPS) of the oxysilaborane film 528 of this example was impeded by the small thickness. XPS is a surface analytical method that can be used to establish depth profiles by an argon sputtering of the sample between a number of repeated surface measurements. The photoelectrons are not limited to the actual surface but, rather, can be emitted from depths below the surface of over 5.0 nm. In order to better improve the depth profile resolution, the takeoff angle was reduced to 20°, such that the escape depth of photoelectrons was on the order of 2.5 nm. Since the thickness of the oxysilaborane film 528 of this example is 8.2 nm, then each bulk measurement value integrates interfacial effects into it. The best data point is only 4.1 nm from each interface. Subject to such an understanding, an XPS depth profile of the oxysilaborane film 528 of this example in FIG. 90 established the relative bulk atomic concentrations of boron, silicon, and oxygen at the peak boron concentration as: 83.4%, 11.1%, and 5.5%.

The composition at a peak boron concentration is in accordance with prototypical picocrystalline oxysilaborane p-$(B_{12}^{2-}H_4)_2Si_4O_2^{2+}$. Deleterious compositional variations (both real and measurement anomalies) occur near both of the interfaces. The compositional deviations in prototypical picocrystalline oxysilaborane p-$(B_{12}^{2-}H_4)_2Si_4O_2^{2+}$ measured by an XPS depth profile in this example relate to changes in the binding energy of the inner photoelectrons, especially the silicon 2p electron binding energy. The oxygen 1s electron binding energy was measured as 531.5 eV at the surface, 531.4 eV near the middle of the oxysilaborane film 528 of this example, and 530.8 eV near the silicon substrate 527. The boron is electron binding energy in this example was measured by XPS as 187.3 eV at the surface, 187.6 eV in the middle of the oxysilaborane film 528 of this example, and 187.6 eV near the silicon substrate 527. The above binding energies are nearly ideal.

These binding energies are consistent with the boron binding energy measured by XPS in the prior examples hereinabove. Quite different from all the other examples, however, is the existence of a double energy peak in the silicon 2p electron binding energy near the surface, with the lower peak being 99.7 eV. The binding energy of the silicon 2p electron is 99.3 eV in the middle of the oxysilaborane film 528 and near the silicon substrate 527. The binding energy of this single energy peak is in agreement with the single energy peak in prior examples disclosed hereinabove. A thermal processing profile of a picocrystalline oxysilaborane solid similar to this example is in FIG. 91. The temperature is represented along the ordinate and the elapsed run time along the abscissa in seconds.

Figure 91:
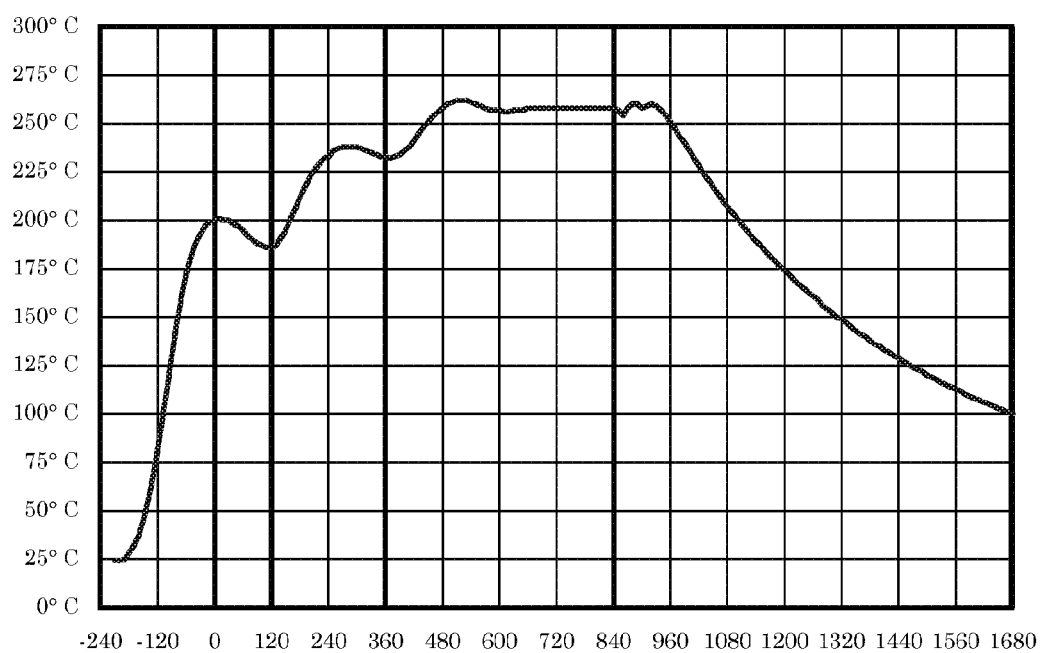
FIG. 91 is an illustration of the thermal processing budget of the oxysilaborane film deposited in Example 14.

It is noteworthy in FIG. 91 that the cooling time is 12 minutes (from 840 to 1680 seconds). The film integrity can be improved by a more rapid cooling. It is known that an undesirable surface oxidation of the oxysilaborane film 528 of this example occurred during the sample cooling. This deleterious oxidation must be eliminated in the phonovoltaic cell 400 shown in FIG. 21. It is further known that excess oxygen and silicon are incorporated in the oxysilaborane film 528 near the silicon substrate 527 due to the native oxide and other adsorbed contaminants introduced during the temperature ramp to the preferred temperature. As shown in the high-resolution transmission electron micrograph (HRTEM) in FIG. 34, the deleterious interfacial layer 503 is ~2 nm thick. An interfacial layer impedes the successful operation of the phonovoltaic cell 400 shown in FIG. 21.

In order to remedy deleterious variations in the compositions of the picocrystalline anode regions 401 and cathode regions 402, the phonovoltaic cell 400 in FIG. 21 must be in situ processed at an invariant deposition temperature. The metal electrodes 403 in the phonovoltaic cell 400 are in situ deposited by an MOCVD deposition using a suitable aluminum precursor. One such precursor is trimethylamine alane (TMAA) $H_3AlN(CH_3)_3$. The deposition of aluminum nanowires by means of TMAA is discussed in detail by Benson et al., "Chemical Vapor Deposition of Aluminum Nanowires on Metal Substrates for Electrical Energy Storage Applications," ACS Nano 6 (1), pp. 118-125 (2012). By way of example, a suitable substrate such as a silicon wafer can be inserted into an EMCORE D-125 MOCVD reactor, per Example 14, which is pumped down below 50 mtorr.

Trimethylamine alane (TMAA) $H_3AlN(CH_3)_3$ is introduced into the deposition chamber by means of a hydrogen carrier gas at a flow rate of 50 sccm. The deposition chamber pressure is regulated at 2-4 torr while the substrate is heated to ~230° C. After approximately 10 nm of aluminum is deposited, the flow of TMAA is then arrested and a 3% mixture, by volume, of diborane in hydrogen $B_2H_6(3\%)/H_2$ (97%) at a flow rate of 150 sccm along with a 2% mixture, by volume, of monosilane in hydrogen $SiH_4(2\%)/H_2(98\%)$ at a flow rate of 300 sccm are introduced into the deposition chamber. The substrate temperature is maintained at ~230° C. and the reaction is permitted to proceed for several minutes until a thin layer of picocrystalline silaborane p-$(B_{12}H_4)_3Si_5$ of ~1-3 nm is deposited, whereupon undiluted nitrous oxide $N_2O$ at a flow rate of 20 sccm is abruptly introduced into the deposition chamber while the hydride gases remain flowing.

The substrate temperature is maintained at ~230° C. and the reaction is permitted to proceed for several minutes until a thin layer of picocrystalline oxysilaborane p-$(B_{12}{}^{2-}H_4)_2Si_4O_2{}^{2+}$ of ~1-3 nm is deposited, whereupon the flow of the hydrides and nitrous oxide is arrested and the hydrogen carrier gas of TMAA is reintroduced into the deposition chamber at the flow rate of 50 sccm. The reaction is permitted to proceed until approximately 10 nm of aluminum is deposited. At this point in the process, an in situ p-isotype rectifier 404 has been formed. It is to be understood that the deposition pressure and temperature can be adjusted in order to minimize the co-deposition of carbon during aluminum deposition and to optimize the growth rate of the thin anode region 401 and cathode region 402.

The deposition times of the picocrystalline silaborane p-$(B_{12}H_4)_3Si_5$ anode region 401 and the picocrystalline oxysilaborane p-$(B_{12}{}^{2-}H_4)_2Si_4O_2{}^{2+}$ cathode region 402 can be adjusted to minimize the thickness of said regions. The in situ deposition of a p-isotype rectifier 404, as described above, can be repeated on an in situ basis so as to form the phonovoltaic cell 400 shown in FIG. 21 by an in situ MOCVD deposition resulting in a large number of p-isotype rectifiers 404, said to be a phonovoltaic pile. An in situ phonovoltaic cell 400 comprises a phonovoltaic pile with 20-50 p-isotype rectifiers 404. Upon removal from the MOCVD deposition chamber, individual phonovoltaic cells 400 are formed by plasma etching the phonovoltaic pile of p-isotype rectifiers 404 by using conventional lithography.

As discussed hereinabove, the open-circuit electric field E across the metallurgical junction of a picocrystalline silaborane p-$(B_{12}H_4)_3Si_5$ anode region 401 and the joined picocrystalline oxysilaborane p-$(B_{12}{}^{2-}H_4)_2Si_4O_2{}^{2+}$ cathode region 402, of a p-isotype rectifier 404, extends into each such region by approximately two Debye lengths $L_D$. The magnitude of the open-circuit electric field E of the p-isotype rectifier 404 is ideally given by Eq. (70). By forming the thickness of the picocrystalline silaborane p-$(B_{12}H_4)_3Si_5$ anode region 401 and the picocrystalline oxysilaborane p-$(B_{12}{}^{2-}H_4)_2Si_4O_2{}^{2+}$ cathode region 402 so as to be less than a Debye length (i.e., less than ~4 nm), the work done by a compression of the open-circuit field lines manifests itself as the open-circuit voltage of each p-isotype rectifier 404. The open-circuit voltage of each p-isotype rectifier 404 can be optimized at ~26 mV. Preferred embodiments of the invention sustain an open-circuit voltage.

Figure 92:
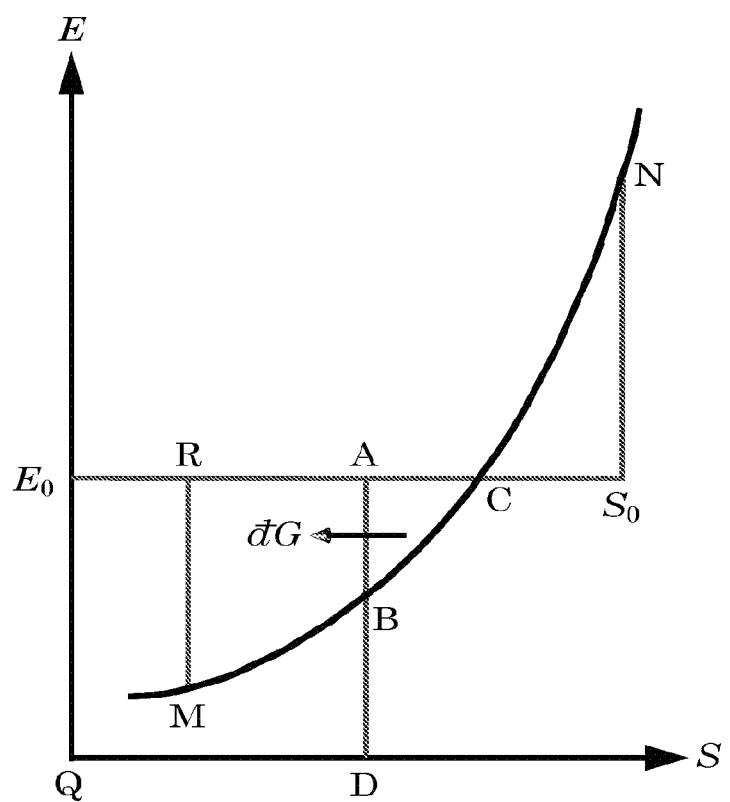
FIG. 92 is a geometric representation of an energy equilibration proposed by Josiah Willard Gibbs.

It is believed that the logical explanation of the highly novel mode of operation of the phonovoltaic cell 400 made in accordance with the invention may be given with respect to the Gibbs free energy and Gibbs free entropy. These two entities will be defined in a manner closely following Gibbs (1873) in "A Method of Geometrical Representation of the Thermodynamic Properties of Substances by Means of Surfaces," *Transactions of the Connecticut Academy*, II. pp. 382-404, December 1873. As used herein, Gibbs free energy is the energy by which a body or many-body system may be diminished without increasing its volume or diminishing its entropy. Following Gibbs (1873), the Gibbs free energy is "represented geometrically by the distance of the point A representing the initial state from the surface of dissipated energy measured parallel to the axis of [E]" in FIG. 92.

Figure 93:
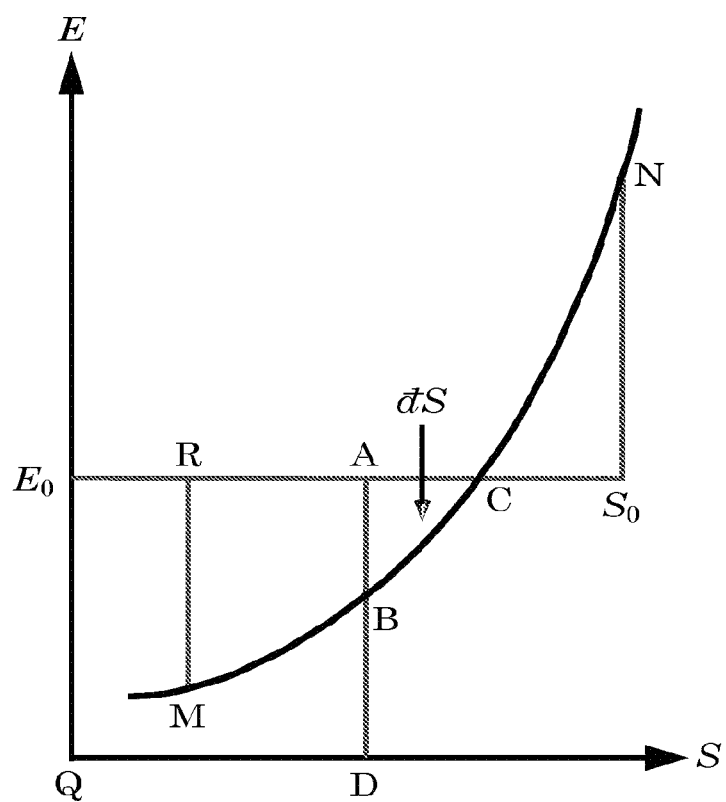
FIG. 93 is a geometric representation of an entropy equilibration proposed by Josiah Willard Gibbs.

As used herein, the Gibbs free entropy is the entropy by which a body or many-body system may be increased without changing its energy or increasing its volume. Following the initial direction of Gibbs (1873), the Gibbs free entropy is "represented geometrically by the distance of the point representing the initial state from the surface of dissipated energy measured parallel to the axis of [S]" in FIG. 93. The Gibbs free energy is widely used in the prior art in the equilibration of a nonequilibrium state. Preferred embodiments of this invention utilize Gibbs free entropy in a novel and useful manner. The Gibbs free energy and Gibbs free entropy are involved in the quantum thermodynamic cycle in FIG. 23 that represents the operation of the phonovoltaic cell 400 in FIG. 21. The initial focus is on the Gibbs free entropy during the isothermal phase transition B→C in FIG. 23.

The volume of the artificial nuclei 104 comprising the picocrystalline oxysilaboranes remains invariant in the operation of the phonovoltaic cell 400. The energy and temperature of the picocrystalline silaborane p-$(B_{12}H_4)_3Si_5$ anode regions 401 are both invariant during the isothermal phase transition B→C. The decrease in the phase transition entropy $S_{trans}$ is due to the Gibbs free entropy of artificial nuclei 104 in the picocrystalline silaborane p-$(B_{12}H_4)_3Si_5$ anode region 401. During the isothermal phase transition B→C, the Gibbs free entropy (in the form of an intraicosahedral entanglement entropy $S_{ent}$) undergoes an uncompensated increase, such that there is a quantum localization of said artificial nuclei 104 that is thus accompanied by a decrease in the phase transition entropy $S_{trans}$ as prophesized by Gibbs (1873) in his development of the Gibbs free entropy.

The novel ability of the artificial nuclei 104 to undergo a spontaneous increase in Gibbs free entropy, associated with the entanglement entropy $S_{ent}$, is the novel and useful property of preferred embodiments of this present invention that is not exhibited by any other known icosahedral boron-rich solid in the prior art. The ability to exploit the Gibbs free entropy in the phonovoltaic cell 400 is a consequence of the artificial nuclei 104 retaining an icosahedral symmetry due to a lifting of the polyatomic electronic orbital degeneracies by spin-orbit coupling in lieu of the lifting of polyatomic electronic orbital degeneracies by Jahn-Teller distortion in all other icosahedral boron-rich solids in the prior art. This is due, in turn, to a highly novel and useful Lorentz force initially conceived by Maxwell in 1861 that became permanently lost in the prior art soon thereafter.

The ability to displace electrical action throughout space, without an actual displacement of electric charge, was conceived by James Clerk Maxwell in his initial development of electromagnetism. In a seminal 1865 paper entitled "A Dynamic Theory of the Electromagnetic Field," in *The Scientific Papers of James Clerk Maxwell*, Vol. I, Dover, 2003, p. 526, Maxwell formally introduced his general equations of the electromagnetic field, as summarized below in a modern form.

Equations of Total Current (A)

$$J' = J + \dot{D} \tag{71a}$$

Equations of Magnetic Force (B)

$$\mu H = \nabla \times A \tag{71b}$$

Equations of Currents (C)

$$\nabla \times H = J' \tag{71c}$$

Equations of Electromotive Force (D)

$$E = v \times B - \frac{\partial A}{\partial t} - \nabla \psi \tag{71d}$$

Equations of Electric Elasticity (E)

$$D = \varepsilon E \tag{71e}$$

Equations of Electric Resistance (F)

$$J = \sigma E \tag{71f}$$

Equations of Free Electricity (G)

$$\nabla \cdot D = \rho \tag{71g}$$

Equations of Continuity (H)

$$\frac{\partial \rho}{\partial t} + \nabla \cdot J = 0 \tag{71h}$$

Equations (71a-f) comprise 6 vector equations that Maxwell specified in terms of 18 equations involving 18 Cartesian components. The scalar equation in Eq. (71g) is an expression of Gauss' law while the scalar equation in Eq. (71h) is the continuity equation. In 1865, Maxwell expressed the general equations of the electromagnetic field in terms of 20 equations utilizing 20 variables. There is an extremely important concept introduced by Maxwell which has been lost over the years in the prior art. Due to the profound impact of this lost concept on modern integrated circuits, a cogent discussion of Maxwell's lost concept is provided.

Maxwell always expressed his equations of the electromagnetic field in terms of the vector potential A and scalar potential ψ. It is commonplace in the present era to express Maxwell's general equations of the electromagnetic field in terms of field equations not involving Maxwell's potentials A and ψ. In order to better understand an important lost concept in Maxwell's electromagnetism that impacts modern integrated circuits, it is purposeful to specify Eqs. (71a-h) as field equations that are related to the modern form of Maxwell's equations. Pursuant to this objective, consider the following set of electromagnetic field equations.

$$\nabla \cdot D = \rho \tag{72a}$$

$$\nabla \times E = -\dot{B} \tag{72b}$$

$$\nabla \times H = \dot{D} \tag{72c}$$

$$\nabla \cdot B = 0 \tag{72d}$$

Newton's dot convention is used in Eqs. (72a-d), such that an overdot is understood to denote the total time derivative of any variable. This is important since a time variation can occur explicitly or implicitly. As discussed by Jackson, *Classical Electrodynamics*, Second Edition, John Wiley & Sons, 1975, p. 212, the total time derivative can be expanded with the aid of the convective derivative by involving a velocity v, such that the convective derivative in Eqs. (72b-c) results in the following relations wherein the divergence in Eq. (73b) vanishes per Eq. (73d).

$$\nabla \cdot D = \rho \tag{73a}$$

$$\nabla \times E = -\frac{\partial B}{\partial t} - \nabla \times (B \times v) \tag{73b}$$

$$\nabla \times H = \frac{\partial D}{\partial t} + \nabla \times (D \times v) + v(\nabla \cdot D) \tag{73c}$$

$$\nabla \cdot B = 0 \tag{73d}$$

In general, the instantaneous velocity v can be decomposed into two distinct velocities that were recognized by Maxwell in 1861-1865. In general, any infinitesimal electromagnetic disturbance can be specified in terms of the velocity $\dot{r}$ due to the motion of an inextensible electromagnetic disturbance through space and, also, the phase velocity $\dot{s}$ due to the periodic oscillation of an electromagnetic disturbance. The generalization of Faraday's induction law by Maxwell yielded the magnetic component v×B of the Lorentz force, albeit not the conventional Lorentz force. As can be established, examination of Maxwell's derivation manifests that the instantaneous velocity v is the phase velocity $\dot{s}$, such that Eqs. (73a-d) are:

$$\nabla \cdot D = \rho \tag{74a}$$

$$\nabla \times E = -\frac{\partial B}{\partial t} - \nabla \times B \times \dot{s} \tag{74b}$$

$$\nabla \times H = \frac{\partial D}{\partial t} + \nabla \cdot D\dot{r} + \nabla \times D \times \dot{s} \tag{74c}$$

$$\nabla \cdot B = 0 \tag{74d}$$

The term involving $\nabla \cdot D\dot{r}$ is a conduction current density J associated with a displacement of inextensible electromagnetic disturbances ($\dot{s}=0$) through space, such that Eqs. (74a-d) can be specified in a more familiar form. It warrants noting that $\dot{s} \times B$ and $B \times \dot{s}$ differ in polarity due to the anticommutative multiplicands of an outer product. A similar condition also exists for $D \times \dot{s}$ and $\dot{s} \times D$.

$$\nabla \cdot D = \rho \tag{75a}$$

$$\nabla \times E = -\frac{\partial B}{\partial t} - \nabla \times \dot{s} \times B \tag{75b}$$

$$\nabla \times H = J + \frac{\partial D}{\partial t} - \nabla \times \dot{s} \times D \tag{75c}$$

$$\nabla \cdot B = 0 \tag{75d}$$

Two terms in Eqs. (75a-d) are not known in the prior art: the spectral induction $\nabla \times \dot{s} \times B$ and the spectral displacement current density $\nabla \times \dot{s} \times D$. Both of of these two terms pertain to a form of the Lorentz force that was introduced into physics by Maxwell in 1861 in another paper "On Physical Lines of Force," in *The Scientific Papers of James Clerk Maxwell*, Vol. I, Dover, 2003, p. 526. In this paper, Maxwell expressed the objective of Prop. XI as: "To find the electromotive forces in a moving body." Maxwell's Eq. (69) in Prop. XI is stated in modern terms as:

$$dB_x = -i \cdot \nabla \times E \, dt + \left[ B_x \frac{\partial}{\partial x} + B_y \frac{\partial}{\partial y} + B_z \frac{\partial}{\partial z} \right] dx \tag{76}$$

The term in brackets comprehends the infinitesimal variation in the x-coordinate of an extensible electromagnetic disturbance. The neglect of such a coordinate variation would thereby cause Eq. (76) to reduce to the x-component of Faraday's induction law. In mathematically executing the derivation in Prop. XI, Maxwell obtained the following relation (in a modern formulation) in 1861.

$$\nabla \times E = -\frac{\partial B}{\partial t} + \nabla \times \dot{s} \times B \tag{77}$$

Maxwell's electric field E in his Eq. (77) in Prop. XI is expressed as:

$$E = \dot{s} \times B - \frac{\partial A}{\partial t} - \nabla \psi \tag{78}$$

This field relation supports a novel type of Lorentz force first derived by Maxwell in 1861 when Hendrik Lorentz was only seven years old. In order to understand the profound physical significance of the spectral induction $\nabla \times \dot{s} \times B$ (not Maxwell's term) in Eq. (77), a derivation is provided in [0682]-[0703] of U.S. Provisional Application No. 62/591, 848 and incorporated herein by reference.

The artificial nucleus 104 is formed by the chemical fusion of twelve natural boron atoms into an icosahedron, with a nearly-symmetrical nuclear configuration, in which all of the 36 boron valence electrons occupy intraicosahedral bonding and antibonding suborbitals. As previously disclosed hereinabove, fusion necessarily involves a transformation of a quantity of matter into energy. In the artificial nucleus 104 in FIG. 5, a small quantity of matter is transformed into the "trembling motion" (zitterbewegung) of a Dirac quasiparticle. As derived in U.S. Provisional Application No. 62/591,848 and incorporated herein by reference, the "trembling motion" (zitterbewegung) of a Dirac quasiparticle gives rise to:

$$\dot{\rho}_1 = -\frac{2 \, mc^2}{\hbar} \rho_2 \tag{79a}$$

$$\dot{\rho}_3 = -\frac{2c\sigma \cdot \hat{p}}{\hbar} \rho_2 \tag{79b}$$

Schrödinger first discovered, and named, zitterbewegung (trembling motion) in any Dirac quasiparticle in 1930. However, Schrödinger only discovered the Compton zitterbewegung frequency $2mc^2/\hbar$ in Eq. (79a). Although not known in the prior art, the microwave zitterbewegung frequency $2c\sigma \cdot \hat{p}/\hbar$ defined in Eq. (79b) plays a significant role in preferred embodiments of this invention. As used herein, a phonon is a collective oscillation of atoms or molecules of a uniform frequency due to a periodic, elastic arrangement. The two oscillatory bound-energy terms on the right side of Eqs. (26a-b) induce zitterbewegung by a mass decrease.

$$mc^2 - E = mc^2 \left[ \frac{\alpha^2}{2n^2} + \frac{\alpha^4}{2\kappa n^3} \right] > 0 \tag{26a}$$

$$\begin{cases} n = +1, +2, +3 \\ \kappa = \mp 1, \mp 2, \ldots, -n \end{cases}$$

$$mc^2 + E = mc^2 \left[ \frac{\alpha^2}{2n^2} + \frac{\alpha^4}{2\kappa n^3} \right] > 0 \tag{26b}$$

$$\begin{cases} \kappa = +1, +2, \ldots, +n \\ n = -1, -2, -3 \end{cases}$$

The first bound-energy zitterbewegung in the brackets on the right side of Eqs. (26a-b) decreases the electron mass by $\sim \alpha^2/8\pi$, which gives rise to the energy difference of $\sim 1.08$ eV that supports the intraicosahedral antibonding and bonding orbitals. Although the corresponding zitterbewegung frequency is much too high to contribute to a conduction of electrical action, it supports the spectral induction of valence electrons from the intraicosahedral bonding suborbitals into the intraicosahedral antibonding suborbitals due to the uncompensated increase in the intraicosahedral entanglement entropy $S_{ent}$. The entanglement entropy $S_{ent}$ constitutes the Gibbs free entropy that supports a generation of mobile electron-hole pairs by means of spectral induction in the phonovoltaic cell 400.

Figure 94B:
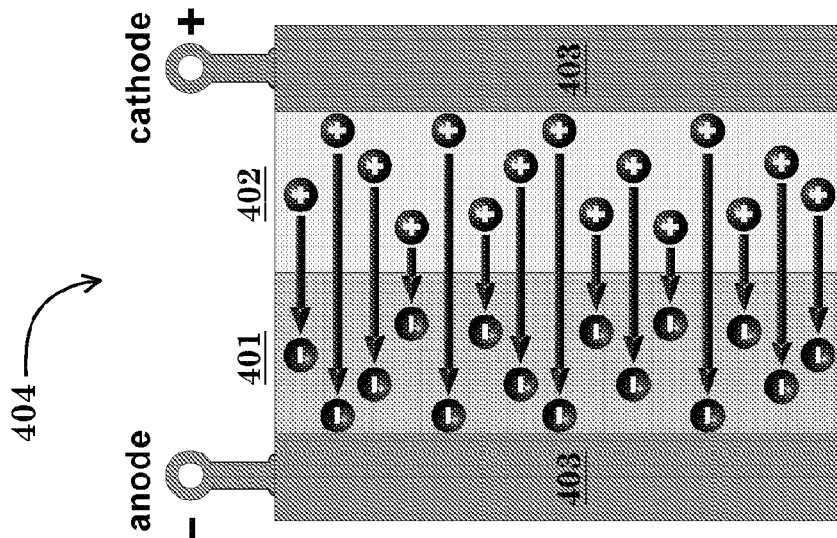
FIGS. 94A-B is an illustration comparing a phonovoltaic cell and a photovoltaic cell in the dark.
Figure 94A:
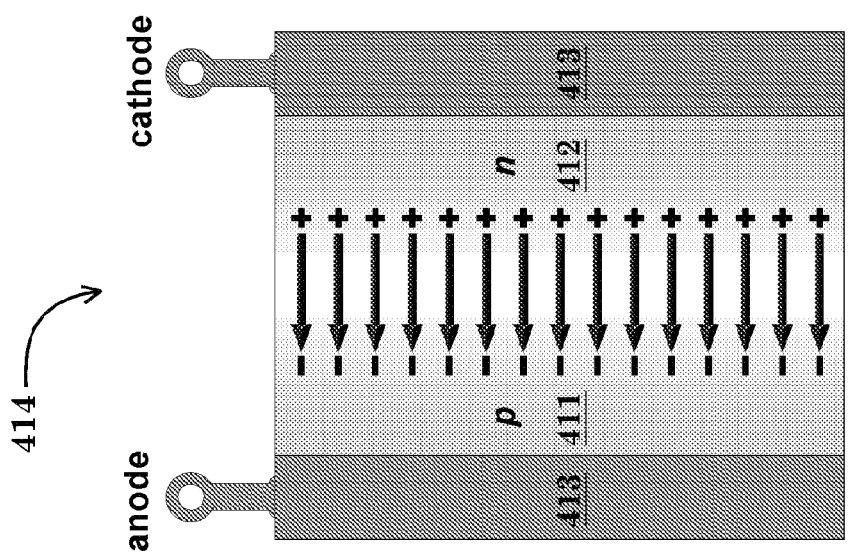

This can better understood by comparing the p-isotype rectifier 404 of the phonovoltaic cell 400 to the p-n anisotype rectifier 414 of a silicon photovoltaic cell. Pursuant to this objective, a p-n anisotype rectifier 414 in the dark is shown in FIG. 94A along with the p-isotype rectifier 404 in FIG. 94B. The various dimensions are greatly exaggerated for the ease of presentation of novel concepts in these, and other related, figures. The p-n anisotype rectifier 414 in FIG. 94A is constituted by an acceptor-doped monocrystalline silicon p-Si anode region 411 and a conjoined donor-doped monocrystalline silicon n-Si cathode region 412. The regions are electrically contacted by two aluminum electrodes 413. Thermal equilibrium is established in the p-n anisotype rectifier 414 by the diffusion of mobile holes and mobile electrons between conjoined regions 411 and 412, such that an open-circuit electric field exists between immobile donor ions and acceptor ions.

The open-circuit electric field lines between the immobile donor and acceptor ions in the p-n anisotype rectifier 414 reside in a depleted space-charge region in which the immobile charge concentration far exceeds the mobile charge concentration. As the result, the crystalline restoration force in the p-n anisotype rectifier 414 is mobile charge recombination. In contrast, the open-circuit electric field in the p-isotype rectifier 404 in FIG. 94B prevails between mobile dications and dianions. The mobile dications and dianions in the p-isotype rectifier 404 are due to a charge diffusion across the metallurgical junction of the picocrystalline silaborane p-$(B_{12}H_4)_3Si_5$ anode region 401 and the picocrystalline oxysilaborane p-$(B_{12}{}^{2-}H_4)_2Si_4O_2{}^{2+}$ cathode region 402 under open-circuit conditions.

Figure 95B:
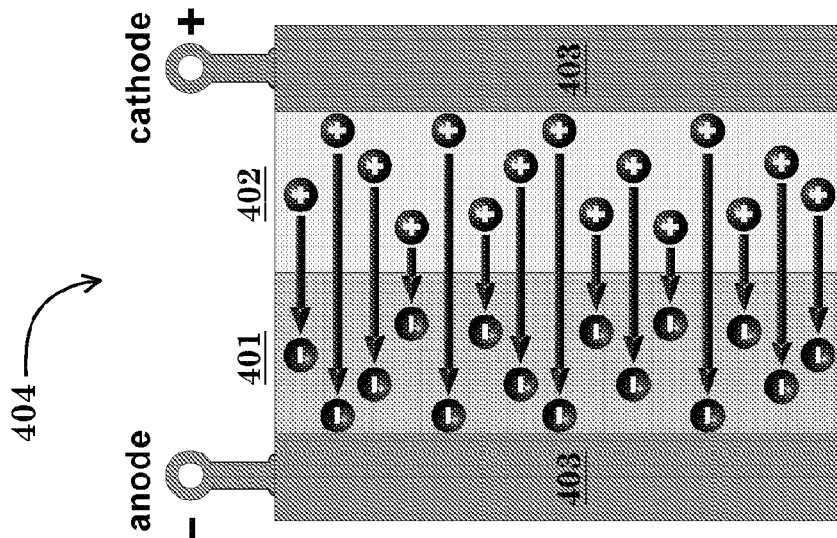
FIGS. 95A-B is an illustration comparing a phonovoltaic cell and a photovoltaic cell in which mobile electron-hole pairs are radiatively induced.
Figure 95A:
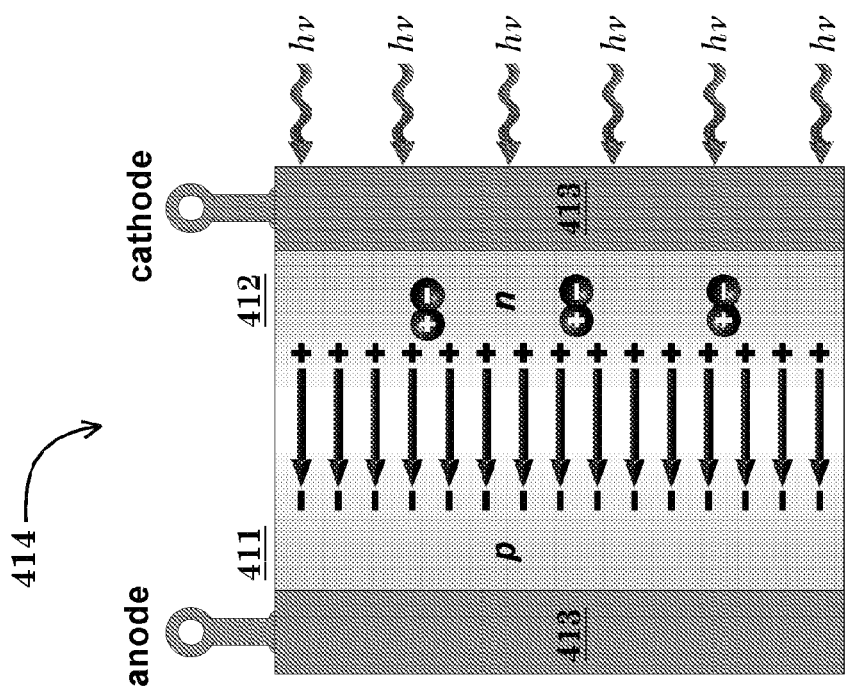

The open-circuit electric field lines between the mobile dications and dianions in the p-isotype rectifier 404 reside within an accumulated space-charge region in which the mobile charge concentration far exceeds the immobile charge concentration. As a result, the crystalline restoration force in the p-isotype rectifier 404 is a mobile charge generation. Since the thickness of the picocrystalline silaborane p-$(B_{12}H_4)_3Si_5$ anode region 401 and the picocrystalline oxysilaborane p-$(B_{12}{}^{2-}H_4)_2Si_4O_2{}^{2+}$ cathode region 402 are both less than a Debye length, the anode potential floats below the cathode potential so as to arrest an open-circuit current in the p-isotype rectifier 404 in FIG. 94B. No open-circuit voltage is generated in the p-n anisotype rectifier 414 in the dark, due to the absence of mobile electron-hole pairs available for conduction. This is remedied by the radiative generation of mobile electron-hole pairs in FIG. 95A in response to impinging radiation hv.

The open-circuit electric field between immobile acceptor and donor ions in the p-n anisotype rectifier 414 separates mobile electron-hole pairs which randomly diffuse into the depleted space-charge region. This charge separation causes mobile holes to diffuse towards the anode electrode 413 and mobile electrons towards the cathode electrode 413. Since no current flow exists under open-circuit conditions, the anode potential floats above the cathode potential per FIG. 96A. An electric current flow exists when an electrical load is impressed between the anode and cathode electrodes of the p-n anisotype rectifier 414 of the photovoltaic cell in FIG. 97A and the p-isotype rectifier 404 of the phonovoltaic cell in FIG. 97B. Whereas the open-circuit voltage of the p-n anisotype rectifier 414 is ~0.6 V, the open-circuit voltage of the p-isotype rectifier 404 is ~26 mV.

The output voltage of the p-isotype rectifier 404 of the phonovoltaic cell 404 is orders of magnitude lower than that of the p-n anisotype rectifier 414 of a photovoltaic cell. This disparity is very deceiving since the power density of a solid-state device typically varies many orders of magnitude due to a variation in the current density. It is in this regard that the contrary polarity difference between the p-n anisotype rectifier 414 and p-isotype rectifier 404 is significant. Since the anode floats above the cathode, a reverse-bias current is delivered to an impressed electrical load by the p-n anisotype rectifier 414 of a photovoltaic cell in FIG. 97A. Conversely, since the anode floats below the cathode, a forward-bias current is delivered to an impressed electrical load by the p-isotype rectifier 404 of the phonovoltaic cell 400 in FIG. 97B. This distinction is quite significant.

The forward-bias current density of a rectifier is typically orders of magnitude greater than the reverse-bias current density. This limitation in the reverse-bias current density delivered to an electrical load by the p-n anisotype rectifier 414 of a photovoltaic cell is entirely consistent with a limitation in solar irradiance. The maximum power density of a silicon photovoltaic cell is limited to less than 34 mW/cm$^2$ by the solar irradiance. The efficiency of a photovoltaic cell is fundamentally limited in that the crystalline restoration force of the p-n anisotype rectifier 414 is mobile charge recombination—which is contrary to the preferred crystalline restoration force of charge generation. This is due, in turn, to a limitation in the contact technology of a monocrystalline semiconductor that supports extended conduction and valence energy bands over space.

The practical means to exploit the ability of a monocrystalline silicon lattice to support extensive changes in eigenstate in the absence of any mechanical work is fundamentally limited by its structure. First, monocrystalline silicon can only be epitaxially deposited over monocrystalline silicon substrates. Secondly, the termination of a monocrystalline silicon lattice, in order to electrically contact it, results in Tamm-Shockley states that pin the electrochemical potential within the forbidden energy region between the bottom of the conduction band and top of the valence band. This pinning of the electrochemical potential results in a rectifying contact independent of the metal work function of electrodes. See Bardeen, by way of example, "Surface States at a Metal Semi-Conductor Contact," *Phys. Rev.* 10, No. 11, 1947, p. 471. The Tamm-Shockley interface state density must be reduced.

By well-known processing techniques, a substantial reduction in the Tamm-Shockley interface state density can be realized by terminating crystalline silicon regions with amorphous silicon dioxide films such that the surface electrochemical potential can be modulated, in device operation, throughout the forbidden energy region. A field-effect transistor uses the ability to modulate the electrical conductivity of a monocrystalline silicon surface by capacitively-coupled electrodes via an intervening silicon dioxide thin-film. However, any silicon dioxide must be removed from semiconductor contact regions due to the extremely high resistivity of silicon dioxide ~$10^{16}$ Ω-cm. In order to significantly reduce the Tamm-Shockley states in semiconductor contact regions, the semiconductor surface is degenerately doped so as to form an isotype homojunction such that the semiconductor surface electrochemical potential is pinned in the conduction or valence energy band.

A metal or a silicide can be alloyed to the degenerate semiconductor surface, such that mobile charges can tunnel through a potential barrier into the isotype homojunction. Under low-level injection, the isotype homojunction acts as an ohmic contact to any high-resistivity semiconductor region. However, this type of ohmic contact prevents the employment of a monocrystalline semiconductor in an electrochemical rectifier wherein the electrochemical potential varies between the external electrodes. This deficiency can be remedied by replacing the natural silicon atoms with picocrystalline artificial borane atoms 101, so as to form a self-assembled picocrystalline oxysilaborane that exhibits a bond-orientational order compatible with monocrystalline silicon, as previously discussed hereinabove.

Mobile charge conduction in the p-isotype rectifier 404 is by means of hopping between the artificial nuclei 104 of the picocrystalline artificial borane atoms 101 with a mobility of ~0.01 cm$^2$/V-sec. Although the phonovoltaic cell 400 delivers a current to an electrical load under forward-bias conditions, the current density is reduced due to the hopping mobility. This tradeoff, however, results in a much more favorable power density than that of a photovoltaic cell. In order to more fully appreciate this advantage, a projected manufacturing cost analysis of a phonovoltaic cell 400 is provided in FIG. 98. As established, the phonovoltaic pile of p-isotype rectifiers 404 in a phonovoltaic cell 400 is in situ deposited in an MOCVD reactor under computer control. The effective processing cost is taken to be the processing cost of the phonovoltaic pile of the phonovoltaic cell 400.

The specific resistance due to the hopping mobility is assumed to be 100 μΩ-cm². It is believed that this specific resistance is subject to a reduction by a yet further engineering improvement. The power density of 6.76 W/cm² is more than 200 times greater than that of the p-n anisotype rectifier of a photovoltaic cell. Unlike a photovoltaic cell, the p-isotype rectifier 404 of the phonovoltaic cell 400 can be in situ deposited, under computer control, in a phonovoltaic pile. For comparison purposes, the phonovoltaic pile in FIG. 98 is assumed to comprise 36 p-isotype rectifiers 404. The power density of 243 W/cm², which is consistent with that of the thermionic converter in FIG. 99A, is four orders of magnitude greater than that of a one-sun photovoltaic cell. The power cost of $2.25/kW is far below that of any known form of renewable energy and is competitive with combustion.

U.S. Pat. No. 307,031 is the first patent ever granted on any electronic device. The inventor of this patent, Thomas A. Edison, disclosed a new phenomenon: "I have discovered that if a conductive substance is interposed anywhere in the vacuous space within the globe of an incandescent electric lamp, and said conductive substance is connected outside of the lamp with one terminal, preferably the positive one, of the incandescent conductor, a portion of the current will, when the lamp is in operation, pass through the shunt-circuit thus formed, which shunt includes a portion of the vacuous space within the lamp." The above phenomenon later became known as the Edison effect. As used herein, the Edison effect is the phenomenon of the flow of electric charge between a pair of metallic electrodes, within an evacuated region, when one such metallic electrode (said to be the cathode electrode) is heated above the other such metallic electrode (said to be the anode electrode) by a sufficiently large temperature difference.

As shown in FIG. 99A, when the cathode electrode is heated above the anode electrode, by a sufficiently large temperature difference, free electrons are thermionically emitted from the cathode electrode into the evacuated region, whereupon said free electrons diffuse upon their own accord towards the lower-temperature anode electrode. Since no open-circuit current can exist, the cathode potential floats below the anode potential so as to arrest any open-circuit current. Although a thermionic converter escapes the limitations of the solar irradiance, it is limited by the Carnot efficiency. What is needed is a solid-state Edison effect that is not limited by either the solar irradiance or the Carnot efficiency.

As used herein, the solid-state Edison effect is the phenomenon of a flow of electric charge between two metallic electrodes, both being at the ambient temperature, that are intervened by a solid semiconductive material having two contiguous zones of different Seebeck coefficients and that cause a decrease in the entropy of the ambient by the flow of electric charge to any passive electrical load impressed, directly or indirectly, between said metallic electrodes. Although a transient electric charge flow can exist between contiguous material regions of different Seebeck coefficients, said electric charge flow is continuously sustained if, and only, the increase in the entropy of mixing between said regions is due, at least indirectly, to the spectral induction of valence electrons into higher-energy antibonding energy levels due to an infrared zitterbewegung resonance.

Although Maxwell conceived spectral induction (albeit not by name) in 1861 in a seminal paper "On Physical Lines of Force," no actual use of spectral induction has ever occurred in the prior art. This is due, in turn, to a heretofore inability to adequately exploit zitterbewegung in practical materials and devices. The phonovoltaic cell 400 exploits a near-infrared zitterbewegung resonance to move electric charge through space in a novel and useful way. Another preferred embodiment of this invention exploits the microwave zitterbewegung in Eq. (79b) to displace electrical action, but not electrical charge, through space in a way that generalizes Maxwell's displacement current. Whereas Maxwell's electrical action is displaced over space by an externally-impressed time-dependent periodic driving force, electrical action is displaced herein by an intrinsic zitterbewegung.

In Part III of "On Physical Lines of Force," Maxwell expressed: "Here then we have two independent qualities of bodies, one by which they allow of the passage of electricity through them, and the other by which they allow of electrical action being transmitted through them without any electricity being allowed to pass . . . As long as electromotive force acts on a conductor, it produces a current which, as it meets with resistance, occasions a continual transformation of electrical energy into heat, which is incapable of being restored as electrical energy by any reversion of the process . . . In a dielectric under induction, we may conceive that the electricity in each molecule is so displaced that one side is rendered positively, and the other negatively electrical, but that the electricity remains entirely connected with the molecule, and does not pass from one molecule to another."

Maxwell's displacement current is not an actual current associated with the motion of electric charges over space but, rather, is a displaced electrical action due to a time-dependent electric field. The displacement of electric charge in a conductor is due to a time-independent electric field. An electric field E is, in general, a force per unit charge, such that charge displacement in a conductor in response to an electric field E constitutes a form of work that is accompanied by a Joule heating. Maxwell emphasized that charge monopole displacement in a conductor is always accompanied by the transformation of electrical energy into heat energy. The displacement of electricity involves an electromotive force, which has never been reconciled with ordinary mechanical force. What is needed in the art is a field-free material in which electricity is displaced by an electromotive force.

Whereas the operation of the phonovoltaic cell 400 of this invention involves a displacement of electric charge through space by hopping between the artificial nuclei 104, other preferred embodiments involve a novel displacement of electrical action through space with all valence electrons remaining in molecular bonds. In order to accomplish such a condition, the physical impact of the nuclear electric quadrupole moments of the natural boron atoms 102 must be eliminated. Pursuant to this particular objective, trace metallic impurities can be introduced at the same impurity concentration as that due to the nuclear electric quadrupole moments of the natural boron atoms 102, which is now clarified by an example.

Example 15

Figure 100:
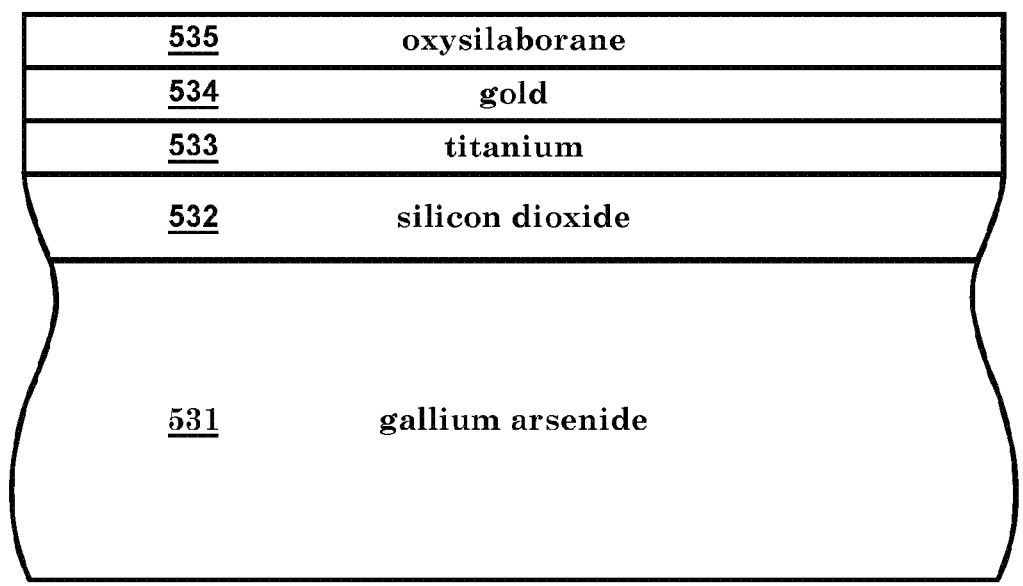
FIG. 100 is an illustration of a device comprising an oxysilaborane film and gold produced in accordance with Example 15.

Referring to FIG. 100, a silicon dioxide film 532 was deposited over a gallium arsenide substrate 531. The titanium film 533 and the gold film 534 were evaporated over the silicon dioxide film 532. The substrate 531 was loaded onto a resistively-heated susceptor in the D-125 MOCVD chamber of Example 14. The chamber was mechanically pumped below 50 mtorr, whereupon a 3% mixture by volume of diborane in hydrogen $B_2H_6(3\%)/H_2(97\%)$ at a flow rate of 360 sccm and a 2% mixture by volume of monosilane in hydrogen SiH$_4$(2%)/H$_2$(98%) at a flow rate of 1300 sccm were introduced into the deposition chamber. At the same time, undiluted nitrous oxide N$_2$O was introduced at a flow rate of 150 sccm. The reaction gases were allowed to mix and to stabilize before entering the deposition chamber. Upon stabilization of the gas flow rate, the chamber pressure was regulated at 20 torr and the molybdenum susceptor was rotated at 1100 rpm.

Figure 101:
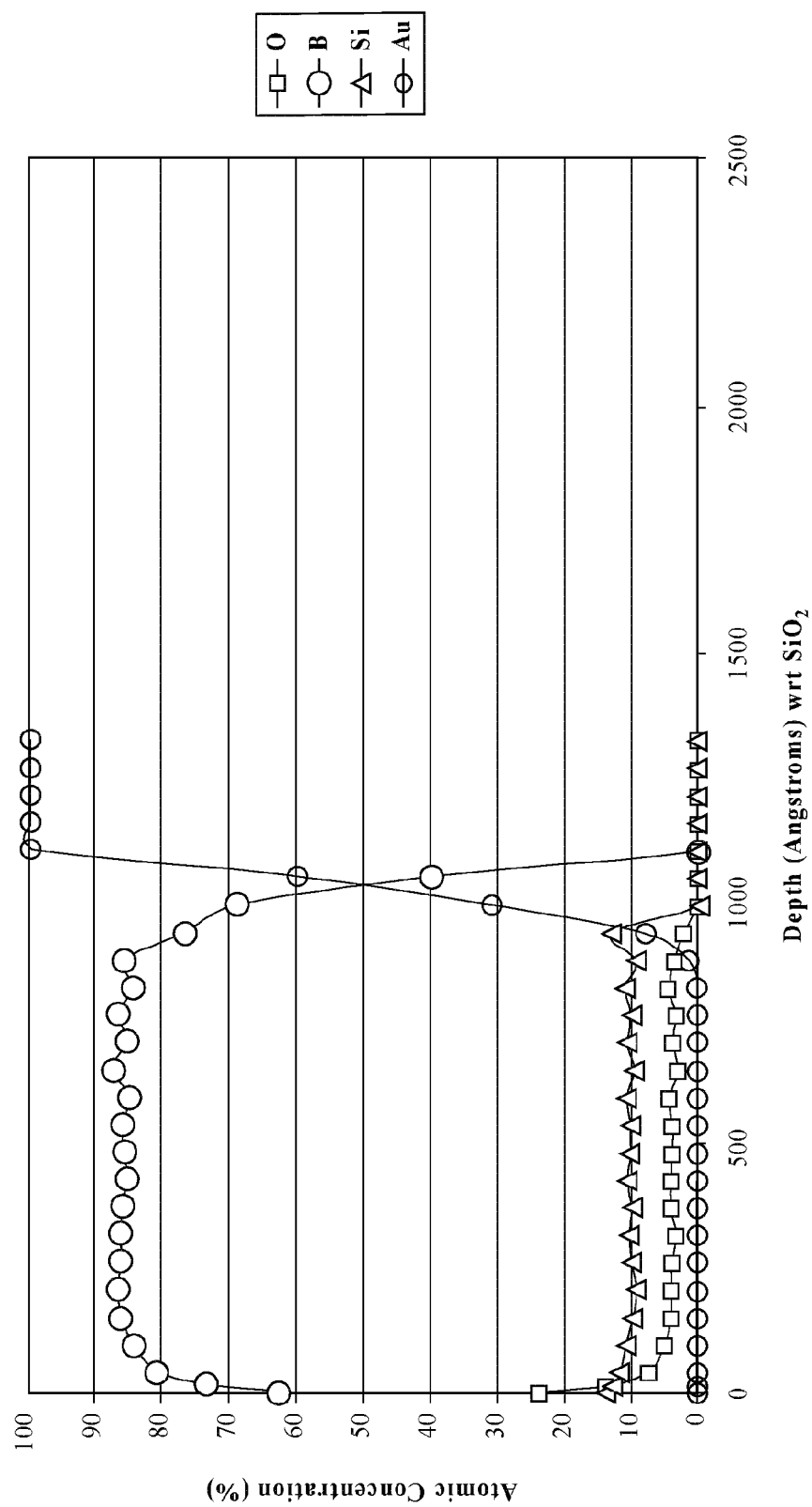
FIG. 101 is an x-ray photoelectron spectroscopy (XPS) depth profile of the oxysilaborane film deposited in Example 15.

The substrate temperature was increased to 240° C. by the resistively-heated rotating susceptor. After stabilizing at a deposition temperature of 240° C., the chemical reaction was allowed to proceed for 20 minutes, whereupon the susceptor heating was halted and the sample was allowed to cool to below 80° C. prior to removing it from the chamber. An oxysilaborane film 535 was deposited over the gold film 534, as represented in FIG. 100. The film thickness was measured by variable-angle spectroscopic ellipsometry to be 91.8 nm. The XPS depth profile in FIG. 101 established that the respective relative atomic concentrations of boron, silicon and oxygen within the oxysilaborane film 535 are: 85.2%, 10.0%, and 3.8%. A secondary ion mass spectroscopy (SIMS) was performed in order to measure the trace impurity concentration of gold in the oxysilaborane film 535.

Figure 102:
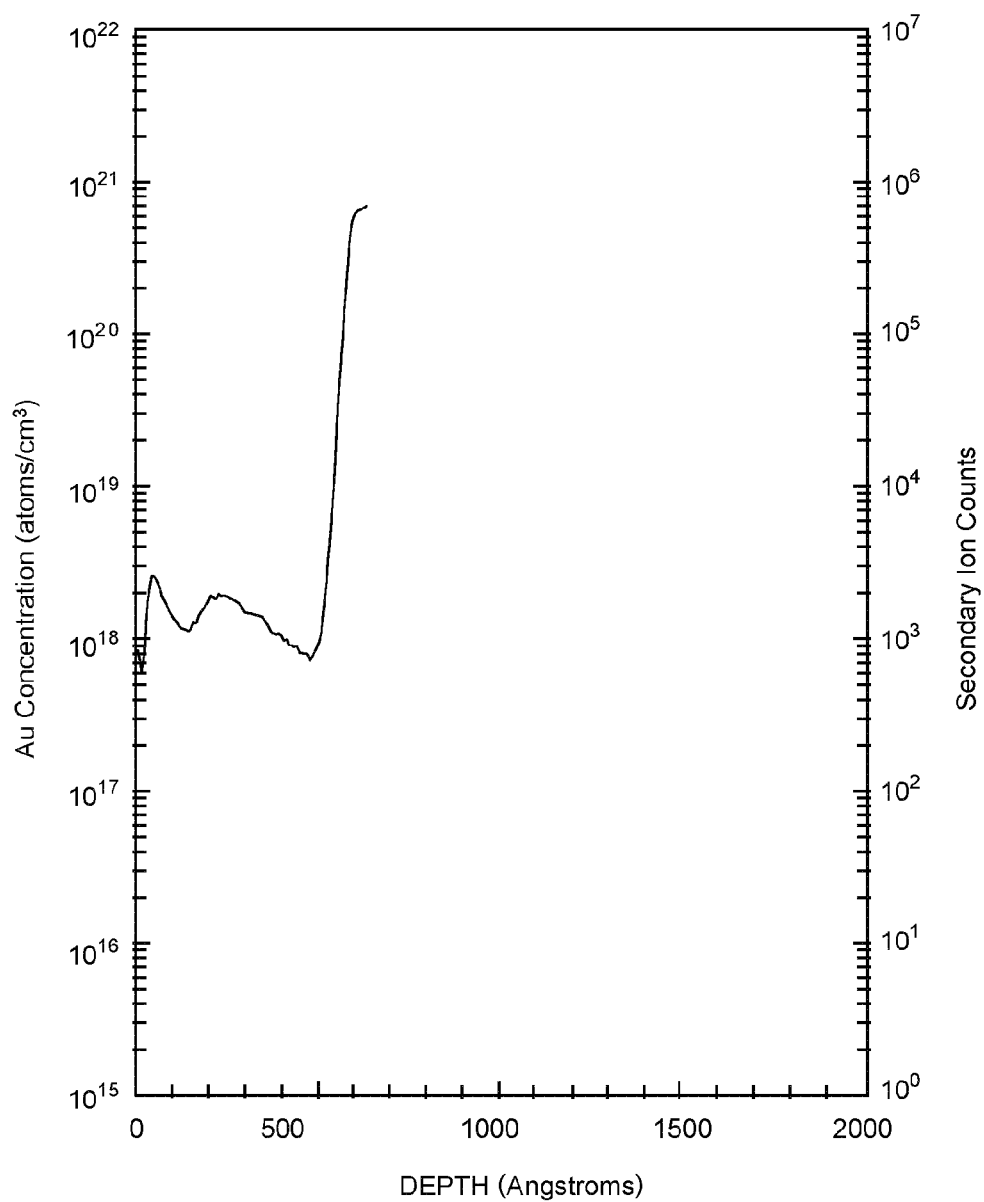
FIG. 102 is secondary ion mass spectroscopy (SIMS) performed to measure a trace impurity concentration of gold in the oxysilaborane film in Example 15.
Figure 103:
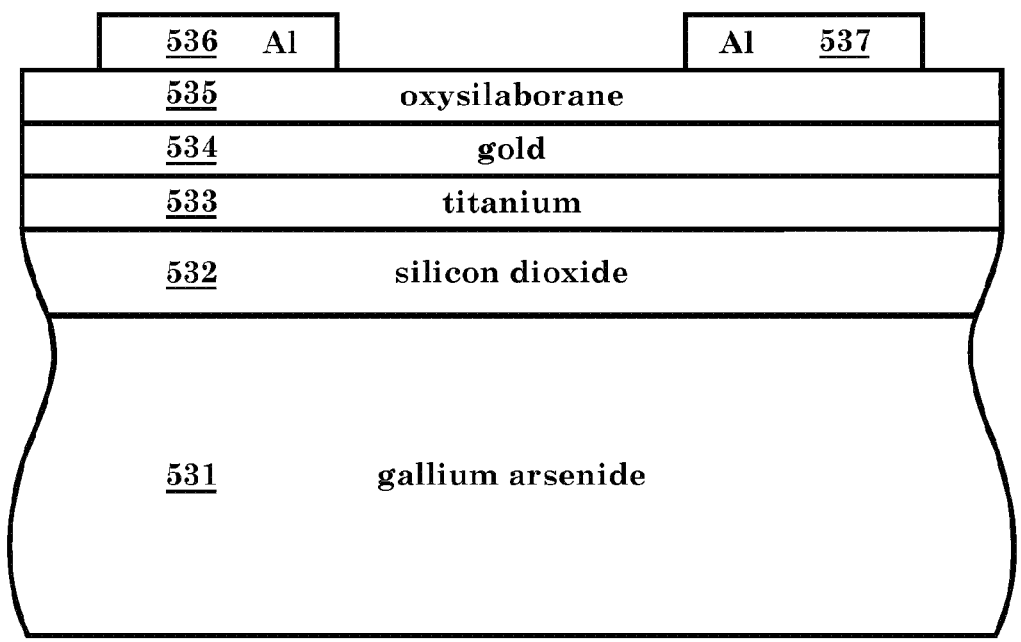
FIG. 103 depicts metal electrodes 536 and 537 evaporated over the gold film containing device of Example 15.
Figure 104:
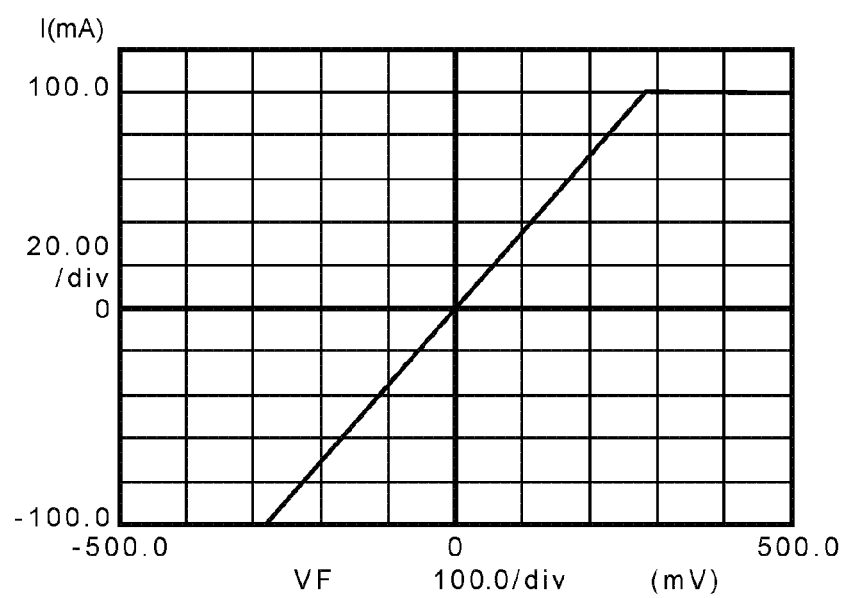
FIG. 104 is a linear graph of the current-voltage characteristics of the oxysilaborane film in Example 15.

The SIMS depth profile in FIG. 102 established the gold atomic concentration as being ~10$^{18}$ cm$^{-3}$. An RBS and HFS analysis established the relative atomic concentrations of boron, hydrogen, silicon, and oxygen as respectively being: 70%, 17%, 10%, and 3%. Metal electrodes 536 and 537 were evaporated over the gold film, per FIG. 103, by evaporating aluminum through a shadow mask in a bell-jar evaporator. The current-voltage characteristics of the oxysilaborane film 535 were measured by an HP-4145 parameter analyzer, with the two sweep signals being obtained by microprobes positioned on the metal electrodes 536 and 537. A graph of the current-voltage characteristics of the oxysilaborane film 535 is shown in FIG. 104. The current-voltage characteristics exhibited an ohmic conduction, with the 2.9Ω resistance due to the microprobe measurement apparatus.

The incorporation of gold as a trace impurity substantially modifies the electrical conductivity properties of the oxysilaborane film 535. It is believed that a logical explanation of the change in conduction due to a trace incorporation of a coinage metal such as gold may be given by way of Maxwell's development of electromagnetism. The reformulation of Maxwell's equations is fully described in [0682]-[0703] of U.S. Provisional Application No. 62/591,848 and is incorporated herein by reference. Maxwell's reformulated field equations can be expressed as:

$$\nabla \cdot D = \rho \tag{80a}$$

$$\nabla \times E = -\frac{\partial B}{\partial t} \tag{80b}$$

$$\nabla \times H = J + \frac{\partial D}{\partial t} \tag{80c}$$

$$\nabla \cdot B = 0 \tag{80d}$$

The unification of electricity and magnetism by Maxwell resulted in a generalization of Ampère's circuital law in Eq. (80c) to include the displacement current density ∂D/∂t. Maxwell's displacement current supports a displacement of electromagnetic energy through space without an actual displacement of electric charge. The power flux density of radiation propagating through space by means of Maxwell's displacement current is represented by the Poynting vector E×H. In the case of electromagnetic radiation due to Maxwell's displacement current, the radiation power displaced through space must be provided by means of some sort of external periodic driving force. Maxwell's reformulated field equations are yet further generalized in Eqs. (75a-d) to include the spectral induction ∇×ṡ×B and spectral displacement current density ∇×ṡ×D that are unknown in the prior art.

As further described in [0757]-[0780] of U.S. Provisional Application No. 62/591,848 and incorporated herein by reference, an integral form of spectral induction ∇×ṡ×B is hidden in Dirac's relativistic wave equation, such that:

$$\nabla \times E = \tag{81}$$

$$\nabla \times \dot{s} \times B \Leftrightarrow V_\sigma = \oint_{f^k \ell_{(\xi)}} \nabla \times (A \times \dot{s}) \cdot ds = \sigma \cdot A \times \dot{s} = \frac{\hbar}{2m} \sigma \cdot A \times \nabla$$

The following relation is derived in [0757]-[0780] of U.S. Provisional Application No. 62/591,848 and incorporated herein by reference.

$$\left[ \frac{(\hat{p}_0 + eA_0)^2}{2m} - \frac{(\hat{p} + eA)^2}{2m} - \frac{mc^2}{2} + \rho_1 \frac{eA_0}{2m} \sigma \cdot \hat{p} - eV_\sigma \right] \Psi = 0 \tag{82}$$

The above relation is due to the amalgamation of the Klein-Gordon and Schrödinger equations, following Dirac, which contains a pair of heretofore-unknown terms in the prior art. The above relationship reduces into the Klein-Gordon equation when these two heretofore-unknown terms are equated.

$$V_\sigma = \rho_1 \frac{A_0}{2m} \sigma \cdot \hat{p} \tag{83}$$

The term σ·p̂ on the right side of Eq. (83) pertains to the microwave zitterbewegung described by Eq. (79b). As discussed hereinabove, the existence of a microwave zitterbewegung is not known in the prior art. The above relation in Eq. (83) represents a novel and useful phenomenon, referred to herein as the microwave zitterbewegung Aharonov-Bohm effect. It is believed that the microwave zitterbewegung Aharonov-Bohm effect generates a periodic driving force in picocrystalline oxysilaboranes which is capable of displacing an electromagnetic power density E×H through space without the aid of any outside agency.

As physical dimensions of monolithic integrated circuits are scaled towards molecular dimensions, the extended energy bands of the existing scaling paradigm break down for fundamental reasons due to Heisenberg's quantum conditions. The scaling paradigm of integrated circuits in the prior art involves the planar scaling of covalently-bonded semiconductor regions wherein electric charge monopoles are displaced in extended energy bands in which the mean free path of electric charge monopoles is typically many orders of magnitude greater than the interatomic spacing of the host semiconductor lattice atoms. This type of electric charge monopole displacement exists in the back end of line (BEOL) fabrication as well as in the front end of line (FEOL) fabrication of integrated circuits.

In order to reduce deleterious resistive effects, BEOL interconnects were transformed from aluminum to copper in the prior art. However, the mean free path of electrons in copper is 39 nm, such that a large increase in resistivity occurs as the copper line widths are scaled below 50 nm. In a related manner, a parasitic leakage current occurs when silicon transistor feature sizes are scaled below approximately 28 nm, owing to the fundamental inability to confine mobile electric charge monopoles within extended energy bands over space. A number of other deleterious scaling effects occur in response to attempts to confine mobile electric charge monopoles in extended energy bands in deep-nanoscale integrated circuits. What is needed is a new type of integrated electrical displacement that does not involve the actual displacement of electric charge monopoles over space. It is here that the microwave zitterbewegung Aharonov-Bohm effect is useful.

The electromagnetic power density E×H displaced through space by the microwave zitterbewegung Aharonov-Bohm effect is believed to support the spectral displacement current density $\nabla \times \dot{s} \times D$ without incurring any resistance associated with an actual displacement of electric charge. As a result, preferred embodiments of this invention are believed to ideally act as a room-temperature superconductor, so long as the effective current density does not exceed a certain maximum current density. It is yet further believed that said maximum current density is comparable to that of graphene. The picocrystalline oxysilaboranes of this invention are highly useful as BEOL interconnects in that, unlike graphene, the deposition of the picocrystalline oxysilaboranes is by a low-temperature, conformal vapor-phase-deposition. It is believed that gold-doped picocrystalline silaborane, void of any oxygen, is most useful as a BEOL interconnect.

An incorporation of a trace impurity concentration $\sim 10^{18}$ cm$^{-3}$ of gold atoms in gold-doped picocrystalline silaborane can be realized by including a gold precursor in the formation gas resulting in the deposition of picocrystalline silaborane. Preferred gold precursors are volatile organometallic dimethyl gold (III) complexes, with dimethyl gold (III) acetate $(CH_3)_2Au(OAc)$ being a preferred such gold precursor. The gold precursor can be introduced into the formation gas by a hydrogen carrier gas in an MOCVD reactor. By introducing gold impurities, the electrical conductivity of both picocrystalline silaborane and picocrystalline oxysilaborane can be substantially increased in a controlled manner.

What is claimed is:
1. A phonovoltaic cell, comprising:
   a first conductor layer;
   a first boron layer in contact with the first conductor layer, the first boron layer comprising icosahedral boron and hydrogen and having a higher relative atomic concentration of boron than any other atom;
   a second boron layer in contact with the first boron layer, the second boron layer comprising icosahedral boron, hydrogen and oxygen and having a higher relative atomic concentration of boron than any other atom;
   a second conductor layer in contact with the second boron layer; and
   wherein an electrical potential is generated between the first conductor layer and the second conductor layer.
2. The phonovoltaic cell of claim 1 wherein the first boron layer further comprises silicon.
3. The phonovoltaic cell of claim 2, wherein the first boron layer is a silaborane.
4. The phonovoltaic cell of claim 3, wherein the first boron layer is a picocrystalline silaborane.
5. The phonovoltaic cell of claim 3 wherein the silaborane layer is silaborane having a formula of $(B_{12}H_w)_xSi_y$, wherein $3 \leq w \leq 5$, $2 \leq x \leq 4$, and $3 \leq y \leq 5$.
6. The phonovoltaic cell of claim 5 wherein the silaborane layer is picocrystalline silaborane having a formula of $(B_{12}H_4)_xSi_y$, wherein $2 \leq x \leq 4$ and $3 \leq y \leq 5$.
7. The phonovoltaic cell of claim 6 wherein the silaborane layer is picocrystalline silaborane having the formula $(B_{12}H_4)_3Si_5$.
8. The phonovoltaic cell of claim 1, wherein the second boron layer further comprises silicon.
9. The phonovoltaic cell of claim 8, wherein the second boron layer is an oxysilaborane.
10. The phonovoltaic cell of claim 9, wherein the second boron layer is a picocrystalline oxysilaborane.
11. The phonovoltaic cell of claim 9 wherein the oxysilaborane layer is oxysilaborane having a formula of $(B_{12}H_w)_x Si_yO_z$, wherein $3 \leq w \leq 5$, $2 \leq x \leq 4$, $3 \leq y \leq 5$ and $0 \leq z \leq 3$.
12. The phonovoltaic cell of claim 11 wherein the oxysilaborane layer is picocrystalline oxysilaborane having a formula of $(B_{12}H_4)_xSi_yO_z$, wherein $2 \leq x \leq 4$, $3 \leq y \leq 5$ and $0 < z \leq 3$.
13. The phonovoltaic cell of claim 12 wherein the oxysilaborane layer is picocrystalline oxysilaborane having the formula $(B_{12}H_4)_2Si_4O_2$.
14. The phonovoltaic cell of claim 1 wherein the first and second conductor layer are each a metallic electrode.
15. The phonovoltaic cell of claim 14 wherein the metallic electrode is aluminum.
16. The phonovoltaic cell of claim 1 wherein the icosahedral symmetry of the first and second boron layers are substantially free of Jahn-Teller distortion.
17. The phonovoltaic cell of claim 2, wherein the second boron layer further comprises silicon.
18. The phonovoltaic cell of claim 3, wherein the second boron layer is an oxysilaborane.
19. The phonovoltaic cell of claim 4, wherein the second boron layer is a picocrystalline oxysilaborane.
20. The phonovoltaic cell of claim 5 wherein the oxysilaborane layer is oxysilaborane having a formula of $(B_{12}H_w)_x Si_yO_z$, wherein $3 \leq w \leq 5$, $2 \leq x \leq 4$, $3 \leq y \leq 5$ and $0 < z \leq 3$.
21. The phonovoltaic cell of claim 6 wherein the oxysilaborane layer is picocrystalline oxysilaborane having a formula of $(B_{12}H_4)_xSi_yO_z$, wherein $2 \leq x \leq 4$, $3 \leq y \leq 5$ and $0 < z \leq 3$.
22. The phonovoltaic cell of claim 7 wherein the oxysilaborane layer is picocrystalline oxysilaborane having the formula $(B_{12}H_4)_2Si_4O_2$.
23. The phonovoltaic cell of claim 1 wherein the relative atomic concentration of boron in the first boron layer and the second boron layer is at least 50% greater than any other atom.
24. The phonovoltaic cell of claim 1 wherein the first boron layer has a thickness less than or equal to 4 nm and the second boron layer has a thickness less than or equal to 4 nm.
25. The phonovoltaic cell of claim 1 wherein a phonovoltaic pile is formed from at least two phonovoltaic cells with the second conductor of a first phonovoltaic cell forming the first conductor of a second phonovoltaic cell.
26. A rectifier comprising:
   a first conductor layer;
   a first boron layer in contact with the first conductor layer, the first boron layer comprising icosahedral boron and hydrogen and having a higher relative atomic concentration of boron than any other atom;

a second boron layer in contact with the first boron layer, the second boron layer comprising icosahedral boron, hydrogen and oxygen and having a higher relative atomic concentration of boron than any other atom;

a second conductor layer in contact with the second boron layer; and wherein the rectifier has an asymmetric electrical conductance between the first and second conductor layers.

27. The rectifier of claim 26, wherein the first boron layer further comprises silicon.

28. The rectifier of claim 27, wherein the first boron layer is a silaborane.

29. The rectifier of claim 28, wherein the first boron layer is a picocrystalline silaborane.

30. The rectifier of claim 28, wherein the silaborane layer is silaborane having a formula of $(B_{12}H_w)_xSi_y$, wherein $3 \le w \le 5$, $2 \le x \le 4$, and $3 \le y \le 5$.

31. The rectifier of claim 30, wherein the silaborane layer is picocrystalline silaborane having a formula of $(B_{12}H_4)_xSi_yO_z$, wherein $2 \le x \le 4$ and $3 \le y \le 5$.

32. The rectifier of claim 31, wherein the silaborane layer is picocrystalline silaborane having the formula $(B_{12}H_4)_3Si_5$.

33. The rectifier of claim 26, wherein the second boron layer further comprises silicon.

34. The rectifier of claim 33, wherein the second boron layer is an oxysilaborane.

35. The rectifier of claim 34, wherein the second boron layer is a picocrystalline oxysilaborane.

36. The rectifier of claim 34, wherein the oxysilaborane layer is oxysilaborane having a formula of $(B_{12}H_w)_xSi_yO_z$, wherein $3 \le w \le 5$, $2 \le x \le 4$, $3 \le y \le 5$ and $0 < z \le 3$.

37. The rectifier of claim 36, wherein the oxysilaborane layer is picocrystalline oxysilaborane having a formula of $(B_{12}H_4)_xSi_yO_z$, wherein $2 \le x \le 4$, $3 \le y \le 5$ and $0 < z \le 3$.

38. The rectifier of claim 37, wherein the oxysilaborane layer is picocrystalline oxysilaborane having the formula $(B_{12}H_4)_2Si_4O_2$.

39. The rectifier of claim 26, wherein the first and second conductor layer are each a metallic electrode.

40. The rectifier of claim 39, wherein the metallic electrode is aluminum.

41. The rectifier of claim 26, wherein the icosahedral symmetry of the first and second boron layers are substantially free of Jahn-Teller distortion.

42. The rectifier of claim 27, wherein the second boron layer further comprises silicon.

43. The rectifier of claim 28, wherein the second boron layer is an oxysilaborane.

44. The rectifier of claim 29, wherein the second boron layer is a picocrystalline oxysilaborane.

45. The rectifier of claim 30, wherein the oxysilaborane layer is oxysilaborane having a formula of $(B_{12}H_w)_xSi_yO_z$, wherein $3 \le w \le 5$, $2 \le x \le 4$, $3 \le y \le 5$ and $0 < z \le 3$.

46. The rectifier of claim 31, wherein the oxysilaborane layer is picocrystalline oxysilaborane having a formula of $(B_{12}H_4)_xSi_yO_z$, wherein $2 \le x \le 4$, $3 \le y \le 5$ and $0 < z \le 3$.

47. The rectifier of claim 32, wherein the oxysilaborane layer is picocrystalline oxysilaborane having the formula $(B_{12}H_4)_2Si_4O_2$.

48. The rectifier of claim 26, wherein the relative atomic concentration of boron in the first boron layer and the second boron layer is at least 50% greater than any other atom.

49. The rectifier of claim 26, wherein the first boron layer has a thickness less than or equal to about 4 nm and the second boron layer has a thickness less than or equal to about 4 nm.

50. The phonovoltaic cell of claim 1 wherein:

the first boron layer is a silaborane having a formula of $(B_{12}H_w)_xSi_y$, wherein $3 \le w \le 5$, $2 \le x \le 4$, and $3 \le y \le 5$ and has a thickness less than or equal to 4 nm;

the second boron layer is an oxysilaborane having a formula of $(B_{12}H_w)_xSi_yO_z$, wherein $3 \le w \le 5$, $2 \le x \le 4$, and $3 \le y \le 5$ and $0 < z \le 3$ and has a thickness less than or equal to 4 nm;

a second conductor layer in contact with the second boron layer; and wherein an electrical potential is generated between the first conductor layer and the second conductor layer.

51. The phonovoltaic cell of claim 50 wherein:

the first boron layer is a picocrystalline silaborane; and the second boron layer is a picocrystalline oxysilaborane.

52. The phonovoltaic cell of claim 51 wherein:

the first boron layer is a picocrystalline silaborane having a formula of $(B_{12}H_{14})_xSi_y$, wherein $2 \le x \le 4$, and $3 \le y \le 5$; and the second boron layer is a picocrystalline oxysilaborane having a formula of $(B_{12}H_4)_xSi_yO_z$, wherein $2 \le x \le 4$, and $3 \le y \le 5$ and $0 < z \le 3$.

53. The phonovoltaic cell of claim 52 wherein:

the first boron layer is a picocrystalline silaborane having the formula $(B_{12}H_{14})_3Si_5$; and the second boron layer is a picocrystalline oxysilaborane having the formula $(B_{12}H_4)_2Si_4O_2$.

54. The phonovoltaic cell of claim 50 wherein the relative atomic concentration of boron in each of the first boron layer and the second boron layer is at least 50% greater than any other atom.

55. The phonovoltaic cell of claim 50 further comprising a phonovoltaic pile formed from at least two phonovoltaic cells with the second conductor of a first phonovoltaic cell forming the first conductor of a second phonovoltaic cell.

* * * * *